US009213237B2

(12) United States Patent
Ito et al.

(10) Patent No.: US 9,213,237 B2
(45) Date of Patent: Dec. 15, 2015

(54) PATTERN FORMING METHOD, ACTINIC RAY-SENSITIVE OR RADIATION-SENSITIVE RESIN COMPOSITION, RESIST FILM, MANUFACTURING METHOD OF ELECTRONIC DEVICE, AND ELECTRONIC DEVICE

(71) Applicant: FUJIFILM Corporation, Tokyo (JP)

(72) Inventors: Junichi Ito, Shizuoka (JP); Hidenori Takahashi, Shizuoka (JP); Shuhei Yamaguchi, Shizuoka (JP); Kei Yamamoto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/315,661

(22) Filed: Jun. 26, 2014

(65) Prior Publication Data

US 2014/0308605 A1 Oct. 16, 2014

Related U.S. Application Data

(63) Continuation of application No. PCT/JP2012/084294, filed on Dec. 27, 2012.

(60) Provisional application No. 61/580,465, filed on Dec. 27, 2011.

(30) Foreign Application Priority Data

Dec. 27, 2011 (JP) ................................ 2011-286985

(51) Int. Cl.

| | |
|---|---|
| ***G03F 7/004*** | (2006.01) |
| ***G03F 7/32*** | (2006.01) |
| ***G03F 7/40*** | (2006.01) |
| ***G03F 7/038*** | (2006.01) |
| ***H01L 21/027*** | (2006.01) |
| ***C08F 220/18*** | (2006.01) |
| ***G03F 7/039*** | (2006.01) |
| ***G03F 7/11*** | (2006.01) |
| ***G03F 7/20*** | (2006.01) |

(52) U.S. Cl.

CPC ............ *G03F 7/0388* (2013.01); *C08F 220/18* (2013.01); *G03F 7/0045* (2013.01); *G03F 7/0046* (2013.01); *G03F 7/038* (2013.01); *G03F 7/0397* (2013.01); *G03F 7/11* (2013.01); *G03F 7/2041* (2013.01); *G03F 7/325* (2013.01); *H01L 21/0274* (2013.01)

(58) Field of Classification Search

CPC ............. G03F 7/32; G03F 7/325; G03F 7/20; G03F 7/26; G03F 7/0392; G03F 7/0397; G03F 7/2041; H01L 21/0274; C08F 220/18

USPC ............... 430/270.1, 434, 435, 322, 330, 325

See application file for complete search history.

(56) References Cited

U.S. PATENT DOCUMENTS

| | | | | |
|---|---|---|---|---|
| 7,998,655 | B2 * | 8/2011 | Tsubaki | 430/270.1 |
| 2005/0238993 | A1 * | 10/2005 | Watanabe et al. | 430/270.1 |
| 2008/0241746 | A1 | 10/2008 | Fukuhara et al. | |
| 2008/0318171 | A1 | 12/2008 | Tsubaki | |
| 2009/0239176 | A1 * | 9/2009 | Kanda | 430/285.1 |
| 2011/0177462 | A1 * | 7/2011 | Hatakeyama et al. | 430/325 |
| 2011/0269072 | A1 * | 11/2011 | Shibuya | 430/270.1 |
| 2011/0294069 | A1 * | 12/2011 | Bae et al. | 430/283.1 |
| 2012/0135355 | A1 | 5/2012 | Tsubaki | |
| 2013/0011785 | A1 * | 1/2013 | Kato et al. | 430/270.1 |
| 2013/0040096 | A1 | 2/2013 | Iwato et al. | |
| 2013/0078432 | A1 * | 3/2013 | Takahashi et al. | 428/195.1 |
| 2013/0216948 | A1 * | 8/2013 | Kasahara et al. | 430/270.1 |
| 2013/0295506 | A1 * | 11/2013 | Sakakibara et al. | 430/270.1 |

FOREIGN PATENT DOCUMENTS

| | | | |
|---|---|---|---|
| EP | 2 390 722 | A1 | 11/2011 |
| JP | 2008-268933 | A | 11/2008 |
| JP | 2008-309879 | A | 12/2008 |
| JP | 2009-25707 | A | 2/2009 |
| JP | 2009-025708 | A | 2/2009 |
| JP | 2009-80482 | A | 4/2009 |
| JP | 2009080482 | A * | 4/2009 |
| JP | 2011-248019 | A | 12/2011 |

OTHER PUBLICATIONS

Machine translation of JP 2009-080482 (no date).*

International Search Report (PCT/ISA/210), dated Feb. 5, 2013, issued by the International Searching Authority in counterpart International Patent Application No. PCT/JP2012/084294.

Written Opinion (PCT/ISA/237), dated Feb. 5, 2013, issued by the International Searching Authority in counterpart International Patent Application No. PCT/JP2012/084294.

Office Action dated Feb. 17, 2015 in corresponding Japanese Application No. 2012-279835.

Office Action from the Japanese Patent Office dated Sep. 29, 2015 in a counterpart Japanese Application No. 2012-279835.

* cited by examiner

*Primary Examiner* — Amanda C Walke

(74) *Attorney, Agent, or Firm* — Sughrue Mion, PLLC

(57) ABSTRACT

There is provided a pattern forming method comprising (i) a step of forming a film by using an actinic ray-sensitive or radiation-sensitive resin composition containing (A) a resin capable of increasing the polarity by the action of an acid to decrease the solubility for an organic solvent-containing developer, (B) a compound capable of generating an acid upon irradiation with an actinic ray or radiation, (C) a solvent, and (D) a resin substantially free from a fluorine atom and a silicon atom and different from the resin (A), (ii) a step of exposing the film, and (iii) a step of performing development by using an organic solvent-containing developer to form a negative pattern.

40 Claims, No Drawings

PATTERN FORMING METHOD, ACTINIC RAY-SENSITIVE OR RADIATION-SENSITIVE RESIN COMPOSITION, RESIST FILM, MANUFACTURING METHOD OF ELECTRONIC DEVICE, AND ELECTRONIC DEVICE

CROSS REFERENCE TO RELATED APPLICATION

This is a continuation of International Application No. PCT/JP2012/084294 filed on Dec. 27, 2012, and claims priority from Japanese Patent Application No. 2011-286985 filed on Dec. 27, 2011, U.S. Provisional Application No. 61/580,465 filed on Dec. 27, 2011, the entire disclosures of which are incorporated therein by reference.

TECHNICAL FIELD

The present invention relates to a pattern forming method, an actinic ray-sensitive or radiation-sensitive resin composition, a resist film, a manufacturing method of an electronic device, and an electronic device. More specifically, the present invention relates to a pattern forming method suitably used for the process of producing a semiconductor such as IC or the production of a liquid crystal device or a circuit board such as thermal head and further for the lithography in other photo-fabrication processes, an actinic ray-sensitive or radiation-sensitive resin composition, a resist film, a manufacturing method of an electronic device, and an electronic device. In particular, the present invention relates to a pattern forming method suitably used for exposure by an ArF exposure apparatus, an ArF immersion-type projection exposure apparatus and an EUV exposure apparatus each using a light source that emits far ultraviolet light having a wavelength of 300 nm or less, an actinic ray-sensitive or radiation-sensitive resin composition, a resist film, a manufacturing method of an electronic device, and an electronic device.

BACKGROUND ART

Since the advent of a resist for KrF excimer laser (248 nm), an image forming method called chemical amplification is used as an image forming method for a resist so as to compensate for sensitivity reduction caused by light absorption. For example, the image forming method by positive chemical amplification is an image forming method of decomposing an acid generator in the exposed area upon exposure to produce an acid, changing an alkali-insoluble group into an alkali-soluble group by using the generated acid as a reaction catalyst in the baking after exposure (PEB: Post Exposure Bake), and removing the exposed area by alkali development. A positive image forming method utilizing this chemical amplification mechanism is now the mainstream.

Also, there is known a so-called immersion method of filling the space between the projection lens and the sample with a high refractive-index liquid (hereinafter sometimes referred to as an "immersion liquid") in an effort to more shorten the wavelength and thereby realize high resolution. For example, JP-A-2008-268933 (the term "JP-A" as used herein means an "unexamined published Japanese patent application") describes a case where a resin having a specific acid-decomposable repeating unit and a specific resin free from a fluorine atom and a silicon atom are incorporated into a positive resist composition and the followability of immersion liquid is thereby improved.

However, in the above-described positive image forming method, an isolated line or dot pattern can be successfully formed, but in the case of forming an isolated space or fine hole pattern, the pattern profile is liable to be deteriorated.

To meet the requirement for finer pattern formation, as well as the currently mainstream positive pattern, there is recently known a technique of resolving a resist film made of a chemical amplification resist composition by using an organic developer to form a negative pattern. As such a technique, for example, in a method for forming a negative pattern by using an organic developer and an immersion method, a technique of adding a resin containing a silicon atom or a fluorine atom is known (see, for example, JP-A-2008-309879).

SUMMARY OF INVENTION

Furthermore, in recent years, the demand for formation of a finer hole pattern is abruptly increasing and in turn, it is required to more improve the local pattern dimension uniformity (Local CDU) and exposure latitude (EL) and more reduce the residual water defect when a hole pattern having particularly an ultrafine hole diameter (for example, 45 nm or less) is formed in a resist film.

The present invention has been made considering these problems, and an object of the present invention is to provide a pattern forming method ensuring that in forming a fine pattern such as hole pattern having a hole diameter of 45 nm or less, the local pattern dimension uniformity and exposure latitude are excellent and the generation of residual water defect is reduced, an actinic ray-sensitive or radiation-sensitive resin composition used therefor, a resist film, a manufacturing method of an electronic device, and an electronic device. Above all, the object of the present invention is to provide a pattern forming method suitable for immersion exposure, an actinic ray-sensitive or radiation-sensitive resin composition used therefor, a resist film, a manufacturing method of an electronic device, and an electronic device.

The present invention has the following configurations, and the above-described object of the present invention is attained by these configurations.

[1] A pattern forming method comprising:

(i) a step of forming a film by using an actinic ray-sensitive or radiation-sensitive resin composition containing (A) a resin capable of increasing the polarity by the action of an acid to decrease the solubility for an organic solvent-containing developer, (B) a compound capable of generating an acid upon irradiation with an actinic ray or radiation, (C) a solvent, and (D) a resin substantially free from a fluorine atom and a silicon atom and different from the resin (A), (ii) a step of exposing the film, and (iii) a step of performing development by using an organic solvent-containing developer to form a negative pattern, wherein the content of the resin (D) is from 0.1 mass % to less than 10 mass % based on the total solid content of the actinic ray-sensitive or radiation-sensitive resin composition and the mass percentage content in the resin (D), which is accounted for by the $CH_3$ partial structure contained in the side chain moiety of the resin (D), is 12.0% or more.

[2] The pattern forming method as described in [1], wherein the resin (A) contains a repeating unit having a group capable of decomposing by the action of an acid to produce a polar group and the repeating unit is composed only of at least one repeating unit represented by the following formula (I):

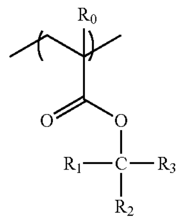

(I)

wherein $R_0$ represents a hydrogen atom or an alkyl group, each of $R_1$ to $R_3$ independently represents an alkyl group or a cycloalkyl group, and two members out of $R_1$ to $R_3$ may combine to form a monocyclic or polycyclic cycloalkyl group.

[3] The pattern forming method as described in [2], wherein the percentage content of the repeating unit represented by formula (I) is from 60 to 100 mol % based on all repeating units in the resin (A).

[4] The pattern forming method as described in any one of [1] to [3], wherein the resin (D) contains at least either one repeating unit represented by the following formula (II) or (III):

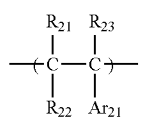

(II)

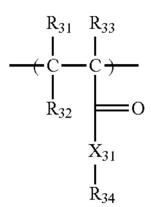

(III)

wherein in formula (II), each of $R_{21}$ to $R_{23}$ independently represents a hydrogen atom or an alkyl group, $Ar_{21}$ represents an aromatic group, $R_{22}$ and $Ar_{21}$ may form a ring, and in this case, $R_{22}$ represents an alkylene group; and in formula (III), each of $R_{31}$ to $R_{33}$ independently represents a hydrogen atom or an alkyl group, $X_{31}$ represents —O— or —$NR_{35}$—, $R_{35}$ represents a hydrogen atom or an alkyl group, and $R_{34}$ represents an alkyl group or a cycloalkyl group.

[5] The pattern forming method as described in [4], wherein the content of the repeating unit represented by formula (II) or (III) is from 50 to 100 mol % based on all repeating units in the resin (D).

[6] The pattern forming method as described in any one of claims 1 to 5, wherein the mass percentage content in the resin (D), which is accounted for by the $CH_3$ partial structure contained in the side chain moiety of the resin (D), is from 12.0 to 50.0% and the resin (D) is a resin containing a repeating unit represented by formula (IV):

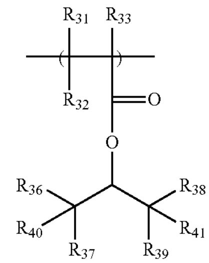

(IV)

each of $R_{31}$ to $R_{33}$ independently represents a hydrogen atom or an alkyl group, each of $R_{36}$ to $R_{39}$ independently represents an alkyl group or a cycloalkyl group, each of $R_{40}$ and $R_{41}$ independently represents a hydrogen atom, an alkyl group or a cycloalkyl group.

[7] The pattern forming method according to as described in any one of [1] to [6], wherein the developer is a developer containing at least one kind of an organic solvent selected from the group consisting of a ketone-based solvent, an ester-based solvent, an alcohol-based solvent, an amide-based solvent and an ether-based solvent.

[8] The pattern forming method as described in any one of [1] to [7], further comprising:

(iv) a step of performing rinsing by using an organic solvent-containing rinsing solution.

[9] The pattern forming method as described in any one of [1] to [8], wherein the exposure in the step (ii) is immersion exposure.

[10] An actinic ray-sensitive or radiation-sensitive resin composition used for the pattern forming method described in any one of [1] to [9].

[11] A resist film formed of the actinic ray-sensitive or radiation-sensitive resin composition described in [10].

[12] A method for manufacturing an electronic device, comprising the pattern forming method as described in any one of [1] to [9].

[13] An electronic device manufactured by the manufacturing method of an electronic device as described in [12].

The present invention preferably further includes the following configurations.

[14] The pattern forming method as described in any one of [1] to [9], wherein the resin (D) does not contain a repeating unit having an acid-decomposable group.

[15] The pattern forming method as described in any one of [1] to [9] and [14], wherein the resin (D) does not contain a repeating unit having an acid group (alkali-soluble group).

[16] The pattern forming method as described in any one of [1] to [9], [14] and [15], wherein the resin (D) does not contain a repeating unit having a lactone structure.

[17] The pattern forming method as described in any one of [1] to [9] and [14] to [16], wherein the weight average molecular weight of the resin (D) is from 10,000 to 40,000.

[18] The pattern forming method as described in any one of [1] to [9] and [14] to [17], wherein the exposure in the step (ii) is ArF exposure.

[19] The pattern forming method as described in any one of [1] to [9] and [14] to [18], wherein the resin (A) contains, as the repeating unit having an acid-decomposable group, a repeating unit having in the side chain thereof a structure capable of decomposing by the action of an acid to produce an alcoholic hydroxy group.

[20] The pattern forming method as described in any one of [1] to [9] and [14] to [19], wherein the compound (B) is a compound represented by the following formula (ZI-4'):

(ZI-4')

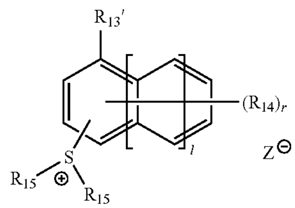

wherein in formula (ZI-4'), $R_{13}'$ represents a branched alkyl group, $R_{14}$ represents, when a plurality of $R_{14}$s are present, each independently represents, a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group, each $R_{15}$ independently represents an alkyl group, a cycloalkyl group or a naphthyl group, and two $R_{15}$s combine with each other to form a ring, l represents an integer of 0 to 2, r represents an integer of 0 to 8, and $Z^-$ represents a non-nucleophilic anion.

[21] The pattern forming method as described in any one of [1] to [9] and [14] to [20], wherein the compound (B) is a compound represented by the following formula (ZI) or (ZII):

(ZI)

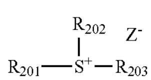

(ZII)

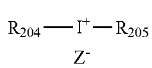

wherein in formulae (ZI) and (ZII), each of $R_{201}$, $R_{202}$ and $R_{203}$ independently represents an organic group, two members out of $R_{201}$ to $R_{203}$ may combine to form a ring structure, and the ring may contain an oxygen atom, a sulfur atom, an ester bond, an amide bond or a carbonyl group, each of $R_{204}$ and $R_{205}$ independently represents an aryl group, an alkyl group or a cycloalkyl group, and $Z^-$ represents a non-nucleophilic anion.

[22] The pattern forming method as described in [21], wherein $Z^-$ as the non-nucleophilic anion is an anion capable of producing an organic acid represented by the following formula (III) or (IV):

(III)

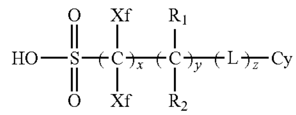

(IV)

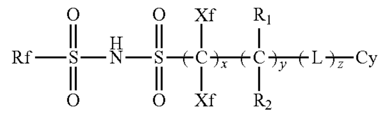

wherein each Xf independently represents a fluorine atom or an alkyl group substituted with at least one fluorine atom, each of $R_1$ and $R_2$ independently represents a hydrogen atom, a fluorine atom or an alkyl group, each L independently represents a divalent linking group, Cy represents a cyclic organic group, Rf represents a fluorine atom-containing group, x represents an integer of 1 to 20, y represents an integer of 0 to 10, and z represents an integer of 0 to 10.

[23] The pattern forming method as described in [22], wherein Cy as the cyclic organic group is a group having a steroid skeleton.

[24] The pattern forming method as described in [21], wherein $Z^-$ as the non-nucleophilic anion is a sulfonate anion represented by the following formula (B-1):

(B-1)

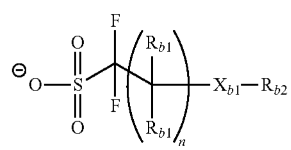

wherein in formula (B-1), each $R_{b1}$ independently represents a hydrogen atom, a fluorine atom or a trifluoromethyl group ($CF_3$), n represents an integer of 0 to 4, $X_{b1}$ represents a single bond, an alkylene group, an ether bond, an ester bond (—OCO— or —COO—), a sulfonic acid ester bond (—$OSO_2$— or —$SO_3$—) or a combination thereof, and $R_{b2}$ represents an organic group having a carbon number of 6 or more.

[25] The pattern forming method as described in any one of [1] to [9] and [14] to [24], wherein the actinic ray-sensitive or radiation-sensitive resin composition further contains an N-alkylcaprolactam.

[26] The actinic ray-sensitive or radiation-sensitive resin composition as described in [10], which is a chemical amplification resist composition for development using an organic solvent.

[27] The actinic ray-sensitive or radiation-sensitive resin composition as described in [10] and [26], which is for immersion exposure.

According to the present invention, a pattern forming method ensuring that in forming a fine pattern such as hole pattern having a hole diameter of 45 nm or less, the local pattern dimension uniformity and exposure latitude are excellent and the generation of residual water defect is reduced, an actinic ray-sensitive or radiation-sensitive resin composition used therefor, a resist film, a manufacturing method of an electronic device, and an electronic device can be provided.

Above all, a pattern forming method suitable for immersion exposure, an actinic ray-sensitive or radiation-sensitive resin composition used therefor, a resist film, a manufacturing method of an electronic device, and an electronic device can be provided.

DESCRIPTION OF EMBODIMENTS

The mode for carrying out the present invention is described below.

In the description of the present invention, when a group (atomic group) is denoted without specifying whether substituted or unsubstituted, the group encompasses both a group having no substituent and a group having a substituent. For example, "an alkyl group" encompasses not only an alkyl group having no substituent (unsubstituted alkyl group) but also an alkyl group having a substituent (substituted alkyl group).

The term "actinic ray" or "radiation" as used in the description of the present invention means, for example, a bright line spectrum of mercury lamp, a far ultraviolet ray typified by excimer laser, an extreme-ultraviolet ray (EUV light), an X-ray, or an electron beam (EB). Also, in the present invention, the "light" means an actinic ray or radiation.

In addition, unless otherwise indicated, the "exposure" as used in the description of the present invention encompasses not only exposure to a mercury lamp, a far ultraviolet ray typified by excimer laser, an extreme-ultraviolet ray, an X-ray, EUV light or the like but also lithography with a particle beam such as electron beam and ion beam.

The pattern forming method of the present invention comprises:

(i) a step of forming a film by using an actinic ray-sensitive or radiation-sensitive resin composition containing (A) a resin capable of increasing the polarity by the action of an acid to decrease the solubility for an organic solvent-containing developer, (B) a compound capable of generating an acid upon irradiation with an actinic ray or radiation, (C) a solvent, and (D) a resin substantially free from a fluorine atom and a silicon atom and different from the resin (A), (ii) a step of exposing the film, and (iii) a step of performing development by using an organic solvent-containing developer to form a negative pattern, wherein the content of the resin (D) is from 0.1 mass % to less than 10 mass % based on the total solid content of the actinic ray-sensitive or radiation-sensitive resin composition and the mass percentage content in the resin (D), which is accounted for by the $CH_3$ partial structure contained in the side chain moiety of the resin (D), is 12.0% or more. (In this specification, mass ratio is equal to weight ratio.)

The reason why the pattern forming method of the present invention using an actinic ray-sensitive or radiation-sensitive resin composition where the mass percentage content in the resin (D), which is accounted for by the $CH_3$ partial structure contained in the side chain moiety of the resin (D), is 12.0% or more and the resin (D) substantially free from a fluorine atom and a silicon atom is contained in an amount of 0.1 mass % to less than 10 mass % can ensure that in forming a fine pattern such as hole pattern having a hole diameter of 45 nm or less by negative pattern formation using an organic solvent-containing developer, the local pattern dimension uniformity and EL are excellent and the generation of residual water defect is reduced, is not clearly known but is presumed as follows.

In conventional positive pattern formation by the immersion method, in order to solve problems due to use of an immersion liquid, it has been done to mix a resin having low surface free energy and high hydrophobicity other than the main resin in the resist composition. In this regard, even the resin having low surface free energy and high hydrophobicity must be dissolved in an alkali developer at the development and therefore, alkali solubility, for example, having a group capable of generating an alkali-soluble group, is required of the resin having low surface free energy and high hydrophobicity, as a result, from the standpoint of securing high hydrophobicity (or low surface free energy) contradicting the alkali solubility, it has been required to incorporate a fluorine atom or a silicon atom into the resin having low surface free energy or high hydrophobicity.

However, incorporation of a fluorine atom or a silicon atom into a resin in the resist composition leads to impairing the contact angle property of the immersion liquid and involves a problem that the immersion liquid remains as a droplet during exposure scanning, as a result, a residual water defect is generated after development.

On the other hand, according to the negative pattern forming method of performing development by using an organic solvent-containing developer of the present invention, the problems due to use of an immersion liquid are solved and alkali solubility is not required of the resin having low surface free energy and high hydrophobicity, which is used together with the main rain in the resist composition, as a result, neither a fluorine atom nor silicon atom is required. In addition, a resin having a higher mass percentage content of the $CH_3$ partial structure contained in the resin molecule is considered to make it possible to more reduce the surface free energy and more enhance the hydrophobicity of the resin molecule and therefore, low surface free energy or high hydrophobicity of the resin molecule is estimated to be attained even without requiring a fluorine atom or a silicon atom.

That is, in the negative pattern forming method of the present invention, the mass percentage content of the $CH_3$ partial structure contained in the side chain moiety of the resin (D) is 12.0% or more, whereby low surface free energy or high hydrophobicity is achieved without requiring a fluorine atom and a silicon atom. This is presumed to enable enhancing the contact angle property of the immersion liquid (decreasing the difference between advancing contact angle and receding contact angle) and reducing the residual water defect.

Also, when a resist film formed using an actinic ray-sensitive or radiation-sensitive resin composition containing the compound (B) (hereinafter, sometimes referred to as "acid generator") is exposed, as compared with the inside, the surface layer part of the resist film tends to be exposed to a higher degree and have a high concentration of the acid generated, allowing the reaction between the acid and the resin (A) to more proceed. If such an exposed film is developed using an organic solvent-containing developer, the pattern dimension uniformity and EL may be impaired in the region defining a hole pattern (that is, the exposed area).

On the other hand, in the actinic ray-sensitive or radiation-sensitive resin composition of the present invention, it is presumed that thanks to setting of the mass percentage content of the $CH_3$ partial structure to a specific range, a fluorine atom and a silicon atom are not required and because the resin (D) which has achieved low surface free energy or high hydrophobicity is contained in an amount of 0.1 mass % to less than 10 mass % based on the total solid content of the actinic ray-sensitive or radiation-sensitive resin composition, the resin is likely to be unevenly distributed to the surface layer part of the resist film.

The resin is unevenly distributed in a high concentration to the surface layer part of the resist film and therefore, the solubility of the surface layer part of the resist film for an organic solvent-containing developer is enhanced. The enhanced solubility of the surface layer part of the resist film for an organic solvent-containing developer, which is brought about by the resin (D), is presumed to offset or suppress the deterioration of the pattern dimension uniformity and EL due to the generated acid that is unevenly distributed in excess to the surface layer of the exposed area.

As a result, the reaction using the acid as a catalyst to make the resist film insoluble or sparingly insoluble in an organic solvent-containing developer is allowed to proceed more uniformly with respect to the thickness direction of the resist film, and this is presumed to enable enhancing the pattern dimension uniformity and EL in the region defining a hole pattern.

Incidentally, as described above, when a fine hole pattern is formed by a positive image forming method, the pattern profile is readily impaired, and it is substantially very difficult to form a fine (for example, the hole diameter is 45 nm or less) hole pattern. Because, in the case of forming a hole pattern by a positive image forming method, the region where the hole pattern is formed becomes the exposure area and it is optically very difficult to expose and resolve an ultrafine exposure area.

In the pattern forming method of the present invention, the developer is preferably a developer containing at least one kind of an organic solvent selected from the group consisting of a ketone-based solvent, an ester-based solvent, an alcohol-based solvent, an amide-based solvent and an ether-based solvent.

The pattern forming method of the present invention preferably further includes (iv) a step of performing rinsing by using an organic solvent-containing rinsing solution.

The rinsing solution is preferably a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent The pattern forming method of the present invention preferably has (v) a heating step after the exposure step (ii).

In the pattern forming method of the present invention, the resin (A) is a resin capable of increasing the polarity by the action of an acid to increase the solubility for an alkali developer, and the pattern forming method may further includes (vi) a step of performing development by using an alkali developer.

In the pattern forming method of the present invention, the exposure step (ii) may be performed a plurality of times.

In the pattern forming method of the present invention, the heating step (v) may be performed a plurality of times.

The resist film of the present invention is a film formed of the above-described actinic ray-sensitive or radiation-sensitive resin composition, and this is a film formed, for example, by coating the actinic ray-sensitive or radiation-sensitive resin composition on a base material.

The actinic ray-sensitive or radiation-sensitive resin composition which can be used in the present invention is described below.

The present invention also relates to the actinic ray-sensitive or radiation-sensitive resin composition described below.

The actinic ray-sensitive or radiation-sensitive resin composition according to the present invention is used for negative development (development where the solubility for developer is decreased upon exposure, as a result, the exposed area remains as a pattern and the unexposed area is removed) particularly in the case of forming a hole pattern having a fine hole diameter (for example, 45 nm or less) in a resist film. That is, the actinic ray-sensitive or radiation-sensitive resin composition according to the present invention can be an actinic ray-sensitive or radiation-sensitive resin composition for organic solvent development, which is used for development using an organic solvent-containing developer. The term "for organic solvent development" as used herein means usage where the composition is subjected to at least a step of performing development by using an organic solvent-containing developer.

The actinic ray-sensitive or radiation-sensitive resin composition of the present invention is typically a resist composition and is preferably a negative resist composition (that is, a resist composition for organic solvent development), because particularly high effects can be obtained. Also, the composition according to the present invention is typically a chemical amplification resist composition.

In a negative image forming method using an organic solvent-containing developer, as compared with a positive image forming method using an alkali developer, the dissolution contrast for the developer between the unexposed area and the exposed area is generally small. In order to form a hole pattern having an ultrafine hole diameter, a negative image forming method is employed for the reason described above, but the variation of acid concentration in the thickness direction of the exposed area of the resist film (that is, the acid is present in an excess amount in the surface layer part of the exposed area) has a greater influence in a negative image forming method than in a positive image forming method where the dissolution contrast for the developer between the unexposed area and the exposed area is large.

Accordingly, the present invention has great technical significance in that the problem in the cross-sectional profile of a pattern, which is liable to emerge in a negative image forming method, can be solved and, as a result, a pattern excellent in the pattern dimension uniformity and EL can be formed, despite having an ultrafine hole diameter.

[1] (A) Resin Capable of Increasing the Polarity by the Action of an Acid to Decrease the Solubility for an Organic Solvent-Containing Developer The resin capable of increasing the polarity by the action of an acid to decrease the solubility for an organic solvent-containing developer, which is used for the actinic ray-sensitive or radiation-sensitive resin composition according to the present invention, includes, for example, a resin having a group capable of decomposing by the action of an acid to produce a polar group (hereinafter sometimes referred to as an "acid-decomposable group"), on either one or both of the main and side chains of the resin (hereinafter sometimes referred to as an "acid-decomposable resin" or a "resin (A)").

The acid-decomposable group preferably has a structure where a polar group is protected by a group capable of decomposing and leaving by the action of an acid.

The polar group is not particularly limited as long as it is a group capable of becoming sparingly soluble or insoluble in an organic solvent-containing developer, but examples thereof include a phenolic hydroxyl group, an acidic group (a group capable of dissociating in an aqueous 2.38 mass % tetramethylammonium hydroxide solution which has been conventionally used as the developer for a resist) such as carboxyl group, fluorinated alcohol group (preferably hexafluoroisopropanol group), sulfonic acid group, sulfonamide group, sulfonylimide group, (alkylsulfonyl)(alkylcarbonyl)methylene group, (alkylsulfonyl)(alkylcarbonyl)imide group, bis(alkylcarbonyl)methylene group, bis(alkylcarbonyl)imide group, bis(alkylsulfonyl)methylene group, bis (alkylsulfonyl)imide group, tris(alkylcarbonyl)methylene group and tris(alkylsulfonyl)methylene group, and an alcoholic hydroxyl group.

In addition, the alcoholic hydroxyl group is a hydroxyl group bonded to a hydrocarbon group and indicates a hydroxyl group except for a hydroxyl group directly bonded on an aromatic ring (phenolic hydroxyl group), and an aliphatic alcohol substituted with an electron-withdrawing group such as fluorine atom at the α-position (for example, a fluorinated alcohol group (e.g., hexafluoroisopropanol)) is excluded from the hydroxyl group. The alcoholic hydroxyl group is preferably a hydroxyl group having a pKa of 12 to 20.

Preferred polar groups include a carboxyl group, a fluorinated alcohol group (preferably a hexafluoroisopropanol group), and a sulfonic acid group.

The group preferred as the acid-decomposable group is a group where a hydrogen atom of the group above is substituted for by a group capable of leaving by the action of an acid.

Examples of the group capable of leaving by the action of an acid include —$C(R_{36})(R_{37})(R_{38})$, —$C(R_{36})(R_{37})(OR_{39})$, and —$C(R_{01})(R_{02})(OR_{39})$.

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group, and an octyl group.

The cycloalkyl group of $R_{36}$ to $R_{39}$, $R_{01}$ and $R_{02}$ may be monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group, and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group, and an androstanyl group. Incidentally, at least one carbon atom in the cycloalkyl group may be substituted with a heteroatom such as oxygen atom.

The aryl group of $R_{36}$ to $R_{39}$, $R_{01}$ and $R_{02}$ is preferably an aryl group having a carbon number of 6 to 10, and examples thereof include a phenyl group, a naphthyl group, and an anthryl group.

The aralkyl group of $R_{36}$ to $R_{39}$, $R_{01}$ and $R_{02}$ is preferably an aralkyl group having a carbon number of 7 to 12, and examples thereof include a benzyl group, a phenethyl group, and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group, and a cyclohexenyl group.

The ring formed by combining $R_{36}$ and $R_{37}$ is preferably a cycloalkyl group (monocyclic or polycyclic). The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 to 6, still more preferably a monocyclic cycloalkyl group having a carbon number of 5.

The acid-decomposable group is preferably a cumyl ester group, an enol ester group, an acetal ester group, a tertiary alkyl ester group or the like, more preferably a tertiary alkyl ester group.

The resin (A) preferably contains a repeating unit having an acid-decomposable group.

The repeating unit having an acid-decomposable group contained in the resin (A) is preferably a repeating unit represented by the following formula (I):

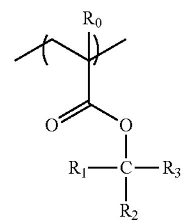

(I)

In formula (I), $R_0$ represents a hydrogen atom or a linear or branched alkyl group.

Each of $R_1$ to $R_3$ independently represents a linear or branched alkyl group or a monocyclic or polycyclic cycloalkyl group.

Two members out of $R_1$ to $R_3$ may combine to form a monocyclic or polycyclic cycloalkyl group.

The linear or branched alkyl group of $R_0$ may have a substituent and is preferably a linear or branched alkyl group having a carbon number of 1 to 4, and examples thereof include a methyl group, an ethyl group, an n-propyl group, an isopropyl group, an n-butyl group, an isobutyl group, and a tert-butyl group. Examples of the substituent include a hydroxyl group and a halogen atom (such as fluorine atom).

$R_0$ is preferably a hydrogen atom, a methyl group, a trifluoromethyl group or a hydroxymethyl group.

The alkyl group of $R_1$ to $R_3$ is preferably an alkyl group having a carbon number of 1 to 4, such as methyl group, ethyl group, n-propyl group, isopropyl group, n-butyl group, isobutyl group and tert-butyl group.

The cycloalkyl group of $R_1$ to $R_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of $R_1$ to $R_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 or 6.

One preferred embodiment is an embodiment where $R_1$ is a methyl group or an ethyl group and $R_2$ and $R_3$ are combined to form the above-described cycloalkyl group.

Each of the groups above may have a substituent, and examples of the substituent include a hydroxyl group, a halogen atom (such as fluorine atom), an alkyl group (having a carbon number of 1 to 4), a cycloalkyl group (having a carbon number of 3 to 8), an alkoxy group (having a carbon number of 1 to 4), a carboxyl group, and an alkoxycarbonyl group (having a carbon number of 2 to 6). The carbon number is preferably 8 or less.

A particularly preferred embodiment of the repeating unit represented by formula (I) is an embodiment where each of $R_1$, $R_2$ and $R_3$ independently represents a linear or branched alkyl group.

In this embodiment, the linear or branched alkyl group of $R_1$, $R_2$ and $R_3$ is preferably an alkyl group having a carbon number of 1 to 4, and examples thereof include a methyl group, an ethyl group, an n-propyl group, an isopropyl group, an n-butyl group, an isobutyl group and a tert-butyl group.

$R_1$ is preferably a methyl group, an ethyl group, an n-propyl group or an n-butyl group, more preferably a methyl group or an ethyl group, still more preferably a methyl group.

$R_2$ is preferably a methyl group, an ethyl group, an n-propyl group, an isopropyl group or an n-butyl group, more preferably a methyl group or an ethyl group, still more preferably a methyl group.

$R_3$ is preferably a methyl group, an ethyl group, an n-propyl group, an isopropyl group, an n-butyl group, an isobutyl group or a tert-butyl group, more preferably a methyl group, an ethyl group, an isopropyl group or an isobutyl group, still more preferably a methyl group, an ethyl group or an isopropyl group.

Specific preferred examples of the repeating unit having an acid-decomposable group are illustrated below, but the present invention is not limited thereto.

In specific examples, Rx represents a hydrogen atom, $CH_3$, $CF_3$ or $CH_2OH$, and each of Rxa and Rxb represents an alkyl group having a carbon number of 1 to 4. Z represents a substituent, and when a plurality of Z's are present, each Z may be the same as or different from every other Z. p represents 0 or a positive integer. Specific examples and preferred examples of Z are the same as specific examples and preferred examples of the substituent which each group such as $R_1$ to $R_3$ may have.

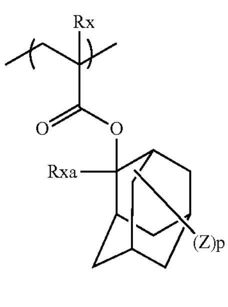

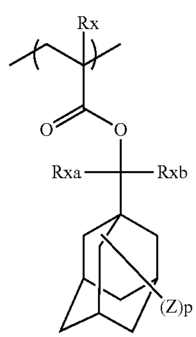

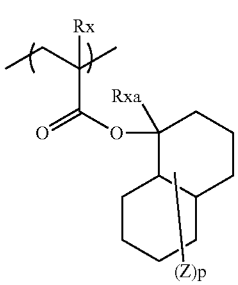

-continued

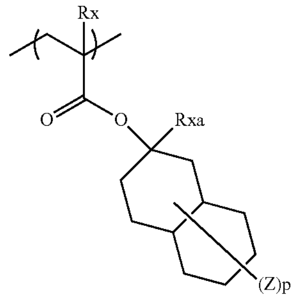

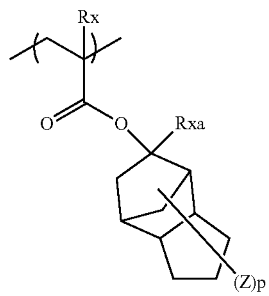

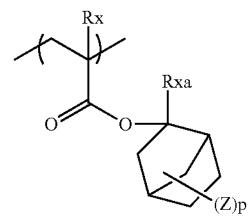

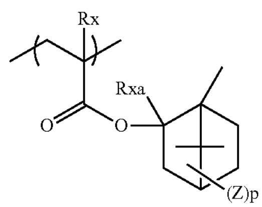

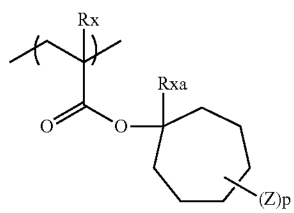

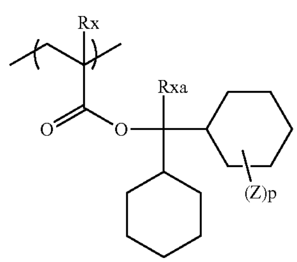

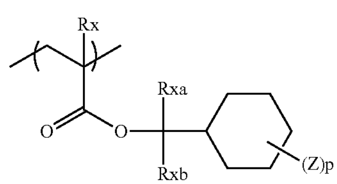

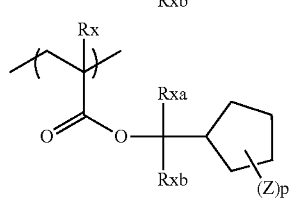

-continued
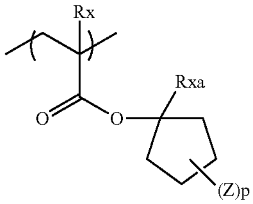
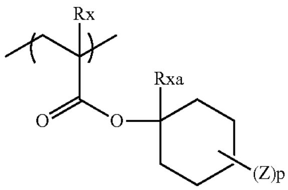
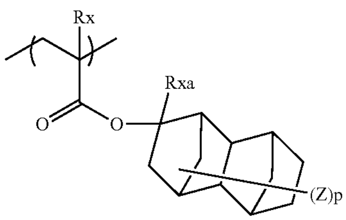
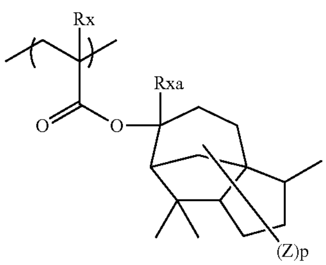
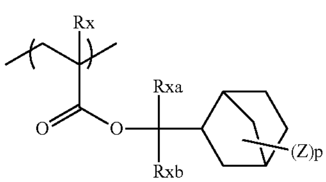
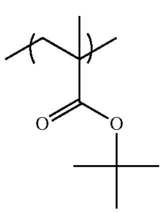
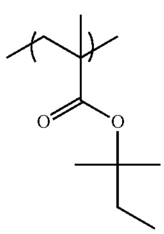
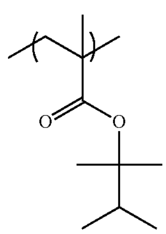
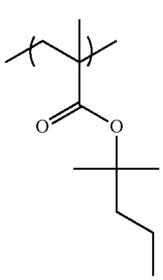
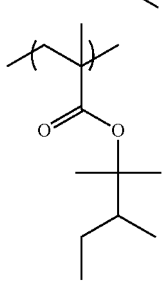
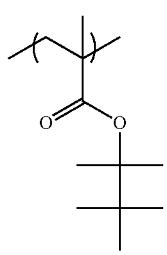
-continued
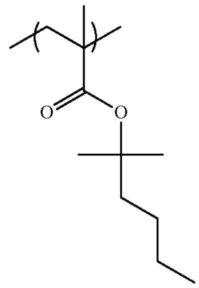
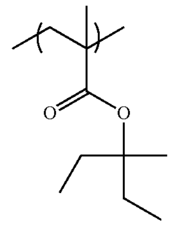
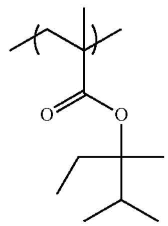
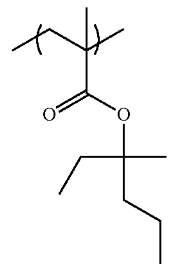
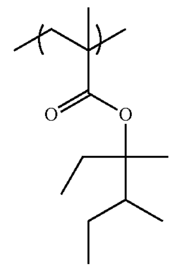
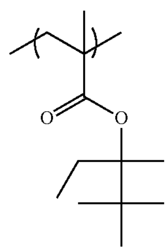
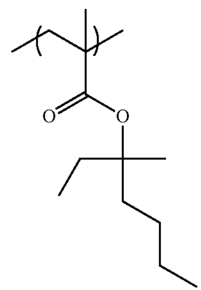
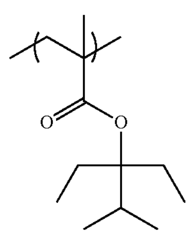
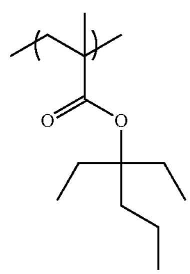
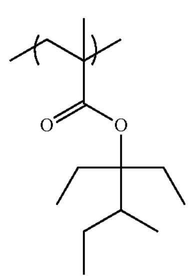
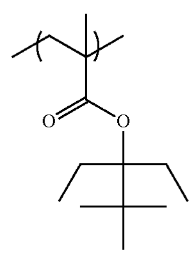
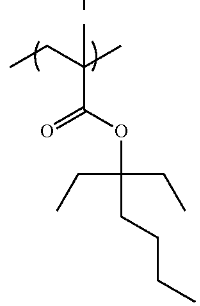
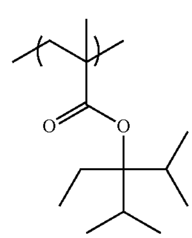

-continued

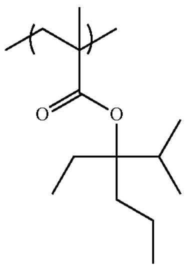
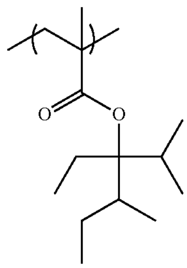
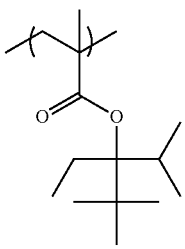
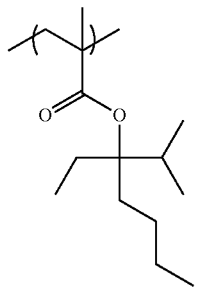
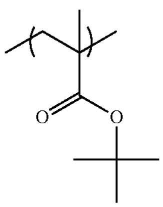
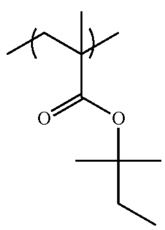
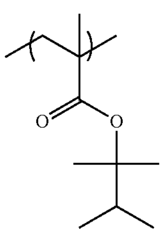
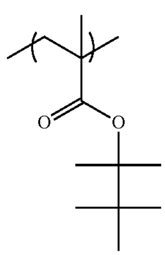
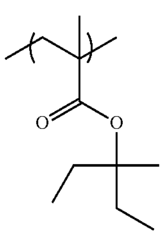
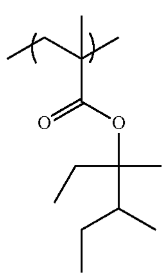
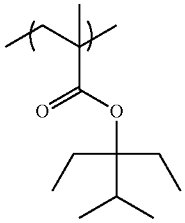
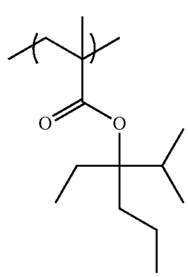

-continued

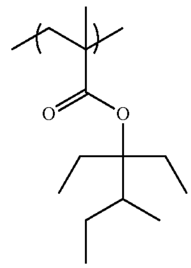
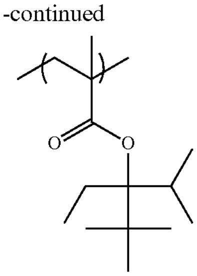
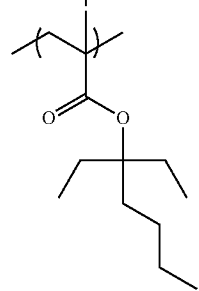

In the case where the resin (A) contains a repeating unit represented by formula (I) as the repeating unit having an acid-decomposable group, the repeating unit having an acid group is preferably composed of only at least one repeating unit represented by formula (I).

It is also preferred that the acid-decomposable group-containing repeating unit is a repeating unit capable of decomposing by the action of an acid to produce a carboxyl group, represented by the following formula (IB), and thanks to this configuration, the pattern forming method can ensure that the roughness performance such as line width roughness, the uniformity of local pattern dimension and the exposure latitude are more excellent and the reduction in film thickness of the pattern part formed by development, so-called film loss, is more suppressed.

(IB)

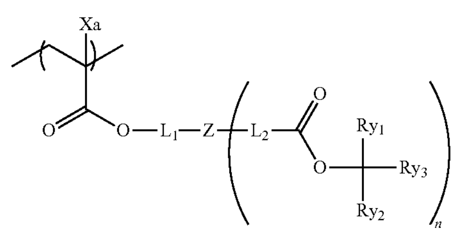

In the formula, Xa represents a hydrogen atom, an alkyl group, a cyano group or a halogen atom.

Each of $Ry_1$ to $Ry_3$ independently represents an alkyl group or a cycloalkyl group, and two members out of $Ry_1$ to $Ry_3$ may combine to form a ring.

Z represents a (n+1)-valent linking group having a polycyclic hydrocarbon structure which may have a heteroatom as a ring member.

Each of $L_1$ and $L_2$ independently represents a single bond or a divalent linking group.

n represents an integer of 1 to 3.

When n is 2 or 3, each $L_2$, each $Ry_1$, each $Ry_2$ and each $Ry_3$ may be the same as or different from every other $L_2$, $Ry_1$, $Ry_2$ and $Ry_3$, respectively.

The alkyl group of Xa may have a substituent, and examples of the substituent include a hydroxyl group and a halogen atom (preferably fluorine atom).

The alkyl group of Xa is preferably an alkyl group having a carbon number of 1 to 4, and examples thereof include a methyl group, an ethyl group, a propyl group, a hydroxymethyl group, and a trifluoromethyl group, with a methyl group being preferred.

Xa is preferably a hydrogen atom or a methyl group.

The alkyl group of $Ry_1$ to $Ry_3$ may be chain or branched and is preferably an alkyl group having a carbon number of 1 to 4, such as methyl group, ethyl group, n-propyl group, isopropyl group, n-butyl group, isobutyl group and tert-butyl group.

The cycloalkyl group of $Ry_1$ to $Ry_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The ring formed by combining two members out of $Ry_1$ to $Ry_3$ is preferably a monocyclic hydrocarbon ring such as cyclopentane ring and cyclohexane ring, or a polycyclic hydrocarbon ring such as norbornane ring, tetracyclodecane ring, tetracyclododecane ring and adamantane ring, more preferably a monocyclic hydrocarbon ring having a carbon number of 5 to 6.

Each of $Ry_1$ to $Ry_3$ is independently preferably an alkyl group, more preferably a chain or branched alkyl group having a carbon number of 1 to 4. Also, the total of the carbon numbers of the chain or branched alkyl groups as $Ry_1$ to $Ry_3$ is preferably 5 or less.

Each of $Ry_1$ to $Ry_3$ may further have a substituent, and examples of the substituent include an alkyl group (having a carbon number of 1 to 4), a cycloalkyl group (having a carbon number of 3 to 8), a halogen atom, an alkoxy group (having a carbon number of 1 to 4), a carboxyl group, and an alkoxycarbonyl group (having a carbon number of 2 to 6). The carbon number is preferably 8 or less. Above all, from the standpoint of more enhancing the dissolution contrast for an organic solvent-containing developer between before and after acid decomposition, the substituent is preferably a group free from a heteroatom such as oxygen atom, nitrogen atom and sulfur atom (for example, preferably not an alkyl group substituted with a hydroxyl group), more preferably a group composed of only a hydrogen atom and a carbon atom, still more preferably a linear or branched alkyl group or a cycloalkyl group.

The linking group having a polycyclic hydrocarbon structure of Z includes a ring-assembly hydrocarbon ring group and a crosslinked cyclic hydrocarbon ring group, and these groups include a group obtained by removing arbitrary (n+1) hydrogen atoms from a ring-assembly hydrocarbon ring and a group obtained by removing arbitrary (n+1) hydrogen atoms from a crosslinked cyclic hydrocarbon ring, respectively.

Examples of the ring-assembly hydrocarbon ring group include a bicyclohexane ring group and a perhydronaphthalene ring group. Examples of the crosslinked cyclic hydrocarbon ring group include a bicyclic hydrocarbon ring group such as pinane ring group, bornane ring group, norpinane ring group, norbornane ring group and bicyclooctane ring group (e.g., bicyclo[2.2.2]octane ring group, bicyclo[3.2.1]octane ring group), a tricyclic hydrocarbon ring group such as homobledane ring group, adamantane ring group, tricyclo[5.2.1.$0^{2,6}$]decane ring group and tricyclo[4.3.1.$1^{2,5}$]undecane ring group, and a tetracyclic hydrocarbon ring group such as tetracyclo[4.4.0.$1^{2,5}$.$1^{7,10}$]dodecane ring group and perhydro-1,4-methano-5,8-methanonaphthalene ring group. The crosslinked cyclic hydrocarbon ring group also includes a condensed cyclic hydrocarbon ring group, for example, a condensed ring group obtained by fusing a plurality of 5- to 8-membered cycloalkane ring groups, such as perhydronaphthalene (decalin) ring group, perhydroanthracene ring group, perhydrophenathrene ring group, perhydroacenaphthene ring group, perhydrofluorene ring group, perhydroindene ring group and perhydrophenalene ring group.

Preferred examples of the crosslinked cyclic hydrocarbon ring group include a norbornane ring group, an adamantane ring group, a bicyclooctane ring group, and a tricycle[5,2,1,$0^{2,6}$]decane ring group. Of these crosslinked cyclic hydrocarbon ring groups, a norbornane ring group and an adamantane ring group are more preferred.

The linking group having a polycyclic hydrocarbon structure represented by Z may have a substituent. Examples of the substituent which Z may have include a substituent such as alkyl group, hydroxyl group, cyano group, keto group (═O), acyloxy group, —COR, —COOR, —CON(R)$_2$, —$SO_2$R, —$SO_3$R and —$SO_2$N(R)$_2$, wherein R represents a hydrogen atom, an alkyl group, a cycloalkyl group or an aryl group.

The alkyl group, alkylcarbonyl group, acyloxy group, —COR, —COOR, —CON(R)$_2$, —$SO_2$R, —$SO_3$R and —$SO_2$N(R)$_2$ as the substituent which Z may have may further have a substituent, and this substituent includes a halogen atom (preferably fluorine atom).

In the linking group having a polycyclic hydrocarbon structure represented by Z, the carbon constituting the polycyclic ring (the carbon contributing to ring formation) may be a carbonyl carbon. Also, as described above, the polycyclic ring may have, as a ring member, a heteroatom such as oxygen atom and sulfur atom.

Examples of the linking group represented by $L_1$ and $L_2$ include —COO—, —OCO—, —CONH—, —NHCO—, —CO—, —O—, —S—, —SO—, —$SO_2$—, an alkylene group (preferably having a carbon number of 1 to 6), a cycloalkylene group (preferably having a carbon number of 3 to 10), an alkenylene group (preferably having a carbon number of 2 to 6), and a linking group formed by combining a plurality of these members, and a linking group having a total carbon number of 12 or less is preferred.

$L_1$ is preferably a single bond, an alkylene group, —COO—, —OCO—, —CONH—, —NHCO—, -alkylene group-COO—, -alkylene group-OCO—, -alkylene group-CONH—, -alkylene group-NHCO—, —CO—, —O—, —$SO_2$—, or -alkylene group-O—, more preferably a single bond, an alkylene group, -alkylene group-COO—, or -alkylene group-O—.

$L_2$ is preferably a single bond, an alkylene group, —COO—, —OCO—, —CONH—, —NHCO—, —COO-alkylene group-, —OCO-alkylene group-, —CONH-alkylene group-, —NHCO-alkylene group-, —CO—, —O—, —$SO_2$—, —O-alkylene group-, or —O-cycloalkylene group-, more preferably a single bond, an alkylene group, —COO-alkylene group-, —O-alkylene group-, or —O-cycloalkylene group-.

In the descriptions above, the bond "—" at the left end means to be bonded to the ester bond on the main chain side in $L_1$ and bonded to Z in $L_2$, and the bond "—" at the right end means to be bonded to Z in $L_1$ and bonded to the ester bond connected to the group represented by $(Ry_1)(Ry_2)(Ry_3)$C— in $L_2$.

Incidentally, $L_1$ and $L_2$ may be bonded to the same atom constituting the polycyclic ring in Z.

n is preferably 1 or 2, more preferably 1.

Specific examples of the repeating unit represented by formula (IB) are illustrated below, but the present invention is not limited thereto. In specific examples, Xa represents a hydrogen atom, an alkyl group, a cyano group or a halogen atom.
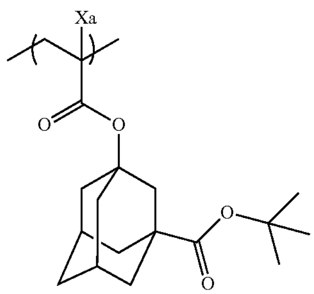
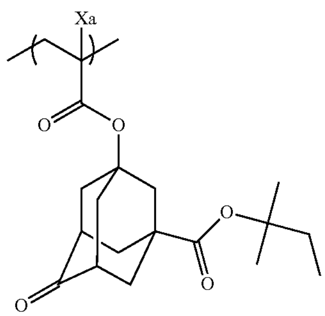
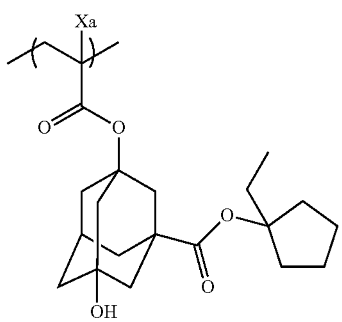
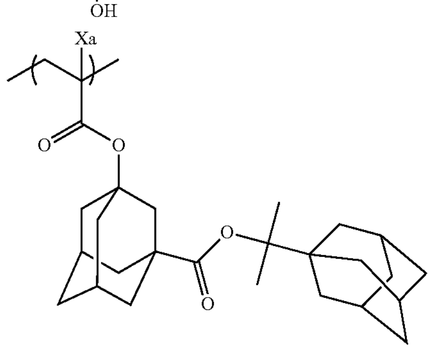
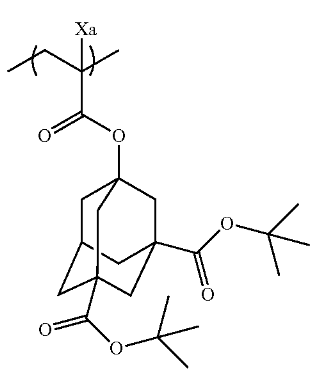
-continued
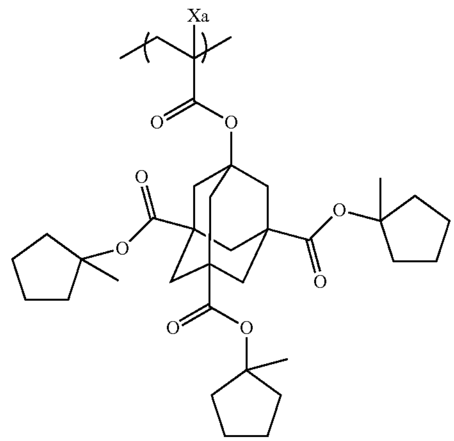
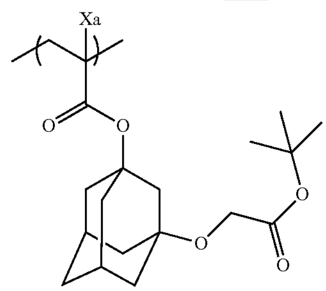
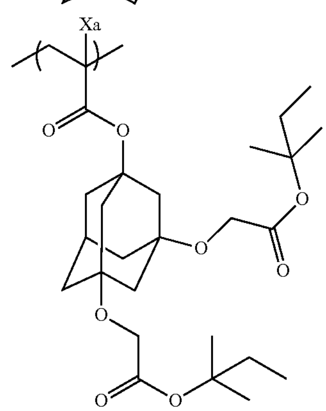
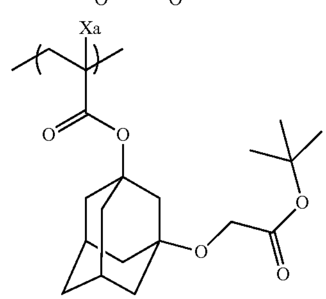
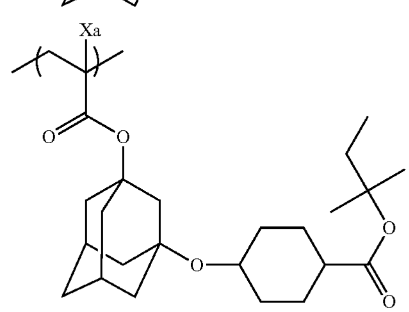

-continued
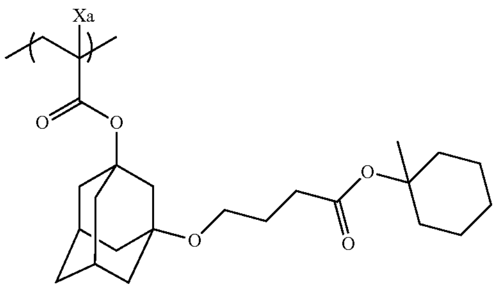
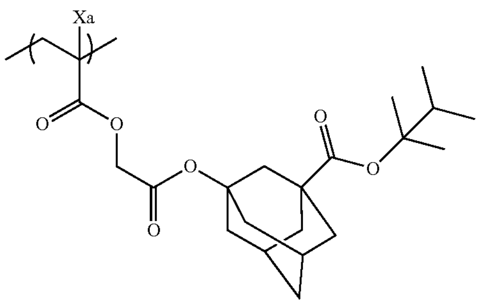
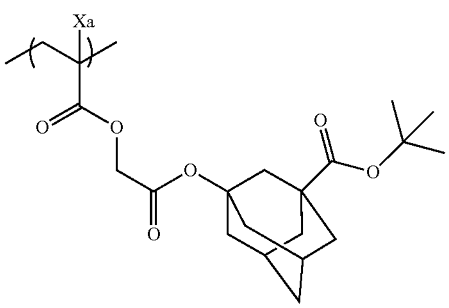
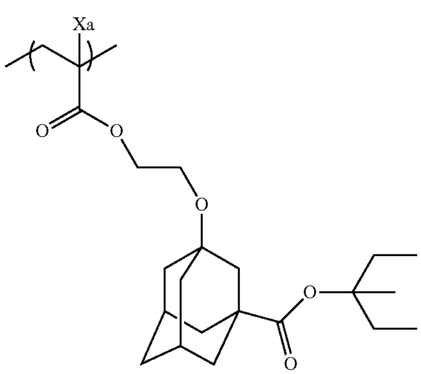
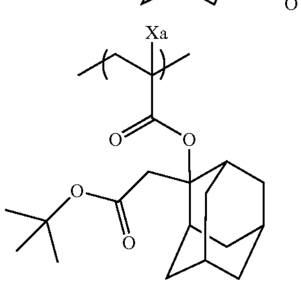
-continued
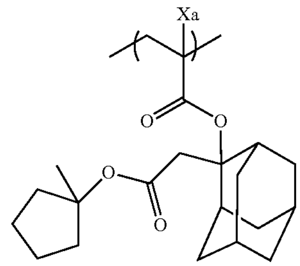
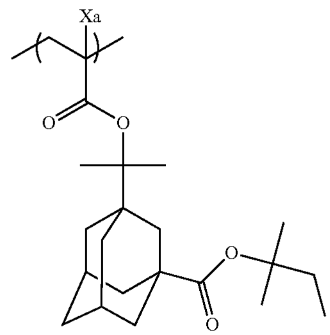
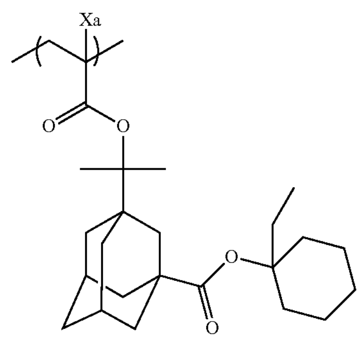
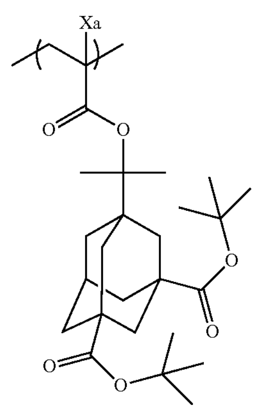
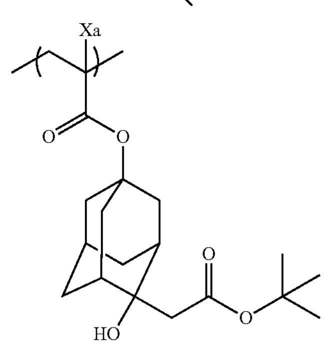

-continued
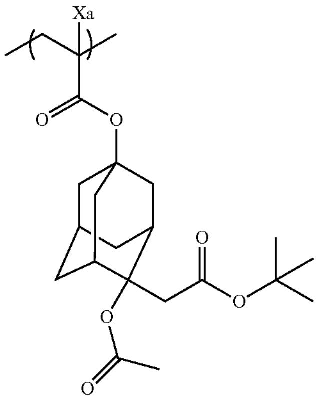
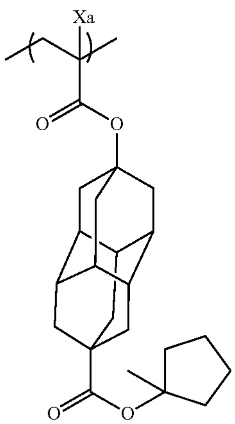
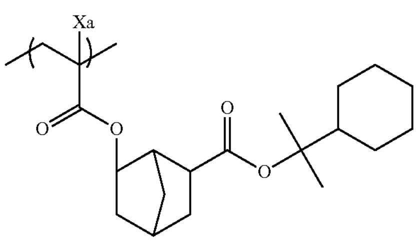
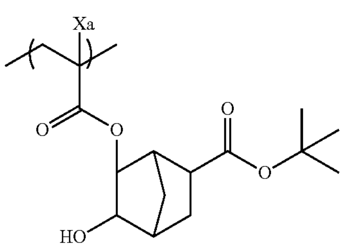
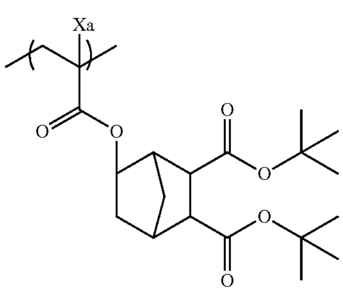
-continued
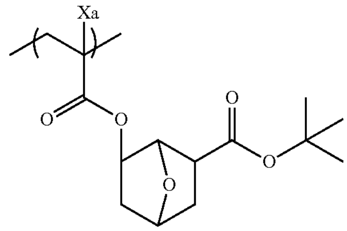
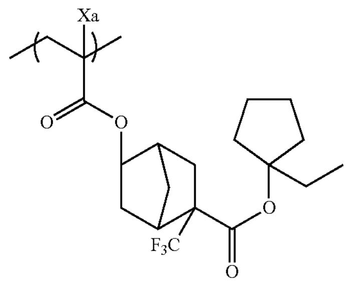
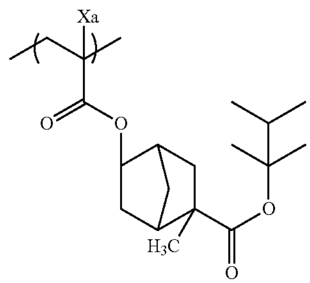
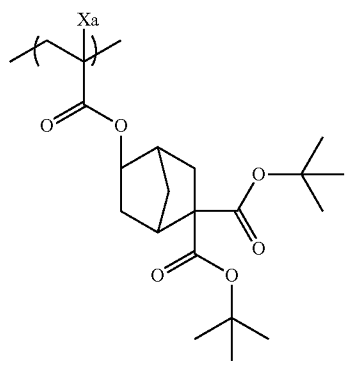
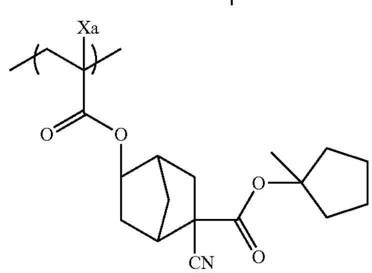
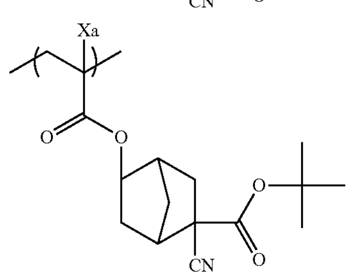

-continued
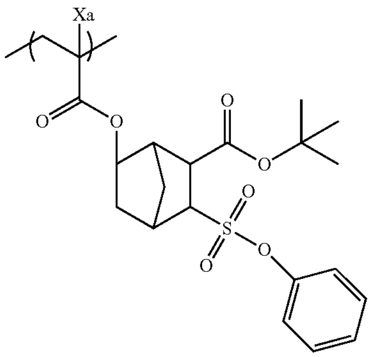
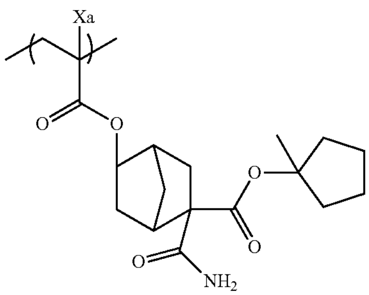
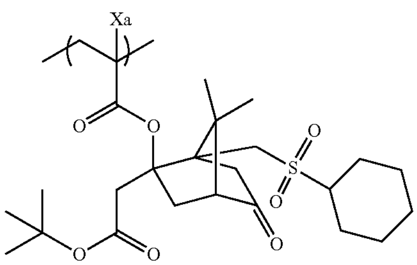
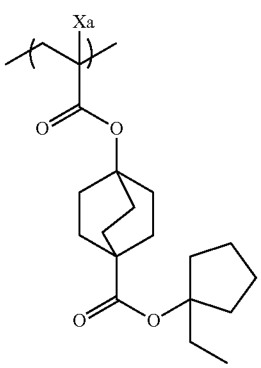
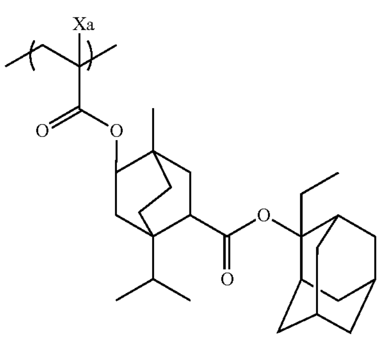
-continued
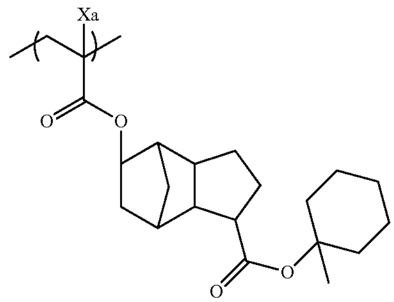
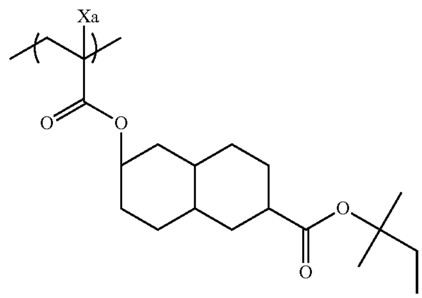
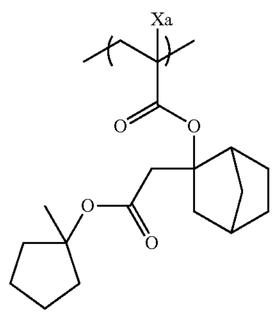
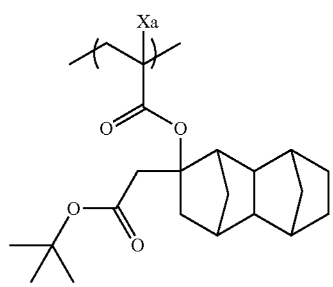
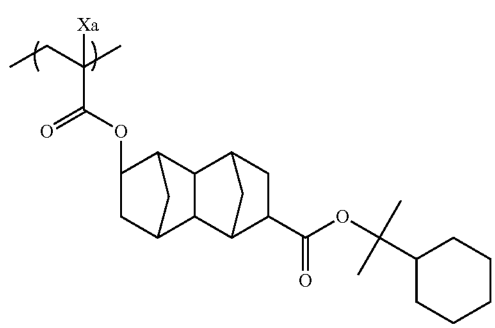

-continued

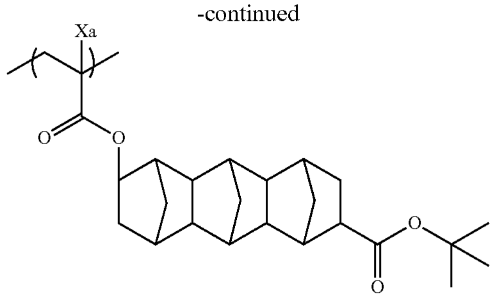

Also, the resin (A) may contain, as the repeating unit having an acid-decomposable group, a repeating unit having in the side chain thereof a structure capable of decomposing by the action of an acid to produce an alcoholic hydroxy group (hereinafter, sometimes referred to as "OH protection structure"). Here, the "alcoholic hydroxy group" means that the target hydroxy group is not a phenolic hydroxyl group, namely, is not directly bonded to a benzene ring.

The OH protection structure is preferably a structure represented by at least one formula selected from the group consisting of the following formulae (II-1) to (II-4):

(II-1)

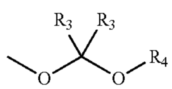

(II-2)

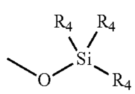

(II-3)

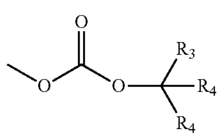

(II-4)

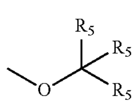

In the formulae, each $R_3$ independently represents a hydrogen atom or a monovalent organic group. $R_3$s may combine with each other to form a ring.

Each $R_4$ independently represents a monovalent organic group. $R_4$s may combine with each other to form a ring. $R_3$ and $R_4$ may combine with each other to form a ring.

Each $R_5$ independently represents a hydrogen atom, an alkyl group, a cycloalkyl group, an aryl group, an alkenyl group or an alkynyl group. At least two $R_5$s may combine with each other to form a ring, provided that when one or two members out of three $R_5$s are a hydrogen atom, at least one of the remaining $R_5$s represents an aryl group, an alkenyl group or an alkynyl group.

As the OH protection structure, at least one structure selected from the group consisting of the following formulae (II-5) to (II-9) is also a preferred embodiment:

(II-5)

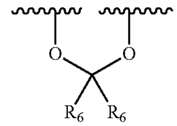

(II-6)

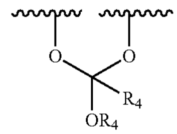

(II-7)

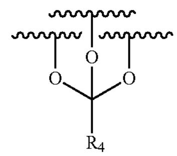

(II-8)

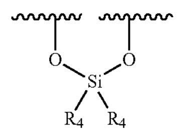

(II-9)

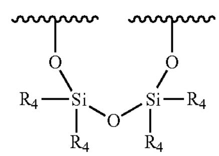

In the formulae, $R_4$ has the same meaning as in formulae (II-1) to (II-3).

Each $R_6$ independently represents a hydrogen atom or a monovalent organic group. $R_6$s may combine with each other to form a ring.

The group capable of decomposing by the action of an acid to produce an alcoholic hydroxy group is more preferably represented by at least one formula selected from formulae (II-1) to (II-3), still more preferably represented by formula (II-1) or (II-3), yet still more preferably represented by formula (II-1).

$R_3$ represents a hydrogen atom or a monovalent organic group as described above. $R_3$ is preferably a hydrogen atom, an alkyl group or a cycloalkyl group, more preferably a hydrogen atom or an alkyl group.

The alkyl group of $R_3$ may be a linear or branched-chain alkyl group. The carbon number of the alkyl group of $R_3$ is preferably from 1 to 10, more preferably from 1 to 3. Examples of the alkyl group of $R_3$ include a methyl group, an ethyl group, an n-propyl group, an isopropyl group, and an n-butyl group.

The cycloalkyl group of $R_3$ may be monocyclic or polycyclic. The carbon number of the cycloalkyl group of $R_3$ is preferably from 3 to 10, more preferably from 4 to 8. Examples of the cycloalkyl group of $R_3$ include a cyclopropyl group, a cyclobutyl group, a cyclopentyl group, a cyclohexyl group, a norbornyl group, and an adamantyl group.

$R_4$ represents a monovalent organic group. $R_4$ is preferably an alkyl group or a cycloalkyl group, more preferably an alkyl group. These alkyl group and cycloalkyl group may have a substituent.

The alkyl group of $R_4$ preferably has no substituent or has one or more aryl groups and/or one or more silyl groups as the substituent. The carbon number of the unsubstituted alkyl group is preferably from 1 to 20. The carbon number of the alkyl group moiety in the alkyl group substituted with one or more aryl groups is preferably from 1 to 25. The carbon number of the alkyl group moiety in the alkyl group substituted with one or more silyl groups is preferably from 1 to 30. Also, in the case where the cycloalkyl group of $R_4$ does not have a substituent, the carbon number thereof is preferably from 3 to 20.

$R_5$ represents a hydrogen atom, an alkyl group, a cycloalkyl group, an aryl group, an alkenyl group or an alkynyl group. However, when one or two members out of three $R_5$s are a hydrogen atom, at least one of the remaining $R_5$s represents an aryl group, an alkenyl group or an alkynyl group. $R_5$ is preferably a hydrogen atom or an alkyl group. The alkyl group may or may not have a substituent. In the case where the alkyl group does not have a substituent, the carbon number thereof is preferably from 1 to 6, more preferably from 1 to 3.

$R_6$ represents a hydrogen atom or a monovalent organic group as described above. $R_6$ is preferably a hydrogen atom, an alkyl group or a cycloalkyl group, more preferably a hydrogen atom or an alkyl group, still more preferably a hydrogen atom or an alkyl group having no substituent. $R_6$ is preferably a hydrogen atom or an alkyl group having a carbon number of 1 to 10, more preferably a hydrogen atom or an alkyl group having a carbon number of 1 to 10 and having no substituent.

Examples of the alkyl group and cycloalkyl group of $R_4$, $R_5$ and $R_6$ are the same as those described for $R_3$ above.

Specific examples of the repeating unit having an OH protection structure in the side chain include the following specific examples and those derived from monomers exemplified in paragraph [0025] of U.S. Patent Application Publication 2012/0064456A, but the present invention is not limited thereto.

(In the following specific examples, $Xa_1$ represents a hydrogen atom, $CH_3$, $CF_3$ of $CH_2OH$.)

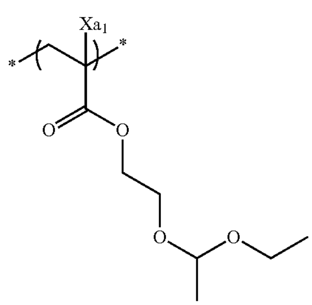

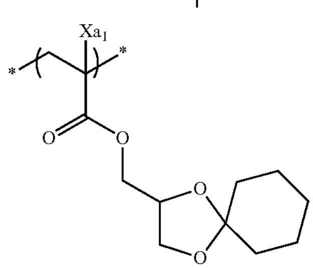

-continued

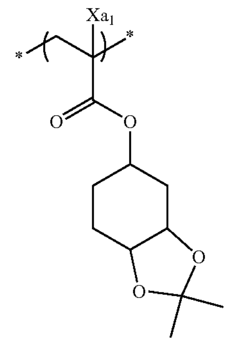

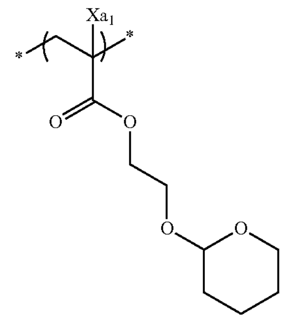

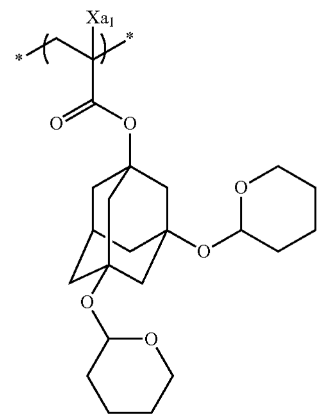

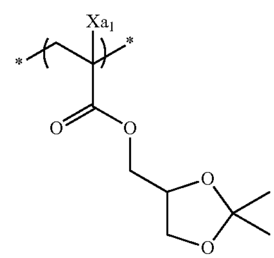

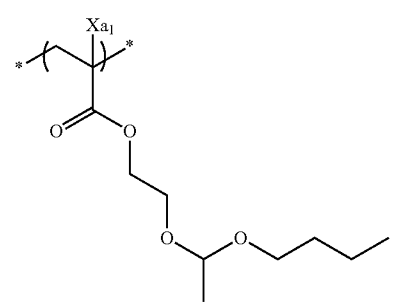

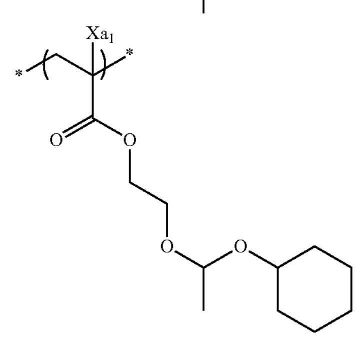

-continued

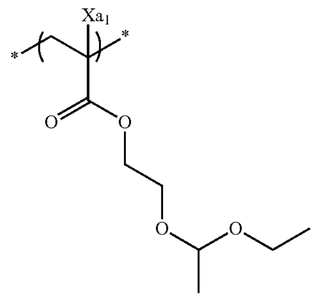

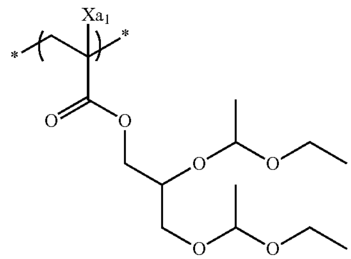

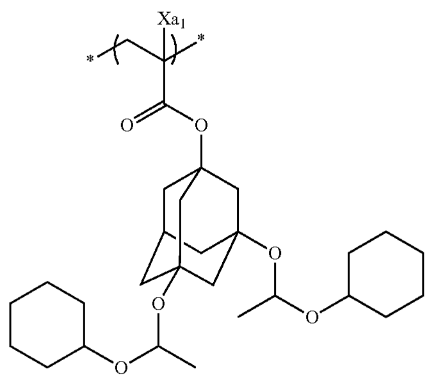

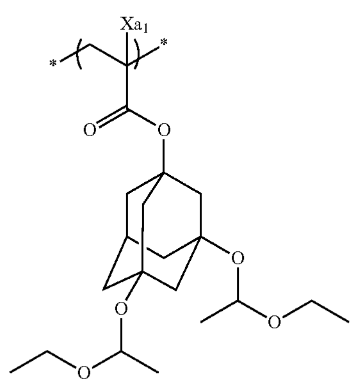

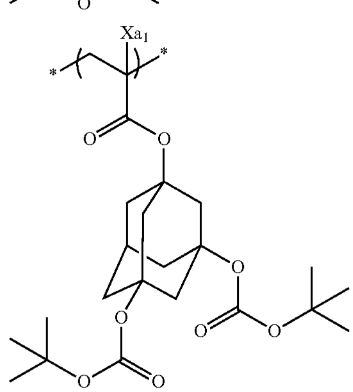

-continued

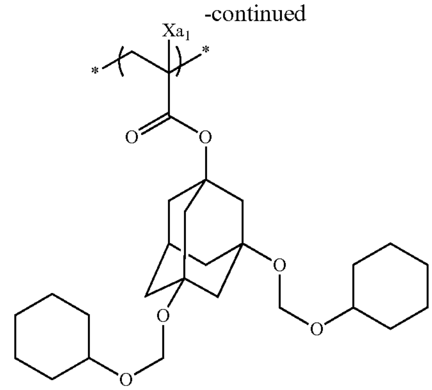

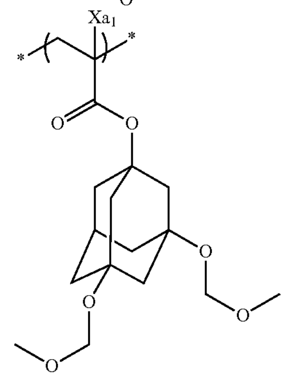

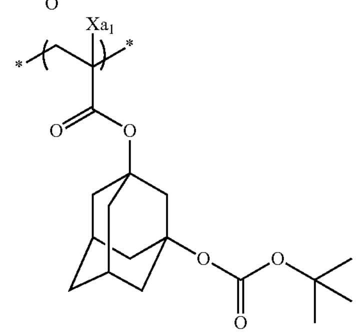

As for the acid-decomposable group-containing repeating unit in the resin (A), one kind may be used, or two or more kinds may be used in combination.

In the present invention, the resin (A) preferably contains the acid-decomposable group-containing repeating unit in which the molecular weight of the eliminated material produced by the decomposition of the group capable of decomposing by the action of an acid to produce a polar group (acid-decomposable group) (in the case of producing a plurality of kinds of eliminated materials, the weighted average value of molecular weights by molar fraction (hereinafter, sometimes referred to as a "molar average value")) is 140 or less, in an amount of (in the case of containing a plurality of kinds of repeating units, as a total) of 50 mol % or more based on all repeating units in the resin. In the case of forming a negative image, the exposed area remains as a pattern and therefore, by letting the eliminated material have a small molecular weight, reduction in film thickness of the pattern part can be prevented.

In the present invention, the "eliminated material produced by the decomposition of the acid-decomposable group" indicates a material which corresponds to a group capable of decomposing and leaving by the action of an acid and is decomposed and eliminated by the action of an acid. For example, in the case of the later-described repeating unit (α) (in examples illustrated later, the upper leftmost repeating unit), the eliminated material indicates alkane ($H_2C{=}C(CH_3)_2$) produced by the decomposition of the tert-butyl moiety.

In the present invention, the molecular weight of the eliminated material produced by the decomposition of the acid-decomposable group (in the case of producing a plurality of kinds of eliminated materials, the molar average value) is preferably 100 or less from the standpoint of preventing reduction in film thickness of the pattern part.

The lower limit of the molecular weight of the eliminated material produced by the decomposition of the acid-decomposable group (in the case of producing a plurality of kinds of eliminated materials, the average value thereof) is not particularly limited, but from the standpoint of letting the acid-decomposable group exert its function, the lower limit is preferably 45 or more, more preferably 55 or more.

In the present invention, from the standpoint of more reliably maintaining the film thickness of the pattern part that is the exposed area, the acid-decomposable group-containing repeating unit in which the molecular weight of the eliminated material produced by the decomposition of the acid-decomposable group is 140 or less, is more preferably contained in an amount (in the case of containing a plurality of kinds of repeating units, as a total) of 60 mol % or more, still more preferably 65 mol % or more, yet still more preferably 70 mol % or more, based on all repeating units in the resin. The upper limit is not particularly limited but is preferably 90 mol % or less, more preferably 85 mol % or less.

Specific examples of the acid-decomposable group-containing repeating unit in which the molecular weight of the eliminated material produced by the decomposition of the acid-decomposable group is 140 or less, are illustrated below, but the present invention is not limited thereto.

In specific examples, $Xa_1$ represents a hydrogen atom, $CH_3$, $CF_3$ or $CH_2OH$.

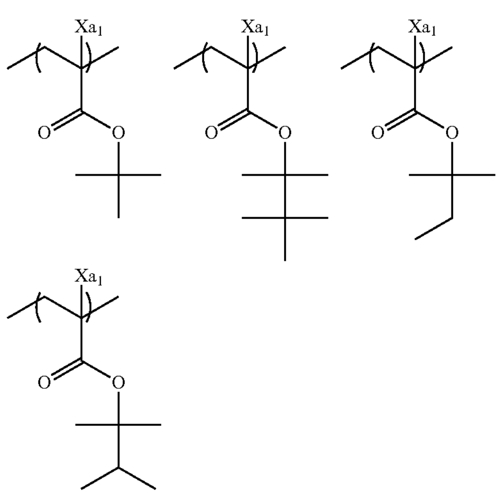

Repeating Unit (α)

Molecular weight Molecular weight Molecular weight Molecular weight of eliminated of eliminated of eliminated of eliminated material: 56 material: 98 material: 70 material: 84

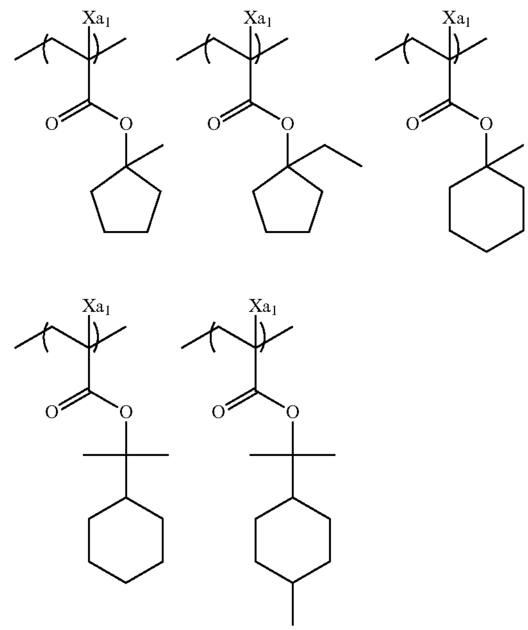

Molecular weight Molecular weight Molecular weight Molecular weight Molecular weight of eliminated of eliminated of eliminated of eliminated of eliminated material: 82 material: 96 material: 96 material: 124 material: 138

The content as a total of the acid-decomposable group-containing repeating unit is preferably 20 mol % or more, more preferably 30 mol % or more, still more preferably 45 mol % or more, yet still more preferably 50 mol % or more, particularly more preferably 60 mol % or more, based on all repeating units in the resin (A).

Also, the content as a total of the acid-decomposable group-containing repeating unit is preferably 100 mol % or less, more preferably 90 mol % or less, still more preferably 85 mol % or less, based on all repeating units in the resin (A).

It is preferred that the resin (A) contains a repeating unit having a group capable of decomposing by the action of an acid to produce a polar group and this repeating unit is composed of only at least one repeating unit represented by formula (I) and that the content of the repeating unit represented by formula (I) is from 60 to 100 mol % based on all repeating units in the resin (A).

The resin (A) may further contain a repeating unit having a lactone structure.

As the lactone structure, any structure may be used as long as it has a lactone structure, but a 5- to 7-membered ring lactone structure is preferred, and a 5- to 7-membered ring lactone structure to which another ring structure is fused to form a bicyclo or spiro structure is preferred. It is more preferred to contain a repeating unit having a lactone structure represented by any one of the following formulae (LC1-1) to (LC1-17). The lactone structure may be bonded directly to the main chain. Preferred lactone structures are (LC1-1), (LC1-4), (LC1-5), (LC1-6), (LC1-13), (LC1-14) and (LC1-17), and the lactone structure of (LC1-4) is more preferred. By virtue of using such a specific lactone structure, LWR and development defect are improved.

-continued
LC1-1
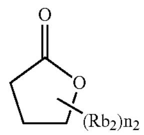
LC1-2
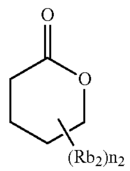
LC1-3
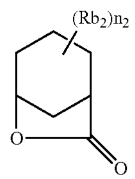
LC1-4
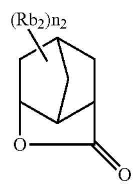
LC1-5
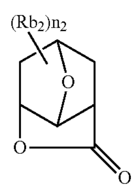
LC1-6
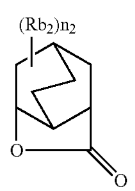
LC1-7
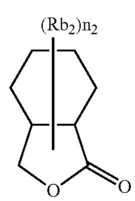
LC1-8
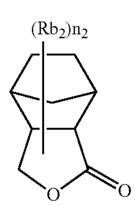
LC1-9
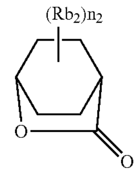
LC1-10
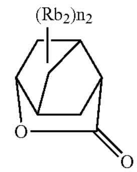
LC1-11
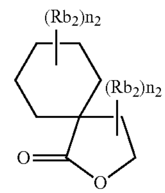
LC1-12
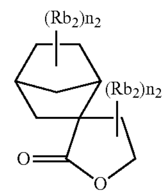
LC1-13
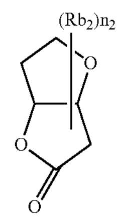
LC1-14
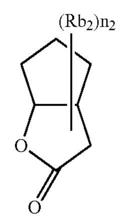
LC1-15
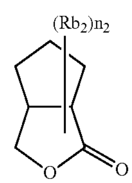
LC1-16
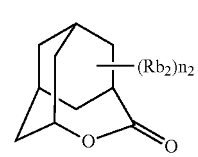

-continued

LC1-17

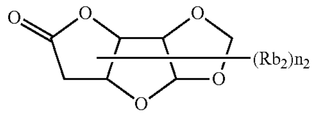

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group, and an acid-decomposable group. Among these, an alkyl group having a carbon number of 1 to 4, a cyano group and an acid-decomposable group are more preferred. $n_2$ represents an integer of 0 to 4. When $n_2$ is 2 or more, each substituent ($Rb_2$) may be the same as or different from every other substituent ($Rb_2$) and also, the plurality of substituents ($Rb_2$) may combine together to form a ring.

The repeating unit having a lactone group usually has an optical isomer, but any optical isomer may be used. One optical isomer may be used alone, or a mixture of a plurality of optical isomers may be used. In the case of mainly using one optical isomer, the optical purity (ee) thereof is preferably 90% or more, more preferably 95% or more.

The lactone structure-containing repeating unit is preferably a repeating unit represented by the following formula (AII):

(AII)

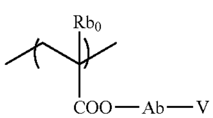

In formula (AII), $Rb_0$ represents a hydrogen atom, a halogen atom or an alkyl group (preferably having a carbon number of 1 to 4) which may have a substituent.

Preferred substituents which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by combining these members. Ab is preferably a single bond or a divalent linking group represented by $-Ab_1-CO_2-$.

$Ab_1$ is a linear or branched alkylene group or a monocyclic or polycyclic cycloalkylene group, preferably a methylene group, an ethylene group, a cyclohexylene group, an adamantylene group or a norbornylene group.

V represents a group having a lactone structure and specifically represents, for example, a group having a structure represented by any one of formulae (LC1-1) to (LC1-17).

In the case where the resin (A) contains the repeating unit having a lactone structure, the content of the repeating unit having a lactone structure is preferably from 0.5 to 80 mol %, more preferably from 1 to 65 mol %, still more preferably from 5 to 60 mol %, yet still more preferably from 3 to 50 mol %, and most preferably from 10 to 50 mol %, based on all repeating units in the resin (A).

As for the repeating unit having a lactone structure, one kind may be used, or two or more kinds may be used in combination.

Specific examples of the repeating unit having a lactone structure are illustrated below, but the present invention is not limited thereto. In the formulae, Rx represents H, $CH_3$, $CH_2OH$ or $CF_3$.

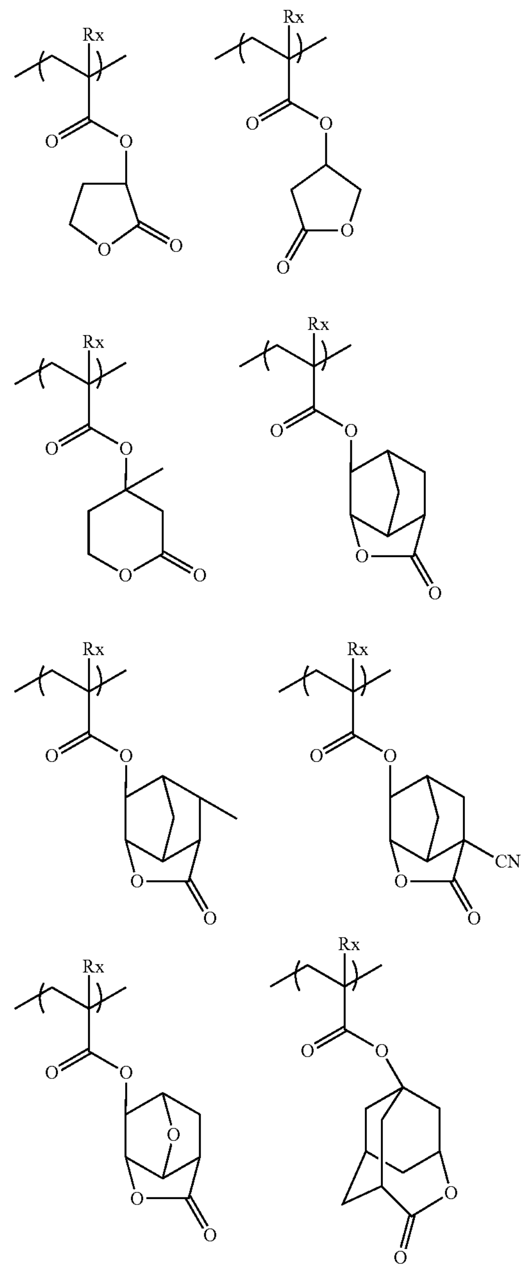

-continued
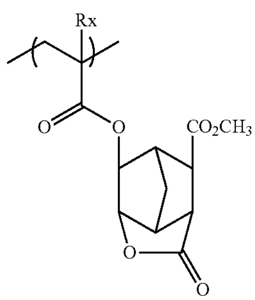
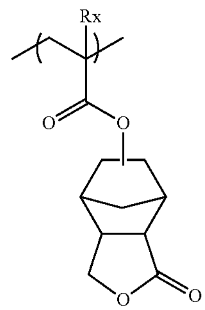
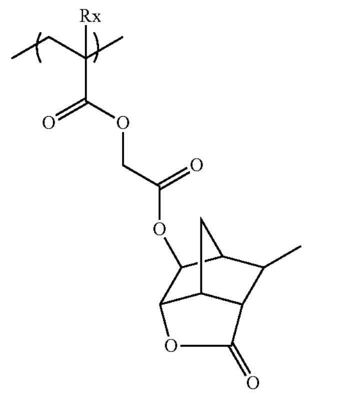
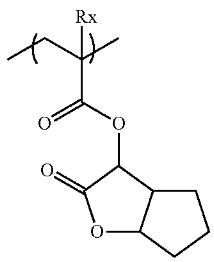
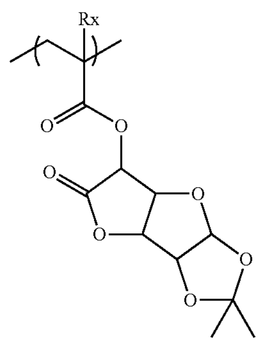
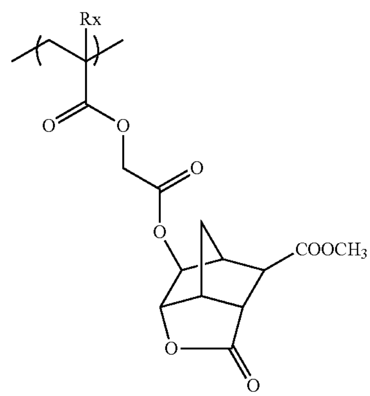
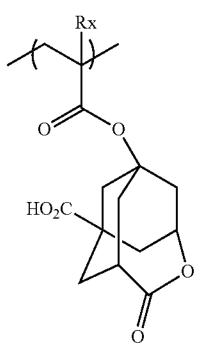
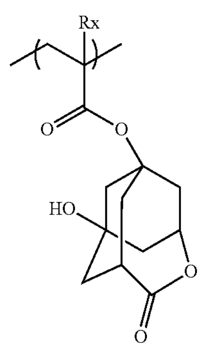
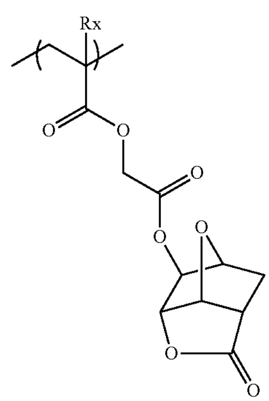
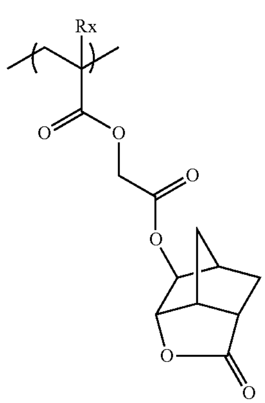
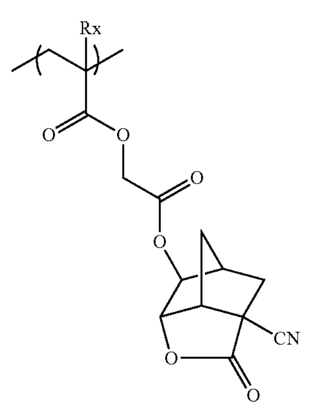

-continued
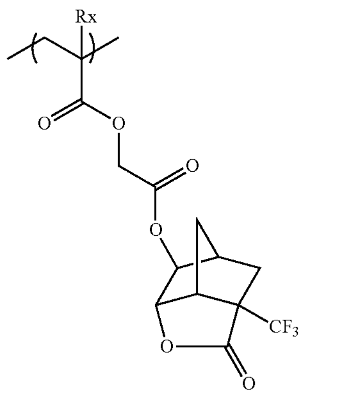
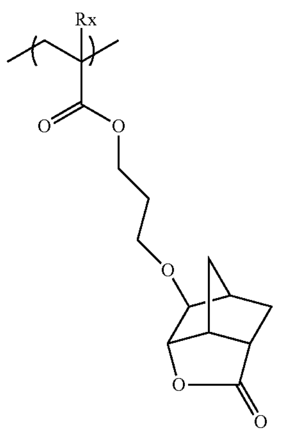
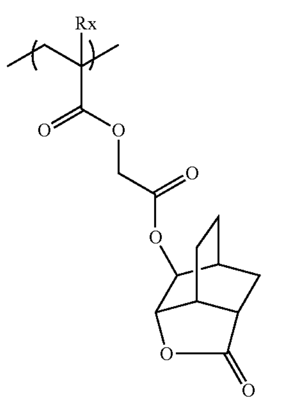
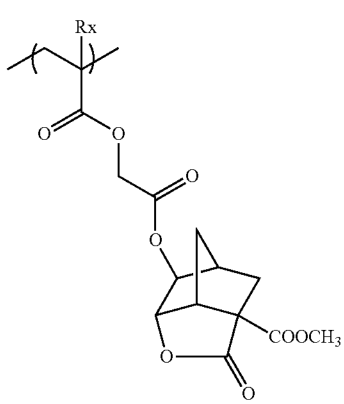
-continued
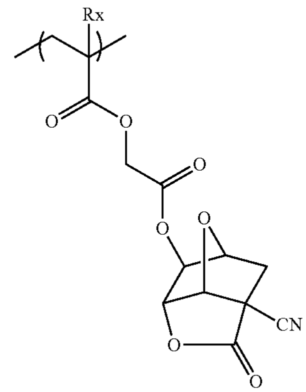
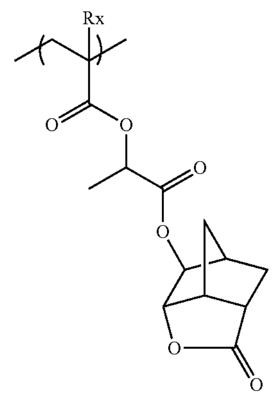
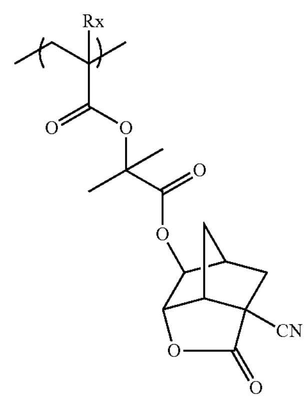
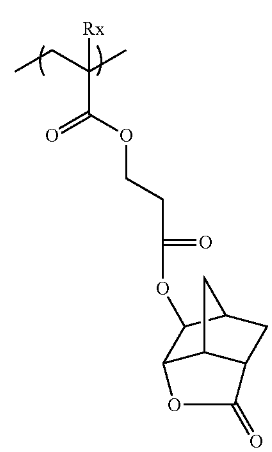

-continued

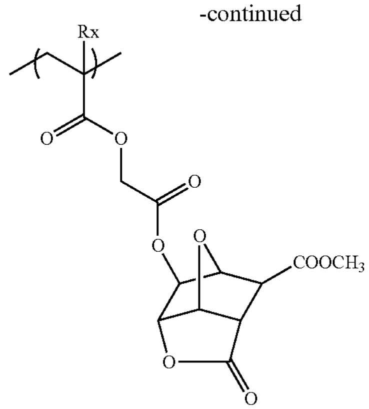

The resin (A) preferably contains a repeating unit having a hydroxyl group or a cyano group. Thanks to this repeating unit, the adherence to substrate and affinity for developer are enhanced. The repeating unit having a hydroxyl group or a cyano group is preferably a repeating unit having an alicyclic hydrocarbon structure substituted with a hydroxyl group or a cyano group and preferably has no acid-decomposable group.

Also, the repeating unit having an alicyclic hydrocarbon structure substituted with a hydroxyl group or a cyano group is preferably different from the repeating unit represented by formula (AII).

The alicyclic hydrocarbon structure in the alicyclic hydrocarbon structure substituted with a hydroxyl group or a cyano group is preferably an adamantyl group, a diamantyl group or a norbornyl group. The alicyclic hydrocarbon structure substituted with a hydroxyl group or a cyano group is preferably a partial structure represented by the following formulae (VIIa) to (VIId):

(VIIa)

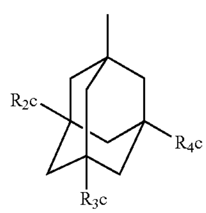

(VIIb)

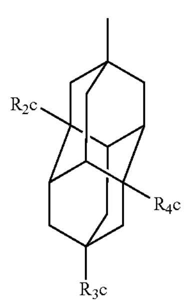

(VIIc)

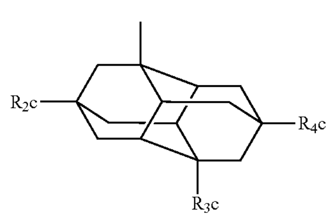

-continued (VIId)

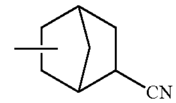

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId):

(AIIa)

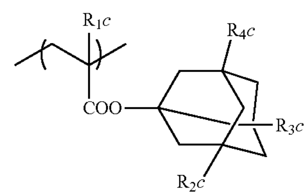

(AIIb)

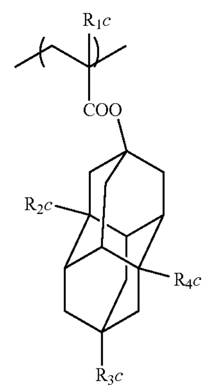

(AIIc)

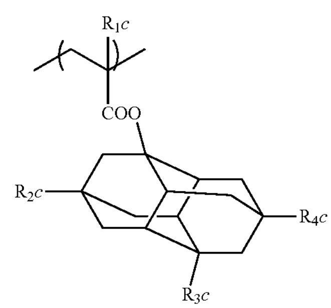

(AIId)

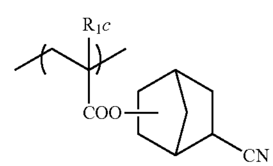

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

The resin (A) may or may not contain a repeating unit having a hydroxyl group or a cyano group, but in the case where the resin (A) contains a repeating unit having a hydroxyl group or a cyano group, the content of the repeating unit having a hydroxyl group or a cyano group is preferably from 1 to 40 mol %, more preferably from 3 to 30 mol %, still more preferably from 5 to 25 mol %, based on all repeating units in the resin (A).

Specific examples of the repeating unit having a hydroxyl group or a cyano group are illustrated below, but the present invention is not limited thereto.

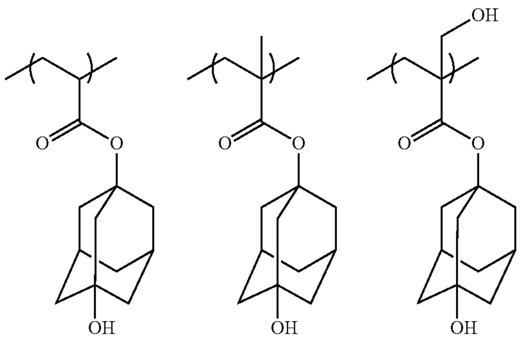

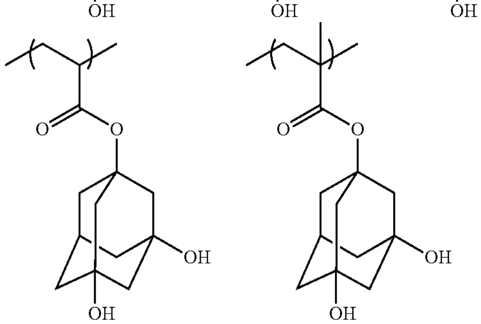

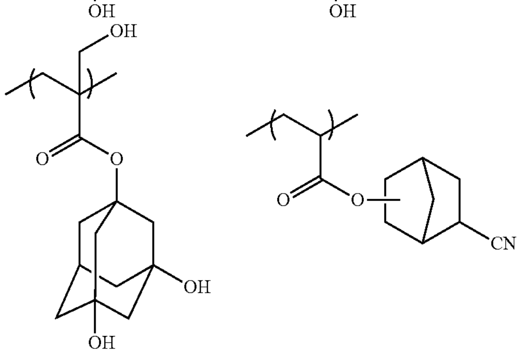

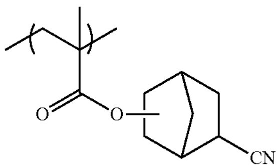

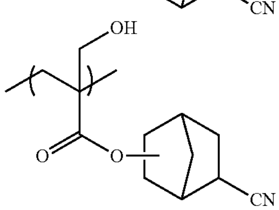

-continued

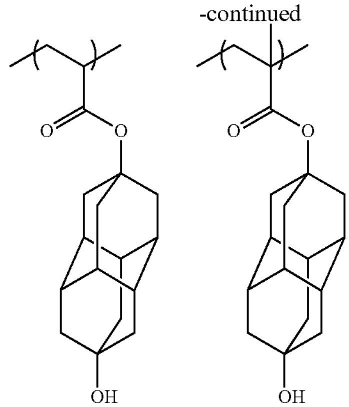

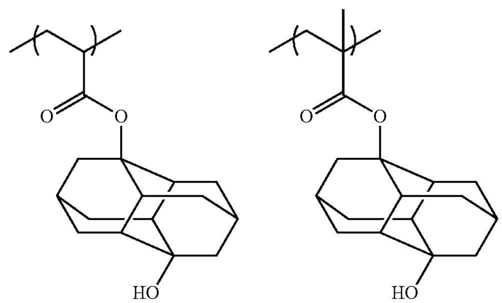

The resin (A) may contain a repeating unit having an acid group. The acid group includes a carboxyl group, a sulfonamide group, a sulfonylimide group, a bisulfonylimide group, and an aliphatic alcohol substituted with an electron-withdrawing group at the α-position (for example, hexafluoroisopropanol group), and it is preferred to contain a repeating unit having a carboxyl group. By virtue of containing a repeating unit having an acid group, the resolution increases in the usage of forming contact holes. As for the repeating unit having an acid group, all of a repeating unit where an acid group is directly bonded to the main chain of the resin, such as repeating unit by an acrylic acid or a methacrylic acid, a repeating unit where an acid group is bonded to the main chain of the resin through a linking group, and a repeating unit where an acid group is introduced into the polymer chain terminal by using an acid group-containing polymerization initiator or chain transfer agent at the polymerization, are preferred. The linking group may have a monocyclic or polycyclic cyclohydrocarbon structure. In particular, a repeating unit by an acrylic acid or a methacrylic acid is preferred.

The resin (A) may or may not contain a repeating unit having an acid group, but in the case of containing a repeating unit having an acid group, the percentage content thereof is preferably 15 mol % or less, more preferably 10 mol % or less, based on all repeating units in the resin (A). In the case where the resin (A) contains a repeating unit having an acid group, the content of the acid group-containing repeating unit in the resin (A) is usually 1 mol % or more.

Specific examples of the repeating unit having an acid group are illustrated below, but the present invention is not limited thereto.

In specific examples, Rx represents H, $CH_3$, $CH_2OH$ or $CF_3$.

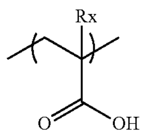

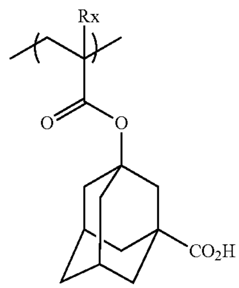

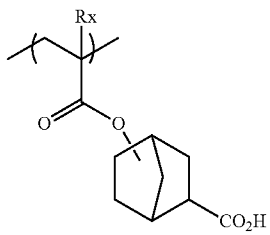

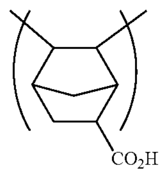

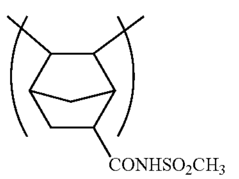

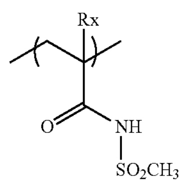

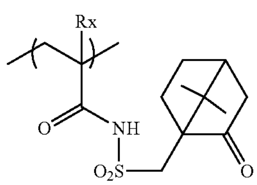

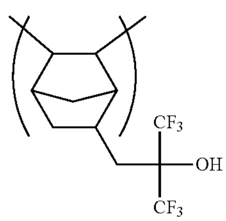

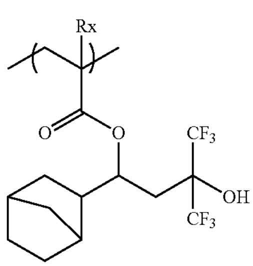

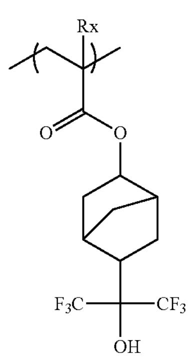

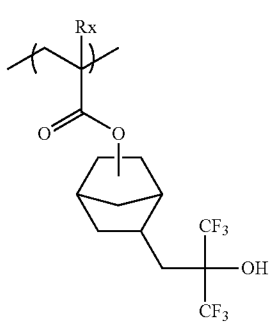

-continued

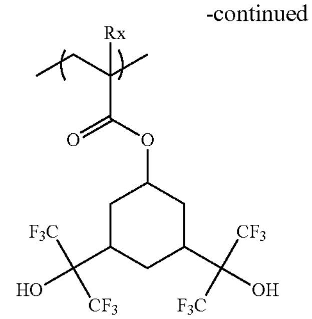

The resin (A) for use in the present invention may further contain a repeating unit having an alicyclic hydrocarbon structure free from a polar group (for example, the above-described acid group, a hydroxyl group or a cyano group) and not exhibiting acid decomposability. Thanks to this repeating unit, dissolution of a low molecular component from the resist film to the immersion liquid can be reduced at the immersion exposure and in addition, the solubility of the resin at the development using an organic solvent-containing developer can be appropriately adjusted. Such a repeating unit includes a repeating unit represented by formula (IV):

(IV)

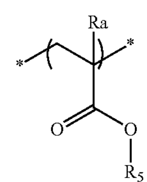

In formula (IV), $R_5$ represents a hydrocarbon group having at least one cyclic structure and having no polar group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring-assembly hydrocarbon group and a crosslinked cyclic hydrocarbon group. Examples of the ring-assembly hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.$0^{2,6}$]decane ring and tricyclo[4.3.1.$1^{2,5}$]undecane ring, and a tetracyclic hydrocarbon ring such as tetracyclo[4.4.0.$1^{2,5}$.$1^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group, and a tricyclo$[5,2,1,0^{2,6}]$decanyl group. Among these crosslinked cyclic hydrocarbon rings, a norbornyl group and an adamantyl group are more preferred.

Such an alicyclic hydrocarbon group may have a substituent, and preferred examples of the substituent include a halogen atom, an alkyl group, a hydroxyl group with a hydrogen atom being substituted for, and an amino group with a hydrogen atom being substituted for. The halogen atom is preferably a bromine atom, a chlorine atom or a fluorine atom, and the alkyl group is preferably a methyl group, an ethyl group, a butyl group or a tert-butyl group. This alkyl group may further have a substituent, and the substituent which may be further substituted on the alkyl group includes a halogen atom, an alkyl group, a hydroxyl group with a hydrogen atom being substituted for, and an amino group with a hydrogen atom being substituted for.

Examples of the substituent for the hydrogen atom include an alkyl group, a cycloalkyl group, an aralkyl group, a substituted methyl group, a substituted ethyl group, an alkoxycarbonyl group, and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group is preferably, for example, an alkoxycarbonyl group having a carbon number of 1 to 4.

The resin (A) may or may not contain a repeating unit having an alicyclic hydrocarbon structure free from a polar group and not exhibiting acid decomposability, but in the case of containing this repeating unit, the content thereof is preferably from 1 to 40 mol %, more preferably from 1 to 20 mol %, based on all repeating units in the resin (A).

Specific examples of the repeating unit having an alicyclic hydrocarbon structure free from a polar group and not exhibiting acid decomposability are illustrated below, but the present invention is not limited thereto. In the formulae, Ra represents H, $CH_3$, $CH_2OH$ or $CF_3$.

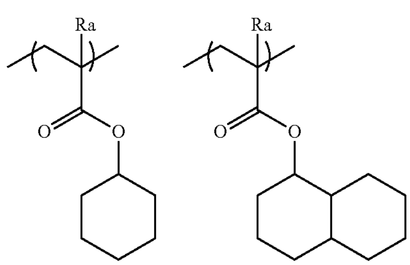

-continued

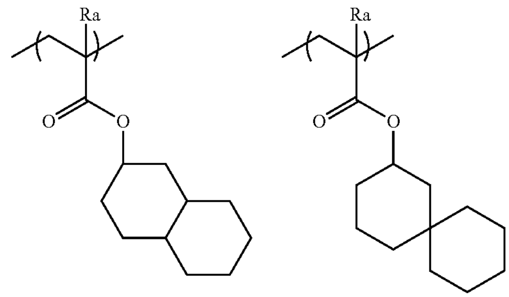

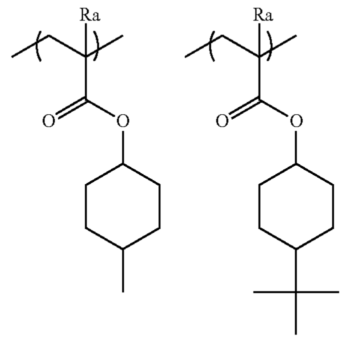

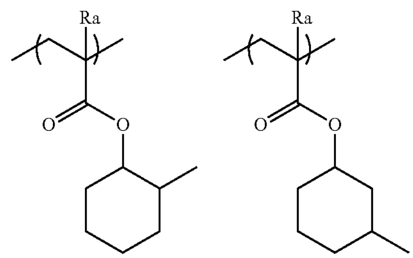

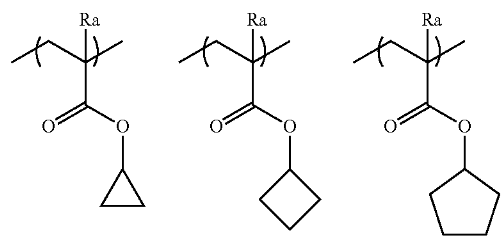

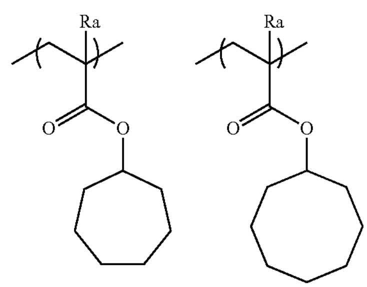

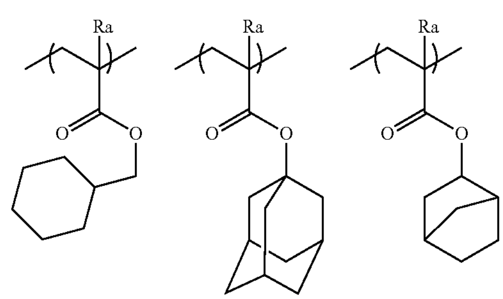

-continued

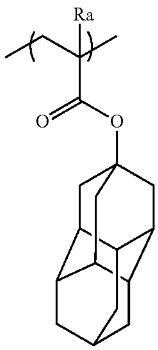

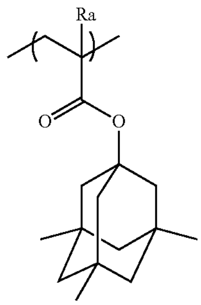

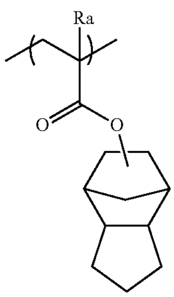

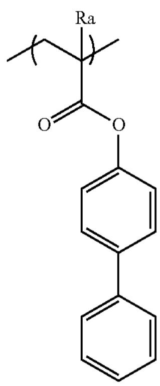

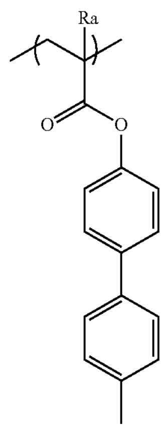

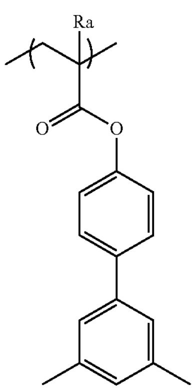

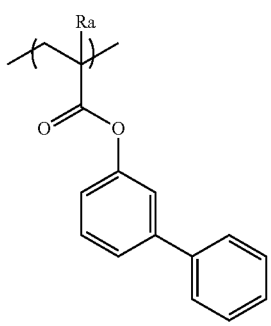

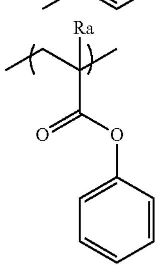

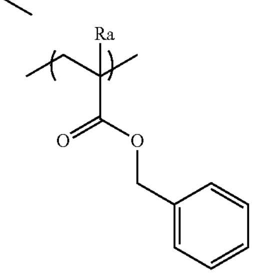

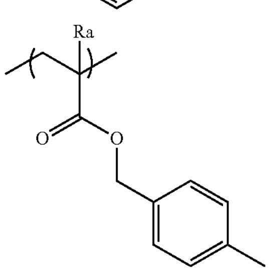

-continued

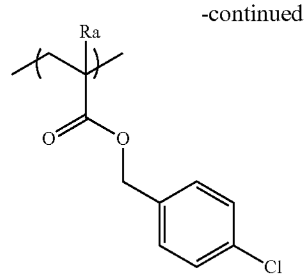

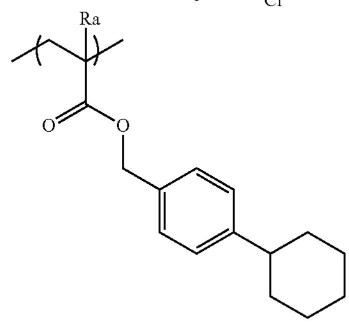

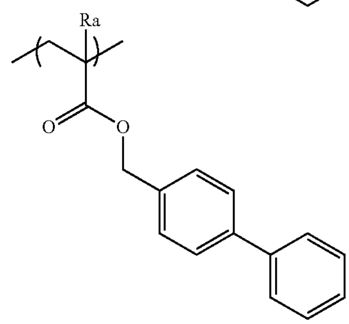

The resin (A) for use in the composition of the present invention may contain, in addition to the above-described repeating structural units, various repeating structural units for the purpose of controlling the dry etching resistance, suitability for standard developer, adherence to substrate, resist profile and properties generally required of a resist, such as resolution, heat resistance and sensitivity.

Examples of such a repeating structural unit include, but are not limited to, repeating structural units corresponding to the monomers described below.

Thanks to such a repeating structural unit, the performance required of the resin used in the composition of the present invention, particularly (1) solubility for coating solvent,
(2) film-forming property (glass transition point),
(3) alkali developability,
(4) film loss (selection of hydrophilic, hydrophobic or alkali-soluble group),
(5) adherence of unexposed area to substrate,
(6) dry etching resistance, and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these compounds, an addition-polymerizable unsaturated compound copolymerizable with the monomers corresponding to the above-described various repeating structural units may be copolymerized.

In the resin (A) for use in the composition of the present invention, the molar ratio of respective repeating structural units contained is appropriately set to control the dry etching resistance of resist, suitability for standard developer, adherence to substrate, resist profile and performances generally required of a resist, such as resolution, heat resistance and sensitivity.

The form of the resin (A) for use in the present invention may be any of random-type, block-type, comb-type and star-type forms. The resin (A) can be synthesized, for example, by radical, cationic or anionic polymerization of unsaturated monomers corresponding to respective structures. It is also possible to obtain the target resin by polymerizing unsaturated monomers corresponding to precursors of respective structures and then performing a polymer reaction.

In the case where the composition of the present invention is used for ArF exposure, in view of transparency to ArF light, the resin (A) for use in the composition of the present invention preferably has substantially no aromatic ring (specifically, the proportion of an aromatic group-containing repeating unit in the resin is preferably 5 mol % or less, more preferably 3 mol % or less, and ideally 0 mol %, that is, the resin does not have an aromatic group). The resin (A) preferably has a monocyclic or polycyclic alicyclic hydrocarbon structure.

Incidentally, from the standpoint of sufficiently bringing out the effects of the later-described resin (D), the mass percentage content in the resin (A), which is accounted for by the $CH_3$ partial structure contained in the side chain moiety of the resin (A), is preferably smaller than the mass percentage content in the resin (D), which is accounted for by the $CH_3$ partial structure contained in the side chain moiety in the resin (D), and is specifically smaller preferably by 1.0% or more, more preferably by 2.0% or more, still more preferably by 3.0% or more. As the resin (A) itself, the mass percentage content in the resin (A), which is accounted for by the $CH_3$ partial structure contained in the side chain moiety, is preferably 11.0% or less, more preferably 10.0% or less, still more preferably 9.0% or less.

As for the method for calculating the "mass percentage content in the resin, which is accounted for by the $CH_3$ partial structure contained in the side chain moiety of the resin", refer to the description on the calculation method in the resin (D).

Also, from another standpoint, in the case where the composition of the present invention contains the later-described resin (E), the resin (A) preferably contains no fluorine atom and no silicon atom in view of compatibility with the resin (E).

The resin (A) for use in the composition of the present invention is preferably a resin where all repeating units are composed of a (meth)acrylate-based repeating unit. In this case, all repeating units may be a methacrylate-based repeating unit, all repeating units may be an acrylate-based repeating unit, or all repeating units may be composed of a methacrylate-based repeating unit and an acrylate-based repeating unit, but the acrylate-based repeating unit preferably accounts for 50 mol % or less based on all repeating units. It is also preferred that the resin is a copolymerized polymer containing from 20 to 50 mol % of an acid decomposable group-containing (meth)acrylate-based repeating unit, from 20 to 50 mol % of a lactone group-containing (meth)acrylate-based repeating unit, from 5 to 30 mol % of a (meth)acrylate-based repeating unit having an alicyclic hydrocarbon structure substituted with a hydroxyl group or a cyano group, and from 0 to 20 mol % of other (meth)acrylate-based repeating units.

In the case of irradiating the composition of the present invention with KrF excimer laser light, electron beam, X-ray or high-energy beam at a wavelength of 50 nm or less (e.g., EUV), the resin (A) preferably further contains a hydroxystyrene-based repeating unit. It is more preferred to contain a hydroxystyrene-based repeating unit, a hydroxystyrene-based repeating unit protected by an acid-decomposable group, and an acid-decomposable repeating unit such as tertiary alkyl (meth)acrylate.

Preferred examples of the hydroxystyrene-based repeating unit having an acid-decomposable group include repeating units composed of a tert-butoxycarbonyloxystyrene, a 1-alkoxyethoxystyrene and a tertiary alkyl (meth)acrylate. Repeating units composed of a 2-alkyl-2-adamantyl (meth)acrylate and a dialkyl(1-adamantyl)methyl (meth)acrylate are more preferred.

The resin (A) for use in the present invention can be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the photosensitive composition of the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction solution is poured in a solvent, and the desired polymer is collected by a powder, solid or other recovery method. The concentration at the reaction is from 5 to 50 mass %, preferably from 10 to 30 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of applying water washing or combining it with an appropriate solvent to remove residual monomers or oligomer components; a purification method in a solution sate, such as ultrafiltration of extracting and removing only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

Also, in order to prevent the resin from undergoing aggregation after the preparation of the composition, as described, for example, in JP-A-2009-037108, a step of dissolving the synthesized resin in a solvent to make a solution and heating the solution at approximately from 30 to 90° C. for approximately from 30 minutes to 4 hours may be added.

The weight average molecular weight of the resin (A) for use in the composition of the present invention is preferably from 1,000 to 200,000, more preferably from 2,000 to 100,000, still more preferably from 3,000 to 70,000, yet still more preferably from 5,000 to 50,000, in terms of polystyrene by the GPC method. When the weight average molecular weight is from 1,000 to 200,000, reduction in the heat resistance and dry etching resistance can be avoided and at the same time, the film-forming property can be prevented from being impaired due to deterioration of developability or increase in the viscosity.

The polydispersity (molecular weight distribution) is usually from 1.0 to 3.0, preferably from 1.0 to 2.6, more preferably from 1.1 to 2.5, still more preferably from 1.2 to 2.4, yet still more preferably from 1.3 to 2.2, even yet still more preferably from 1.4 to 2.0. When the molecular weight distribution satisfies such a range, the resolution and resist profile are excellent, the side wall of the resist pattern is smooth, and the roughness is improved.

In the actinic ray-sensitive or radiation-sensitive resin composition of the present invention, the blending ratio of the resin (A) in the entire composition is preferably from 30 to 99 mass %, more preferably from 60 to 95 mass %, based on the total solid content.

As for the resin (A) used in the present invention, one kind may be used or a plurality of kinds may be used in combination.

[2] (B) Compound Capable of Generating an Acid Upon Irradiation with an Actinic Ray or Radiation The composition for use in the present invention contains (B) a compound capable of generating an acid upon irradiation with an actinic ray or radiation (hereinafter, sometimes referred to as "acid generator"). The compound (B) capable of generating an acid upon irradiation with an actinic ray or radiation is preferably a compound capable of generating an organic acid upon irradiation with an actinic ray or radiation.

The acid generator which can be used may be appropriately selected from a photo-initiator for cationic photopolymerization, a photo-initiator for radical photopolymerization, a photo-decoloring agent for dyes, a photo-discoloring agent, a known compound capable of generating an acid upon irradiation with an actinic ray or radiation, which is used for microresist or the like, and a mixture thereof.

Examples thereof include a diazonium salt, a phosphonium salt, a sulfonium salt, an iodonium salt, imidosulfonate, oxime sulfonate, diazodisulfone, disulfone, and o-nitrobenzyl sulfonate.

Out of the acid generators, preferred compounds include compounds represented by the following formulae (ZI), (ZII) and (ZIII):

(ZI)

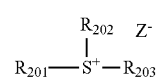

(ZII)

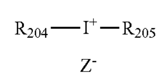

(ZIII)

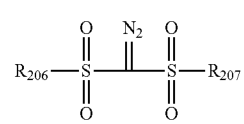

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain therein an oxygen atom, a sulfur atom, an ester bond, an amide bond or a carbonyl group. Examples of the group formed by combining two members out of $R_{201}$ to $R_{203}$ include an alkylene group (e.g., butylenes group, pentylene group).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion and a tris(alkylsulfonyl)methyl anion.

The non-nucleophilic anion is an anion having an extremely low ability of causing a nucleophilic reaction and this anion can suppress the decomposition with aging due to intramolecular nucleophilic reaction. Thanks to this anion, the aging stability of the actinic ray-sensitive or radiation-sensitive resin composition is enhanced.

Examples of the sulfonate anion include an aliphatic sulfonate anion, an aromatic sulfonate anion, and a camphorsulfonate anion.

Examples of the carboxylate anion include an aliphatic carboxylate anion, an aromatic carboxylate anion, and an aralkylcarboxylate anion.

The aliphatic moiety in the aliphatic sulfonate anion and aliphatic carboxylate may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a bornyl group.

The aromatic group in the aromatic sulfonate anion and aromatic carboxylate anion is preferably an aryl group having a carbon number of 6 to 14, and examples thereof include a phenyl group, a tolyl group, and a naphthyl group.

The alkyl group, cycloalkyl group and aryl group in the aliphatic sulfonate anion and aromatic sulfonate anion may have a substituent. Examples of the substituent on the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 1 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). The aryl group and ring structure in each group may further have, as the substituent, an alkyl group (preferably having a carbon number of 1 to 15) or a cycloalkyl group (preferably having a carbon number of 3 to 15).

The aralkyl group in the aralkylcarboxylate anion is preferably an aralkyl group having a carbon number of 7 to 12, and examples thereof include a benzyl group, a phenethyl group, a naphthylmethyl group, a naphthylethyl group, and a naphthylbutyl group.

The alkyl group, cycloalkyl group, aryl group and aralkyl group in the aliphatic carboxylate anion, aromatic carboxylate anion and aralkylcarboxylate anion may have a substituent. Examples of the substituent include the same halogen atom, alkyl group, cycloalkyl group, alkoxy group and alkylthio group as those in the aromatic sulfonate anion.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group, and a neopentyl group. Examples of the substituent on such an alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Other examples of the non-nucleophilic anion include fluorinated phosphorus (e.g., $PF_6^-$), fluorinated boron (e.g., $BF_4^-$), and fluorinated antimony (e.g., $SbF_6^-$).

The non-nucleophilic anion of $Z^-$ is preferably an aliphatic sulfonate anion substituted with a fluorine atom at least at the α-position of sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

The acid generator is preferably a compound capable of generating an acid represented by the following formula (III) or (IV) upon irradiation with an actinic ray or radiation. The compound capable of generating an acid represented by the following formula (III) or (IV) has a cyclic organic group, so that the resolution and roughness performance can be more improved.

The non-nucleophilic anion described above can be an anion capable of generating an organic acid represented by the following formula (III) or (IV):

(III)

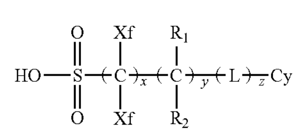

-continued (IV)

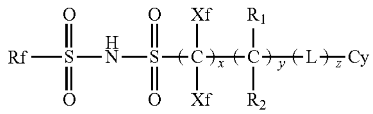

In the formulae, each Xf independently represents a fluorine atom or an alkyl group substituted with at least one fluorine atom.

Each of $R_1$ and $R_2$ independently represents a hydrogen atom, a fluorine atom or an alkyl group.

Each L independently represents a divalent linking group.

Cy represents a cyclic organic group.

Rf represents a fluorine atom-containing group.

x represents an integer of 1 to 20.

y represents an integer of 0 to 10.

z represents an integer of 0 to 10.

Xf represents a fluorine atom or an alkyl group substituted with at least one fluorine atom. The carbon number of the alkyl group is preferably from 1 to 10, more preferably from 1 to 4. Also, the alkyl group substituted with at least one fluorine atom is preferably a perfluoroalkyl group.

Xf is preferably a fluorine atom or a perfluoroalkyl group having a carbon number of 1 to 4. More specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$, more preferably a fluorine atom or $CF_3$, and it is still more preferred that both Xf are a fluorine atom.

Each of $R_1$ and $R_2$ independently represents a hydrogen atom, a fluorine atom or an alkyl group. The alkyl group may have a substituent (preferably fluorine atom) and is preferably an alkyl group having a carbon number of 1 to 4, more preferably a perfluoroalkyl group having a carbon number of 1 to 4. Specific examples of the alkyl group having a substituent of $R_1$ and $R_2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

L represents a divalent linking group. Examples of the divalent linking group include —COO—, —OCO—, —CONH—, —NHCO—, —CO—, —O—, —S—, —SO—, —$SO_2$—, an alkylene group (preferably having a carbon number of 1 to 6), a cycloalkylene group (preferably having a carbon number of 3 to 10), an alkenylene group (preferably having a carbon number of 2 to 6), and a divalent linking group formed by combining a plurality of these members. Among these, —COO—, —OCO—, —CONH—, —NHCO—, —CO—, —O—, —$SO_2$—, —COO-alkylene group-, —OCO-alkylene group-, —CONH-alkylene group- and —NHCO-alkylene group- are preferred, and —COO—, —OCO—, —CONH—, —$SO_2$—, —COO-alkylene group- and —OCO-alkylene group- are more preferred, Cy represents a cyclic organic group. Examples of the cyclic organic group include an alicyclic group, an aryl group, and a heterocyclic group The alicyclic group may be monocyclic or polycyclic. The monocyclic alicyclic group includes, for example, a monocyclic cycloalkyl group such as cyclopentyl group, cyclohexyl group and cyclooctyl group. The polycyclic alicyclic group includes, for example, a polycyclic cycloalkyl group such as norbornyl group, tricyclodecanyl group, tetracyclodecanyl group, tetracyclododecanyl group, adamantyl group and a group having a steroid skeleton. Above all, an alicyclic group having a bulky structure with a carbon number of 7 or more, such as norbornyl group, tricyclodecanyl group, tetracyclodecanyl group, tetracyclododecanyl group, adamantyl group and a group having a steroid skeleton, is preferred from the standpoint of restraining diffusion in film during a PEB (post-exposure baking) step and improving MEEF (Mask Error Enhancement Factor).

The steroid skeleton typically includes a structure where a substituent such as carbonyl group and hydroxy group is arbitrarily substituted on the carbon skeleton shown below, and examples of the anion capable of producing an organic acid represented by formula (III) or (IV), where Cy represents a group having a steroid skeleton, upon irradiation with an actinic ray or radiation include anion structures contained in four compounds exemplified in paragraph [0036] of U.S. Patent Application Publication 2011/0250537A1.

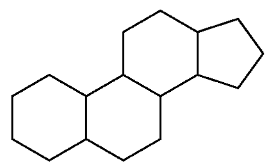 [SMILES: C1CCC2C(C1)CCC1C3CCCC3CCC21]

The aryl group may be monocyclic or polycyclic. Examples of the aryl group include a phenyl group, a naphthyl group, a phenanthryl group, and an anthryl group. Among these, a naphthyl group is preferred because of its relatively low light absorbance at 193 nm.

The heterocyclic group may be monocyclic or polycyclic, but with a polycyclic heterocyclic group, diffusion of an acid can be more restrained. The heterocyclic group may have aromaticity or may not have aromaticity. Examples of the heterocyclic ring having aromaticity include a furan ring, a thiophene ring, a benzofuran ring, a benzothiophene ring, a dibenzofuran ring, a dibenzothiophene ring, and a pyridine ring. Examples of the heterocyclic ring not having aromaticity include a tetrahydropyran ring, a lactone ring, and a decahydroisoquinoline ring. The heterocyclic ring in the heterocyclic group is preferably a furan ring, a thiophene ring, a pyridine ring or a decahydroisoquinoline ring. Examples of the lactone ring include lactone structures exemplified in the resin (A) above.

The above-described cyclic organic group may have a substituent, and examples of the substituent include an alkyl group (may be linear or branched, preferably having a carbon number of 1 to 12), a cycloalkyl group (may be monocyclic, polycyclic or spirocyclic, preferably having a carbon number of 3 to 20), an aryl group (preferably having a carbon number of 6 to 14), a hydroxyl group, an alkoxy group, an ester group, an amido group, a urethane group, a ureido group, a thioether group, a sulfonamido group and a sulfonic acid ester group. Incidentally, the carbon constituting the cyclic organic group (the carbon contributing to ring formation) may be a carbonyl carbon.

x is preferably from 1 to 8, more preferably from 1 to 4, still more preferably 1. y is preferably from 0 to 4, more preferably 0. z is preferably from 0 to 8, more preferably from 0 to 4.

Examples of the fluorine atom-containing group represented by Rf include an alkyl group having at least one fluorine atom, a cycloalkyl group having at least one fluorine atom, and an aryl group having at least one fluorine atom.

These alkyl group, cycloalkyl group and aryl group may be substituted with a fluorine atom or may be substituted with another fluorine atom-containing substituent. In the case where Rf is a cycloalkyl group having at least one fluorine atom or an aryl group having at least one fluorine atom, examples of the another fluorine-containing substituent include an alkyl group substituted with at last one fluorine atom.

Also, these alkyl group, cycloalkyl group and aryl group may be further substituted with a fluorine atom-free substituent. Examples of this substituent include those not containing a fluorine atom out of those described above for Cy.

Examples of the alkyl group having at least one fluorine atom represented by Rf are the same as those described above as the alkyl group substituted with at least one fluorine atom represented by Xf. Examples of the cycloalkyl group having at least one fluorine atom represented by Rf include a perfluorocyclopentyl group and a perfluorocyclohexyl group. Examples of the aryl group having at least one fluorine atom represented by Rf include a perfluorophenyl group.

As the non-nucleophilic anion, a sulfonate anion represented by the following formula (B-1) is also preferred:

(B-1)

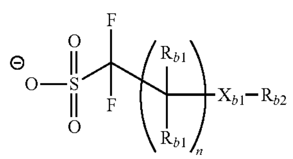

In formula (B-1), each $R_{b1}$ independently represents a hydrogen atom, a fluorine atom or a trifluoromethyl group ($CF_3$).

n represents an integer of 0 to 4.

n is preferably an integer of 0 to 3, more preferably 0 or 1.

$X_{b1}$ represents a single bond, an alkylene group, an ether bond, an ester bond (—OCO— or —COO—), a sulfonic acid ester bond (—$OSO_2$— or —$SO_3$—) or a combination thereof.

$X_{b1}$ is preferably an ester bond (—OCO— or —COO—) or a sulfonic acid ester bond (—$OSO_2$— or —$SO_3$—), more preferably an ester bond (—OCO— or —COO—).

$R_{b2}$ represents an organic group having a carbon number of 6 or more.

The organic group having a carbon number of 6 or more for $R_{b2}$ is preferably a bulky group, and examples thereof include an alkyl group, an alicyclic group, an aryl group, and a heterocyclic group each having a carbon number of 6 or more.

The alkyl group having a carbon number of 6 or more for $R_{b2}$ may be linear or branched and is preferably a linear or branched alkyl group having a carbon number of 6 to 20, and examples thereof include a linear or branched hexyl group, a linear or branched heptyl group, and a linear or branched octyl group. In view of bulkiness, a branched alkyl group is preferred.

The alicyclic group having a carbon number of 6 or more for $R_{b2}$ may be monocyclic or polycyclic. The monocyclic alicyclic group includes, for example, a monocyclic cycloalkyl group such as cyclohexyl group and cyclooctyl group. The polycyclic alicyclic group includes, for example, a polycyclic cycloalkyl group such as norbornyl group, tricyclodecanyl group, tetracyclodecanyl group, tetracyclododecanyl group and adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint of suppressing diffusion in film during a PEB (post-exposure baking) step and improving MEEF (Mask Error Enhancement Factor).

The aryl group having a carbon number of 6 or more for $R_{b2}$ may be monocyclic or polycyclic. Examples of this aryl group include a phenyl group, a naphthyl group, a phenanthryl group, and an anthryl group. Among these, a naphthyl group having a relatively low light absorbance at 193 nm is preferred.

The heterocyclic group having a carbon number of 6 or more for $R_{b2}$ may be monocyclic or polycyclic, but with a polycyclic heterocyclic group, diffusion of an acid can be more suppressed. The heterocyclic group may have aromaticity or may not have aromaticity. Examples of the heterocyclic ring having aromaticity include a benzofuran ring, a benzothiophene ring, a dibenzofuran ring, and a dibenzothiophene ring. Examples of the heterocyclic ring not having aromaticity include a tetrahydropyran ring, a lactone ring, a sultone ring, and a decahydroisoquinoline ring.

The above-described substituent having a carbon number of 6 or more for $R_{b2}$ may further have a substituent. Examples of the further substituent include an alkyl group (may be linear or branched, preferably having a carbon number of 1 to 12), a cycloalkyl group (may be monocyclic, polycyclic or spirocyclic, preferably having a carbon number of 3 to 20), an aryl group (preferably having a carbon number of 6 to 14), a hydroxy group, an alkoxy group, an ester group, an amido group, a urethane group, a ureido group, a thioether group, a sulfonamido group, and a sulfonic acid ester group. Incidentally, the carbon constituting the alicyclic group, aryl group or heterocyclic group (the carbon contributing to ring formation) may be a carbonyl carbon.

Specific examples of the sulfonate anion structure represented by formula (B-1) are illustrated below, but the present invention is not limited thereto.

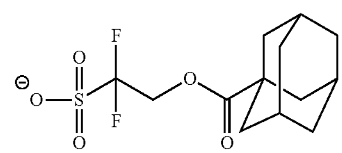

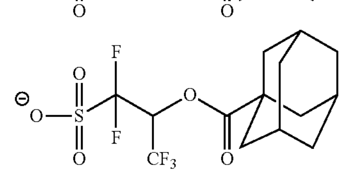

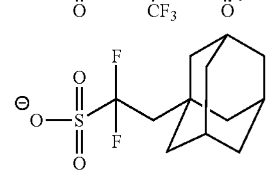

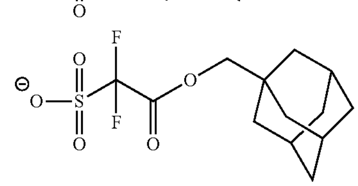

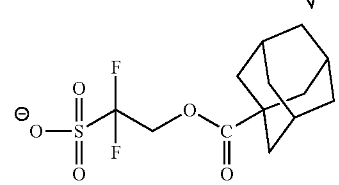

-continued

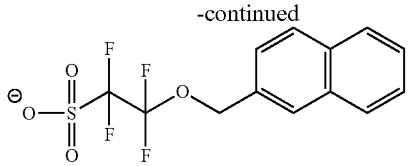

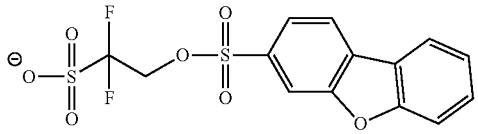

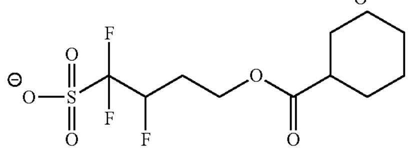

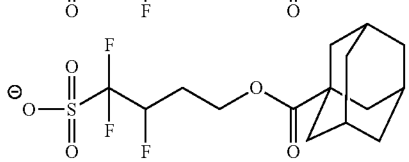

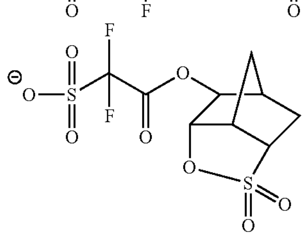

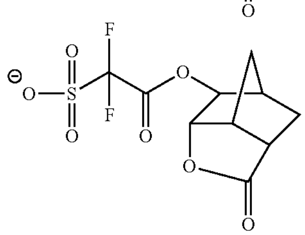

Examples of the organic group represented by $R_{201}$, $R_{202}$ and $R_{203}$ include corresponding groups in the later-described compounds (ZI-1), (ZI-2), (ZI-3) and (ZI-4).

The compound may be a compound having a plurality of structures represented by formula (ZI). For example, the compound may be a compound having a structure where at least one of $R_{201}$ to $R_{203}$ in a compound represented by formula (ZI) is bonded to at least one of $R_{201}$ to $R_{203}$ in another compound represented by formula (ZI) through a single bond or a linking group.

Compounds (ZI-1), (ZI-2), (ZI-3) and (ZI-4) described below are more preferred as the component (ZI).

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group, with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the heterocyclic structure include a pyrrole residue, a furan residue, a thiophene residue, an indole residue, a benzofuran residue, and a benzothiophene residue. In the case where the arylsulfonium compound has two or more aryl groups, these two or more aryl groups may be the same or different.

The alkyl or cycloalkyl group which is contained, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group, and a cyclohexyl group.

The aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein encompasses an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ is independently preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl group, ethyl group, propyl group, butyl group, pentyl group) and a cycloalkyl group having a carbon number of 3 to 10 (e.g., cyclopentyl group, cyclohexyl group, norbornyl group). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C═O at the 2-position of the above-described alkyl group.

The 2-oxocycloalkyl group is preferably a group having >C═O at the 2-position of the above-described cycloalkyl group.

The alkoxy group in the alkoxycarbonylmethyl group is preferably an alkoxy group having a carbon number of 1 to 5 (e.g., methoxy group, ethoxy group, propoxy group, butoxy group, pentoxy group).

$R_{201}$ to $R_{203}$ may be further substituted with a halogen atom, an alkoxy group (for example, having a carbon number of 1 to 5), a hydroxyl group, a cyano group or a nitro group.

The compound (ZI-3) is described below.

The compound (ZI-3) is a compound represented by the following formula (ZI-3), and this is a compound having a phenacylsulfonium salt structure.

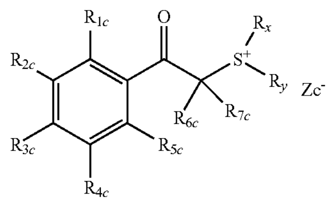

(ZI-3)

In formula (ZI-3), each of $R_{1c}$ to $R_{5c}$ independently represents a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Each of $R_{6c}$ and $R_{7c}$ independently represents a hydrogen atom, an alkyl group, a cycloalkyl group, a halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more members out of $R_{1c}$ to $R_{5c}$, a pair of $R_{5c}$ and $R_{6c}$, a pair of $R_{6c}$ and $R_{7c}$, a pair of $R_{5c}$ and $R_x$, or a pair of $R_x$ and $R_y$ may combine together to form a ring structure. This ring structure may contain an oxygen atom, a sulfur atom, a ketone group, an ester bond or an amide bond.

The ring structure above includes an aromatic or non-aromatic hydrocarbon ring, an aromatic or non-aromatic heterocyclic ring, and a polycyclic condensed ring formed by combining two or more of these rings. The ring structure includes a 3- to 10-membered ring and is preferably a 4- to 8-membered ring, more preferably a 5- or 6-membered ring.

Examples of the group formed by combining any two or more members of $R_{1c}$ to $R_{5c}$, a pair of $R_{6c}$ and $R_{7c}$, or a pair of $R_x$ and $R_y$ include a butylene group and a pentylene group.

The group formed by combining a pair of $R_{5c}$ and $R_{6c}$ or a pair of $R_{5c}$ and $R_x$ is preferably a single bond or an alkylene group, and examples of the alkylene group include a methylene group and an ethylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (such as methyl group, ethyl group, linear or branched propyl group, linear or branched butyl group, or linear or branched pentyl group). The cycloalkyl group includes, for example, a cycloalkyl group having a carbon number of 3 to 10 (e.g., cyclopentyl group, cyclohexyl group).

The aryl group as $R_{1c}$ to $R_{5c}$ is preferably an aryl group having a carbon number of 5 to 15, and examples thereof include a phenyl group and a naphthyl group.

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (such as methoxy group, ethoxy group, linear or branched propoxy group, linear or branched butoxy group, or linear or branched pentoxy group), or a cyclic alkoxy group having a carbon number of 3 to 10 (such as cyclopentyloxy group or cyclohexyloxy group).

Specific examples of the alkoxy group in the alkoxycarbonyl group as $R_{1c}$ to $R_{5c}$ are the same as specific examples of the alkoxy group of $R_{1c}$ to $R_{5c}$.

Specific examples of the alkyl group in the alkylcarbonyloxy group and alkylthio group as $R_{1c}$ to $R_{5c}$ are the same as specific examples of the alkyl group of $R_{1c}$ to $R_{5c}$.

Specific examples of the cycloalkyl group in the cycloalkylcarbonyloxy group as $R_{1c}$ to $R_{5c}$ are the same as specific examples of the cycloalkyl group of $R_{1c}$ to $R_{5c}$.

Specific examples of the aryl group in the aryloxy group and arylthio group as $R_{1c}$ to $R_{5c}$ are the same as specific examples of the aryl group of $R_{1c}$ to $R_{5c}$.

A compound where any one of $R_{1c}$ to $R_{5c}$ is a linear or branched alkyl group, a cycloalkyl group, or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

The ring structure which may be formed by combining any two or more members of $R_{1c}$ to $R_{5c}$ with each other is preferably a 5- or 6-membered ring, more preferably a 6-membered ring (e.g., phenyl ring).

The ring structure which may be formed by combining $R_{5c}$ and $R_{6c}$ with each other includes a 4-membered or higher membered ring (preferably a 5- or 6-membered ring) formed together with the carbonyl carbon atom and carbon atom in formula (I) by combining $R_{5c}$ and $R_{6c}$ with each other to constitute a single bond or an alkylene group (such as methylene group or ethylene group).

The aryl group as $R_{6c}$ and $R_{7c}$ is preferably an aryl group having a carbon number of 5 to 15, and examples thereof include a phenyl group and a naphthyl group.

An embodiment where both of $R_{6c}$ and $R_{7c}$ are an alkyl group is preferred, an embodiment where each of $R_{6c}$ and $R_{7c}$ is a linear or branched alkyl group having a carbon number of 1 to 4 is more preferred, and an embodiment where both are a methyl group is still more preferred.

In the case where $R_{6c}$ and $R_{7c}$ are combined to form a ring, the group formed by combining $R_{6c}$ and $R_{7c}$ is preferably an alkylene group having a carbon number of 2 to 10, and examples thereof include an ethylene group, a propylene group, a butylene group, a pentylene group, and a hexylene group. Also, the ring formed by combining $R_{6c}$ and $R_{7c}$ may contain a heteroatom such as oxygen atom in the ring.

Examples of the alkyl group and cycloalkyl group as $R_x$ and $R_y$ are the same as those of the alkyl group and cycloalkyl group in $R_{1c}$ to $R_{7c}$.

Examples of the 2-oxoalkyl group and 2-oxocycloalkyl group as $R_x$ and $R_y$ include a group having >C═O at the 2-position of the alkyl group or cycloalkyl group as $R_{1c}$ to $R_{7c}$.

Examples of the alkoxy group in the alkoxycarbonylalkyl group as $R_x$ and $R_y$ are the same as those of the alkoxy group in $R_{1c}$ to $R_{5c}$. The alkyl group is, for example, an alkyl group having a carbon number of 1 to 12, preferably a linear alkyl group having a carbon number of 1 to 5 (such as methyl group or ethyl group).

The allyl group as $R_x$ and $R_y$ is not particularly limited but is preferably an unsubstituted allyl group or an allyl group substituted with a monocyclic or polycyclic cycloalkyl group (preferably a cycloalkyl group having a carbon number of 3 to 10).

The vinyl group as $R_x$ and $R_y$ is not particularly limited but is preferably an unsubstituted vinyl group or a vinyl group substituted with a monocyclic or polycyclic cycloalkyl group (preferably a cycloalkyl group having a carbon number of 3 to 10).

The ring structure which may be formed by combining $R_{5c}$ and $R_x$ with each other includes a 5-membered or higher membered ring (preferably a 5-membered ring) formed together with the sulfur atom and carbonyl carbon atom in formula (I) by combining $R_{5c}$ and $R_x$ with each other to constitute a single bond or an alkylene group (such as methylene group or ethylene group).

The ring structure which may be formed by combining $R_x$ and $R_y$ with each other includes a 5- or 6-membered ring, preferably a 5-membered ring (that is, tetrahydrothiophene ring), formed by divalent $R_x$ and $R_y$ (for example, a methylene group, an ethylene group or a propylene group) together with the sulfur atom in formula (ZI-3).

Each of $R_x$ and $R_y$ is preferably an alkyl or cycloalkyl group having a carbon number of 4 or more, more preferably 6 or more, still more preferably 8 or more.

Each of $R_{1c}$ to $R_{7c}$, $R_x$ and $R_y$ may further have a substituent, and examples of such a substituent include a halogen atom (e.g., fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, and an aryloxycarbonyloxy group.

In formula (ZI-3), it is more preferred that each of $R_{1c}$, $R_{2c}$, $R_4$, and $R_{5c}$ independently represents a hydrogen atom and $R_{3c}$ represents a group except for a hydrogen atom, that is, represents an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Examples of the cation in the compound (ZI-2) or (ZI-3) for use in the present invention include cations described in paragraphs [0130] to [0134] of JP-A-2010-256842 and paragraphs [0136] to [0140] of JP-A-2011-76056.

The compound (ZI-4) is described below.

The compound (ZI-4) is represented by the following formula (ZI-4):

(ZI-4)

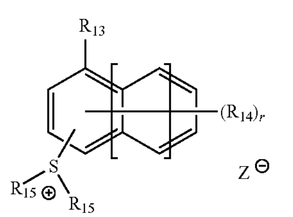

In formula (ZI-4), $R_{13}$ represents a hydrogen atom, a fluorine atom, a hydroxyl group, an alkyl group, a cycloalkyl group, an alkoxy group, an alkoxycarbonyl group or a group having a cycloalkyl group. These groups may have a substituent.

$R_{14}$ represents, when a plurality of $R_{14s}$ are present, each independently represents, a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

Each $R_{15}$ independently represents an alkyl group, a cycloalkyl group or a naphthyl group. Two $R_{15}$s may combine with each other to form a ring. These groups may have a substituent.

l represents an integer of 0 to 2.

r represents an integer of 0 to 8.

$Z^-$ represents a non-nucleophilic anion, and examples thereof are the same as those of the nucleophilic anion of $Z^-$ in formula (ZI).

In formula (ZI-4), the alkyl group of $R_{13}$, $R_{14}$ and $R_{15}$ is a linear or branched alkyl group preferably having a carbon number of 1 to 10, and preferred examples thereof include a methyl group, an ethyl group, an n-butyl group, and a tert-butyl group.

The cycloalkyl group of $R_{13}$, $R_{14}$ and $R_{15}$ includes a monocyclic or polycyclic cycloalkyl group (preferably a cycloalkyl group having a carbon number of 3 to 20) and among others, is preferably cyclopropyl, cyclopentyl, cyclohexyl, cycloheptyl or cyclooctyl.

The alkoxy group of $R_{13}$ and $R_{14}$ is a linear or branched alkoxy group preferably having a carbon number of 1 to 10, and preferred examples thereof include a methoxy group, an ethoxy group, an n-propoxy group, and an n-butoxy group.

The alkoxycarbonyl group of $R_{13}$ and $R_{14}$ is a linear or branched alkoxycarbonyl group preferably having a carbon number of 2 to 11, and preferred examples thereof include a methoxycarbonyl group, an ethoxycarbonyl group, and an n-butoxycarbonyl group.

The group having a cycloalkyl group of $R_{13}$ and $R_{14}$ includes a monocyclic or polycyclic cycloalkyl group (preferably a cycloalkyl group having a carbon number of 3 to 20), and examples thereof include a monocyclic or polycyclic cycloalkyloxy group and an alkoxy group having a monocyclic or polycyclic cycloalkyl group. These groups may further have a substituent.

The monocyclic or polycyclic cycloalkyloxy group of $R_{13}$ and $R_{14}$ preferably has a total carbon number of 7 or more, more preferably a total carbon number of 7 to 15, and preferably has a monocyclic cycloalkyl group. The monocyclic cycloalkyloxy group having a total carbon number of 7 or more indicates a monocyclic cycloalkyloxy group where a cycloalkyloxy group such as cyclopropyloxy group, cyclobutyloxy group, cyclopentyloxy group, cyclohexyloxy group, cycloheptyloxy group, cyclooctyloxy group and cyclododecanyloxy group arbitrarily has a substituent such as alkyl group (e.g., methyl group, ethyl group, propyl group, butyl group, pentyl group, hexyl group, heptyl group, octyl group, dodecyl group, 2-ethylhexyl group, isopropyl group, sec-butyl group, tert-butyl group, isoamyl group), hydroxyl group, halogen atom (e.g., fluorine, chlorine, bromine, iodine), nitro group, cyano group, amido group, sulfonamido group, alkoxy group (e.g., methoxy group, ethoxy group, hydroxyethoxy group, propoxy group, hydroxypropoxy group, butoxy group), alkoxycarbonyl group (e.g., methoxycarbonyl group, ethoxycarbonyl group), acyl group (e.g., formyl group, acetyl group, benzoyl group), acyloxy group (e.g., acetoxy group, butyryloxy group) and carboxy group and where the total carbon number inclusive of the carbon number of an arbitrary substituent on the cycloalkyl group is 7 or more.

Examples of the polycyclic cycloalkyloxy group having a total carbon number of 7 or more include a norbornyloxy group, a tricyclodecanyloxy group, a tetracyclodecanyloxy group, and an adamantyloxy group.

The alkoxy group having a monocyclic or polycyclic cycloalkyl group of $R_{13}$ and $R_{14}$ preferably has a total carbon number of 7 or more, more preferably a total carbon number of 7 to 15, and is preferably an alkoxy group having a monocyclic cycloalkyl group. The alkoxy group having a total carbon number of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, tert-butoxy and isoamyloxy and where the total carbon number inclusive of the carbon number of the substituent is 7 or more. Examples thereof include a cyclohexylmethoxy group, a cyclopentylethoxy group, and a cyclohexylethoxy group, with a cyclohexylmethoxy group being preferred.

Examples of the alkoxy group having a total carbon number of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$.

The alkylsulfonyl group and cycloalkylsulfonyl group of $R_{14}$ are a linear, branched or cyclic alkylsulfonyl group preferably having a carbon number of 1 to 10, and preferred examples thereof include a methanesulfonyl group, an ethanesulfonyl group, an n-propanesulfonyl group, an n-butanesulfonyl group, a cyclopentanesulfonyl group, and a cyclohexanesulfonyl group.

Examples of the substituent which may be substituted on each of the groups above include a halogen atom (e.g., fluorine), a hydroxyl group, a carboxyl group, a cyano group, a nitro group, an alkoxy group, an alkoxyalkyl group, an alkoxycarbonyl group, and an alkoxycarbonyloxy group.

Examples of the alkoxy group include a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

Examples of the alkoxyalkyl group include a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

Examples of the alkoxycarbonyl group include a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

Examples of the alkoxycarbonyloxy group include a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

The ring structure which may be formed by combining two $R_{15s}$ with each other includes a 5- or 6-membered ring, preferably a 5-membered ring (that is, tetrahydrothiophene ring), formed by two $R_{15}$s together with the sulfur atom in formula (ZI-4) and may be fused with an aryl group or a cycloalkyl group. The divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group, and an alkoxycarbonyloxy group. As for the substituent on the ring structure, a plurality of substituents may be present, and they may combine with each other to form a ring (an aromatic or non-aromatic hydrocarbon ring, an aromatic or non-aromatic heterocyclic ring, or a polycyclic condensed ring formed by combining two or more of these rings).

In formula (ZI-4), $R_{15}$ is preferably, for example, a methyl group, an ethyl group, a naphthyl group, or a divalent group capable of forming a tetrahydrothiophene ring structure together with the sulfur atom when two $R_{15}$s are combined.

The substituent which $R_{13}$ and $R_{14}$ may have is preferably a hydroxyl group, an alkoxy group, an alkoxycarbonyl group, or a halogen atom (particularly fluorine atom).

l is preferably 0 or 1, more preferably 1.

r is preferably from 0 to 2.

Examples of the cation in the compound represented by formula (ZI-4) for use in the present invention include cations described in paragraphs [0121], [0123] and [0124] of JP-A-2010-256842 and paragraphs [0127], [0129] and [0130] of JP-A-2011-76056.

One preferred embodiment of the compound (ZI-4) includes a compound represented by the following formula (ZI-4'):

(ZI-4')

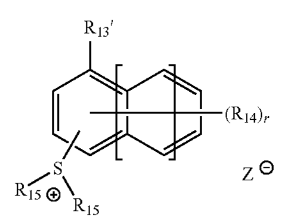

In formula (ZI-4'), $R_{13}'$ represents a branched alkyl group.

$R_{14}$ represents, when a plurality of $R_{14}$s are present, each independently represents, a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group.

Each $R_{15}$ independently represents an alkyl group, a cycloalkyl group or a naphthyl group, and two $R_{15}$s combine with each other to form a ring.

l represents an integer of 0 to 2.

r represents an integer of 0 to 8.

$Z^-$ represents a non-nucleophilic anion.

Examples of the branched alkyl group of $R_{13}'$ include an isopropyl group and a tert-butyl group, with a tert-butyl group being preferred.

In formula (ZI-4'), specific examples and preferred examples of the group of each of $R_{14}$ and $R_{15}$, the ring structure formed by combining two $R_{15}$s with each other, and $Z^-$ are the same as those described in formula (ZI-4).

Preferred ranges of l and r are also the same as those described in formula (ZI-4).

Formulae (ZII) and (ZIII) are described below.

In formulae (ZII) and (ZIII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the framework of the aryl group having a heterocyclic structure include pyrrole, furan, thiophene, indole, benzofuran, and benzothiophene.

The alkyl group and cycloalkyl group in $R_{204}$ to $R_{207}$ are preferably a linear or branched alkyl group having a carbon number of 1 to 10 (e.g., methyl group, ethyl group, propyl group, butyl group, pentyl group) and a cycloalkyl group having a carbon number of 3 to 10 (e.g., cyclopentyl group, cyclohexyl group, norbornyl group).

The aryl group, alkyl group and cycloalkyl group of $R_{204}$ to $R_{207}$ may have a substituent. Examples of the substituent which the aryl group, alkyl group and cycloalkyl group of $R_{204}$ to $R_{207}$ may have include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group, and a phenylthio group.

$Z^-$ represents a non-nucleophilic anion, and examples thereof are the same as those of the non-nucleophilic anion of $Z^-$ in formula (ZI).

Other examples of the acid generator include compounds represented by the following formulae (ZIV), (ZV) and (ZVI):

(ZIV)

$$Ar_3—SO_2SO_2—Ar_4$$

(ZV)

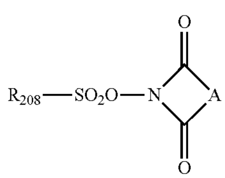

(ZVi)

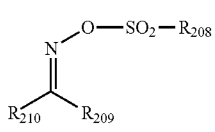

In formulae (ZIV) to (ZVI), each of $Ar_4$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI-1).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI-2).

The alkylene group of A includes an alkylene group having a carbon number of 1 to 12 (e.g., methylene group, ethylene group, propylene group, isopropylene group, butylenes group, isobutylene group); the alkenylene group of A includes an alkenylene group having a carbon number of 2 to 12 (e.g., ethenylene group, propenylene group, butenylene group); and the arylene group of A includes an arylene group having a carbon number of 6 to 10 (e.g., phenylene group, tolylene group, naphthylene group).

Among the acid generators, more preferred are the compounds represented by formulae (ZI) to (ZIII).

Also, the acid generator is preferably a compound that generates an acid having one sulfonic acid group or imide group, more preferably a compound that generates a monovalent perfluoroalkanesulfonic acid, a compound that generates an aromatic sulfonic acid substituted with a monovalent fluorine atom or a fluorine atom-containing group, or a compound that generates an imide acid substituted with a monovalent fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generator which can be used is preferably a compound that generates a fluoro-substituted alkanesulfonic acid, a fluoro-substituted benzenesulfonic acid or a fluoro-substituted imide acid, where pKa of the acid generated is −1 or less, and in this case, the sensitivity is enhanced.

Out of the acid generators, particularly preferred examples are illustrated below.

(z1)

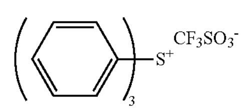

(z2)

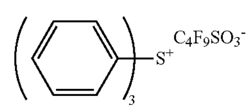

(z3)

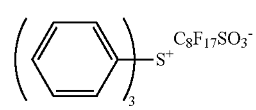

(z4)

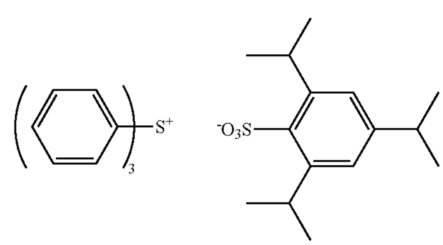

(z5)

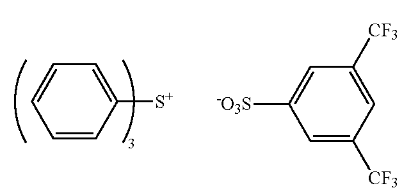

-continued
(z6)
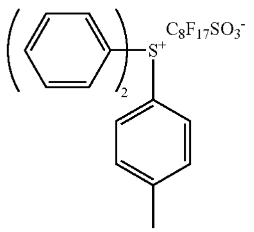
(z7)
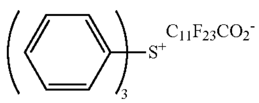
(z8)
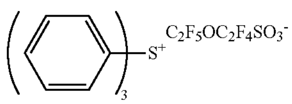
(z9)
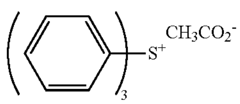
(z10)
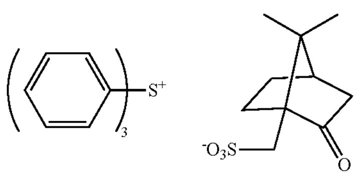
(z11)
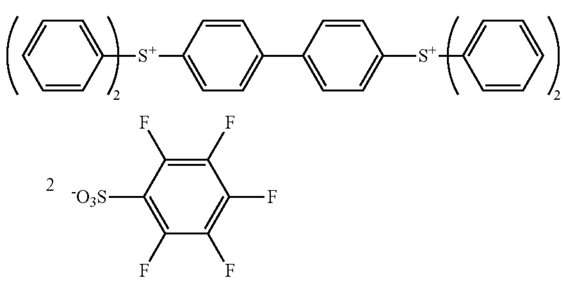
(z12)
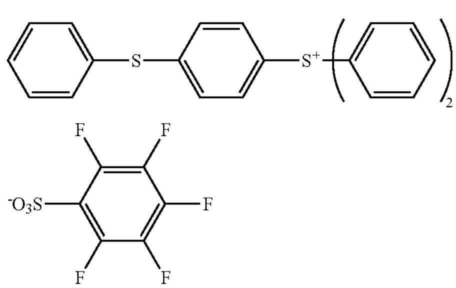
(z13)
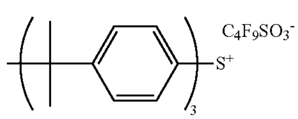
(z14)
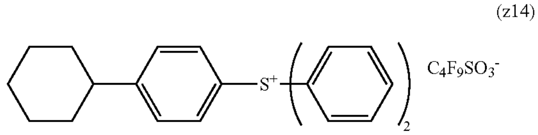
-continued
(z15)
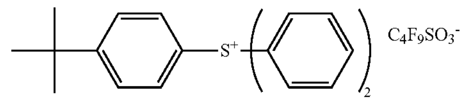
(z16)
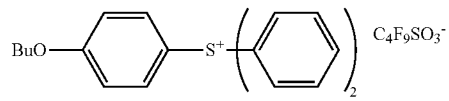
(z17)
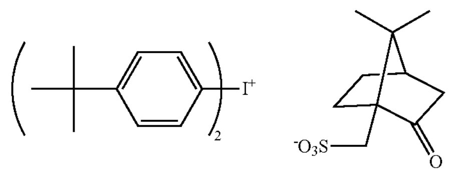
(z18)
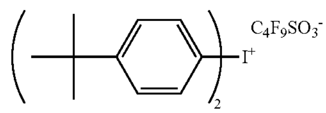
(z19)
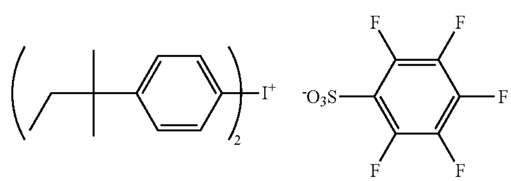
(z20)
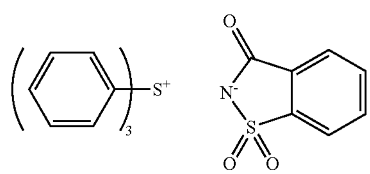
(z21)
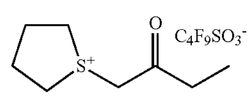
(z22)
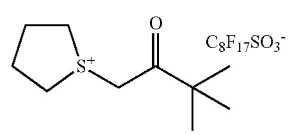
(z23)
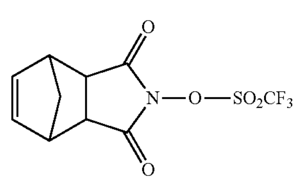
(z24)
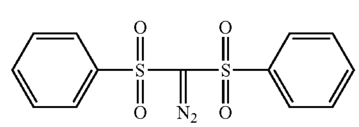
(z25)
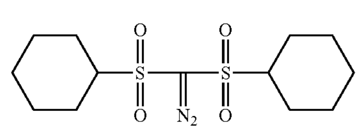

-continued
(z26)
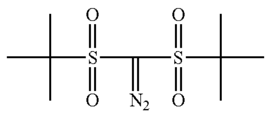
(z27)
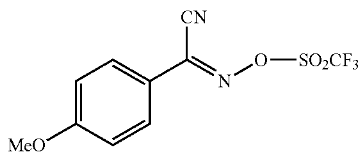
(z28)
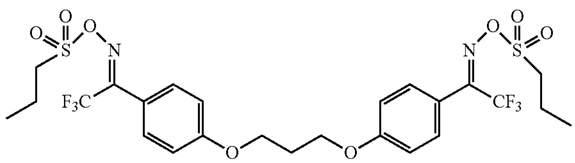
(z29)
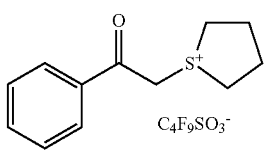
(z30)
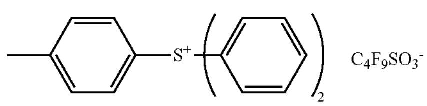
(z31)
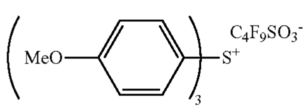
(z32)
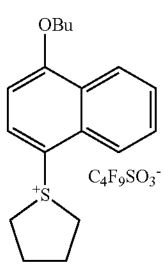
(z33)
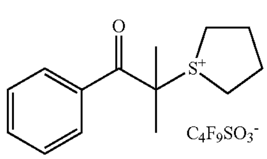
(z34)
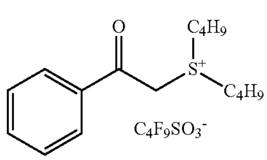
(z35)
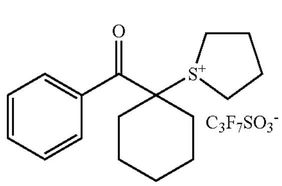
-continued
(z36)
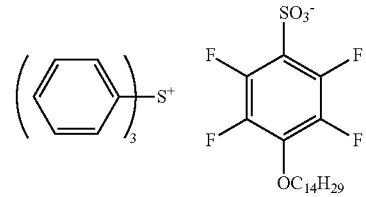
(z37)
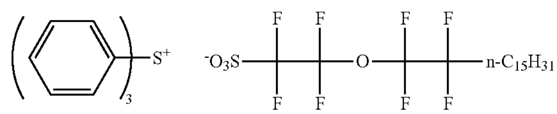
(z38)
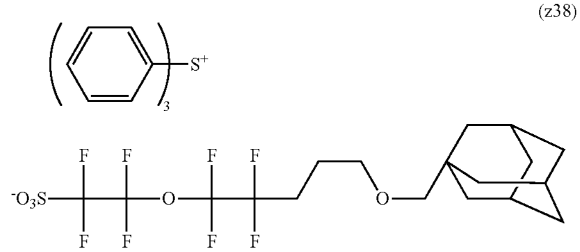
(z39)
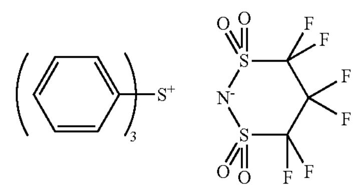
(z40)
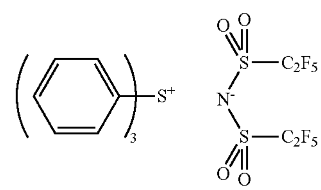
(z41)
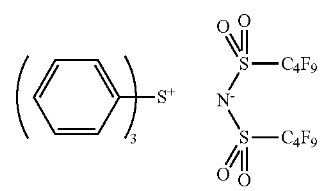
(z42)
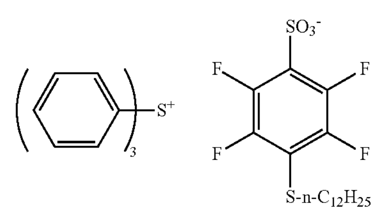
(z43)
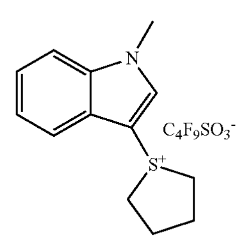

-continued
(z44)
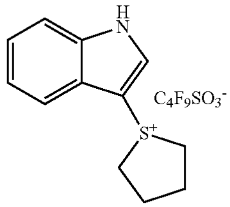
(z45)
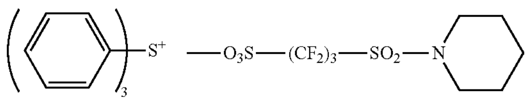
(z46)
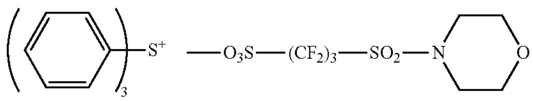
(z47)
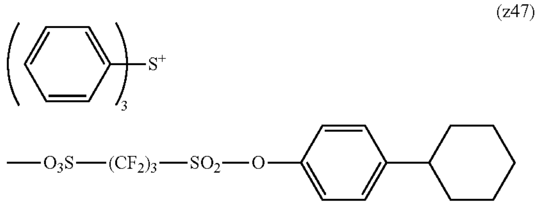
(z48)
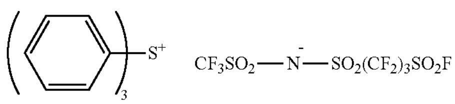
(z49)
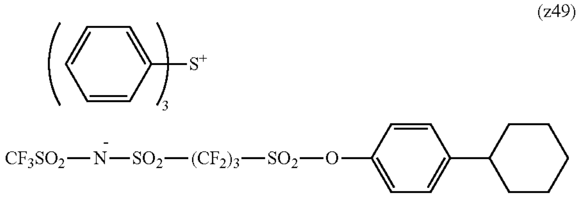
(z50)
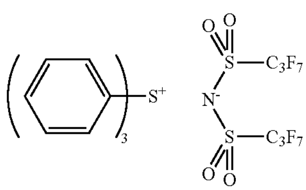
(z51)
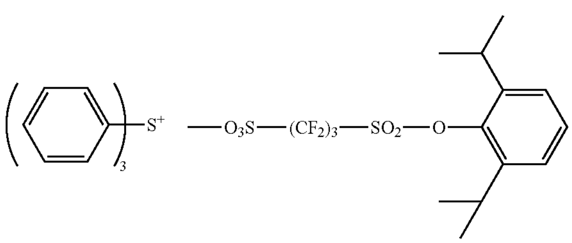
(z52)
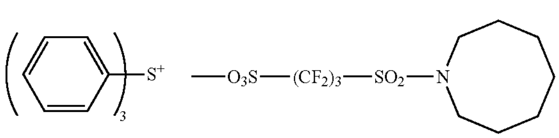
-continued
(z53)
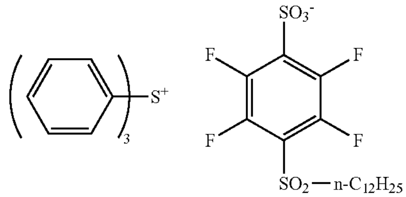
(z54)
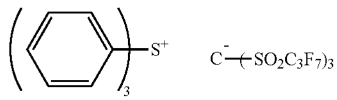
(z55)
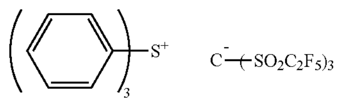
(z56)
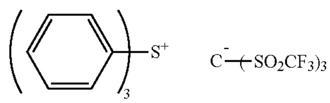
(z57)
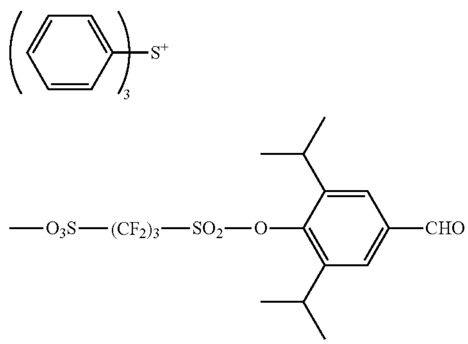
(z58)
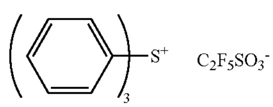
(z59)
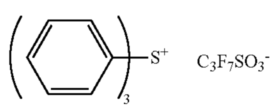
(z60)
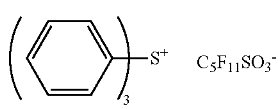
(z61)
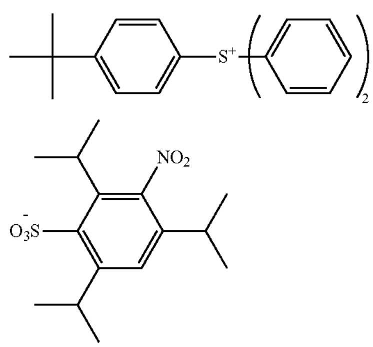

-continued
(z62)
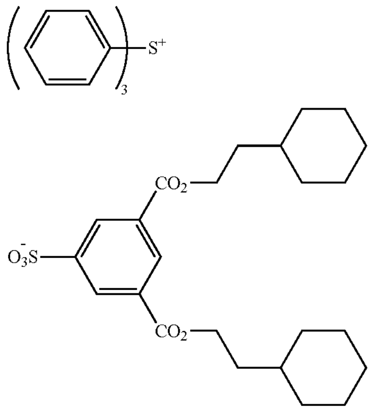
(z63)
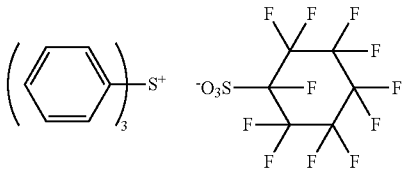
(z64)
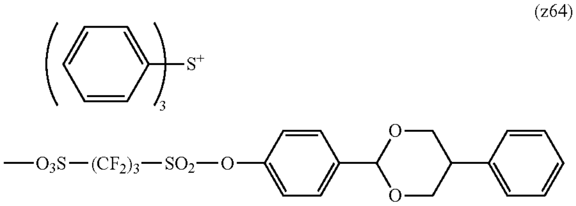
(z65)
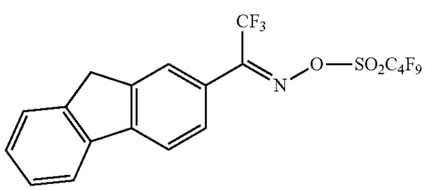
(z66)
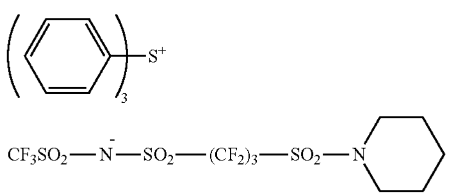
(z67)
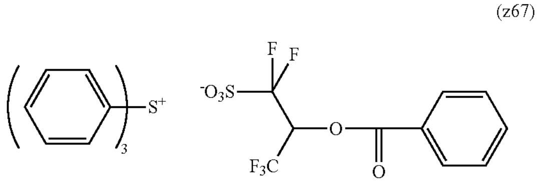
(z68)
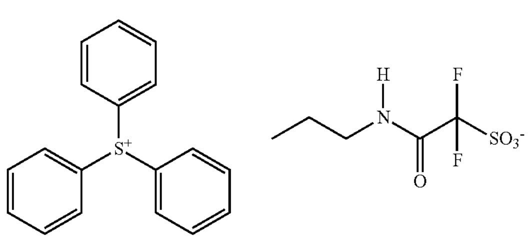
-continued
(z69)
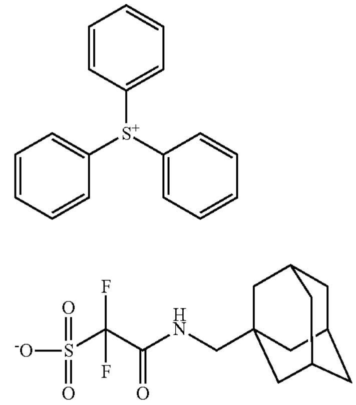
(z70)
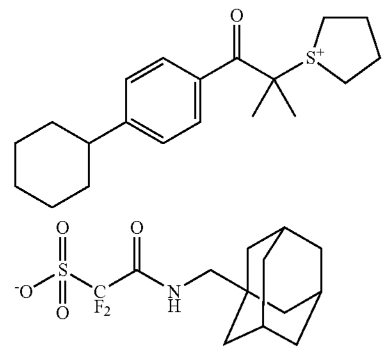
(z71)
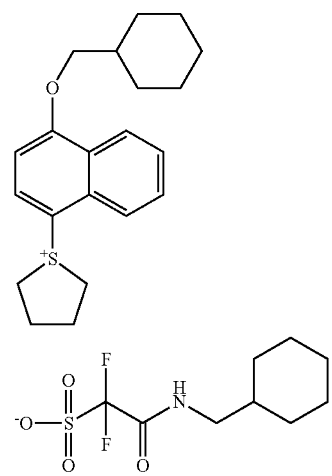
(z72)
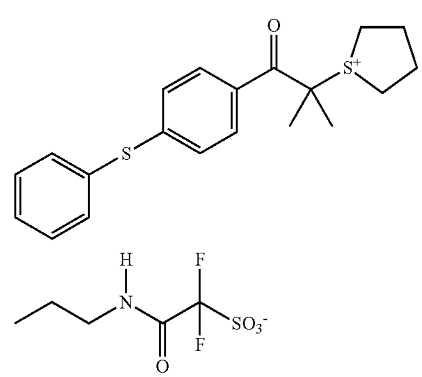

-continued
(z73)
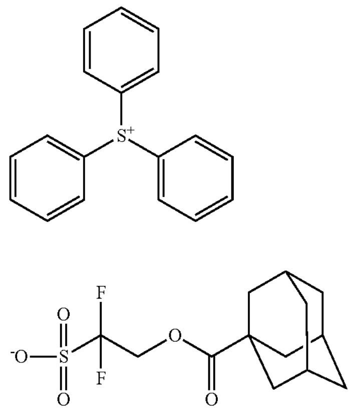
(z74)
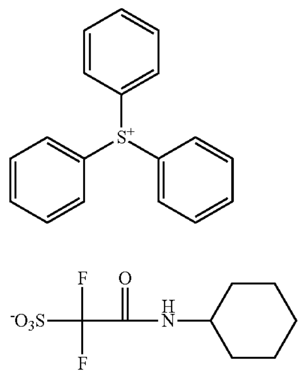
(z75)
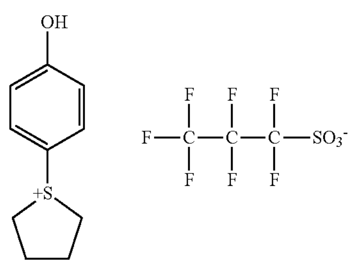
(z76)
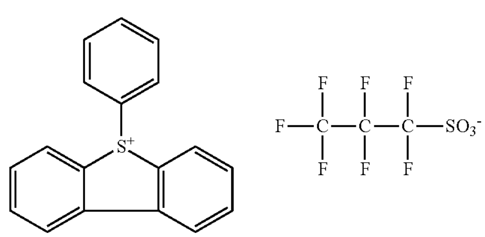
(z77)
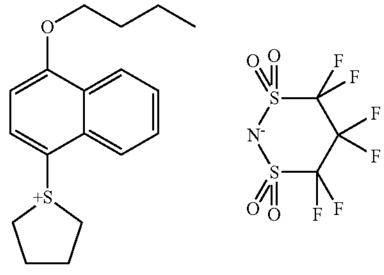
-continued
(z78)
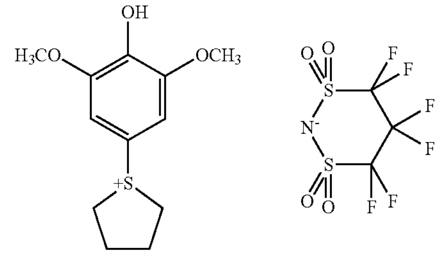
(z79)
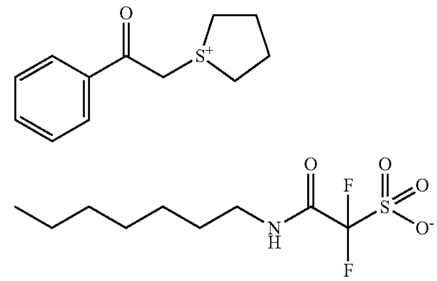
(z80)
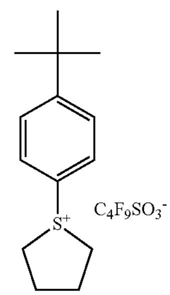
(z81)
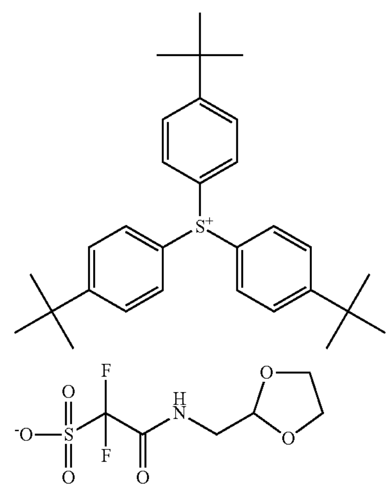
(z82)
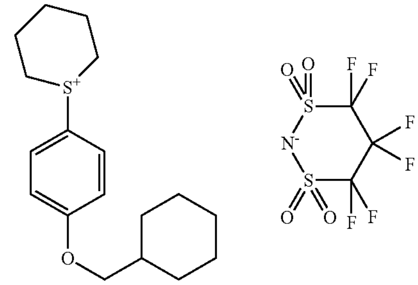

-continued
(z83)
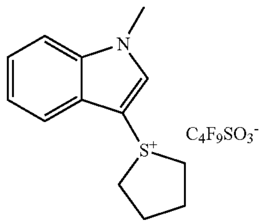
(z84)
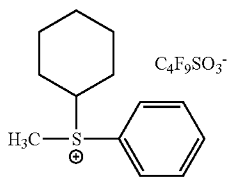
(z85)
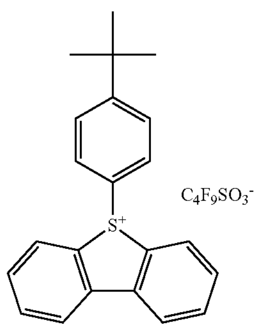
(z86)
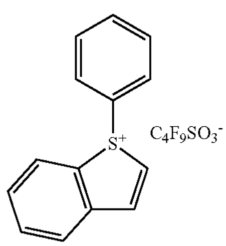
(z87)
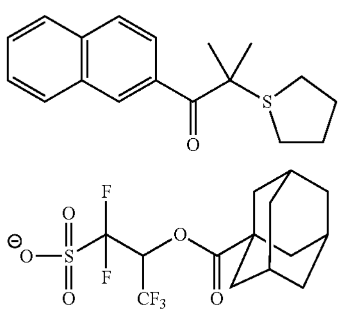
(z88)
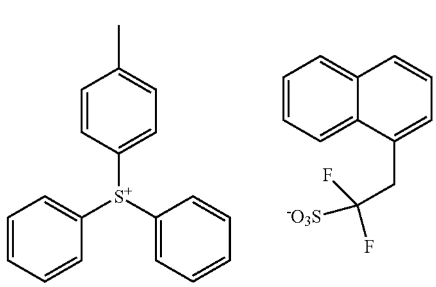
-continued
(z89)
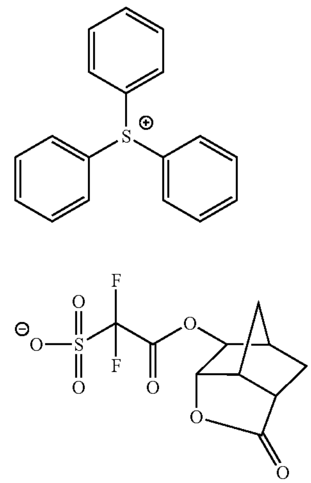
(z90)
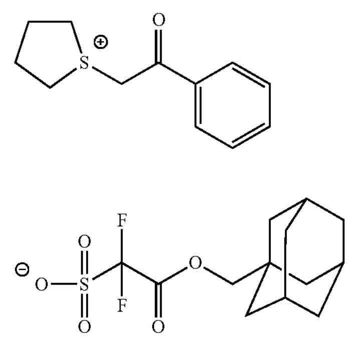
(z91)
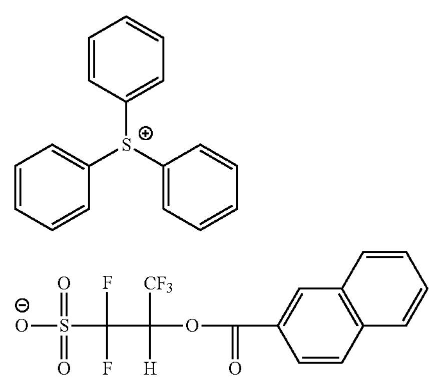
(z92)
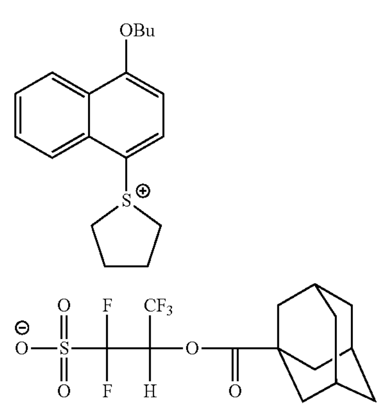

-continued
(z93)
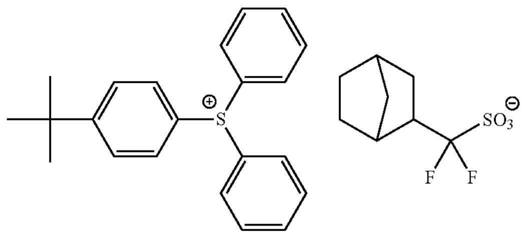
(z94)
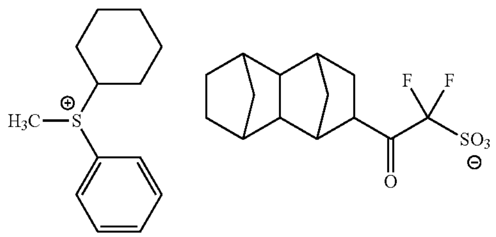
(z95)
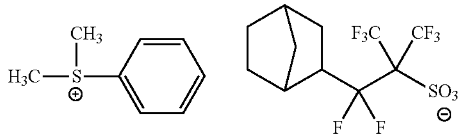
(z96)
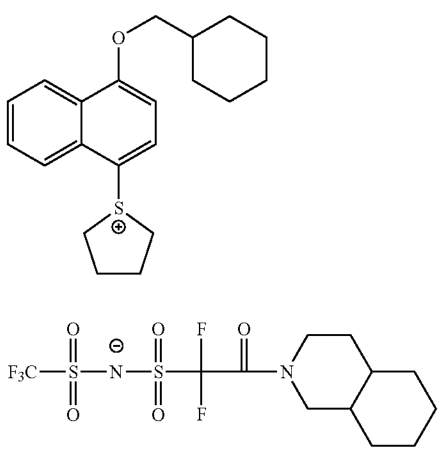
(z97)
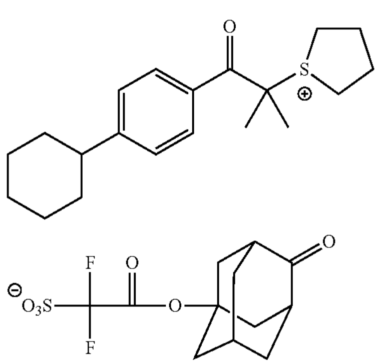
-continued
(z98)
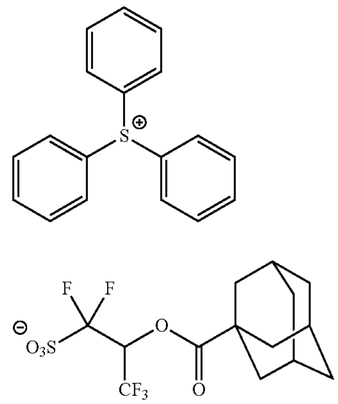
(z99)
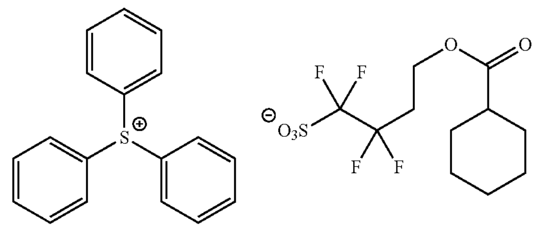
(z100)
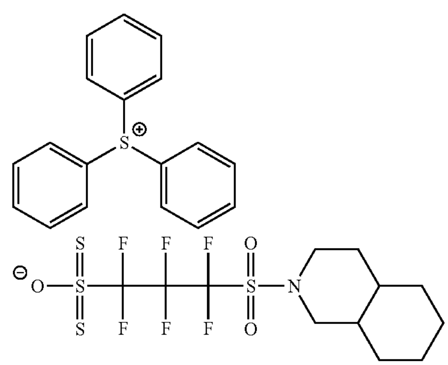
(z101)
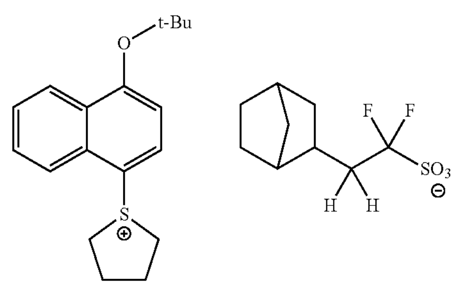
(z102)
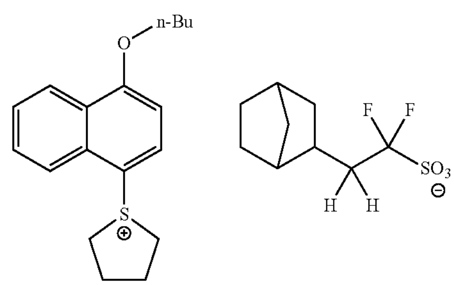

-continued
(z103)
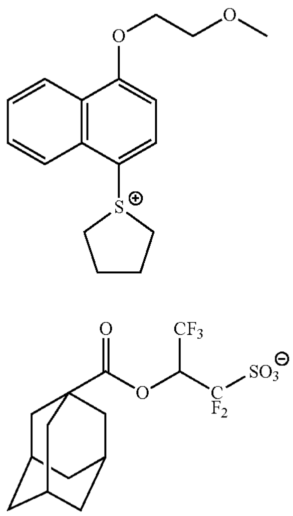
(z104)
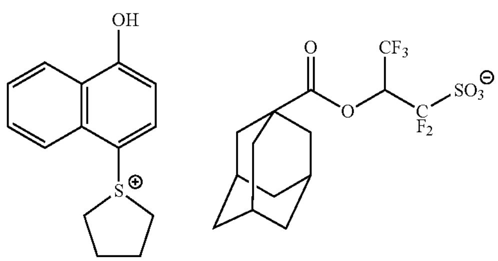
(z105)
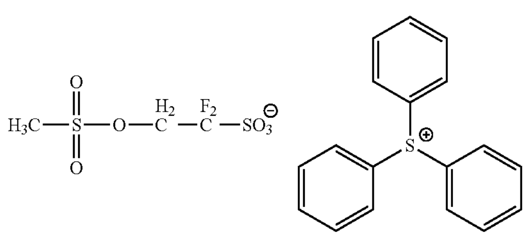
(z106)
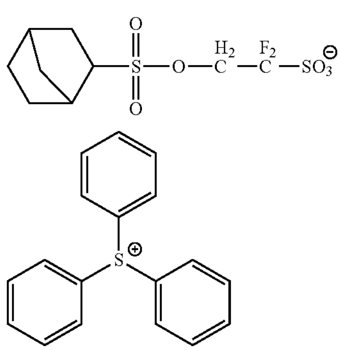
(z107)
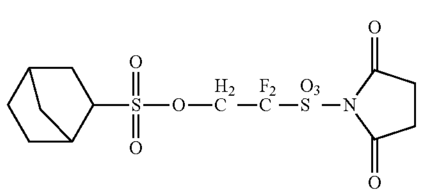
-continued
(z108)
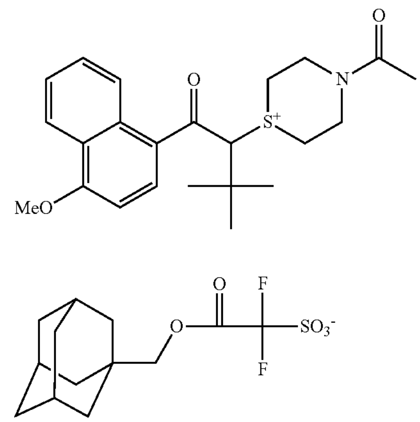
(z109)
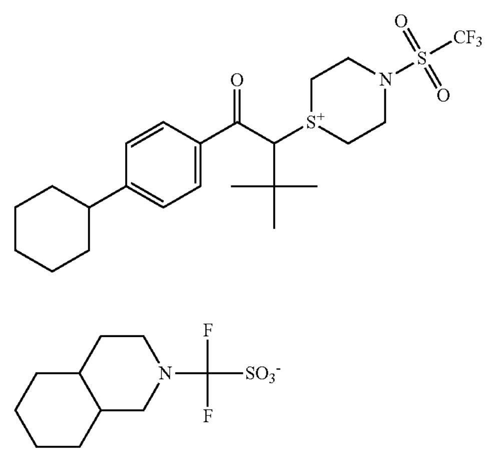
(z110)
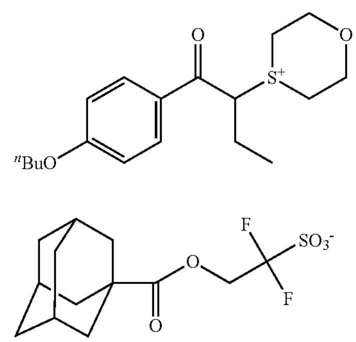
(z111)
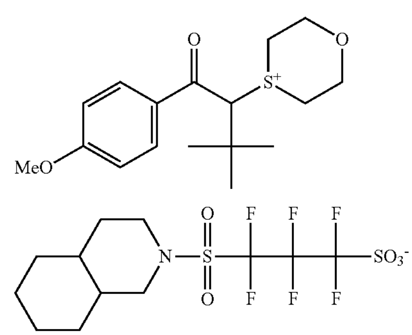

-continued
(z112)
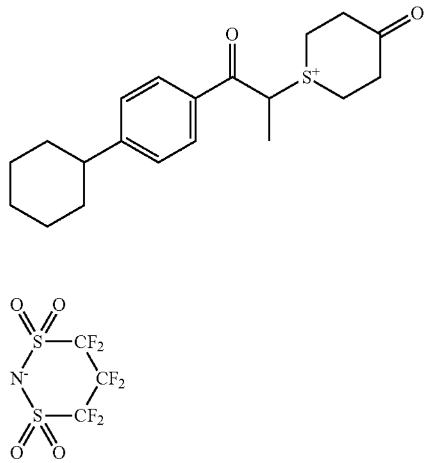
(z113)
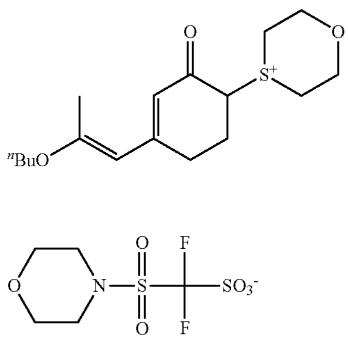
(z114)
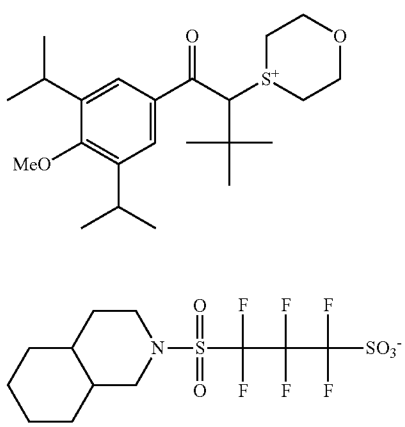
(z115)
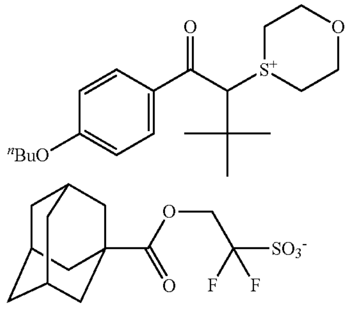
-continued
(z116)
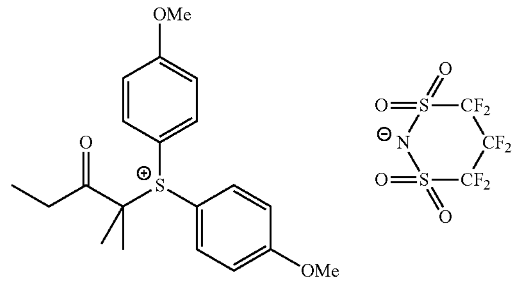
(z117)
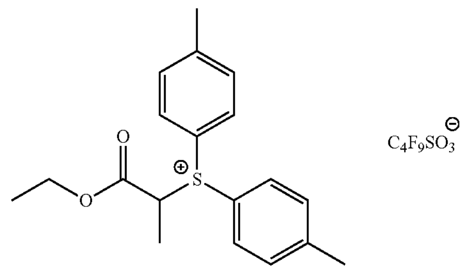
(z118)
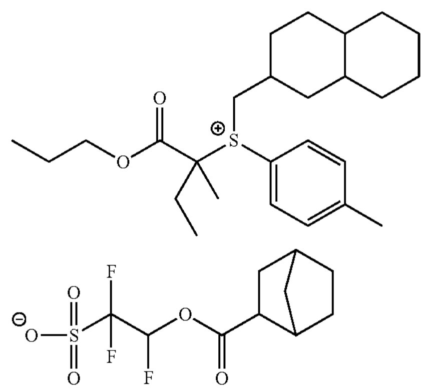
(z119)
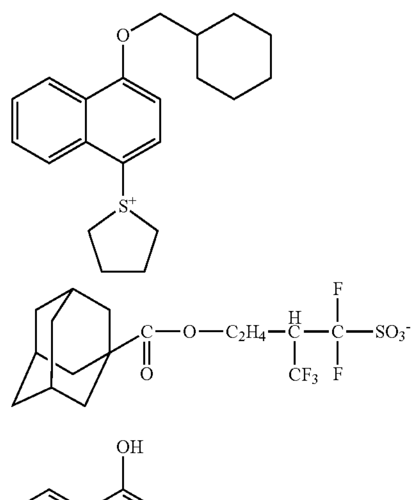
(z120)
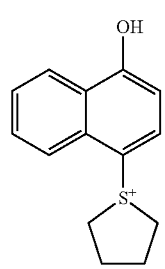

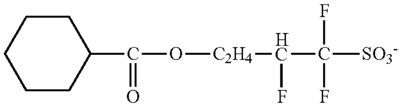
(z121)
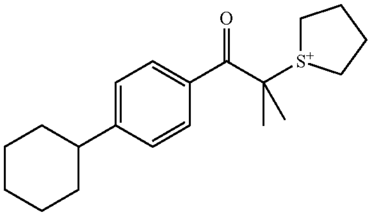
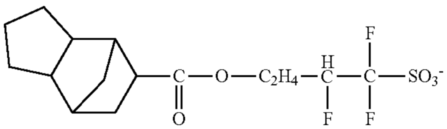
(z122)
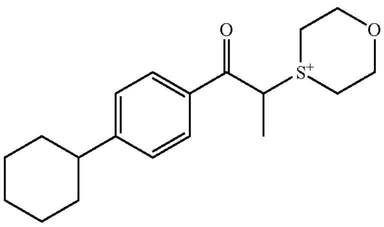
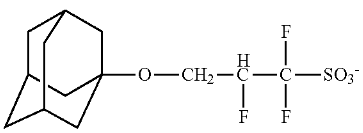
(z123)
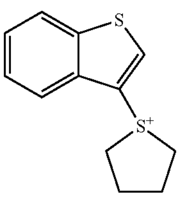
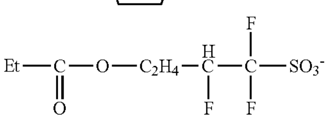
(z124)
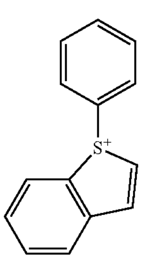
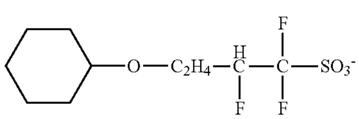
(z125)
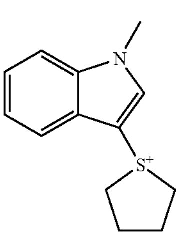
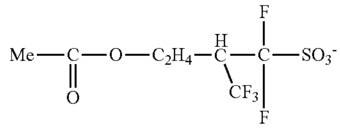
(z126)
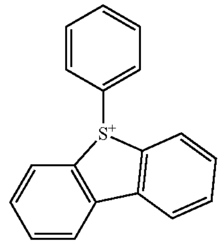
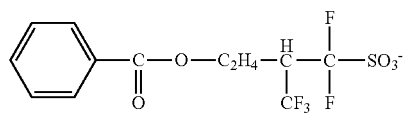
(z127)
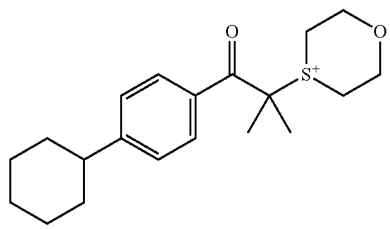
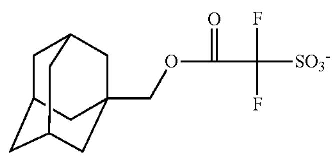
(z128)
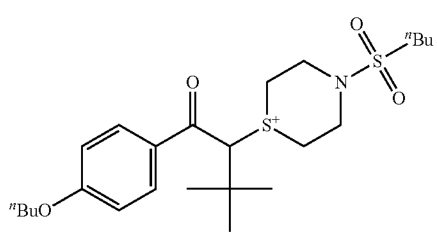
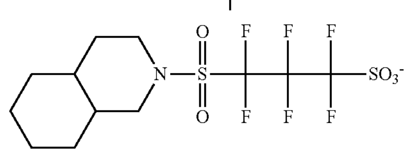
(z129)
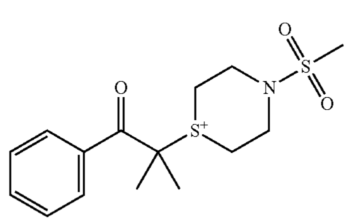
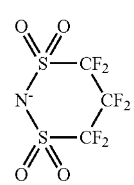

-continued (z130)

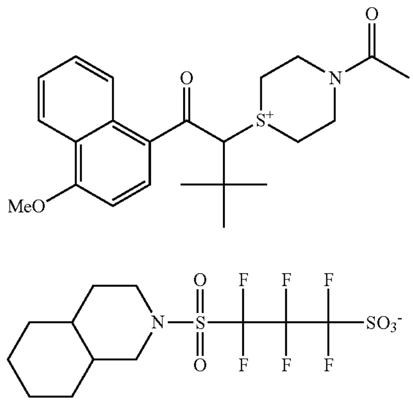

(z131)

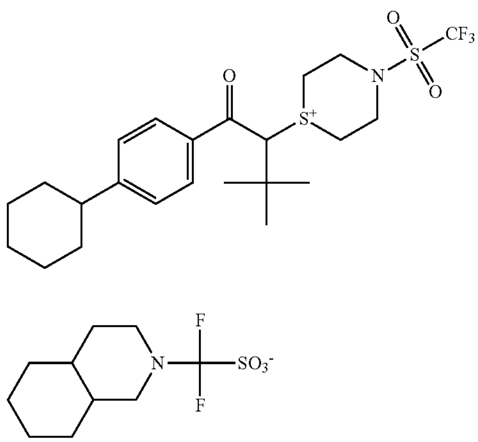

(z132)

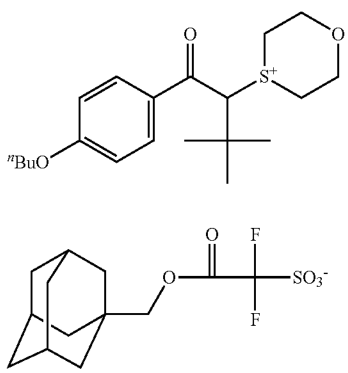

(z133)

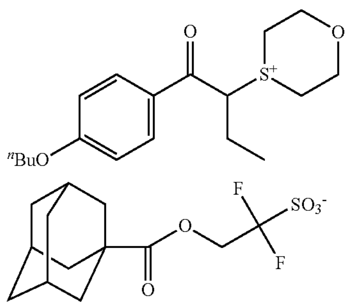

-continued (z134)

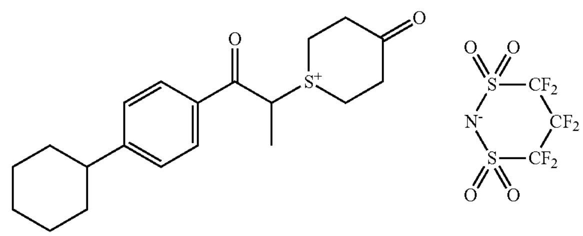

(z135)

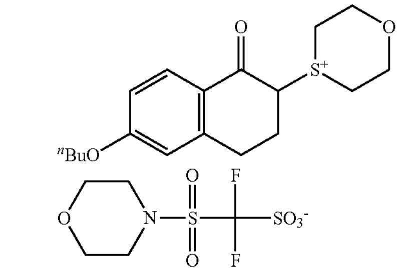

The acid generator can be synthesized by a known method and, for example, can be synthesized in accordance with the method described in JP-A-2007-161707.

As for the acid generator, one kind may be used alone, or two or more kinds may be used in combination.

The content of the compound capable of generating an acid upon irradiation with an actinic ray or radiation in the composition is preferably from 0.1 to 30 mass %, more preferably from 0.5 to 25 mass %, still more preferably from 3 to 20 mass %, yet still more preferably from 3 to 15 mass %, based on the total solid content of the actinic ray-sensitive or radiation-sensitive resin composition.

In the case where the acid generator is represented by formula (ZI-3) or (ZI-4), the content thereof is preferably from 5 to 35 mass %, more preferably from 8 to 30 mass %, still more preferably from 9 to 30 mass %, yet still more preferably from 9 to 25 mass %, based on the total solid content of the composition.

[3] (D) Resin Substantially Free from a Fluorine Atom and a Silicon Atom and Different from the Resin (A)

The actinic ray-sensitive or radiation-sensitive resin composition of the present invention contains (D) a resin substantially free from a fluorine atom and a silicon atom and different from said resin (A) (hereinafter, sometimes referred to as "resin (D)") in an amount of 0.1 mass % to less than 10 mass % based on the total solid content of the actinic ray-sensitive or radiation-sensitive resin composition.

Here, the resin (D) is substantially free from a fluorine atom and a silicon atom, but specifically, the content of the repeating unit having a fluorine atom or a silicon atom is preferably 5 mol % or less, more preferably 3 mol % or less, still more preferably 1 mol % or less, based on all repeating units in the resin (D), and ideally, the content is 0 mol %, that is, the resin does not contain a fluorine atom and a silicon atom. Also, the resin (D) preferably comprises only a repeating unit composed of only an atom selected from a carbon atom, an oxygen atom, a hydrogen atom, a nitrogen atom and a sulfur atom. More specifically, a repeating unit composed of only an atom selected from a carbon atom, an oxygen atom, a hydrogen atom, a nitrogen atom and a sulfur atom preferably accounts for 95 mol % or more, more preferably 97 mol % or more, still more preferably 99 mol % or more, ideally 100 mol %, based on all repeating units in the resin (D).

From the standpoint of causing the resin (D) to be unevenly distributed to the surface layer part of the resist film and achieving excellent performance in the local pattern dimension uniformity and EL and reduction of the residual water defect, the content of the resin (D) in the composition of the present invention is from 0.1 mass % to less than 10 mass %, preferably from 0.2 to 8 mass %, more preferably from 0.3 to 6 mass %, still more preferably from 0.5 to 5 mass %, based on the total solid content of the actinic ray-sensitive or radiation-sensitive resin composition.

In the present invention, the mass percentage content in the resin (D), which is accounted for by the $CH_3$ partial structure contained in the side chain moiety of the resin (D), is 12.0% or more, preferably 18.0% or more. Within this range, low surface free energy can be achieved and the resin (D) can be unevenly distributed to the surface layer part of the resist film, as a result, the local pattern dimension uniformity (in the formation of a fine hole patter, the hole diameter uniformity) and EL can be excellent and in the immersion exposure, reduction of the residual water defect can be achieved.

Incidentally, the upper limit of the mass percentage content of the $CH_3$ partial structure contained in the side chain moiety of the resin (D) is preferably 50.0% or less, more preferably 40% or less.

Here, a methyl group bonded directly to the main chain of the resin (D) (for example, an α-methyl group of a repeating unit having a methacrylic acid structure) little contributes to surface localization of the resin (D) due to the effect of the main chain and therefore, is not encompassed by the $CH_3$ partial structure of the present invention and not counted. More specifically, in the case where the resin (D) contains, for example, a repeating unit derived from a monomer having a polymerizable moiety with a carbon-carbon double bond, such as repeating unit represented by the following formula (M), and where $R_{11}$ to $R_{14}$ are the "very" $CH_3$, this $CH_3$ is not encompassed by the $CH_3$ partial moiety contained in the side chain moiety of the present invention (not counted).

On the other hand, a $CH_3$ partial moiety connected to the C—C main chain through some atom is counted as the $CH_3$ partial structure of the present invention. For example, when $R_{11}$ is an ethyl group ($CH_2CH_3$), this is counted as having "one" $CH_3$ partial structure of the present invention.

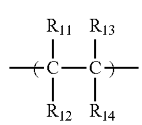

(M)

In formula (M), each of $R_{11}$ to $R_{14}$ independently represents a side chain moiety.

Examples of the side chain moiety of $R_{11}$ to $R_{14}$ include a hydrogen atom and a monovalent organic group.

Examples of the monovalent organic group of $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group.

The monovalent organic group may further have a substituent, and specific examples and preferred examples of the substituent are the same as those described later for the substituent which the aromatic group $Ar_{21}$ in formula (II) may have.

In the present invention, the $CH_3$ partial structure contained in the side chain moiety of the resin (D) (hereinafter, sometimes simply referred to as "side chain $CH_3$ partial structure") encompasses the $CH_3$ partial structure contained in an ethyl group, a propyl group and the like.

The mass percentage content in the resin (D), which is accounted for by the $CH_3$ partial structure contained in the side chain moiety of the resin (D) (hereinafter, sometimes simply referred to as "mass percentage content of the side chain $CH_3$ partial structure in the resin (D)"), is described below.

Here, the mass percentage content of the side chain $CH_3$ partial structure in the resin (D) is described, for example, by referring to a case where the resin (D) is composed of repeating units D1, D2, . . . , Dx, . . . , Dn and the molar fractions of repeating units D1, D2, . . . , Dx, . . . , Dn in the resin (D) are ω1, ω2, . . . , ωx, . . . , ωn, respectively.

(1) First, the mass percentage content (MCx) of the side chain $CH_3$ partial structure of the repeating unit Dx can be calculated by the calculation formula: "100×15.03×(the number of $CH_3$ partial structures in the side chain moiety of the repeating unit Dx)/the molecular weight (Mx) of the repeating unit Dx".

The number of $CH_3$ partial structures in the side chain moiety of the repeating unit Dx excludes the number of methyl groups directly bonded to the main chain.

(2) Next, using the mass percentage contents of the side chain $CH_3$ partial structure calculated for respective repeating units, the mass percentage content of the side chain $CH_3$ partial structure in the resin (D) can be calculated according to the following calculation formula:

Mass Percentage Content of the Side Chain $CH_3$ Partial Structure in the Resin (D):

$$DMC=\Sigma[(\omega1\times MC1)+(\omega2\times MC2)+\ldots+(\omega x\times MCx)+\ldots+(\omega n\times MCn)]$$

Specific examples of the mass percentage content of the $CH_3$ partial structure in the side chain moiety of the repeating unit Dx are shown below, but the present invention is not limited thereto.

| Structure of Repeating Unit | Mw of Repeating Unit | Number of $CH_3$ Partial Structures in Side Chain | Mass Percentage Content of Side Chain $CH_3$ Partial Structure |
|---|---|---|---|
| 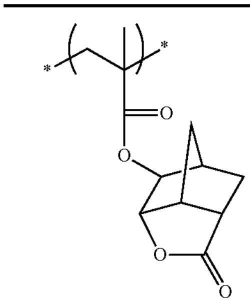 | 222.24 | 0 | 0.0% |

-continued
| Structure of Repeating Unit | Mw of Repeating Unit | Number of $CH_3$ Partial Structures in Side Chain | Mass Percentage Content of Side Chain $CH_3$ Partial Structure |
|---|---|---|---|
| 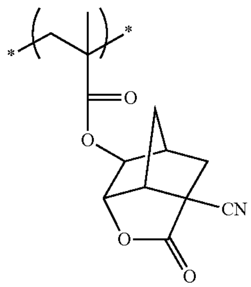 | 247.25 | 0 | 0.0% |
| 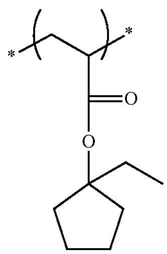 | 168.23 | 1 | 8.9% |
| 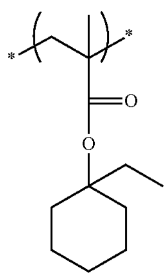 | 196.29 | 1 | 7.7% |
| 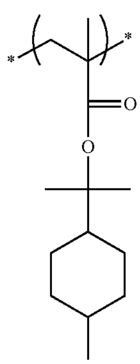 | 224.34 | 3 | 20.1% |
| 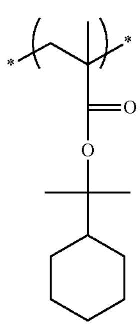 | 210.31 | 2 | 14.3% |

-continued
| Structure of Repeating Unit | Mw of Repeating Unit | Number of $CH_3$ Partial Structures in Side Chain | Mass Percentage Content of Side Chain $CH_3$ Partial Structure |
|---|---|---|---|
| 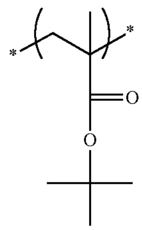 | 142.2 | 3 | 31.7% |
| 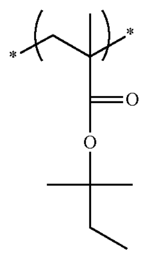 | 156.22 | 3 | 28.9% |
| 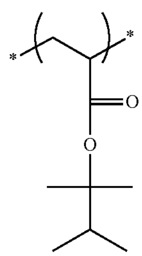 | 156.22 | 4 | 38.5% |
| 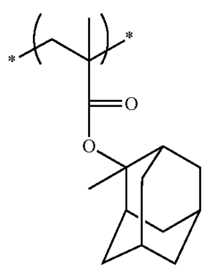 | 234.33 | 1 | 6.4% |
| 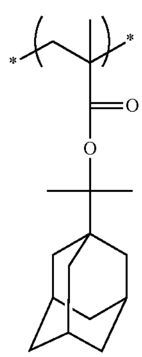 | 262.39 | 2 | 11.5% |
| 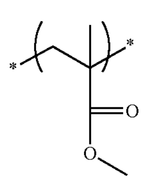 | 100.12 | 1 | 15.0% |

-continued
| Structure of Repeating Unit | Mw of Repeating Unit | Number of $CH_3$ Partial Structures in Side Chain | Mass Percentage Content of Side Chain $CH_3$ Partial Structure |
|---|---|---|---|
| 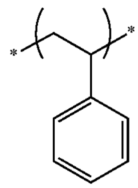 | 104.15 | 0 | 0.0% |
| 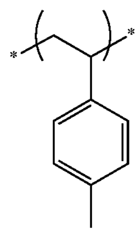 | 118.18 | 1 | 12.7% |
| 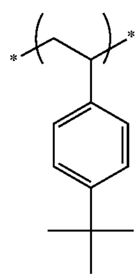 | 160.26 | 3 | 28.1% |
| 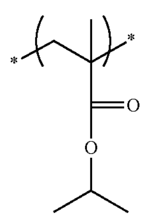 | 128.17 | 2 | 23.5% |
| 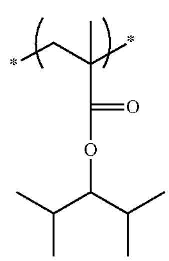 | 184.28 | 4 | 32.6% |
| 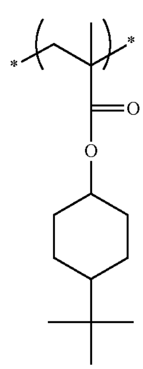 | 224.34 | 3 | 20.1% |

-continued

| Structure of Repeating Unit | Mw of Repeating Unit | Number of $CH_3$ Partial Structures in Side Chain | Mass Percentage Content of Side Chain $CH_3$ Partial Structure |
|---|---|---|---|
| 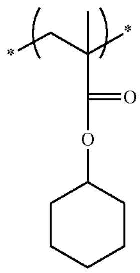 | 168.23 | 0 | 0.0% |
| 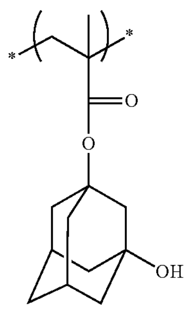 | 236.31 | 0 | 0.0% |

Specific examples of the mass percentage content of the side chain $CH_3$ partial structure in the resin (D) are shown below, but the present invention is not limited thereto.

| Structure of Resin (D) | Compositional Ratio (mol %) | Mass Percentage Content (%) of Side Chain $CH_3$ Partial Structure in Resin (D) |
|---|---|---|
| 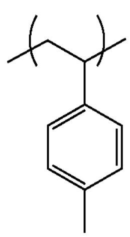 | 100 | 12.7 |
| 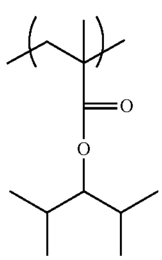 | 100 | 32.6 |

-continued
| Structure of Resin (D) | Compositional Ratio (mol %) | Mass Percentage Content (%) of Side Chain $CH_3$ Partial Structure in Resin (D) |
|---|---|---|
| 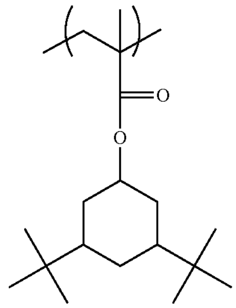 | 100 | 32.2 |
| 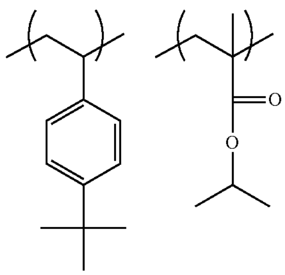 | 30/70 | 25.9 |
| 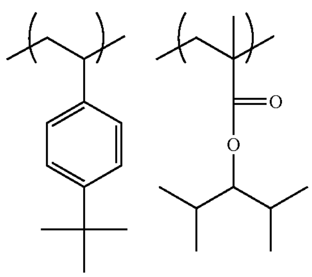 | 10/90 | 32.5 |
| 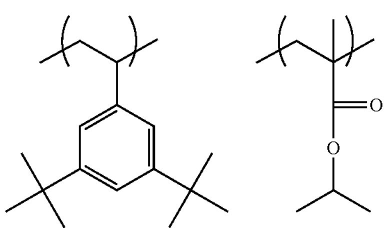 | 15/85 | 26.2 |
| 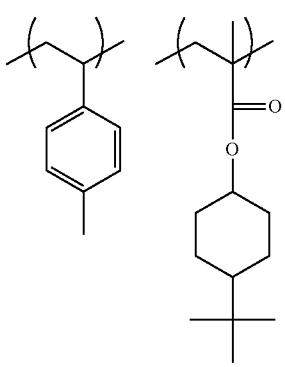 | 15/85 | 19.0 |

-continued
| Structure of Resin (D) | Compositional Ratio (mol %) | Mass Percentage Content (%) of Side Chain $CH_3$ Partial Structure in Resin (D) |
|---|---|---|
| 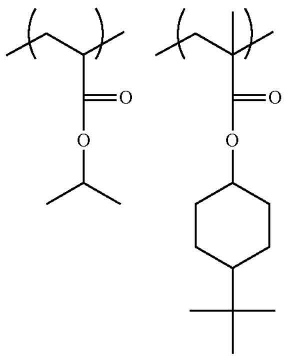 | 50/50 | 21.8 |
| 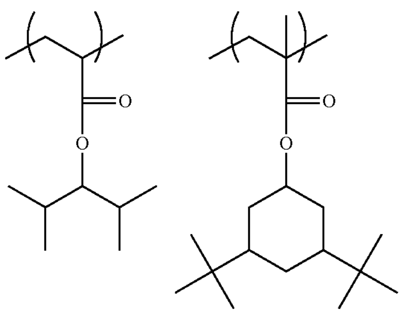 | 60/40 | 32.4 |
| 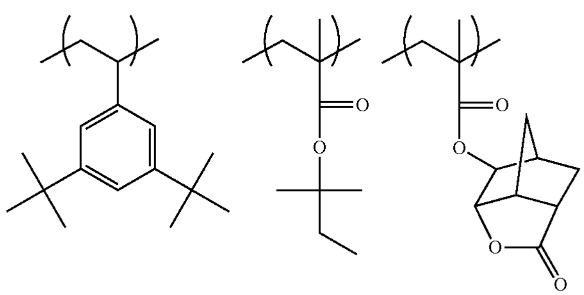 | 40/50/10 | 31.1 |
| 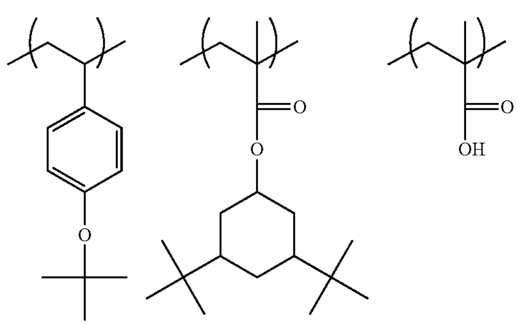 | 10/85/5 | 29.9 |
| 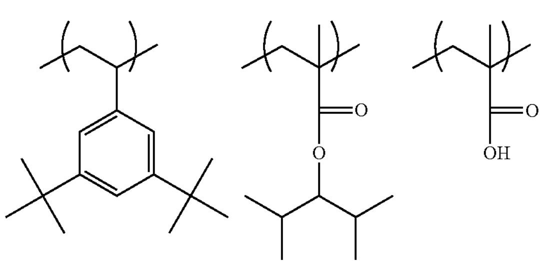 | 40/55/5 | 38.8 |

-continued

| Structure of Resin (D) | Compositional Ratio (mol %) | Mass Percentage Content (%) of Side Chain $CH_3$ Partial Structure in Resin (D) |
|---|---|---|
| 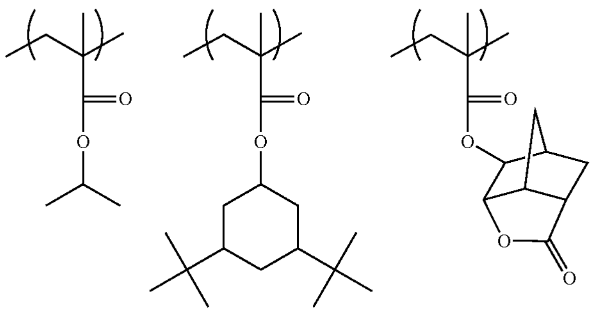 | 50/45/5 | 26.2 |
| 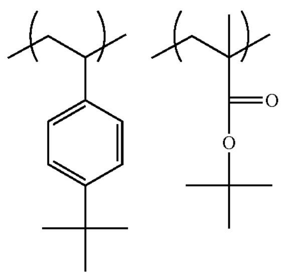 | 20/80 | 28.1 |
| 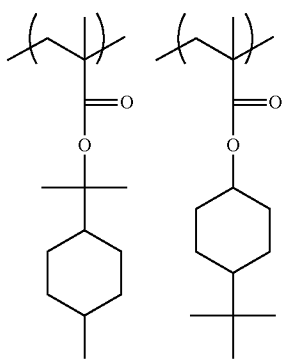 | 50/50 | 20.1 |
| 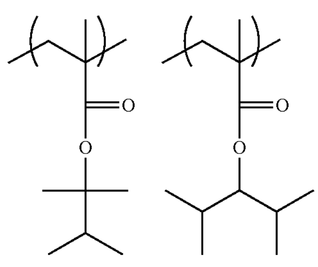 | 40/60 | 33.7 |

The resin (D) preferably contains at least either one repeating unit represented by the following formula (II) or (III) and is more preferably composed only of at least either one repeating unit represented by the following formula (II) or (III):

(II)

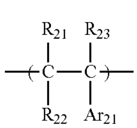

-continued (III)

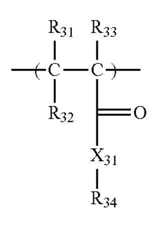

In formula (II), each of $R_{21}$ to $R_{23}$ independently represents a hydrogen atom or an alkyl group.

$Ar_{21}$ represents an aromatic group, $R_{22}$ and $Ar_{21}$ may form a ring, and in this case, $R_{22}$ represents an alkylene group.

In formula (III), each of $R_{31}$ to $R_{33}$ independently represents a hydrogen atom or an alkyl group.

$X_{31}$ represents —O— or —$NR_{35}$—, wherein $R_{35}$ represents a hydrogen atom or an alkyl group.

$R_{34}$ represents an alkyl group or a cycloalkyl group.

The alkyl group of $R_{21}$ to $R_{23}$ in formula (II) is preferably an alkyl group having a carbon number of 1 to 4 (a methyl group, an ethyl group, a propyl group or a butyl group), more preferably a methyl group or an ethyl group, still more preferably a methyl group.

Examples of the alkylene group when $R_{22}$ forms a ring with $Ar_{21}$ include a methylene group and an ethylene group.

Each of $R_{21}$ to $R_{23}$ in formula (II) is preferably a hydrogen atom or a methyl group.

The aromatic group of $Ar_{21}$ in formula (II) may have a substituent and includes an aryl group having a carbon number of 6 to 14, such as phenyl group and naphthyl group, and an aromatic group containing a heterocyclic ring such as thiophene, furan, pyrrole, benzothiophene, benzofuran, benzopyrrole, triazine, imidazole, benzimidazole, triazole, thiadiazole and thiazole. The aromatic group is preferably an aryl group having a carbon number of 6 to 14, such as phenyl group and naphthyl group, which may have a substituent.

Examples of the substituent which the aromatic group $Ar_{21}$ may have include an alkyl group, an alkoxyl group and an aryl group, but from the standpoint of increasing the mass percentage content of the $CH_3$ partial structure contained in the side chain moiety of the resin (D) and decreasing the surface free energy, the substituent is preferably an alkyl group or an alkoxyl group, more preferably an alkyl group having a carbon number of 1 to 4 or an alkoxyl group, still more preferably a methyl group, an isopropyl group, a tert-butyl group or a tert-butoxy group.

Incidentally, the aromatic group of $Ar_{21}$ may have two or more substituent.

The alkyl group of $R_{31}$ to $R_{33}$ and $R_{35}$ in formula (III) is preferably an alkyl group having a carbon number of 1 to 4 (a methyl group, an ethyl group, a propyl group or a butyl group), more preferably a methyl group or an ethyl group, still more preferably a methyl group. Each of $R_{31}$ to $R_{33}$ in formula (III) is independently most preferably a hydrogen atom or a methyl group.

$X_{31}$ in formula (III) is preferably —O— or —NH— (that is, when $R_{35}$ in —$NR_{35}$— is a hydrogen atom), more preferably —O—.

The alkyl group of $R_{34}$ in formula (III) may be either chain or branched and includes a chain alkyl group (such as methyl group, ethyl group, n-propyl group, n-butyl group, n-hexyl group, n-octyl group and n-dodecyl group) and a branched alkyl group (such as isopropyl group, isobutyl group, tert-butyl group, methylbutyl group and dimethylpentyl group), but from the standpoint of increasing the mass percentage content of the $CH_3$ partial structure contained in the side chain moiety of the resin (D) and decreasing the surface free energy, the alkyl group is preferably a branched alkyl group, more preferably a branched alkyl group having a carbon number of 3 to 10, still more preferably a branched alkyl group having a carbon number of 3 to 8.

The cycloalkyl group of $R_{34}$ in formula (III) may have a substituent and includes a monocyclic cycloalkyl group such as cyclobutyl group, cyclopentyl group and cyclohexyl group, and a polycyclic cycloalkyl group such as norbornyl group, tetracyclodecanyl group and adamantyl group, but the cycloalkyl group is preferably a monocyclic cycloalkyl group, more preferably a monocyclic cycloalkyl group having a carbon number of 5 to 6, still more preferably a cyclohexyl group.

Examples of the substituent which $R_{34}$ may have include an alkyl group, an alkoxyl group and an aryl group, but from the standpoint of increasing the mass percentage content of the $CH_3$ partial structure contained in the side chain moiety of the resin (D) and decreasing the surface free energy, the substituent is preferably an alkyl group or an alkoxyl group, more preferably an alkyl group having a carbon number of 1 to 4 or an alkoxyl group, still more preferably a methyl group, an isopropyl group, a tert-butyl group or a tert-butoxy group.

Incidentally, the alkyl group and the cycloalkyl group of $R_{34}$ may have two or more substituents.

$R_{34}$ is preferably not a group capable of decomposing and leaving by the action of an acid, that is, the repeating unit represented by formula (III) is preferably not a repeating unit having an acid-decomposable group.

$R_{34}$ in formula (III) is most preferably a branched alkyl group having a carbon number of 3 to 8, an alkyl group having a carbon number of 1 to 4, or a cyclohexyl group substituted with an alkoxyl group.

Specific examples of the repeating unit represented by formula (II) or (III) are illustrated below, but the present invention is not limited thereto.

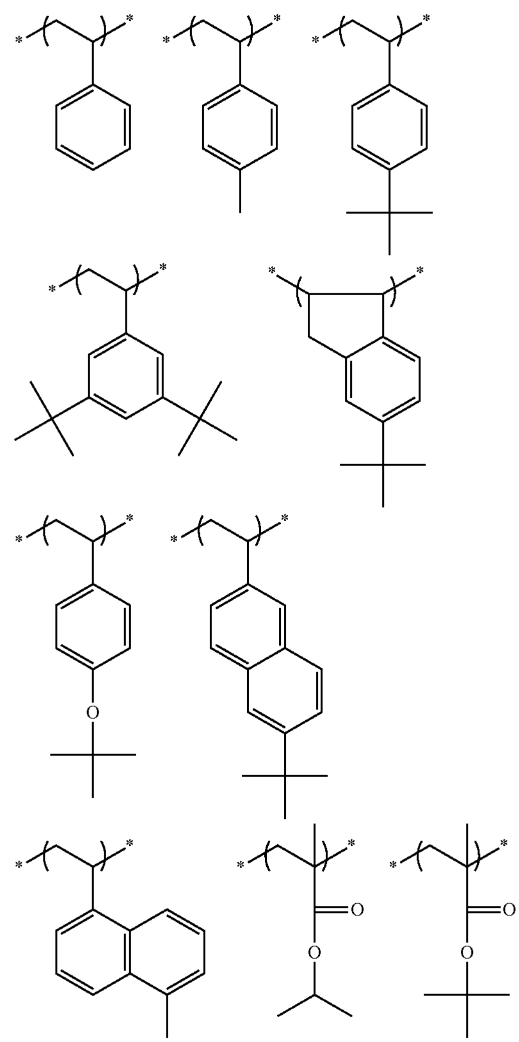

-continued

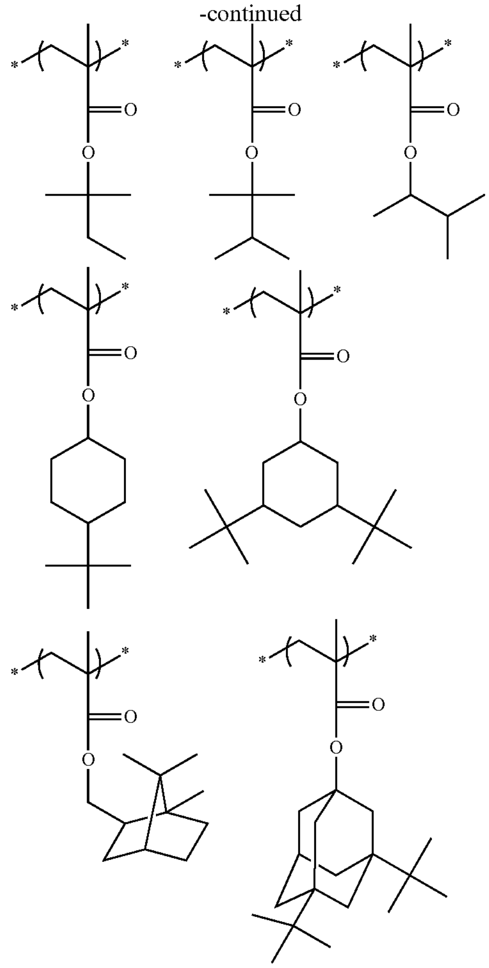

In the case where the resin (D) contains a repeating unit represented by formula (II) or (III), from the standpoint of decreasing the surface free energy and achieving the effects of the present invention, the content of the repeating unit represented by formula (II) or (III) is preferably from 50 to 100 mol %, more preferably from 65 to 100 mol %, still more preferably from 80 to 100 mol %, based on all repeating units in the resin (D).

The preferred embodiment of the present invention includes an embodiment where the mass percentage content in the resin (D), which is accounted for by the $CH_3$ partial structure contained in the side chain moiety of the resin (D), is from 12.0 to 50.0% and the resin (D) is a resin having a repeating unit represented by the following formula (IV). According to this embodiment, the profile of the pattern cross-section in a fine pattern such as hole pattern with a hole diameter of 45 nm or less can be more improved.

(IV)

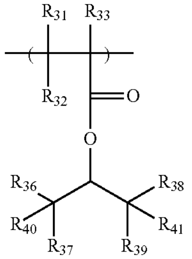

Each of $R_{31}$ to $R_{33}$ independently represents a hydrogen atom or an alkyl group.

Each of $R_{36}$ to $R_{39}$ independently represents an alkyl group or a cycloalkyl group.

Each of $R_{40}$ and $R_{41}$ independently represents a hydrogen atom, an alkyl group or a cycloalkyl group.

Specific examples and preferred examples of the alkyl group as $R_{31}$ to $R_{33}$ in formula (IV) are the same as those described for $R_{31}$ to $R_{33}$ in formula (III).

The alkyl group of $R_{36}$ to $R_{39}$, $R_{40}$ and $R_{41}$ in formula (IV) may be either chain or branched but is preferably a chain alkyl group (for example, a methyl group, an ethyl group, an n-propyl group, an n-butyl group, an n-hexyl group, an n-octyl group or an n-dodecyl group). The alkyl group of $R_{36}$ to $R_{39}$ is preferably a chain alkyl group having a carbon number of 1 to 5, more preferably a chain alkyl group having a carbon number of 1 to 3.

The cycloalkyl group of $R_{36}$ to $R_{39}$, $R_{40}$ and $R_{41}$ in formula (IV) includes a monocyclic cycloalkyl group such as cyclobutyl group, cyclopentyl group and cyclohexyl group, and a polycyclic cycloalkyl group such as norbornyl group, tetracyclodecanyl group and adamantyl group, but the cycloalkyl group is preferably a monocyclic cycloalkyl group, more preferably a monocyclic cycloalkyl group having a carbon number of 5 to 6, still more preferably a cyclohexyl group.

The alkyl group and cycloalkyl group of $R_{36}$ to $R_{39}$, $R_{40}$ and $R_{41}$ may have a substituent, and specific examples and preferred examples of this substituent include those described for the substituent which $R_{34}$ in formula (III) may have.

Incidentally, the alkyl group and cycloalkyl group of $R_{36}$ to $R_{39}$, $R_{40}$ and $R_{41}$ may have two or more substituents.

The resin (D) may further appropriately contain a repeating unit having an acid-decomposable group, a repeating unit having a lactone structure, a repeating unit having a hydroxyl group or a cyano group, a repeating unit having an acid group (alkali-soluble group), and a repeating unit having an alicyclic hydrocarbon structure free from a polar group and not exhibiting acid decomposability, which are the same as those described above for the resin (A).

Specific examples and preferred examples of each of these repeating units which may be contained in the resin (D) are the same as specific examples and preferred examples of each of the repeating units described above for the resin (A).

However, from the standpoint of achieving the effects of the present invention, it is preferred that the resin (D) does not contain a repeating unit having an acid-decomposable group, an alkali-soluble repeating unit and a repeating unit having a lactone structure.

The weight average molecular weight of the resin (D) for use in the present invention is not particularly limited, but the weight average molecular weight is preferably from 3,000 to 100,000, more preferably from 6,000 to 70,000, still more preferably from 10,000 to 40,000. In particular, when the weight average molecular weight is from 10,000 to 40,000, in the formation of a fine hole pattern, the Local CDU and exposure latitude are excellent, and in the immersion exposure, the defect performance is excellent. Here, the weight average molecular weight indicates a molecular weight in terms of polystyrene as measured by GPC (carrier: THF or N-methyl-2-pyrrolidone (NMP)).

The polydispersity (Mw/Mn) is preferably from 1.00 to 5.00, more preferably from 1.03 to 3.50, still more preferably from 1.05 to 2.50. As the molecular weight distribution is smaller, the resolution and resist pattern profile are more excellent.

As for the resin (D) of the present invention, one kind may be used alone, or two or more kinds may be used in combination.

As the resin (D), various commercial products may be used, or the resin may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred.

The reaction solvent, the polymerization initiator, the reaction conditions (such as temperature and concentration), and the method for purification after reaction are the same as those described for the resin (A), but in the synthesis of the resin (D), the concentration at the reaction is preferably from 10 to 50 mass %.

Specific examples of the resin (D) are illustrated below, but the present invention is not limited thereto.

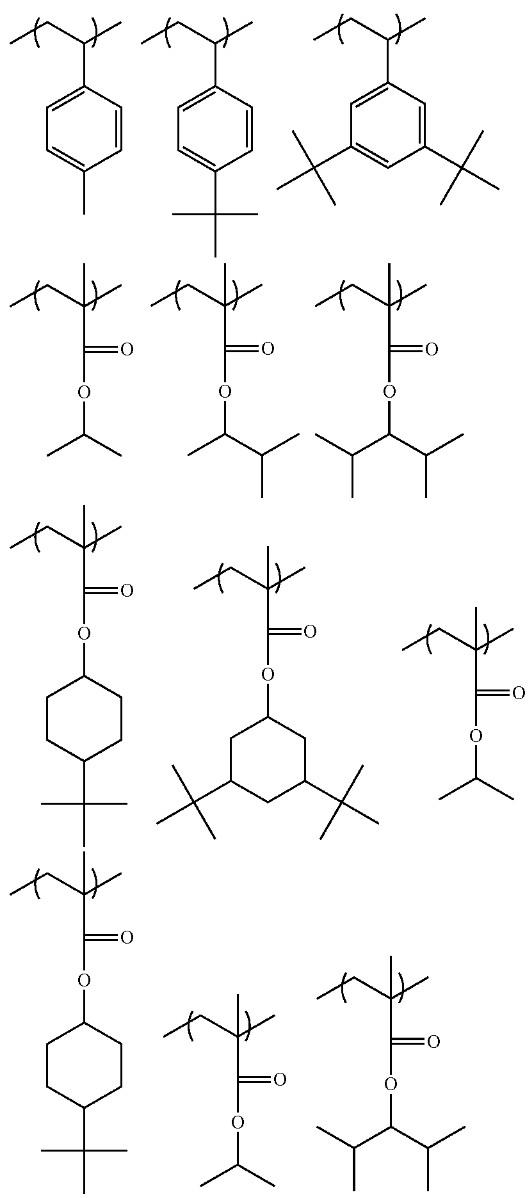

-continued

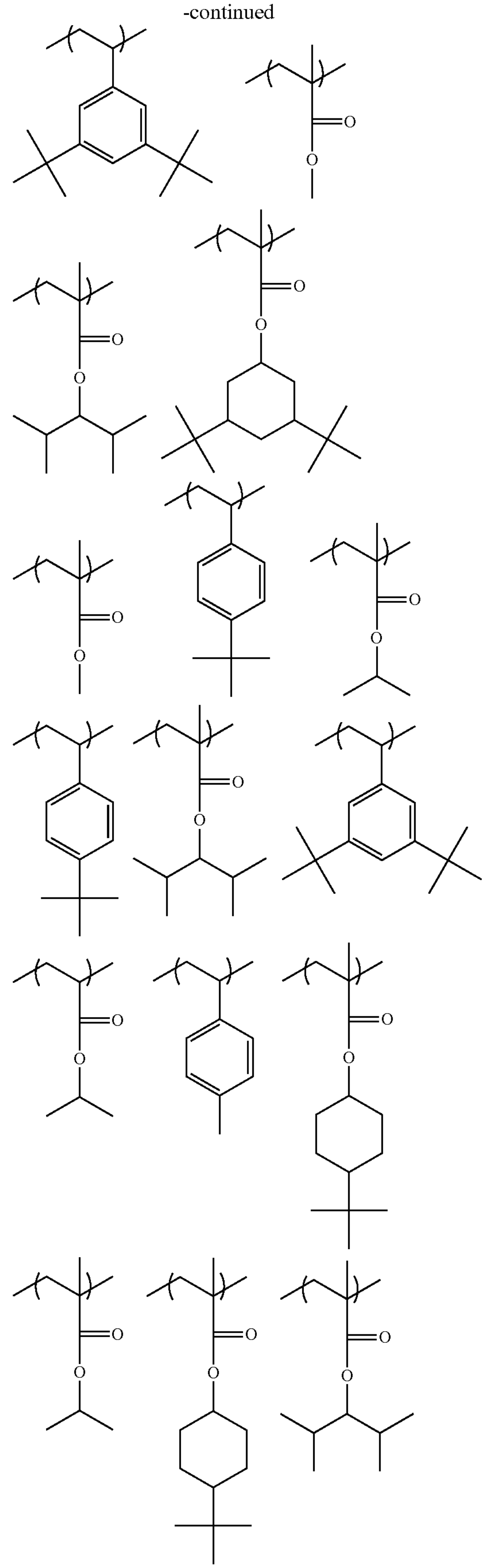

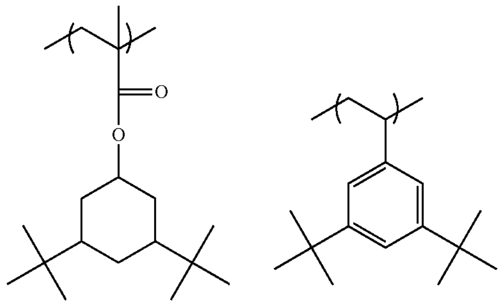
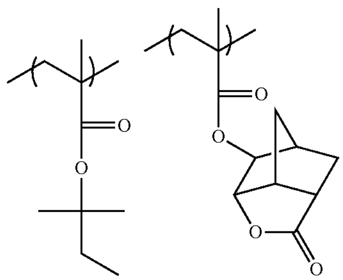
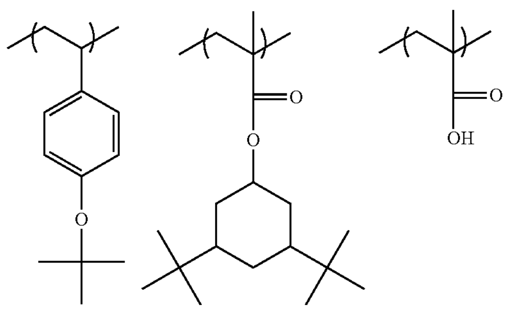
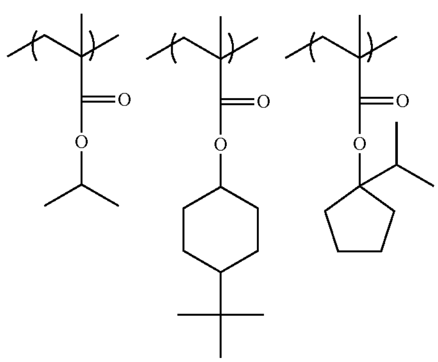
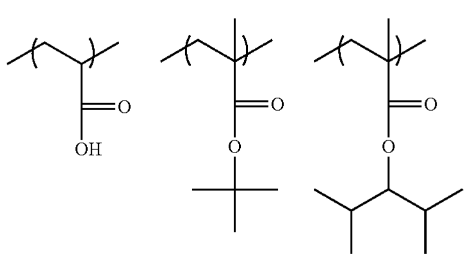
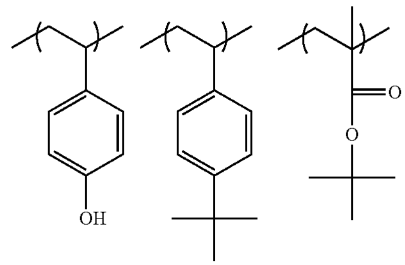
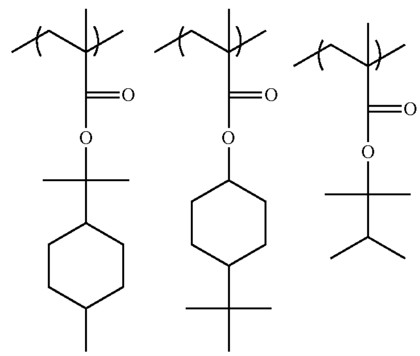
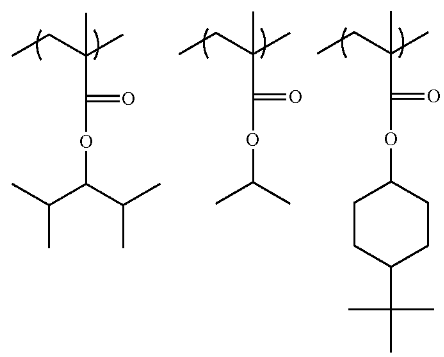
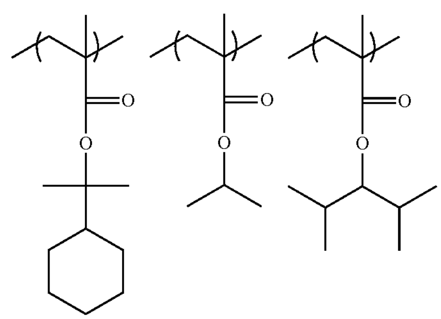
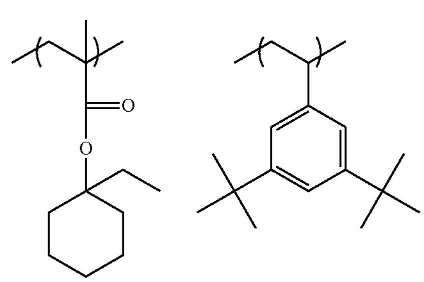

-continued

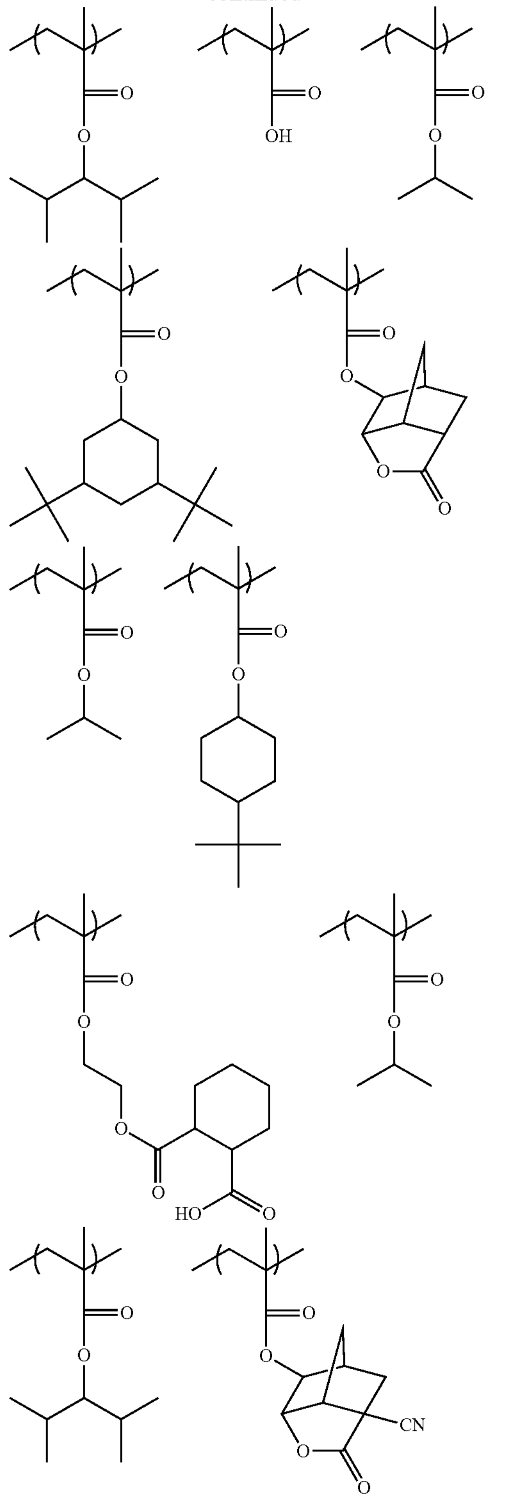

[4] (E) Combined Hydrophobic Resin Having at Least Either a Fluorine Atom or a Silicon Atom and being Different from the Resin (A) and the Resin (D)

The actinic ray-sensitive or radiation-sensitive resin composition of the present invention may contain a hydrophobic resin having at least either a fluorine atom or a silicon atom and being different from the resin (A) and the resin (D) (hereinafter, sometimes referred to as "combined hydrophobic resin (E)" or simply as "resin (E)"), particularly when the composition is applied to immersion exposure. The combined hydrophobic resin (E) is unevenly distributed to the film surface layer and when the immersion medium is water, the static/dynamic contact angle of the resist film surface for water as well as the followability of immersion liquid can be enhanced.

The combined hydrophobic resin (E) is preferably designed to, as described above, be unevenly distributed to the interface but unlike a surfactant, need not have necessarily a hydrophilic group in the molecule and may not contribute to uniform mixing of polar/nonpolar substances.

The combined hydrophobic resin (E) contains a fluorine atom and/or a silicon atom. The fluorine atom and/or silicon atom in the combined hydrophobic resin (E) may be contained in the main chain of the resin or may be contained in the side chain.

In the case where the combined hydrophobic resin (E) contains a fluorine atom, the resin preferably contains a fluorine atom-containing alkyl group, a fluorine atom-containing cycloalkyl group or a fluorine atom-containing aryl group, as a fluorine atom-containing partial structure.

The fluorine atom-containing alkyl group (preferably having a carbon number of 1 to 10, more preferably a carbon number of 1 to 4) is a linear or branched alkyl group with at least one hydrogen atom being substituted for by a fluorine atom and may further have a substituent other than fluorine atom.

The fluorine atom-containing cycloalkyl group is a monocyclic or polycyclic cycloalkyl group with at least one hydrogen atom being substituted for by a fluorine atom and may further have a substituent other than fluorine atom.

The fluorine atom-containing aryl group is an aryl group such as phenyl group or naphthyl group with at least one hydrogen atom being substituted for by a fluorine atom and may further have a substituent other than fluorine atom.

As the fluorine atom-containing alkyl group, fluorine atom-containing cycloalkyl group and fluorine atom-containing aryl group, the groups represented by the following formulae (F2) to (F4) are preferred, but the present invention is not limited thereto.

(F2)

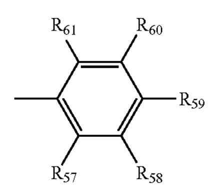

(F3)

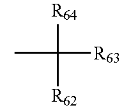

(F4)

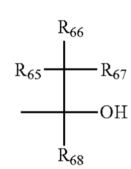

In formulae (F2) to (F4), each of $R_{57}$ to $R_{68}$ independently represents a hydrogen atom, a fluorine atom or an alkyl group (linear or branched), provided that at least one of $R_{57}$ to $R_{61}$, at least one of $R_{62}$ to $R_{64}$, and at least one of $R_{65}$ to $R_{68}$ each independently represents a fluorine atom or an alkyl group (preferably having a carbon number of 1 to 4) with at least one hydrogen atom being substituted for by a fluorine atom.

It is preferred that all of $R_{57}$ to $R_{61}$ and $R_{65}$ to $R_{67}$ are a fluorine atom. Each of $R_{62}$, $R_{63}$ and $R_{68}$ is preferably an alkyl group (preferably having a carbon number of 1 to 4) with at least one hydrogen atom being substituted for by a fluorine atom, more preferably a perfluoroalkyl group having a carbon number of 1 to 4. $R_{62}$ and $R_{63}$ may combine with each other to form a ring.

Specific examples of the group represented by formula (F2) include a p-fluorophenyl group, a pentafluorophenyl group, and a 3,5-di(trifluoromethyl)phenyl group.

Specific examples of the group represented by formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-tert-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Among these, a hexafluoroisopropyl group, a heptafluoroisopropyl group, a hexafluoro(2-methyl)isopropyl group, an octafluoroisobutyl group, a nonafluoro-tert-butyl group and a perfluoroisopentyl group are preferred, and a hexafluoroisopropyl group and a heptafluoroisopropyl group are more preferred.

Specific examples of the group represented by formula (F4) include —$C(CF_3)_2OH$, —$C(C_2F_5)_2OH$, —$C(CF_3)(CH_3)OH$ and —$CH(CF_3)OH$, with —$C(CF_3)_2OH$ being preferred.

The fluorine atom-containing partial structure may be bonded directly to the main chain or may be bonded to the main chain through a group selected from the group consisting of an alkylene group, a phenylene group, an ether bond, a thioether bond, a carbonyl group, an ester bond, an amide bond, a urethane bond and a ureylene bond, or a group formed by combining two or more of these members.

Suitable repeating units having a fluorine atom include the followings.

(C-Ia)

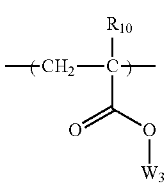

(C-Ib)

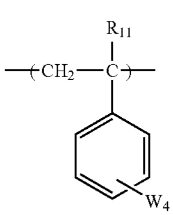

(C-Ic)

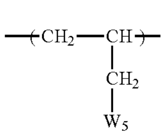

-continued (C-Id)

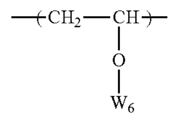

In the formulae, each of $R_{10}$ and $R_{11}$ independently represents a hydrogen atom, a fluorine atom or an alkyl group. The alkyl group is preferably a linear or branched alkyl group having a carbon number of 1 to 4 and may have a substituent, and the alkyl group having a substituent includes, in particular, a fluorinated alkyl group.

Each of $W_3$ to $W_6$ independently represents an organic group having at least one or more fluorine atoms, and the group specifically includes the atomic groups of (F2) to (F4).

Other than these repeating units, the combined hydrophobic resin (E) may contain a unit shown below as the repeating unit having a fluorine atom.

(C-II)

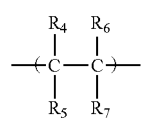

(C-III)

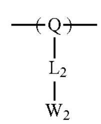

In the formulae, each of $R_4$ to $R_7$ independently represents a hydrogen atom, a fluorine atom or an alkyl group. The alkyl group is preferably a linear or branched alkyl group having a carbon number of 1 to 4 and may have a substituent, and the alkyl group having a substituent includes, in particular, a fluorinated alkyl group.

However, at least one of $R_4$ to $R_7$ represents a fluorine atom. $R_4$ and $R_5$, or $R_6$ and $R_7$ may form a ring.

$W_2$ represents an organic group having at least one fluorine atom, and the group specifically includes the atomic groups of (F2) to (F4).

$L_2$ represents a single bond or a divalent linking group. The divalent linking group is a substituted or unsubstituted arylene group, a substituted or unsubstituted alkylene group, a substituted or unsubstituted cycloalkylene group, —O—, —$SO_2$—, —CO—, —N(R)— (wherein R represents a hydrogen atom or an alkyl group), —$NHSO_2$— or a divalent linking group formed by combining a plurality of these members.

Q represents an alicyclic structure. The alicyclic structure may have a substituent and may be monocyclic or polycyclic, and in the case of a polycyclic structure, the structure may be a crosslinked structure. The monocyclic structure is preferably a cycloalkyl group having a carbon number of 3 to 8, and examples thereof include a cyclopentyl group, a cyclohexyl group, a cyclobutyl group, and a cyclooctyl group. Examples of the polycyclic structure include a group having a bicyclo, tricyclo or tetracyclo structure with a carbon number of 5 or more. A cycloalkyl group having a carbon number of 6 to 20 is preferred, and examples thereof include an adamantyl group, a norbornyl group, a dicyclopentyl group, a tricyclodecanyl group, and a tetracyclododecyl group. A part of carbon atoms in the cycloalkyl group may be substituted with a heteroatom such as oxygen atom. Above all, Q is preferably, for example, a norbornyl group, a tricyclodecanyl group or a tetracyclododecyl group.

Specific examples of the repeating unit having a fluorine atom are illustrated below, but the present invention is not limited thereto.

In specific examples, $X_1$ represents a hydrogen atom, —$CH_3$, —F or —$CF_3$. $X_2$ represents —F or —$CF_3$.

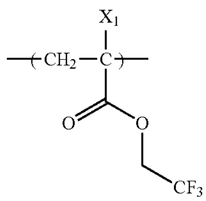
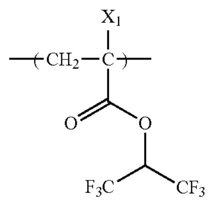
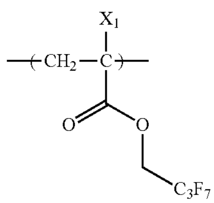
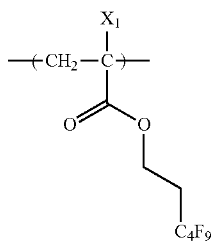
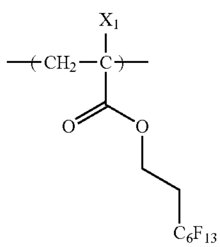
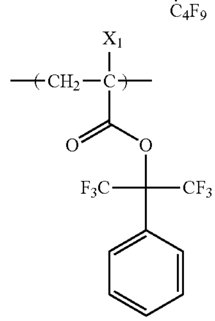
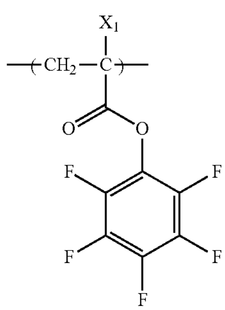
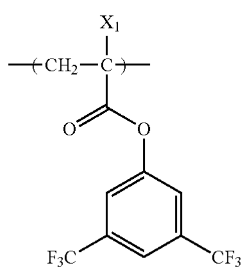
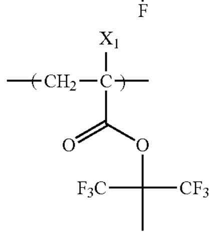
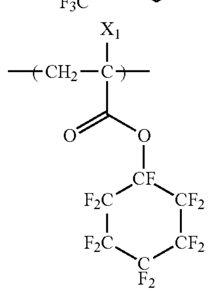
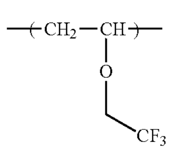
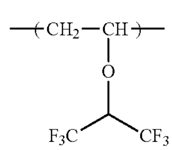

-continued

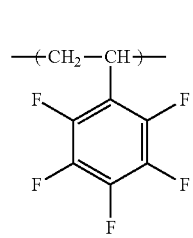
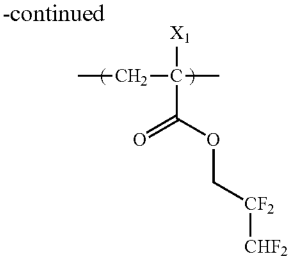
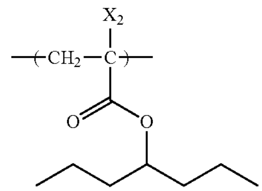
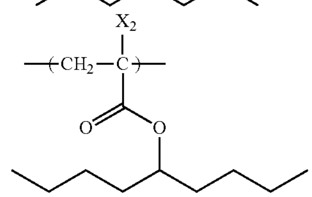
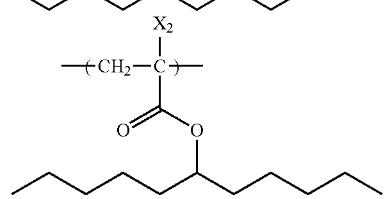
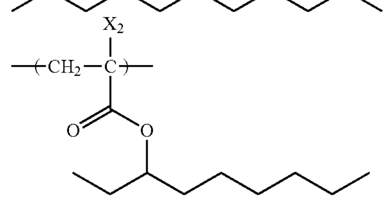
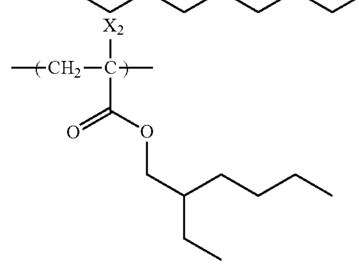
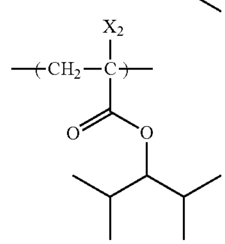
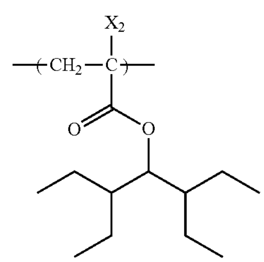
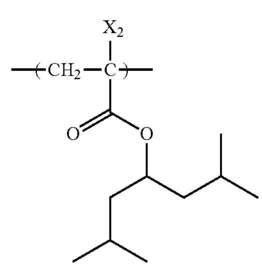

-continued

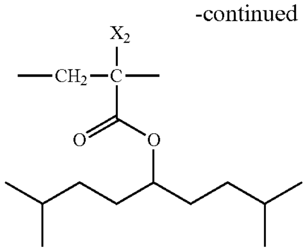

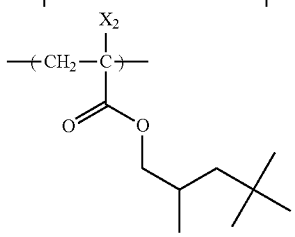

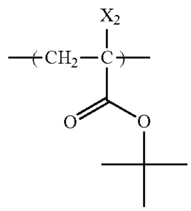

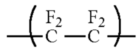

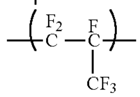

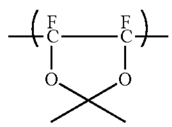

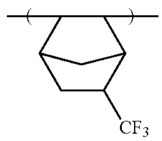

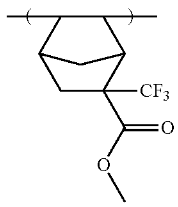

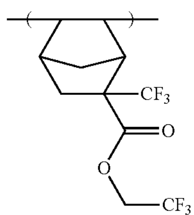

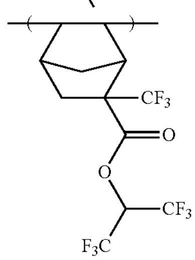

The combined hydrophobic resin (E) may contain a silicon atom. The resin preferably has an alkylsilyl structure (preferably a trialkylsilyl group) or a cyclic siloxane structure, as a silicon atom-containing partial structure.

Specific examples of the alkylsilyl structure and cyclic siloxane structure include the groups represented by the following formulae (CS-1) to (CS-3):

(CS-1)

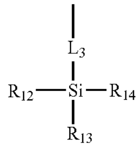

(CS-2)

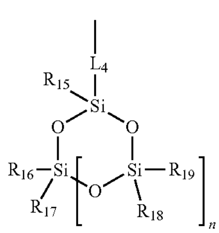

-continued (CS-3)

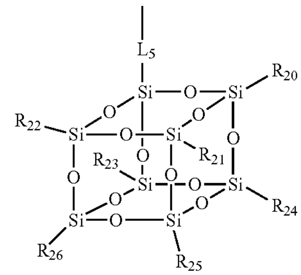

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a sole member or a combination of two or more members (preferably having a total carbon number of 12 or less), selected from the group consisting of an alkylene group, a phenylene group, an ether bond, a thioether bond, a carbonyl group, an ester bond, an amide bond, a urethane bond and a urea bond.

n represents an integer of 1 to 5. n is preferably an integer of 2 to 4.

Specific examples of the repeating unit having a group represented by formulae (CS-1) to (CS-3) are illustrated below, but the present invention is not limited thereto. In specific examples, $X_1$ represents a hydrogen atom, —$CH_3$, —F or —$CF_3$.

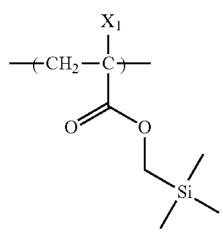

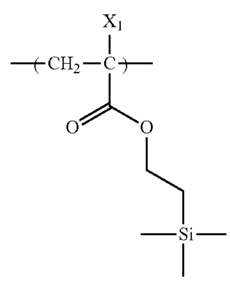

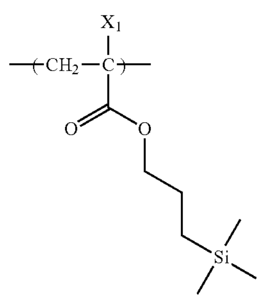

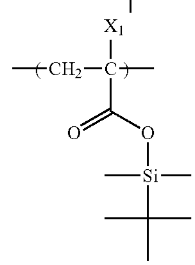

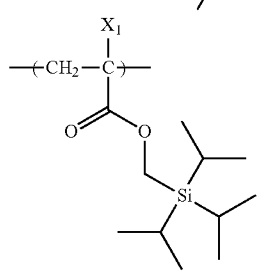

-continued

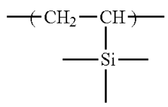

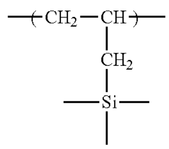

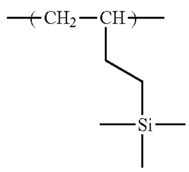

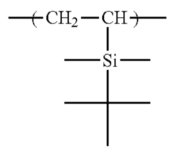

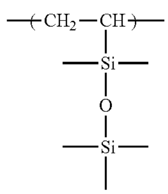

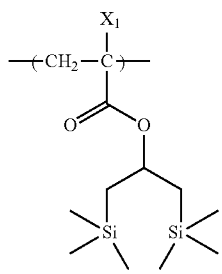

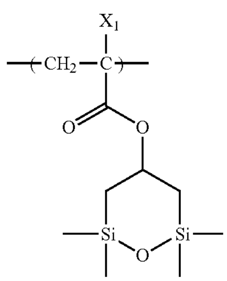

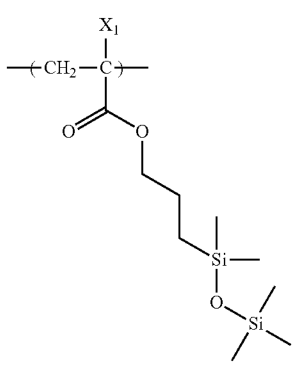

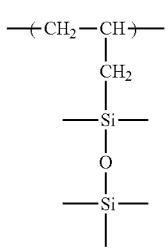

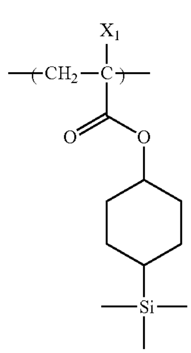

-continued

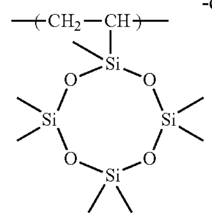

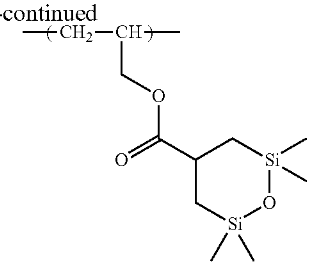

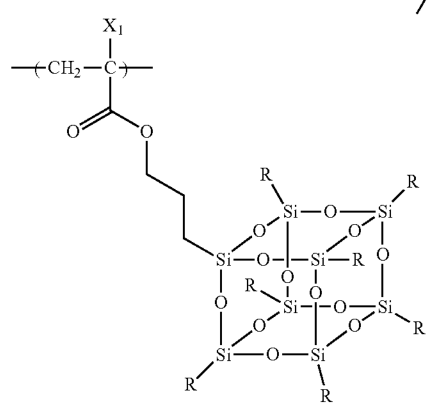

R = $CH_3$, $C_2H_5$, $C_3H_7$, $C_4H_9$

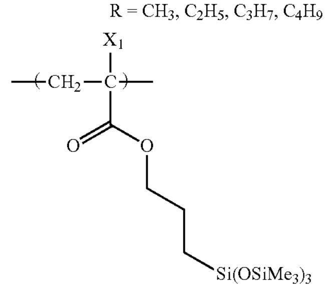

Furthermore, the combined hydrophobic resin (E) may contain at least one group selected from the group consisting of the following (x) to (z):

(x) an acid group, (y) a lactone structure-containing group, an acid anhydride group or an acid imide group, and (z) a group capable of decomposing by the action of an acid.

Examples of the acid group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred acid groups include a fluorinated alcohol group (preferably hexafluoroisopropanol), a sulfonimide group, and a bis(alkylcarbonyl)methylene group.

The repeating unit having (x) an acid group includes, for example, a repeating unit where the acid group is directly bonded to the main chain of the resin, such as repeating unit by an acrylic acid or a methacrylic acid, and a repeating unit where the acid group is bonded to the main chain of the resin through a linking group, and the acid group may be also introduced into the terminal of the polymer chain by using an acid group-containing polymerization initiator or chain transfer agent at the polymerization. All of these cases are preferred. The repeating unit having (x) an acid group may have at least either a fluorine atom or a silicon atom.

The content of the repeating unit having (x) an acid group is preferably from 1 to 50 mol %, more preferably from 3 to 35 mol %, still more preferably from 5 to 20 mol %, based on all repeating units in the combined hydrophobic resin (E).

Specific examples of the repeating unit having (x) an acid group are illustrated below, but the present invention is not limited thereto. In the formulae, Rx represents a hydrogen atom, $CH_3$, $CF_3$ or $CH_2OH$.

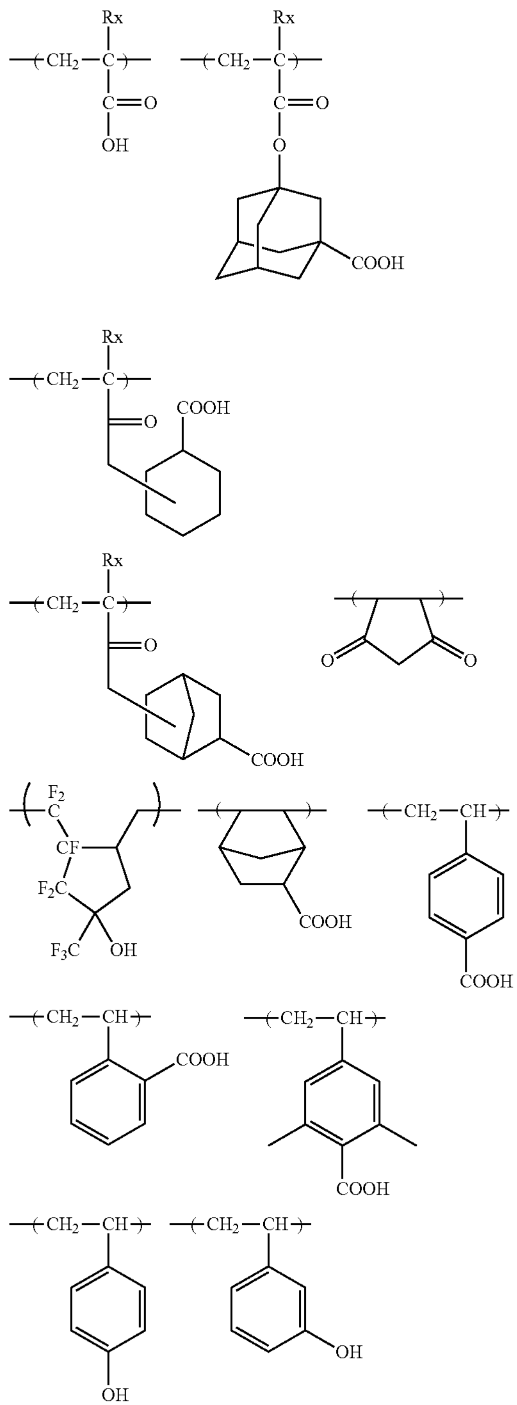

-continued

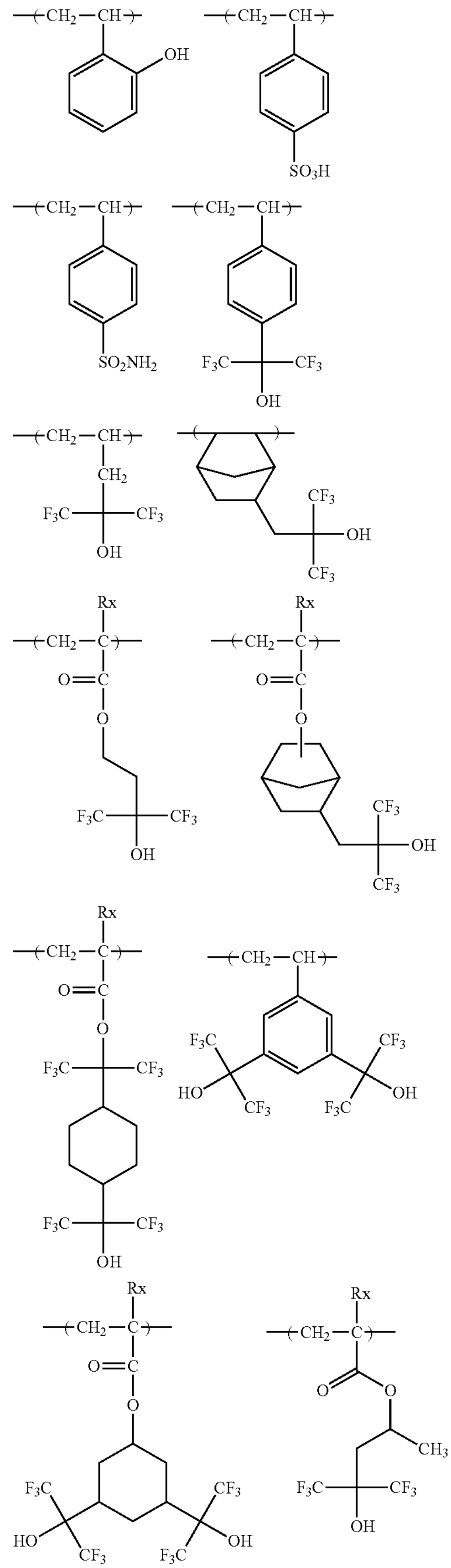

-continued

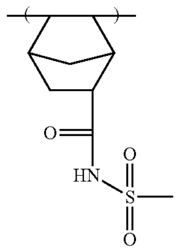

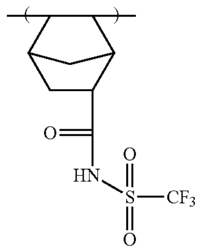

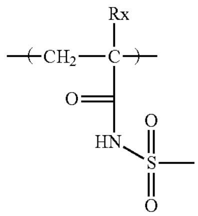

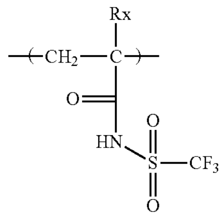

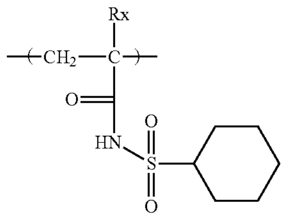

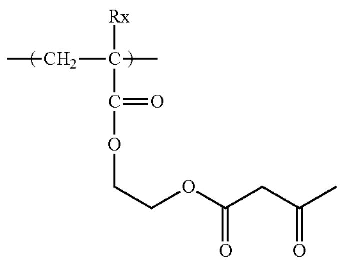

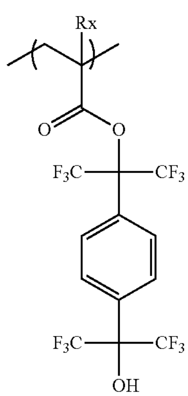

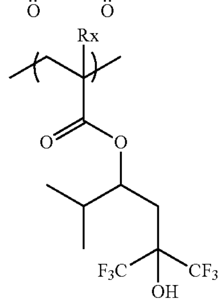

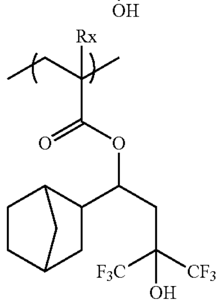

The (y) lactone structure-containing group, acid anhydride group or acid imide group is preferably a lactone structure-containing group.

The repeating unit containing such a group is, for example, a repeating unit where the group is directly bonded to the main chain of the resin, such as repeating unit by an acrylic acid ester or a methacrylic acid ester. This repeating unit may be a repeating unit where the group is bonded to the main chain of the resin through a linking group. Alternatively, in this repeating unit, the group may be introduced into the terminal of the resin by using a polymerization initiator or chain transfer agent containing the group at the polymerization.

Examples of the repeating unit having a lactone structure-containing group are the same as those of the repeating unit having a lactone structure described above in the paragraph of the acid-decomposable resin (A).

The content of the repeating unit having a lactone structure-containing group, an acid anhydride group or an acid imide group is preferably from 1 to 100 mol %, more preferably from 3 to 98 mol %, still more preferably from 5 to 95 mol %, based on all repeating units in the combined hydrophobic resin (E).

Examples of the repeating unit having (z) a group capable of decomposing by the action of an acid, contained in the combined hydrophobic resin (E), are the same as those of the repeating unit having an acid-decomposable group described for the resin (A). The repeating unit having (z) a group capable of decomposing by the action of an acid may contain at least either a fluorine atom or a silicon atom. In the combined hydrophobic resin (E), the content of the repeating unit having (z) a group capable of decomposing by the action of an acid is preferably from 1 to 80 mol %, more preferably from 10 to 80 mol %, still more preferably from 20 to 60 mol %, based on all repeating units in the resin (E).

The combined hydrophobic resin (E) may further contain a repeating unit represented by the following formula (III):

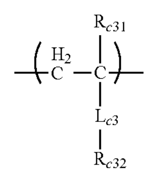

(III)

In formula (III), $R_{c31}$ represents a hydrogen atom, an alkyl group (which may be substituted with a fluorine atom or the like), a cyano group or a —$CH_2$—O—$R_{ac2}$ group, wherein $R_{ac2}$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group, a cycloalkenyl group or an aryl group. These groups may be substituted with a fluorine atom or a silicon atom-containing group.

$L_{c3}$ represents a single bond or a divalent linking group.

In formula (III), the alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The aryl group is preferably an aryl group having a carbon number of 6 to 20, more preferably a phenyl group or a naphthyl group, and these groups may have a substituent.

$R_{c32}$ is preferably an unsubstituted alkyl group or an alkyl group substituted with a fluorine atom.

The divalent linking group of $L_{c3}$ is preferably an alkylene group (preferably having a carbon number of 1 to 5), an ether bond, a phenylene group or an ester bond (a group represented by —COO—).

The content of the repeating unit represented by formula (III) is preferably from 1 to 100 mol %, more preferably from 10 to 90 mol %, still more preferably from 30 to 70 mol %, based on all repeating units in the hydrophobic resin.

It is also preferred that the combined hydrophobic resin (E) further contains a repeating unit represented by the following formula (CII-AB):

(CII-AB)

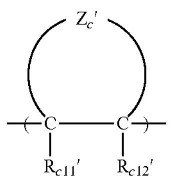

In formula (CII-AB), each of $R_{c11}$' and $R_{c12}$' independently represents a hydrogen atom, a cyano group, a halogen atom, or an alkyl group.

$Z_c$' represents an atomic group for forming an alicyclic structure containing two carbon atoms (C—C) to which $Z_c$' is bonded.

The content of the repeating unit represented by formula (CII-AB) is preferably from 1 to 100 mol %, more preferably from 10 to 90 mol %, still more preferably from 30 to 70 mol %, based on all repeating units in the hydrophobic resin.

Specific examples of the repeating units represented by formulae (III) and (CII-AB) are illustrated below, but the present invention is not limited thereto. In the formulae, Ra represents H, $CH_3$, $CH_2OH$, $CF_3$ or CN.

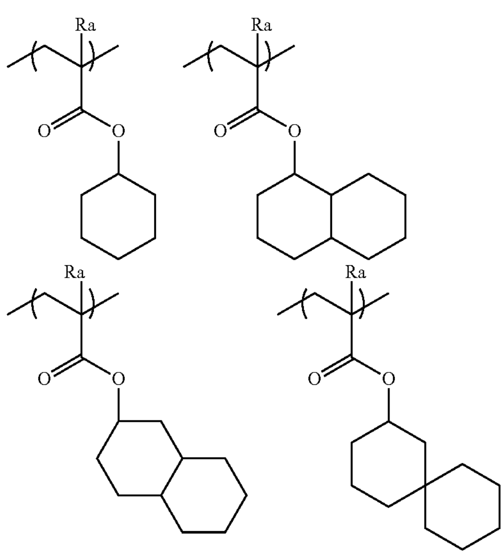

-continued

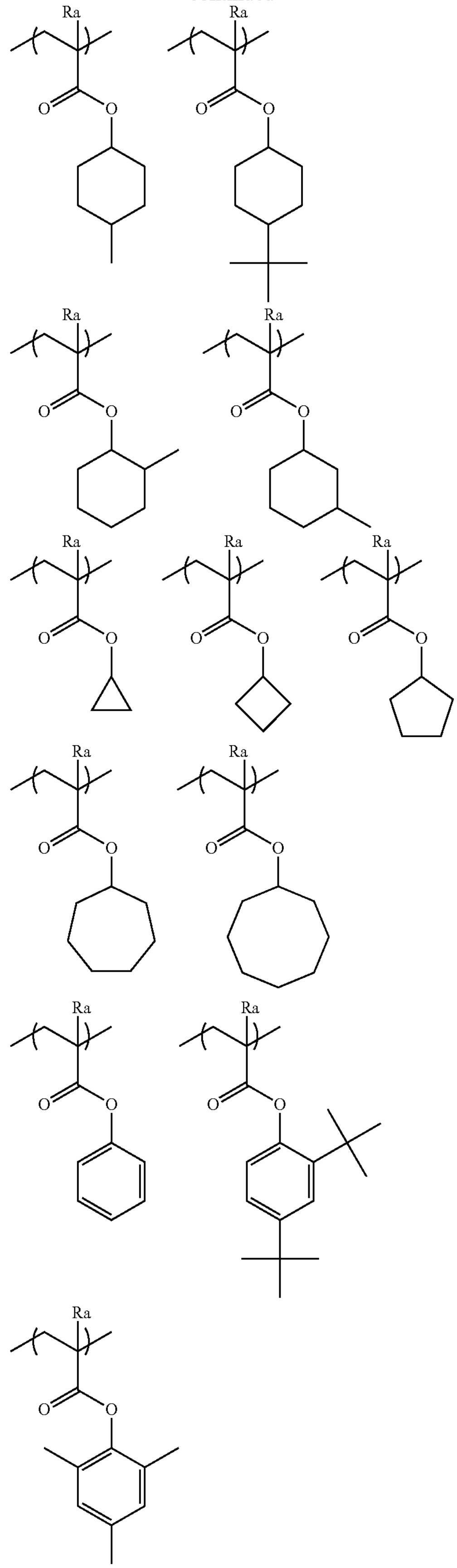

-continued

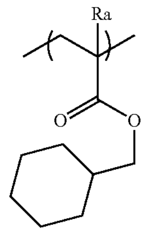

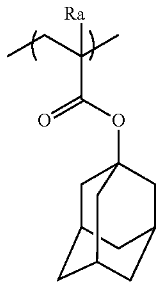

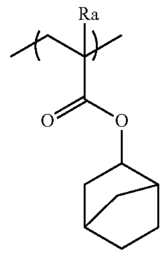

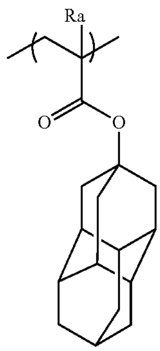

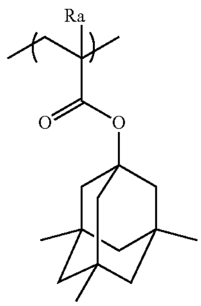

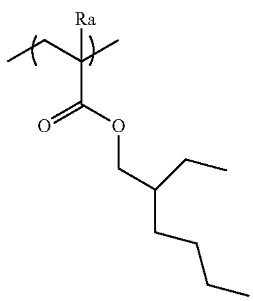

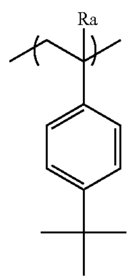

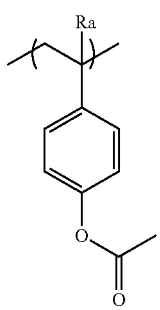

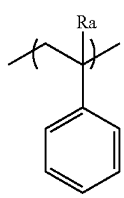

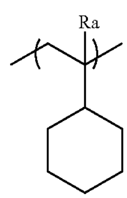

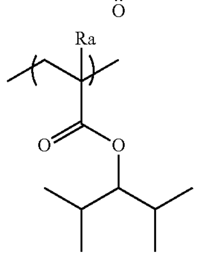

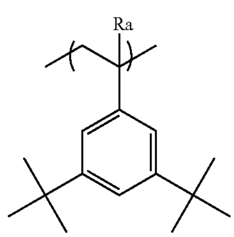

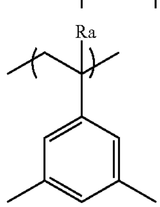

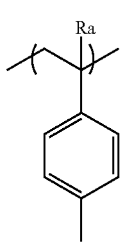

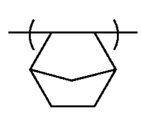

-continued

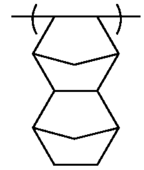

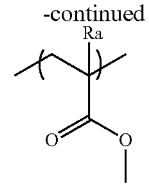

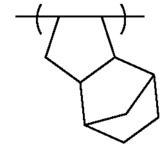

In the case where the combined hydrophobic resin (E) contains a fluorine atom, the fluorine atom content is preferably from 5 to 80 mass %, more preferably from 10 to 80 mass %, based on the weight average molecular weight of the combined hydrophobic resin (E). Also, the fluorine atom-containing repeating unit preferably accounts for 10 to 100 mol %, more preferably from 30 to 100 mol %, based on all repeating units contained in the combined hydrophobic resin (E).

In the case where the combined hydrophobic resin (E) contains a silicon atom, the silicon atom content is preferably from 2 to 50 mass %, more preferably from 2 to 30 mass %, based on the weight average molecular weight of the combined hydrophobic resin (E). Also, the silicon atom-containing repeating unit preferably accounts for 10 to 100 mol %, more preferably from 20 to 100 mol %, based on all repeating units contained in the combined hydrophobic resin (E).

The weight average molecular of the combined hydrophobic resin (E) is, in terms of standard polystyrene, preferably from 1,000 to 100,000, more preferably from 1,000 to 50,000, still more preferably from 2,000 to 15,000.

As for the combined hydrophobic resin (E), one resin may be used, or a plurality of resins may be used in combination.

The content of the combined hydrophobic resin (E) in the composition is preferably from 0.01 to 10 mass %, more preferably from 0.05 to 8 mass %, still more preferably from 0.1 to 5 mass %, based on the total solid content of the composition of the present invention.

In the combined hydrophobic resin (E), similarly to the resin (A), it is of course preferred that the content of impurities such as metal is small, but the content of residual monomers or oligomer components is also preferably from 0.01 to 5 mass %, more preferably from 0.01 to 3 mass %, still more preferably from 0.05 to 1 mass %. By satisfying this range, an actinic ray-sensitive or radiation-sensitive resin composition free from in-liquid extraneous substances and change with aging of sensitivity or the like can be obtained. Furthermore, in view of resolution, resist profile, side wall of resist pattern, roughness and the like, the molecular weight distribution (Mw/Mn, sometimes referred to as "polydispersity") is preferably from 1 to 5, more preferably from 1 to 3, still more preferably from 1 to 2.

As the combined hydrophobic resin (E), various commercial products may be used, or the resin may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred.

The reaction solvent, the polymerization initiator, the reaction conditions (such as temperature and concentration) and the method for purification after reaction are the same as those described for the resin (A), but in the synthesis of the combined hydrophobic resin (E), the concentration at the reaction is preferably from 30 to 50 mass %.

Specific examples of the combined hydrophobic resin (E) are illustrated below. Also, the molar ratio of repeating units (corresponding to repeating units starting from the left), weight average molecular weight and polydispersity of each resin are shown in Tables 1 and 2 later.

(HR-1)

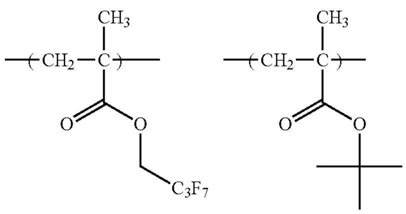

(HR-2)

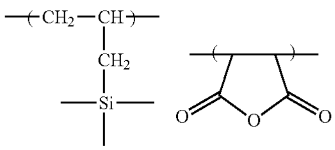

(HR-3)

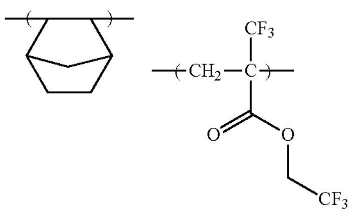

(HR-4)

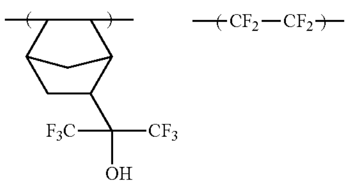

(HR-5)

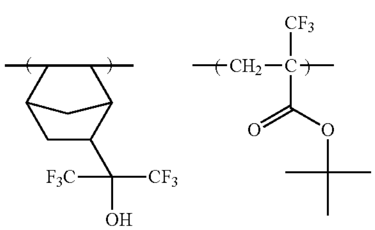

(HR-6)

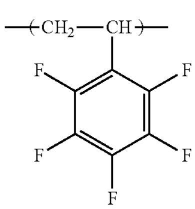

(HR-7)

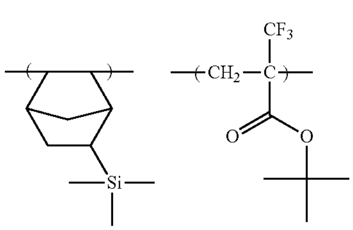

-continued (HR-8)

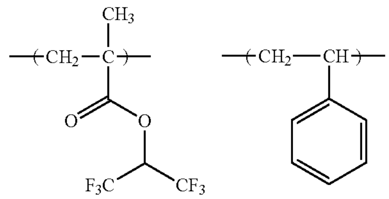

(HR-9)

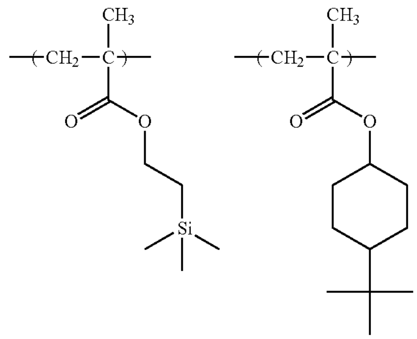

(HR-10)

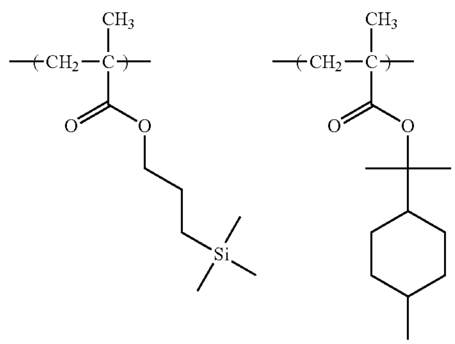

(HR-11)

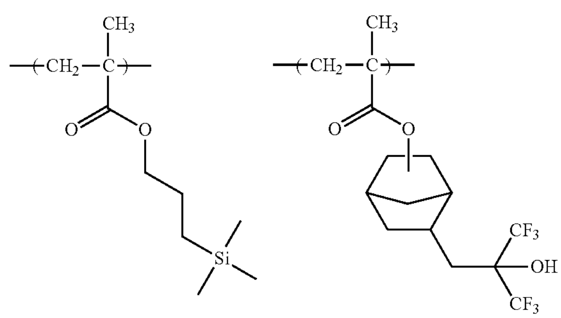

(HR-12)

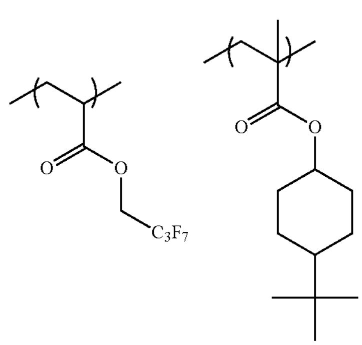

-continued
(HR-13)
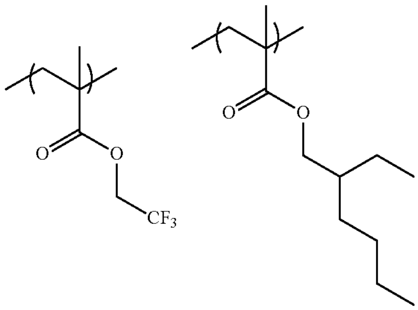
(HR-14)
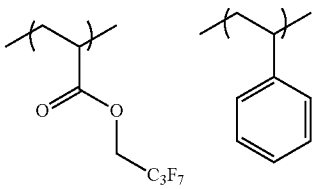
(HR-15)
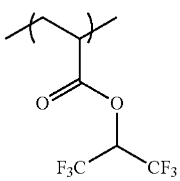
(HR-16)
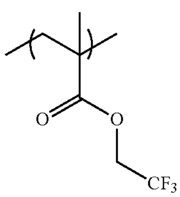
(HR-17)
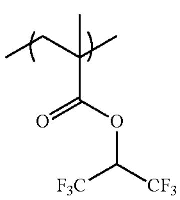
(HR-18)
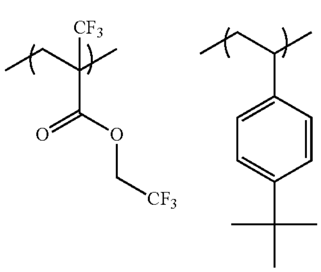
-continued
(HR-19)
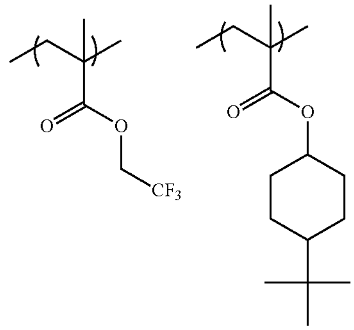
(HR-20)
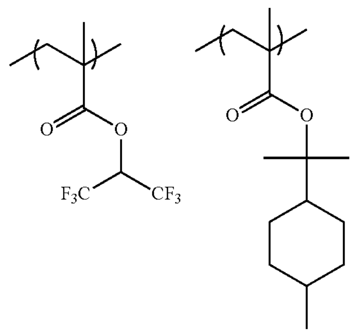
(HR-21)
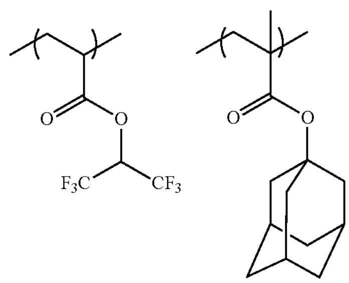
(HR-22)
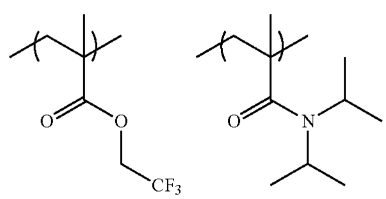
(HR-23)
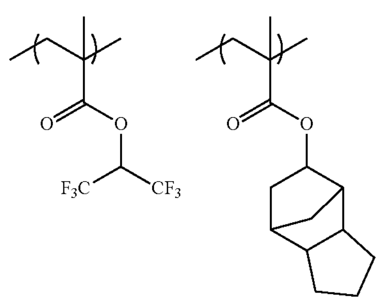

-continued
(HR-24)
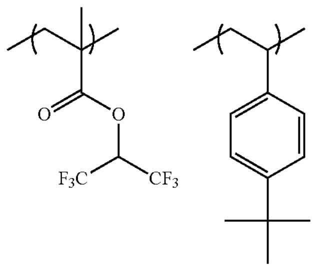
(HR-25)
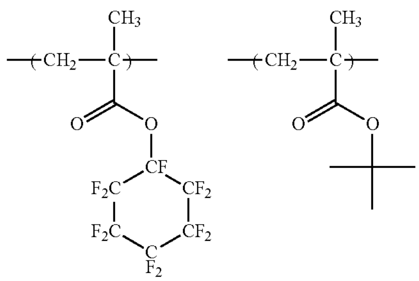
(HR-26)
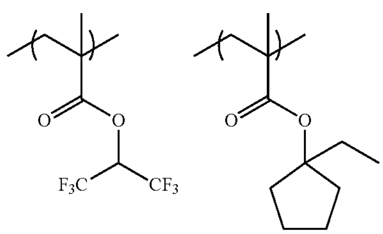
(HR-27)
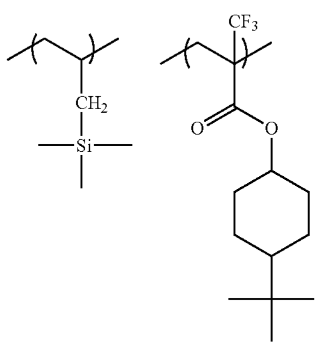
(HR-28)
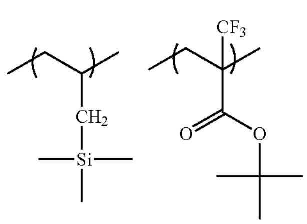
(HR-29)
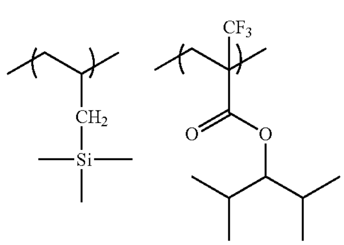
-continued
(HR-30)
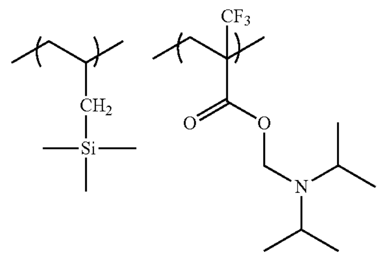
(HR-31)
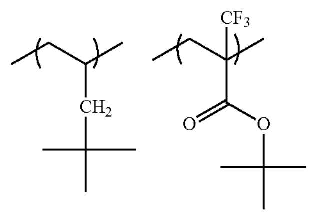
(HR-32)
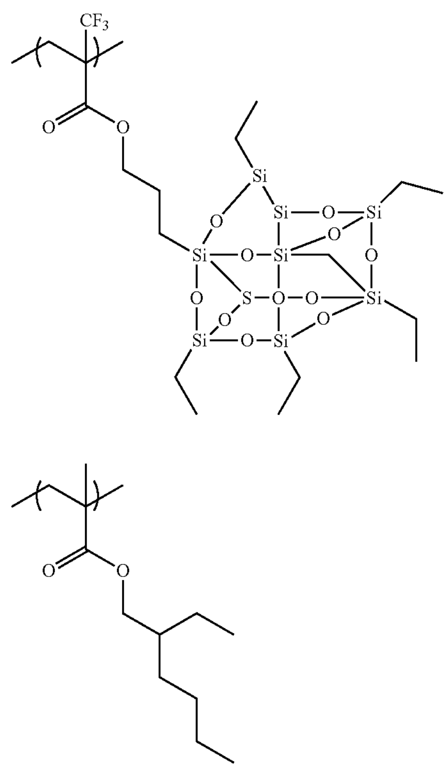
(HR-33)
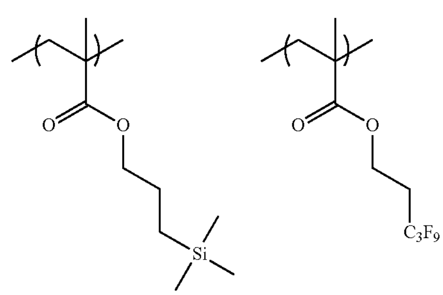

-continued
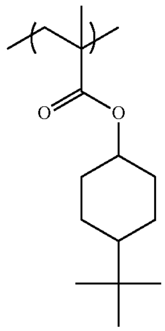
(HR-34)
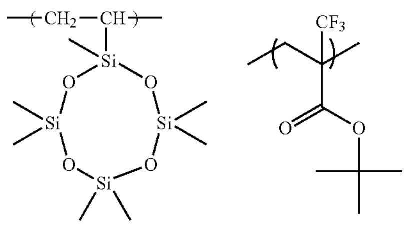
(HR-35)
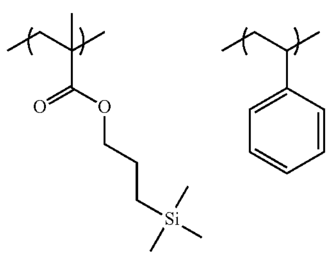
(HR-36)
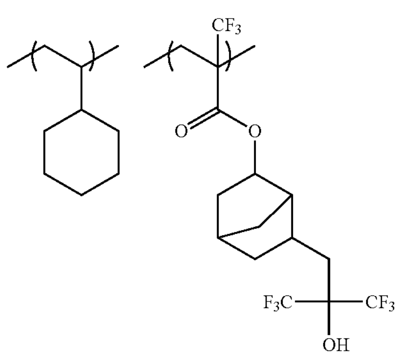
(HR-37)
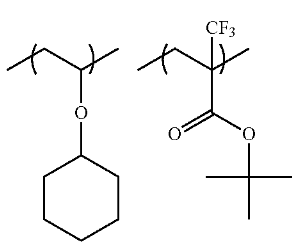
-continued
(HR-38)
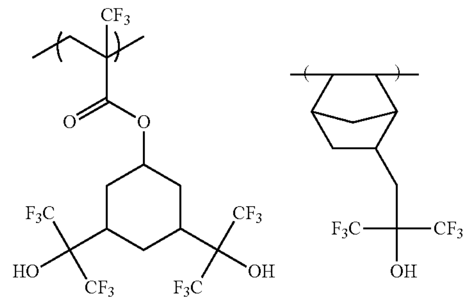
(HR-39)
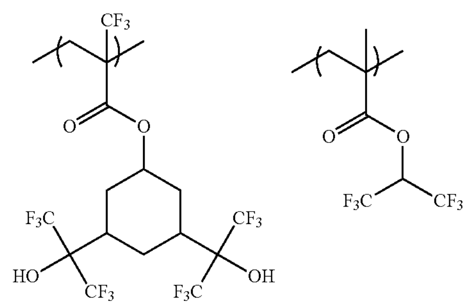
(HR-40)
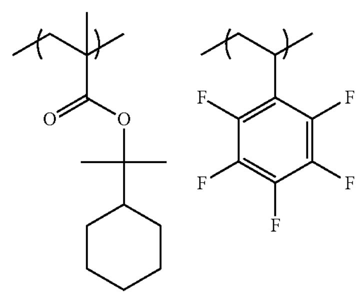
(HR-41)
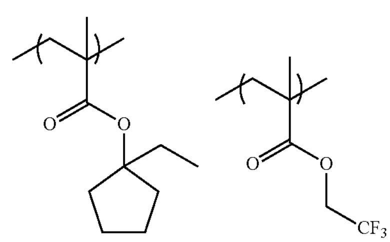
(HR-42)
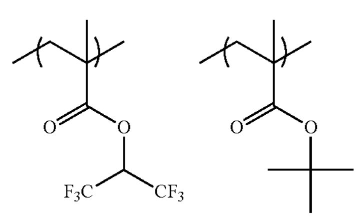

-continued
(HR-43)
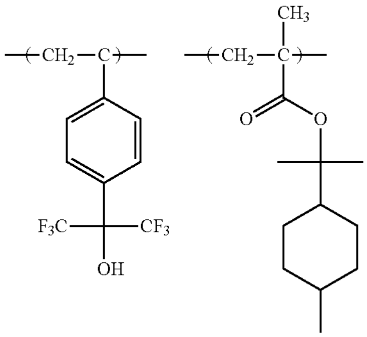
(HR-44)
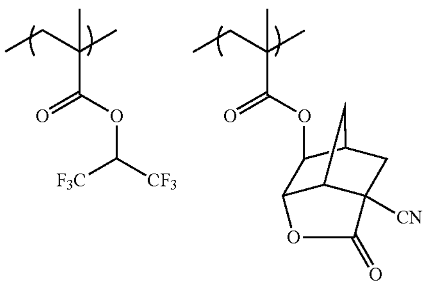
(HR-45)
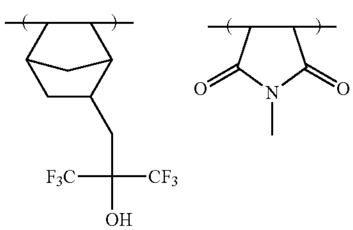
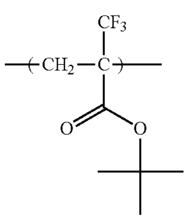
(HR-46)
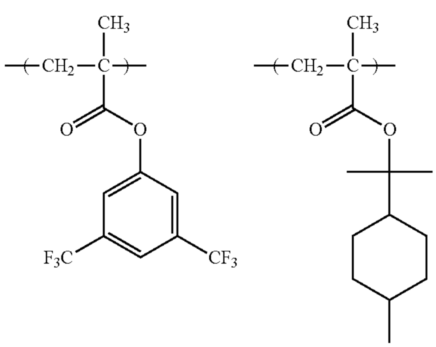
-continued
(HR-47)
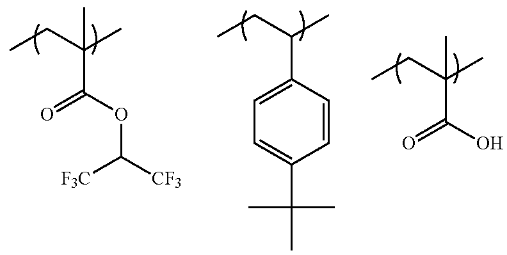
(HR-48)
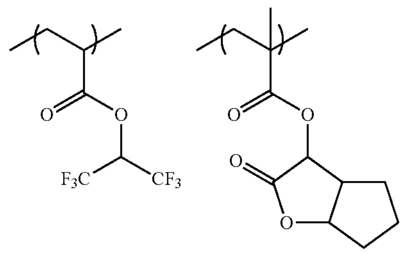
(HR-49)
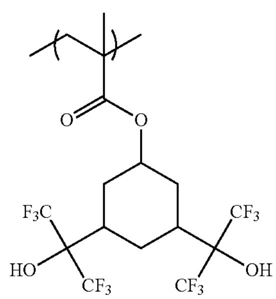
(HR-50)
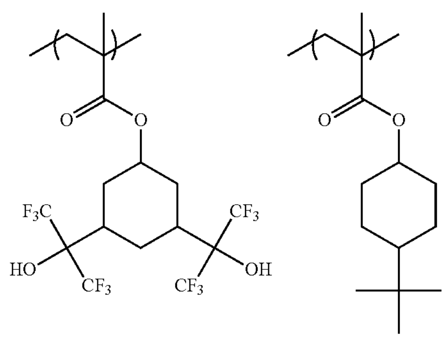
(HR-51)
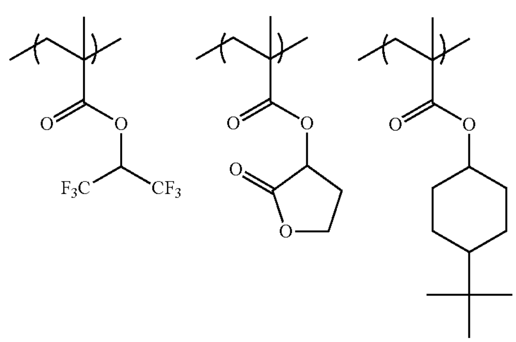

-continued
(HR-52)
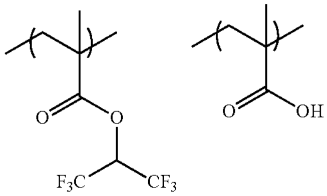
(HR-53)
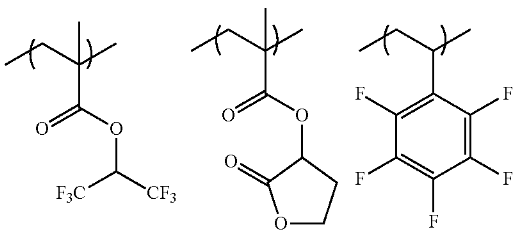
(HR-54)
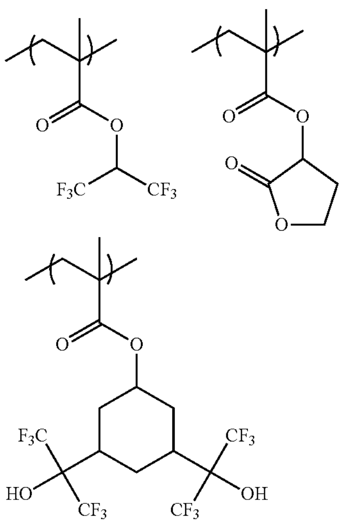
(HR-55)
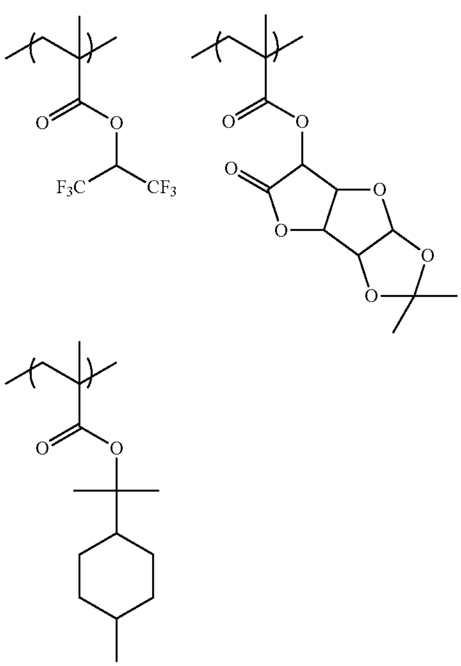
-continued
(HR-56)
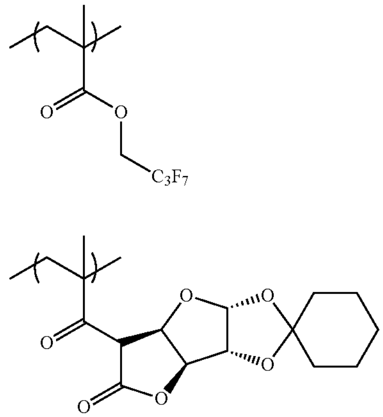
(HR-57)
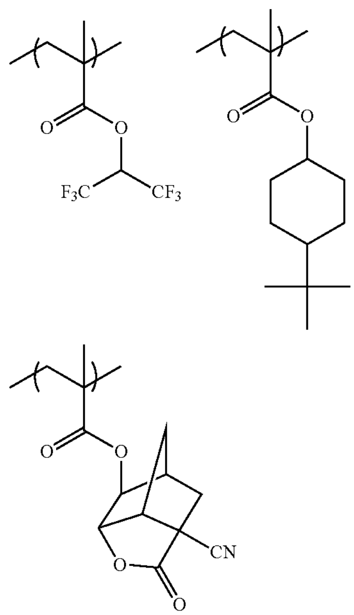
(HR-58)
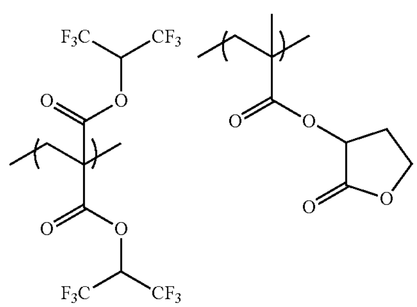
(HR-59)
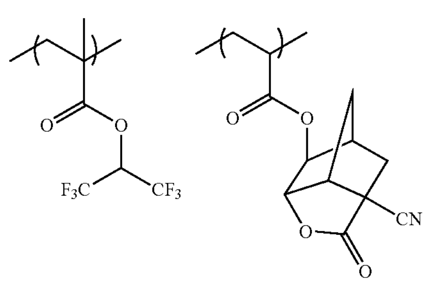

-continued
(HR-60)
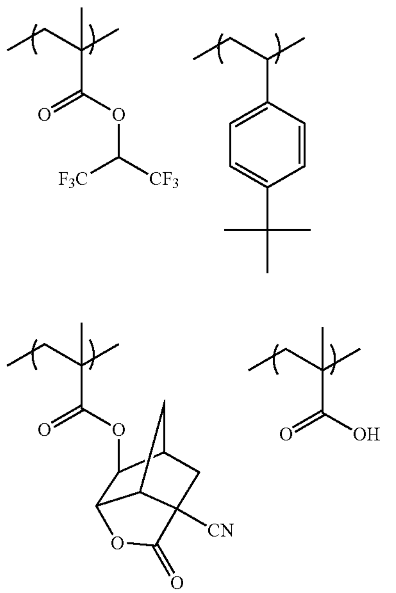
(HR-61)
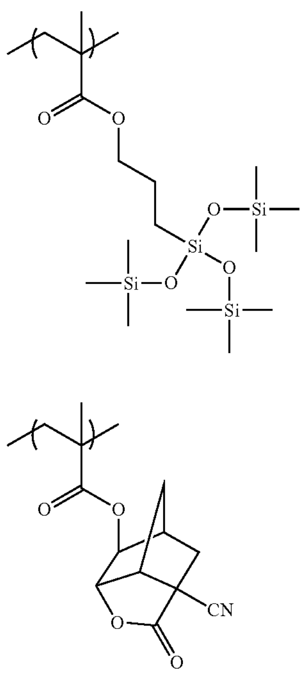
(HR-62)
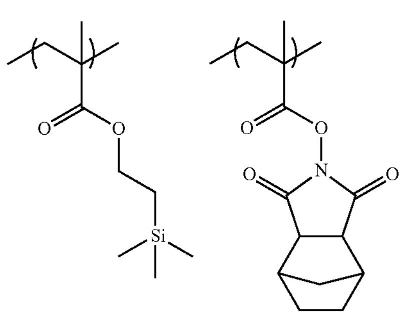
-continued
(HR-63)
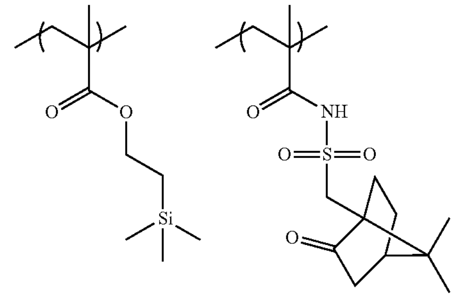
(HR-64)
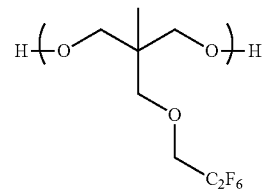
(HR-65)
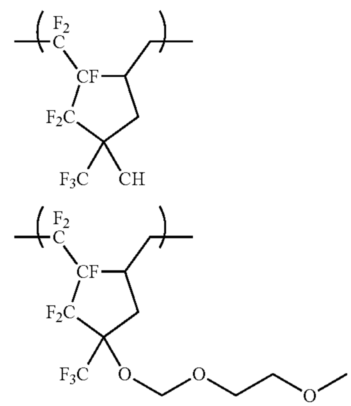
(HR-66)
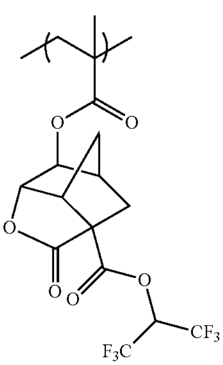
(HR-67)
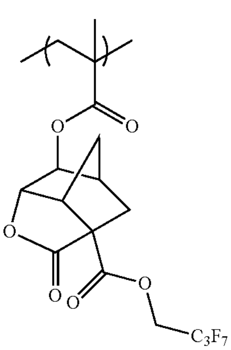

(HR-68)
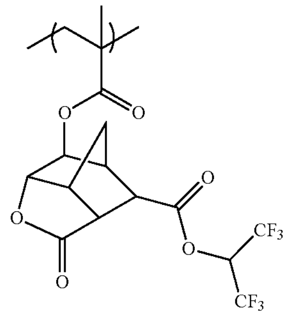
(HR-69)
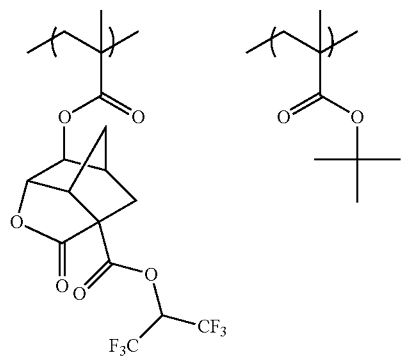
(HR-70)
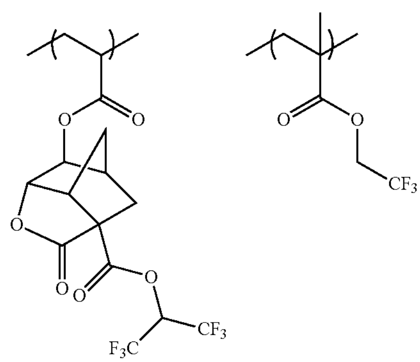
(HR-71)
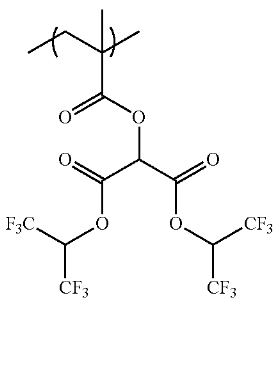
(HR-72)
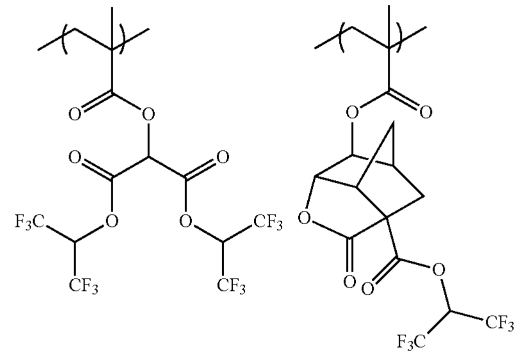
(HR-73)
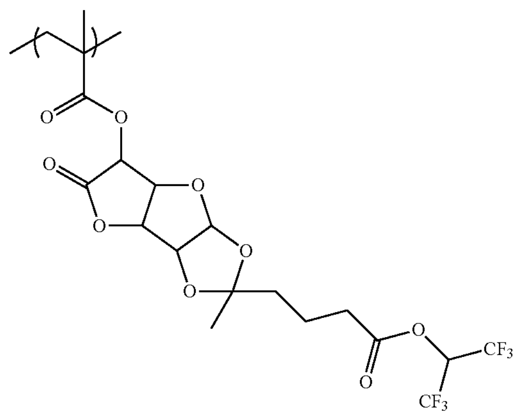
(HR-74)
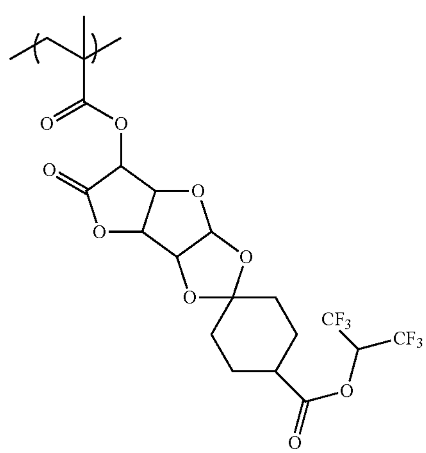

-continued
(HR-75)
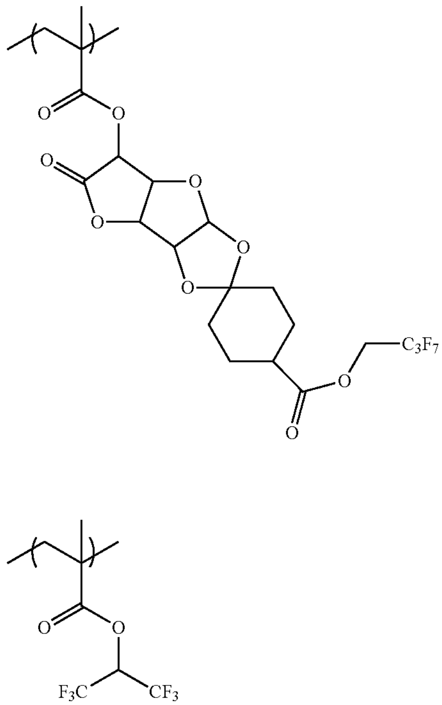
(HR-76)
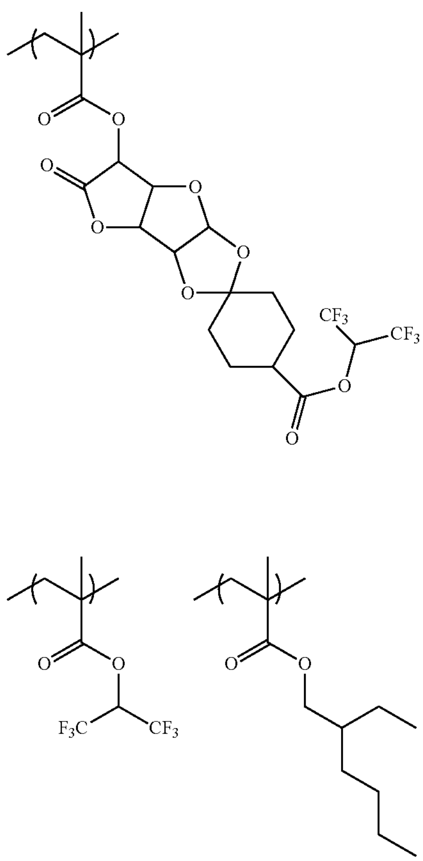
-continued
(HR-77)
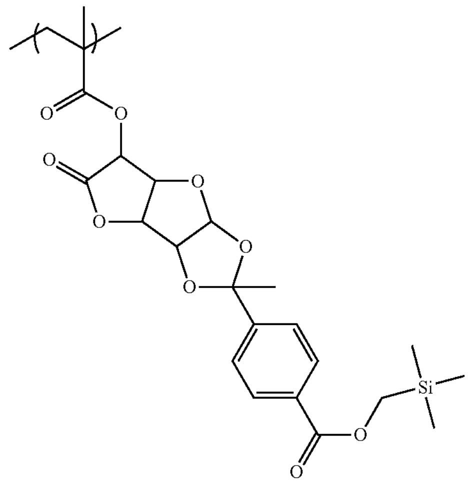
(HR-78)
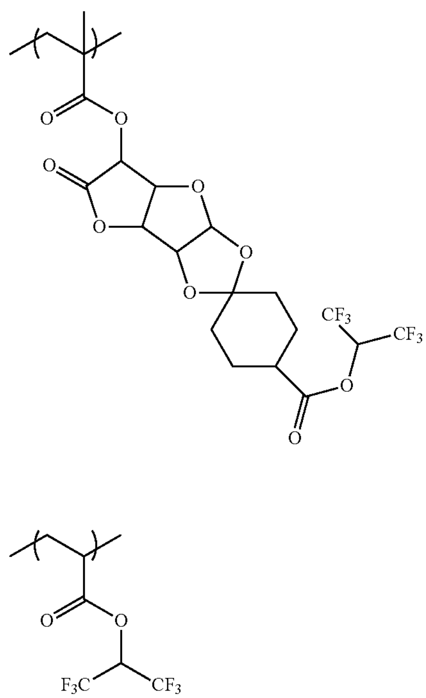
(HR-79)
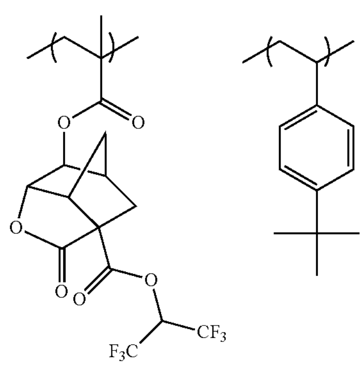

-continued
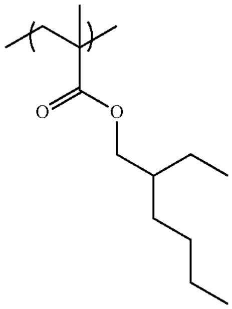
(HR-80)
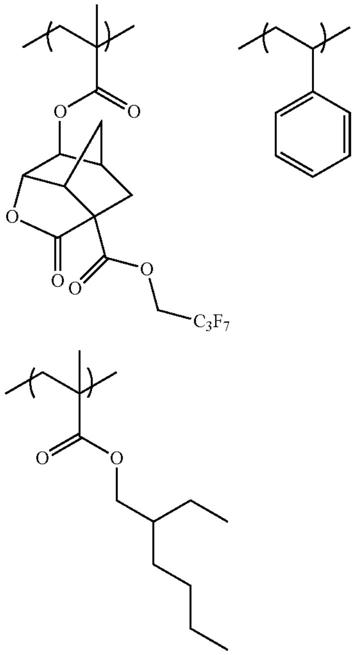
(HR-81)
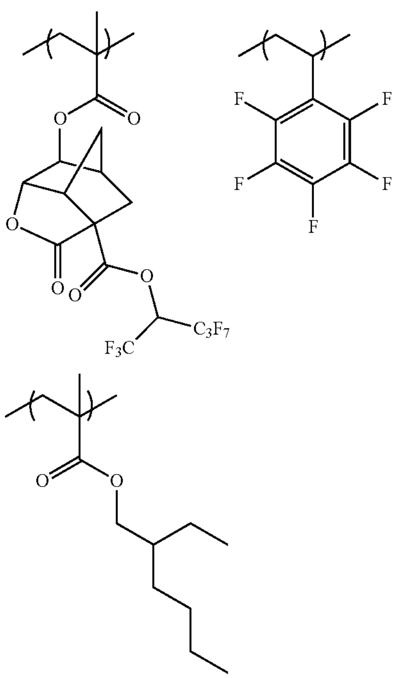
-continued
(HR-82)
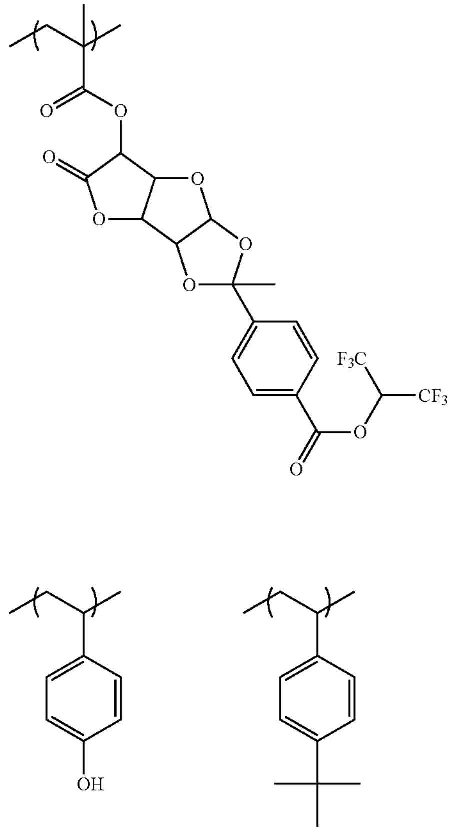
(HR-83)
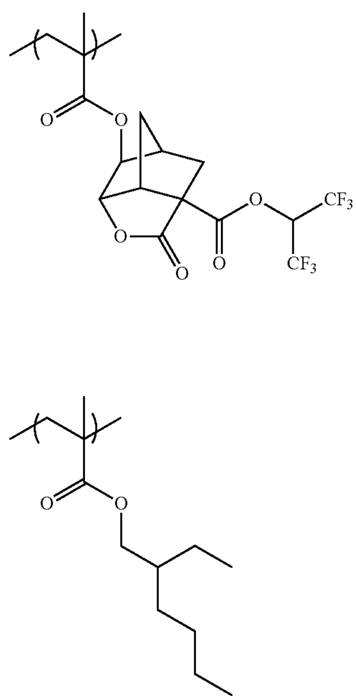

-continued
(HR-84)
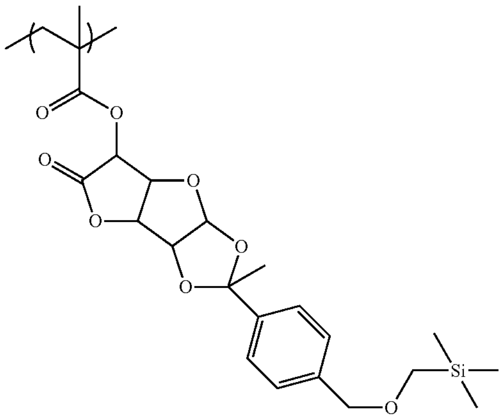
(HR-85)
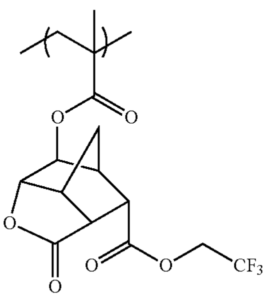
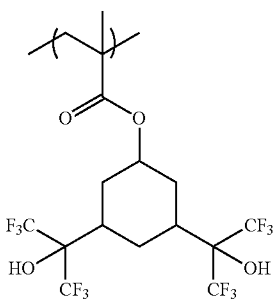
(HR-86)
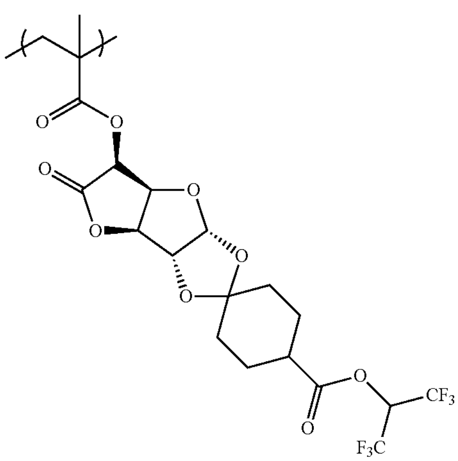
-continued
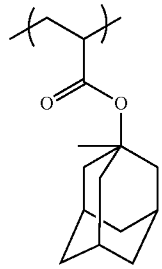
(HR-87)
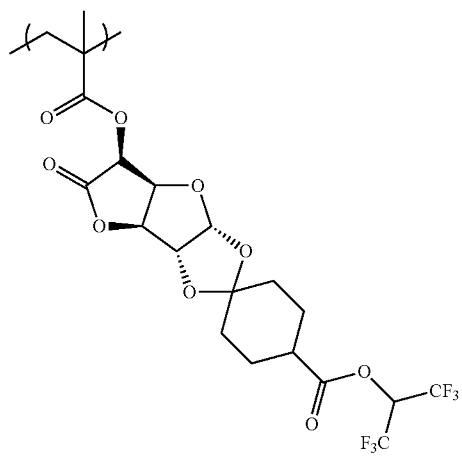
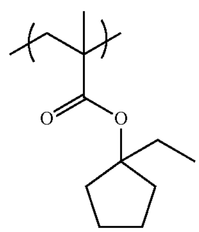
(HR-89)
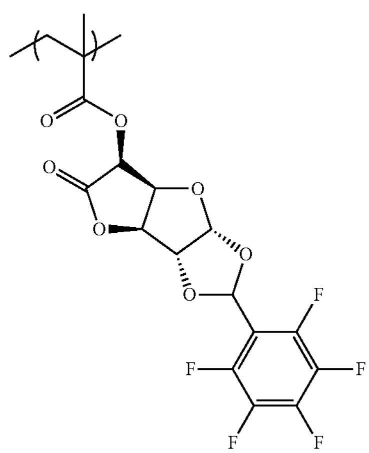

-continued (HR-90)

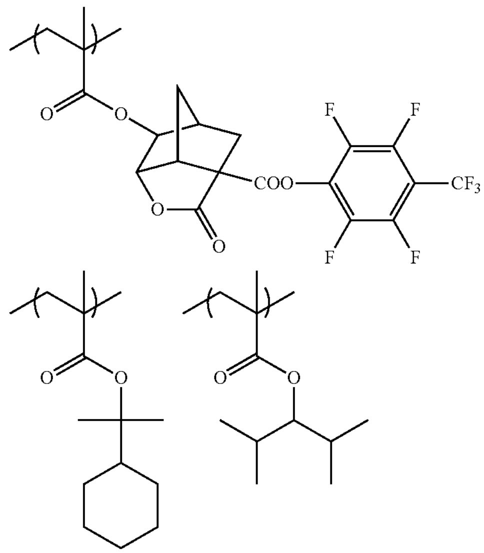

TABLE 1

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |

TABLE 1-continued

| Resin | Composition | Mw | Mw/Mn |
|---|---|---|---|
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

[5-1] (N) Basic compound or ammonium salt compound whose basicity decreases upon irradiation with an actinic ray or radiation The actinic ray-sensitive or radiation-sensitive resin composition of the present invention preferably contains a basic compound or ammonium salt compound whose basicity decreases upon irradiation with an actinic ray or radiation (hereinafter sometimes referred to as "compound (N)").

The compound (N) is preferably (N-1) a compound having a basic functional group or an ammonium group and a group capable of generating an acidic functional group upon irradiation with an actinic ray or radiation. That is, the compound (N) is preferably a basic compound having a basic functional group and a group capable of generating an acidic functional group upon irradiation with an actinic ray or radiation, or an ammonium salt compound having an ammonium group and a group capable of generating an acidic functional group upon irradiation with an actinic ray or radiation.

Specific examples thereof include a compound where an anion after elimination of a proton from an acidic functional of a compound having a basic functional group or an ammonium group and an acidic functional group forms a salt with an onium cation.

Examples of the basic functional group include an atomic group containing a crown ether structure, a primary to tertiary amine structure or a nitrogen-containing heterocyclic structure (e.g., pyridine, imidazole, pyrazine). Also, as for the preferred structure of the ammonium group, examples of the ammonium group include an atomic group containing a primary to tertiary ammonium structure, a pyridinium structure, an imidazolinium structure or a pyrazinium structure. The basic functional group is preferably a functional group having a nitrogen atom, more preferably a structure having a primary to tertiary amino group or a nitrogen-containing heterocyclic structure. In these structures, from the standpoint of enhancing the basicity, it is preferred that all atoms adjacent to the nitrogen atom contained in the structure are a carbon atom or a hydrogen atom. Also, in view of enhancing the basicity, an electron-withdrawing functional group (such as carbonyl group, sulfonyl group, cyano group and halogen atom) is preferably not bonded directly to the nitrogen atom.

Examples of the acidic functional group include a carboxylic acid group, a sulfonic acid group, and a group having a —X—NH—X— (X═CO or $SO_2$) structure.

Examples of the onium cation include sulfonium cation and iodonium cation and specifically include those described as the cation moiety in formulae (ZI) and (ZII) of the acid generator (B).

More specifically, the compound which is generated by the decomposition of the compound (N) or (N-1) upon irradiation with an actinic ray or radiation and whose basicity is decreased includes a compound represented by the following formulae (PA-I), (PA-II) or (PA-III), and from the standpoint that excellent effects can be attained at a high level in terms of all of LWR, local pattern dimension uniformity and DOF, a compound represented by formula (PA-II) or (PA-III) is preferred.

The compound represented by formula (PA-I) is described below.

$$Q\text{-}A_1\text{-}(X)_n\text{—}B\text{—}R \qquad \text{(PA-I)}$$

In formula (PA-I), $A_1$ represents a single bond or a divalent linking group.

Q represents $—SO_3H$ or $—CO_2H$. Q corresponds to an acidic functional group that is generated upon irradiation with an actinic ray or radiation.

X represents $—SO_2—$ or —CO—.

n represents 0 or 1.

B represents a single bond, an oxygen atom or —N(Rx)-.

Rx represents a hydrogen atom or a monovalent organic group.

R represents a monovalent organic group having a basic functional group, or a monovalent organic group having an ammonium group.

The divalent linking group of $A_1$ is preferably a divalent organic group having a carbon number of 2 to 12, and examples thereof include an alkylene group and a phenylene group. An alkylene group having at least one fluorine atom is preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is substituted for by a fluorine atom, more preferably an alkylene group where the carbon atom bonded to the Q site has a fluorine atom, still more preferably a perfluoroalkylene group, yet still more preferably a perfluoroethylene group, a perfluoropropylene group or a perfluorobutylene group.

The monovalent organic group in Rx is preferably an organic group having a carbon number of 4 to 30, and examples thereof include an alkyl group, a cycloalkyl group, an aryl group, an aralkyl group and an alkenyl group.

The alkyl group in Rx may have a substituent and is preferably a linear or branched alkyl group having a carbon number of 1 to 20, and the alkyl chain may contain an oxygen atom, a sulfur atom or a nitrogen atom.

Here, the alkyl group having a substituent includes particularly a group where a cycloalkyl group is substituted on a linear or branched alkyl group (for example, an adamantylmethyl group, an adamantylethyl group, a cyclohexylethyl group and a camphor residue).

The cycloalkyl group in Rx may have a substituent and is preferably a cycloalkyl group having a carbon number of 3 to 20, and the ring may contain an oxygen atom.

The aryl group in Rx may have a substituent and is preferably an aryl group having a carbon number of 6 to 14.

The aralkyl group in Rx may have a substituent and is preferably an aralkyl group having a carbon number of 7 to 20.

The alkenyl group in Rx may have a substituent, and examples thereof include a group having a double bond at an arbitrary position of the alkyl group described as Rx.

Preferred examples of the partial structure of the basic functional group include a crown ether structure, a primary to tertiary amine structure, and a nitrogen-containing heterocyclic structure (e.g., pyridine, imidazole, pyrazine).

Preferred examples of the partial structure of the ammonium group include a primary to tertiary ammonium structure, a pyridinium structure, an imidazolinium structure, and a pyrazinium structure.

The basic functional group is preferably a functional group having a nitrogen atom, more preferably a structure having a primary to tertiary amino group or a nitrogen-containing heterocyclic structure. In such a structure, from the standpoint of enhancing the basicity, it is preferred that all atoms adjacent to the nitrogen atom contained in the structure are a carbon atom or a hydrogen atom. Also, in view of enhancing the basicity, an electron-withdrawing functional group (e.g., carbonyl group, sulfonyl group, cyano group, halogen atom) is preferably not bonded directly to the nitrogen atom.

The monovalent organic group in the monovalent organic group (group R) containing such a structure is preferably an organic group having a carbon number of 4 to 30, and examples thereof include an alkyl group, a cycloalkyl group, an aryl group, an aralkyl group and an alkenyl group. Each of these groups may have a substituent.

Examples of the alkyl group, cycloalkyl group, aryl group, aralkyl group and alkenyl group in the alkyl group, cycloalkyl group, aryl group, aralkyl group and alkenyl group each containing a basic functional group or an ammonium group of R are the same as those of the alkyl group, cycloalkyl group, aryl group, aralkyl group and alkenyl group described as Rx.

Examples of the substituent which each of the groups above may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20).

The cyclic structure in the aryl group, cycloalkyl group and the like may further have an alkyl group (preferably having a carbon number of 1 to 20) as a substituent. The aminoacyl group may further have one or two alkyl groups (preferably having a carbon number of 1 to 20) as a substituent.

When B is —N(Rx)-, R and Rx are preferably combined to form a ring. By forming a ring structure, the stability is enhanced and the composition using this compound is also increased in the storage stability. The number of carbons constituting the ring is preferably from 4 to 20, and the ring may be monocyclic or polycyclic and may contain an oxygen atom, a sulfur atom or a nitrogen atom.

Examples of the monocyclic structure include a 4- to 8-membered ring containing a nitrogen atom. Examples of the polycyclic structure include a structure formed by combining two monocyclic structures or three or more monocyclic structures. The monocyclic structure and polycyclic structure may have a substituent, and preferred examples of the substituent include a halogen atom, a hydroxyl group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 15), an acyloxy group (preferably having a carbon number of 2 to 15), an alkoxycarbonyl group (preferably having a carbon number of 2 to 15), and an aminoacyl group (preferably having a carbon number of 2 to 20). The cyclic structure in the aryl group, cycloalkyl group and the like may further have an alkyl group (preferably having a carbon number of 1 to 15) as a substituent. The aminoacyl group may have one or two alkyl groups (preferably having a carbon number of 1 to 15) as a substituent.

Out of the compounds represented by formula (PA-I), a compound where the Q site is a sulfonic acid can be synthesized using a general sulfonamidation reaction. For example, this compound can be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through a reaction with an amine compound.

The compound represented by formula (PA-II) is described below.

$$Q_1\text{-}X_1\text{—NH—}X_2\text{-}Q_2 \qquad \text{(PA-II)}$$

In formula (PA-II), each of $Q_1$ and $Q_2$ independently represents a monovalent organic group, provided that either one of $Q_1$ and $Q_2$ has a basic functional group. It is also possible that $Q_1$ and $Q_2$ are combined to form a ring and the ring formed has a basic functional group.

Each of $X_1$ and $X_2$ independently represents —CO— or —$SO_2$—.

Here, —NH— corresponds to an acidic functional group that is generated upon irradiation with an actinic ray or radiation.

In formula (PA-II), the monovalent organic group of $Q_1$ and $Q_2$ is preferably an organic group having a carbon number of 1 to 40, and examples thereof include an alkyl group, a cycloalkyl group, an aryl group, an aralkyl group, and an alkenyl group.

The alkyl group of $Q_1$ and $Q_2$ may have a substituent and is preferably a linear or branched alkyl group having a carbon number of 1 to 30, and the alkyl chain may contain an oxygen atom, a sulfur atom or a nitrogen atom.

The cycloalkyl group of $Q_1$ and $Q_2$ may have a substituent and is preferably a cycloalkyl group having a carbon number of 3 to 20, and the ring may contain an oxygen atom or a nitrogen atom.

The aryl group of $Q_1$ and $Q_2$ may have a substituent and is preferably an aryl group having a carbon number of 6 to 14.

The aralkyl group of $Q_1$ and $Q_2$ may have a substituent and is preferably an aralkyl group having a carbon number of 7 to 20.

The alkenyl group of $Q_1$ and $Q_2$ may have a substituent and includes a group having a double bond at an arbitrary position of the alkyl group above.

Examples of the substituent which each of the groups above may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 10). The cyclic structure in the aryl group, cycloalkyl group and the like may further have an alkyl group (preferably having a carbon number of 1 to 10) as a substituent. The aminoacyl group may further have an alkyl group (preferably having a carbon number of 1 to 10) as a substituent. Examples of the alkyl group having a substituent include a perfluoroalkyl group such as perfluoromethyl group, perfluoroethyl group, perfluoropropyl group and perfluorobutyl group.

Preferred examples of the partial structure of the basic functional group contained in at least either $Q_1$ or $Q_2$ are the same as those described for the basic functional group contained in R of formula (PA-I).

Examples of the structure where $Q_1$ and $Q_2$ are combined to form a ring and the ring formed has a basic functional group include a structure where the organic groups of $Q_1$ or $Q_2$ are further bonded by an alkylene group, an oxy group, an imino group or the like.

In formula (PA-II), at least either one of $X_1$ and $X_2$ is preferably —$SO_2$—.

The compound represented by formula (PA-III) is described below.

$$Q_1\text{-}X_1\text{—NH—}X_2\text{-}A_2\text{-}(X_3)_m\text{—B-}Q_3 \qquad \text{(PA-III)}$$

In formula (PA-III), each of $Q_1$ and $Q_3$ independently represents a monovalent organic group, provided that either one of $Q_1$ and $Q_3$ has a basic functional group. It is also possible that $Q_1$ and $Q_3$ are combined to form a ring and the ring formed has a basic functional group.

Each of $X_1$, $X_2$ and $X_3$ independently represents —CO— or —$SO_2$—.

$A_2$ represents a divalent linking group.

B represents a single bond, an oxygen atom or —N(Qx)-.

Qx represents a hydrogen atom or a monovalent organic group.

When B is —N(Qx)-, $Q_3$ and Qx may combine to form a ring.

m represents 0 or 1.

Here, —NH— corresponds to an acidic functional group that is generated upon irradiation with an actinic ray or radiation.

$Q_1$ has the same meaning as $Q_1$ in formula (PA-II).

Examples of the organic group of Q are the same as those of the organic group of $Q_1$ and $Q_2$ in formula (PA-II).

Examples of the structure where $Q_1$ and $Q_3$ are combined to form a ring and the ring formed has a basic functional group include a structure where the organic groups of $Q_1$ or $Q_3$ are further bonded by an alkylene group, an oxy group, an imino group or the like.

The divalent linking group of $A_2$ is preferably a divalent linking group having a carbon number of 1 to 8 and containing a fluorine atom, and examples thereof include a fluorine atom-containing alkylene group having a carbon number of 1 to 8, and a fluorine atom-containing phenylene group. A fluorine atom-containing alkylene group is more preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is substituted for by a fluorine atom, more preferably a perfluoroalkylene group, still more preferably a perfluoroethylene group having a carbon number of 2 to 4.

The monovalent organic group of Qx is preferably an organic group having a carbon number of 4 to 30, and examples thereof include an alkyl group, a cycloalkyl group, an aryl group, an aralkyl group, and an alkenyl group. Examples of the alkyl group, cycloalkyl group, aryl group, aralkyl group and alkenyl group are the same as those for Rx in formula (PA-I).

In formula (PA-III), each of $X_1$, $X_2$ and $X_3$ is preferably —$SO_2$—.

The compound (N) is preferably a sulfonium salt compound of the compound represented by formula (PA-I), (PA-II) or (PA-III), or an iodonium salt compound of the compound represented by formula (PA-I), (PA-II) or (PA-III), more preferably a compound represented by the following formula (PA1) or (PA2):

(PA1)

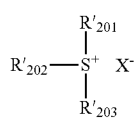

(PA2)

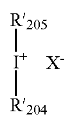

In formula (PA1), each of $R'_{201}$, $R'_{202}$ and $R'_{203}$ independently represents an organic group, and specific examples thereof are the same as those for $R_{201}$, $R_{202}$ and $R_{203}$ of formula (ZI) in the component (B).

$X^-$ represents a sulfonate or carboxylate anion after elimination of a hydrogen atom in the —$SO_3H$ moiety or —COOH moiety of the compound represented by formula (PA-I), or an anion after elimination of a hydrogen atom from the —NH— moiety of the compound represented by formula (PA-II) or (PA-III).

In formula (PA2), each of $R'_{204}$ and $R'_{205}$ independently represents an aryl group, an alkyl group or a cycloalkyl group. Specific examples thereof are the same as those for $R_{204}$ and $R_{205}$ of formula (ZII) in the component (B).

$X^-$ represents a sulfonate or carboxylate anion after elimination of a hydrogen atom in the —$SO_3H$ moiety or —COOH moiety of the compound represented by formula (PA-I), or an anion after elimination of a hydrogen atom from the —NH— moiety of the compound represented by formula (PA-II) or (PA-III).

The compound (N) decomposes upon irradiation with an actinic ray or radiation to generate, for example, a compound represented by formula (PA-I), (PA-II) or (PA-III).

The compound represented by formula (PA-I) is a compound having a sulfonic acid group or a carboxylic acid group together with a basic functional group or an ammonium group and thereby being reduced in or deprived of the basicity or changed from basic to acidic, relative to the compound (N).

The compound represented by formula (PA-II) or (PA-III) is a compound having an organic sulfonylimino group or an organic carbonylimino group together with a basic functional group and thereby being reduced in or deprived of the basicity or changed from basic to acidic, relative to the compound (N).

In the present invention, the expression "reduced in the basicity upon irradiation with an actinic ray or radiation" means that the acceptor property for a proton (an acid generated upon irradiation with an actinic ray or radiation) of the compound (N) is decreased by the irradiation with an actinic ray or radiation. The expression "reduced in the acceptor property" means that when an equilibrium reaction of producing a noncovalent bond complex as a proton adduct from a basic functional group-containing compound and a proton takes place or when an equilibrium reaction of causing the counter cation of the ammonium group-containing compound to be exchanged with a proton takes place, the equilibrium constant in the chemical equilibrium decreases.

A compound (N) whose basicity decreases upon irradiation with an actinic ray or radiation is contained in the resist film, so that in the unexposed area, the acceptor property of the compound (N) is sufficiently brought out and an unintended reaction between an acid diffused from the exposed area or the like and the resin (A) can be suppressed, whereas in the exposed area, the acceptor property of the compound (N) decreases and the intended reaction of an acid with the resin (A) unfailingly occurs. It is presumed that by virtue of such an operation mechanism, a pattern excellent in terms of line width roughness (LWR), local pattern dimension uniformity, focus latitude (DOF) and pattern profile is obtained.

The basicity can be confirmed by measuring the pH, or a calculation value can be computed using a commercially available software.

Specific examples of the compound (N) capable of generating a compound represented by formula (PA-I) upon irradiation with an actinic ray or radiation are illustrated below, but the present invention is not limited thereto.

(PA-1)

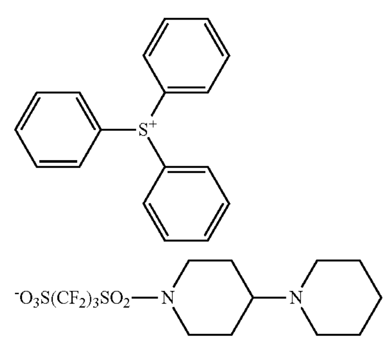

-continued
(PA-2)
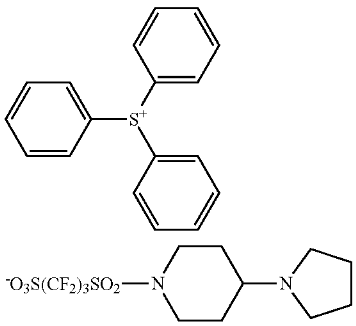
(PA-3)
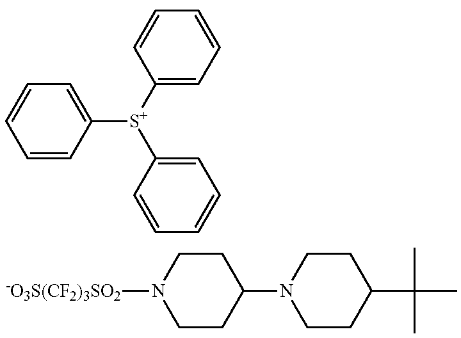
(PA-4)
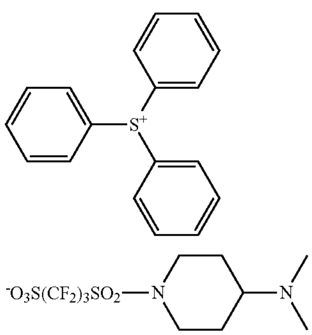
(PA-5)
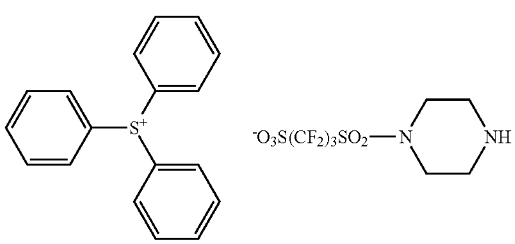
(PA-6)
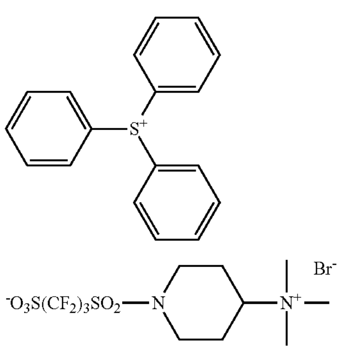
-continued
(PA-7)
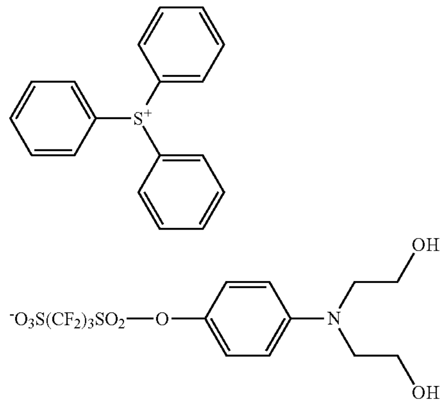
(PA-8)
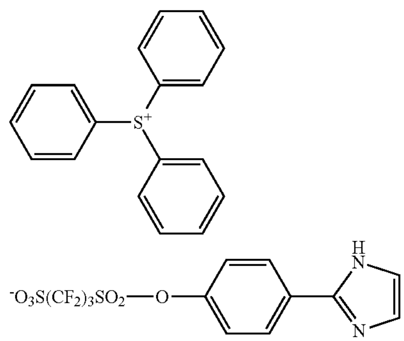
(PA-9)
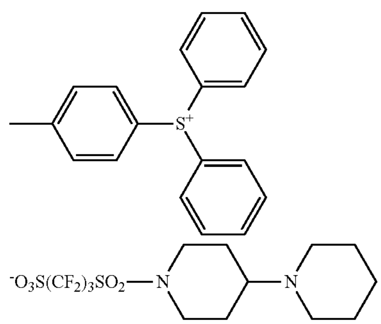
(PA-10)
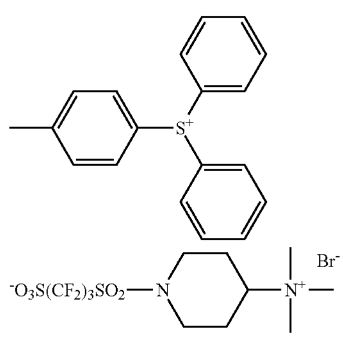
(PA-11)
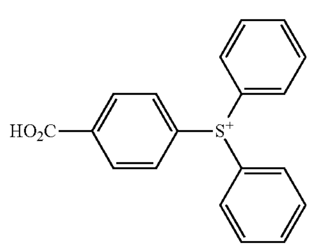

-continued
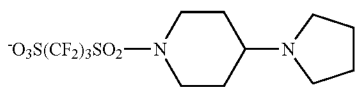
(PA-12)
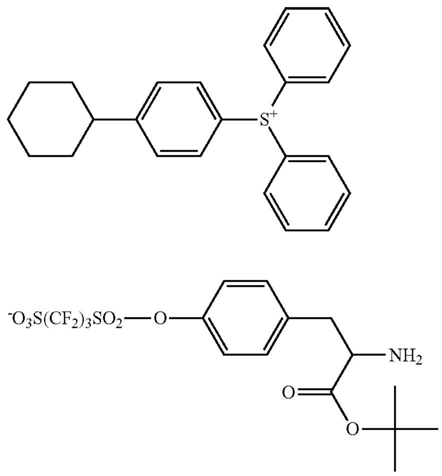
(PA-13)
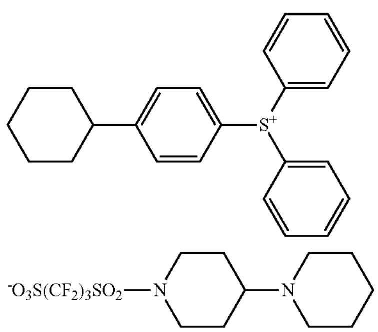
(PA-14)
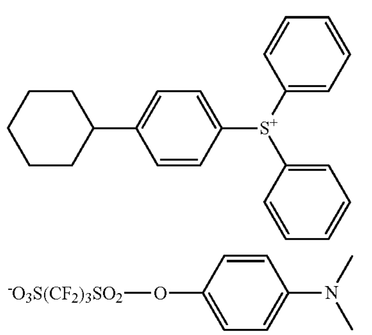
(PA-15)
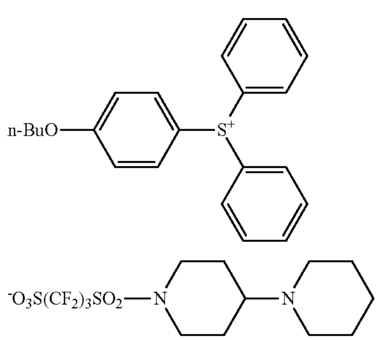
-continued
(PA-16)
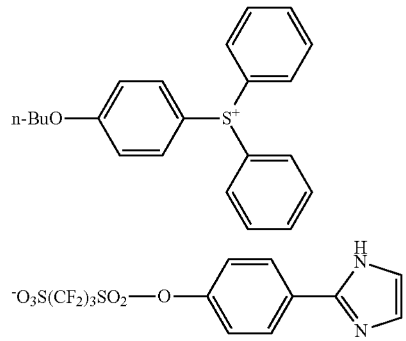
(PA-17)
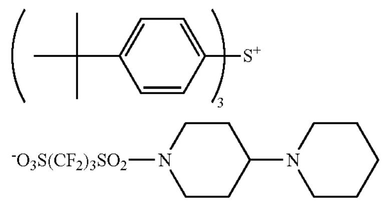
(PA-18)
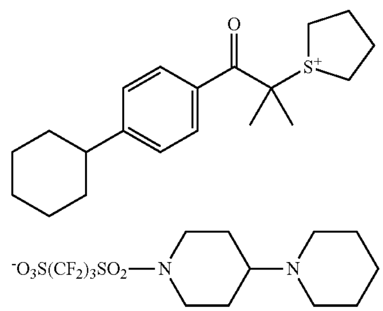
(PA-19)
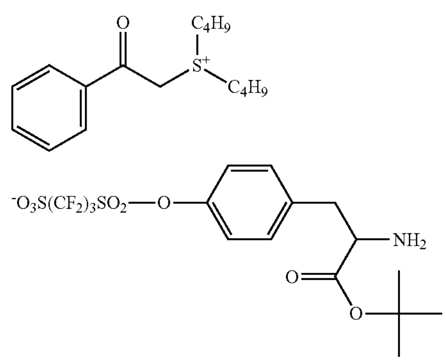
(PA-20)
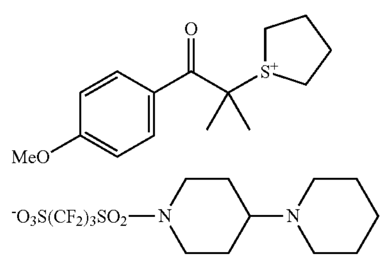
(PA-21)
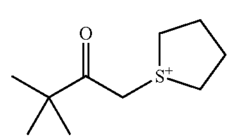

-continued
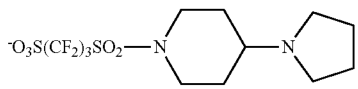
(PA-22)
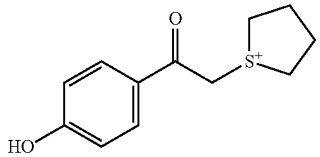
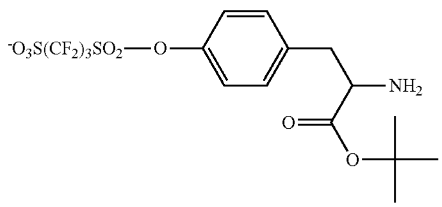
(PA-23)
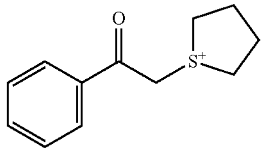
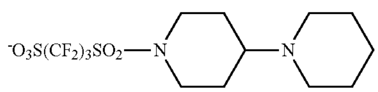
(PA-24)
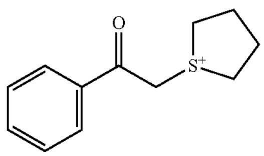
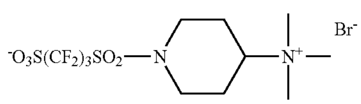
(PA-25)
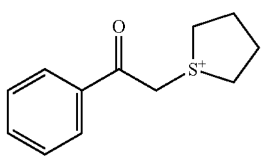
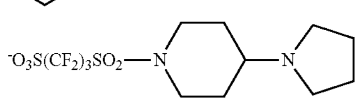
(PA-26)
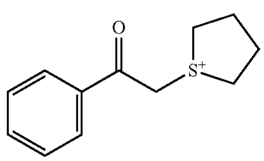
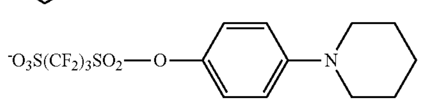
-continued
(PA-27)
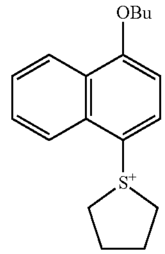
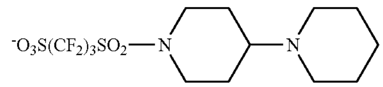
(PA-28)
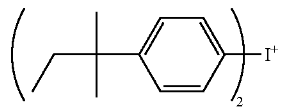
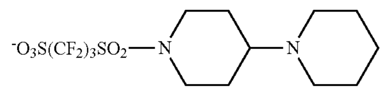
(PA-29)
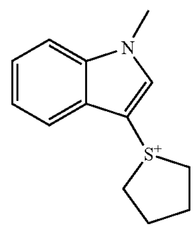
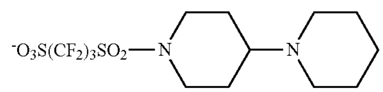
(PA-30)
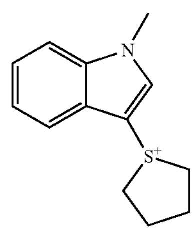
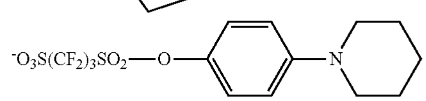
(PA-31)
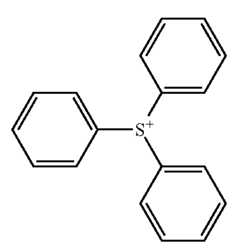
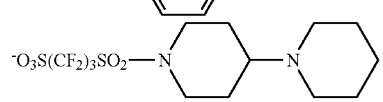

(PA-32)
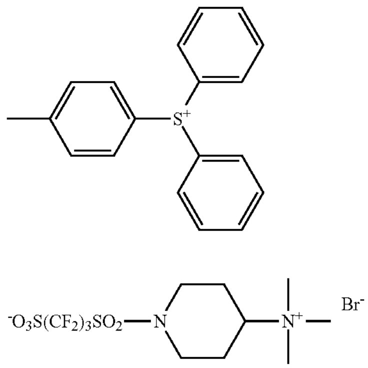
(PA-33)
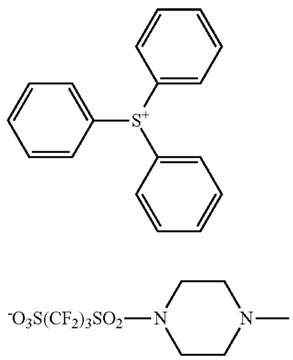
(PA-34)
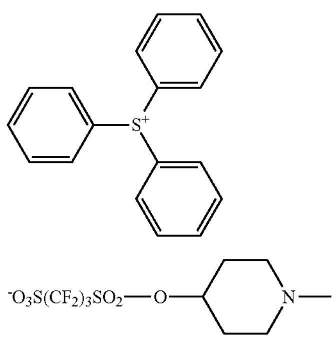
(PA-35)
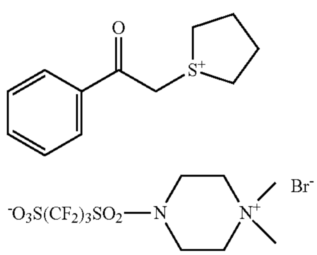
(PA-36)
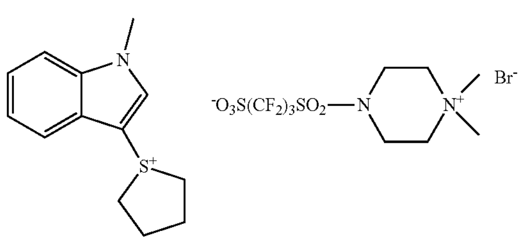
(PA-37)
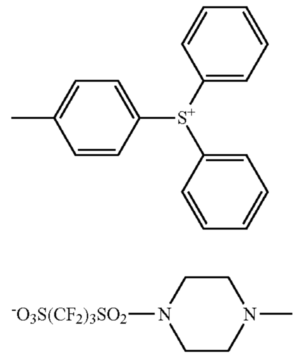
(PA-38)
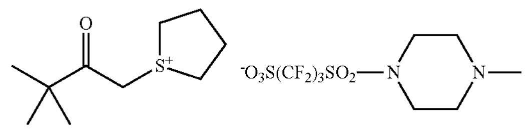
(PA-39)
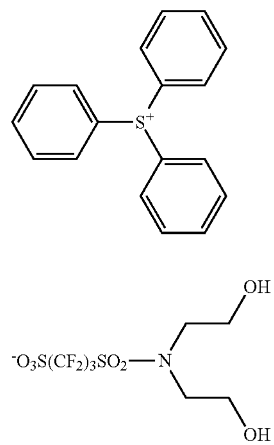
(PA-40)
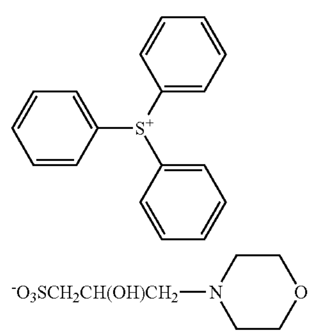
(PA-41)
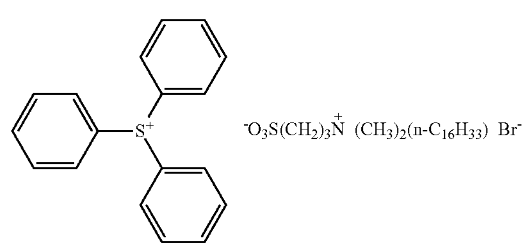

-continued
(PA-42)
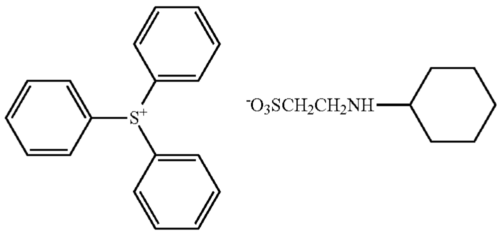
(PA-43)
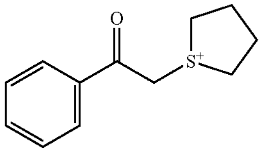
$^-O_3S(CH_2)_3\overset{+}{N}\ (CH_3)_2(n\text{-}C_{16}H_{33})\ Br^-$
(PA-44)
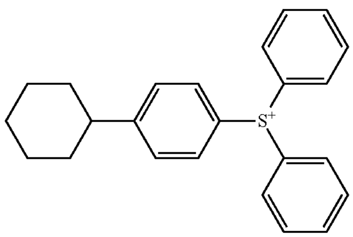
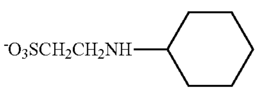
(PA-45)
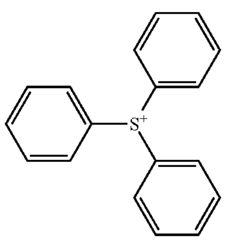
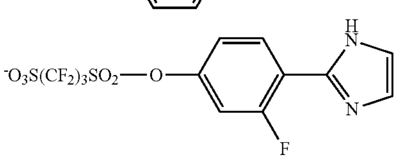
(PA-46)
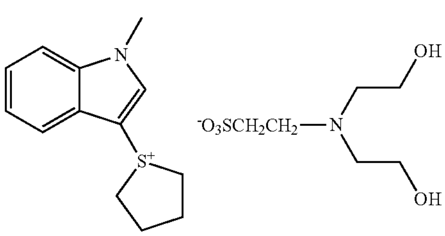
(PA-47)
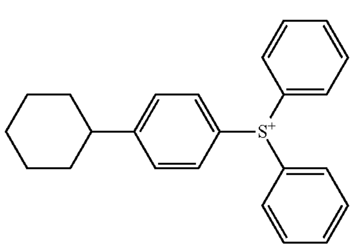
-continued
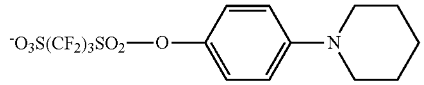
(PA-48)
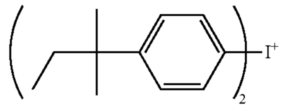
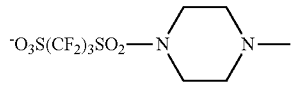
(PA-49)
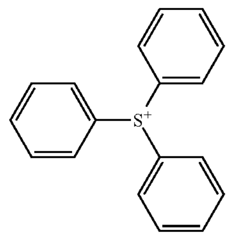
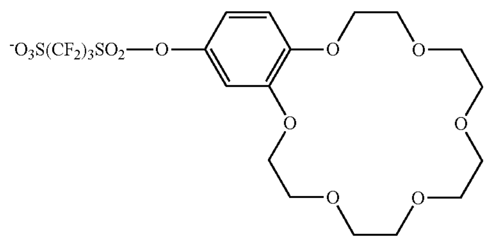
(PA-50)
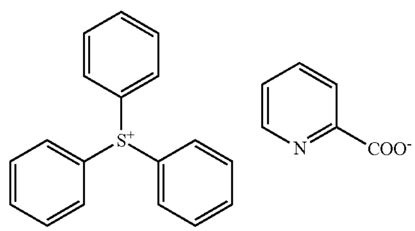
(PA-51)
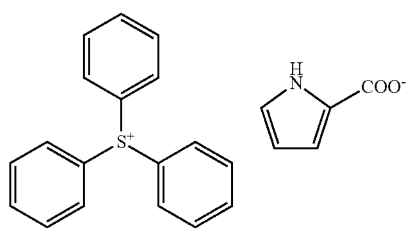
(PA-52)
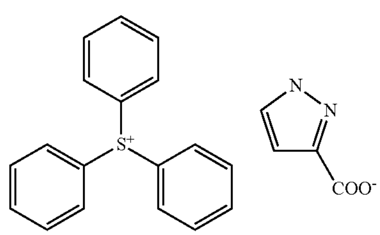

-continued (PA-53)

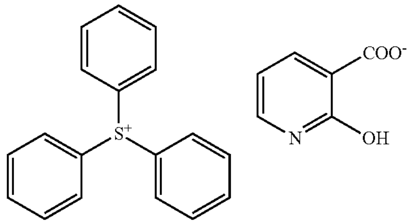

(PA-54)

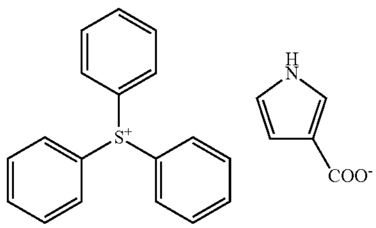

(PA-55)

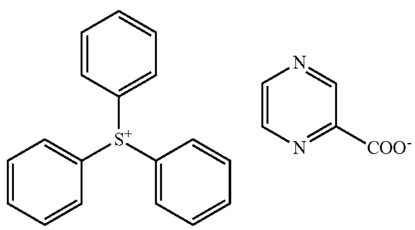

(PA-56)

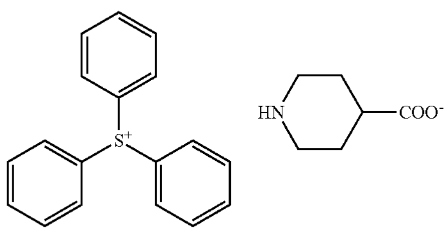

(PA-57)

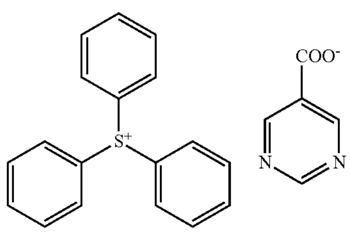

(PA-58)

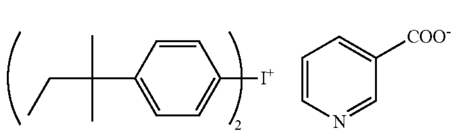

(PA-59)

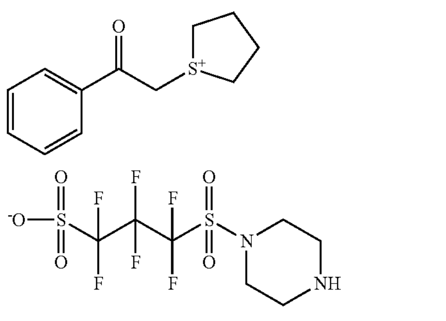

-continued (PA-60)

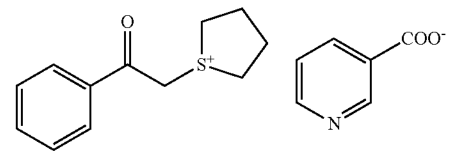

These compounds can be easily synthesized from a compound represented by formula (PA-I) or a lithium, sodium or potassium salt thereof and a hydroxide, bromide, chloride or the like of iodonium or sulfonium, by utilizing the salt exchange method described in JP-T-11-501909 (the term "JP-T" as used herein means a "published Japanese translation of a PCT patent application") or JP-A-2003-246786. The synthesis may be also performed in accordance with the synthesis method described in JP-A-7-333851.

Specific examples of the compound (N) capable of generating a compound represented by formula (PA-II) or (PA-III) upon irradiation with an actinic ray or radiation are illustrated below, but the present invention is not limited thereto.

(PA-61)

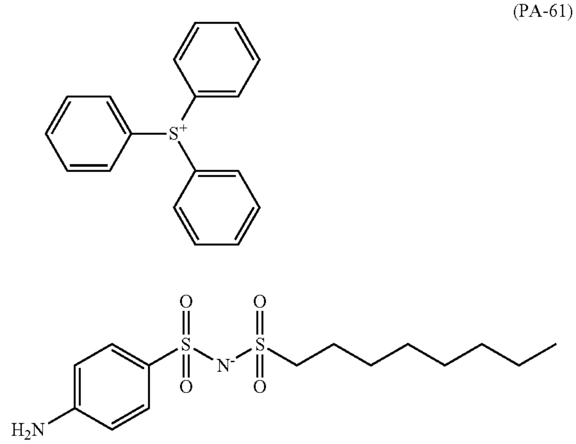

(PA-62)

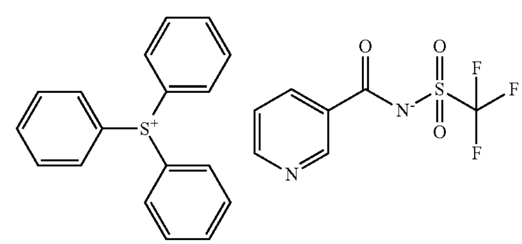

(PA-63)

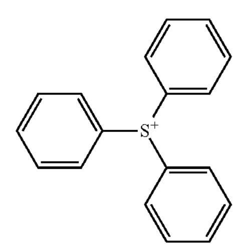

-continued
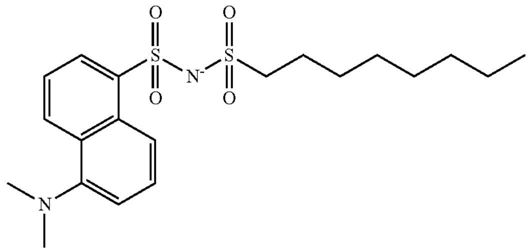
(PA-64)
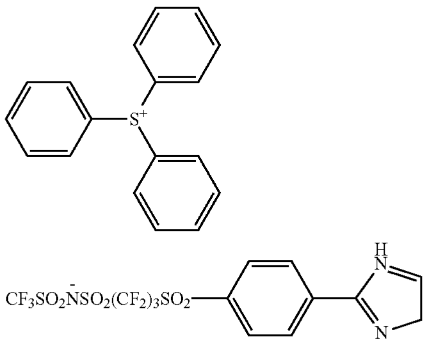
(PA-65)
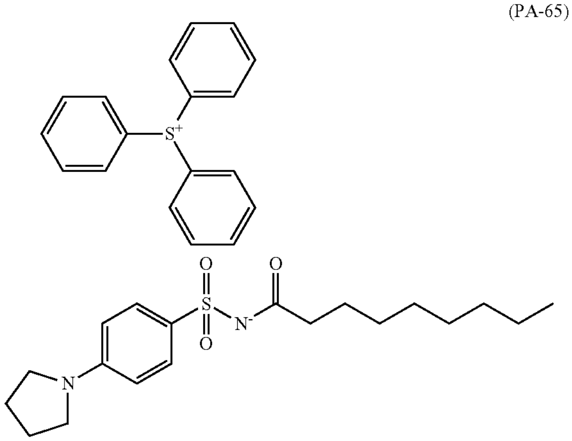
(PA-66)
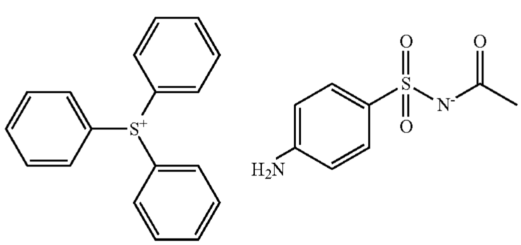
(PA-67)
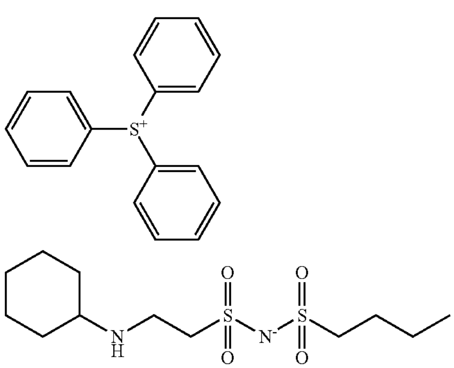
-continued
(PA-68)
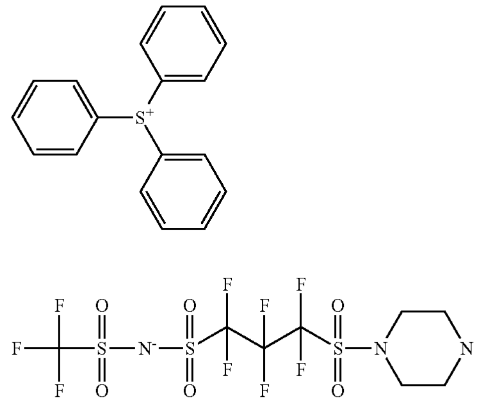
(PA-69)
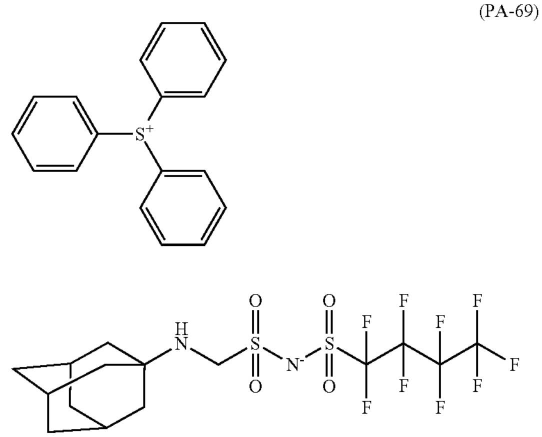
(PA-70)
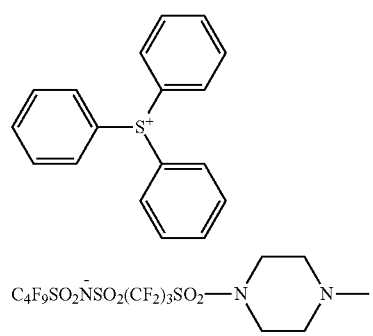
(PA-71)
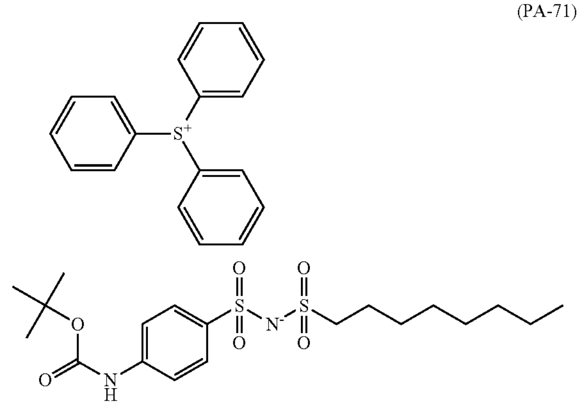

-continued
(PA-72)
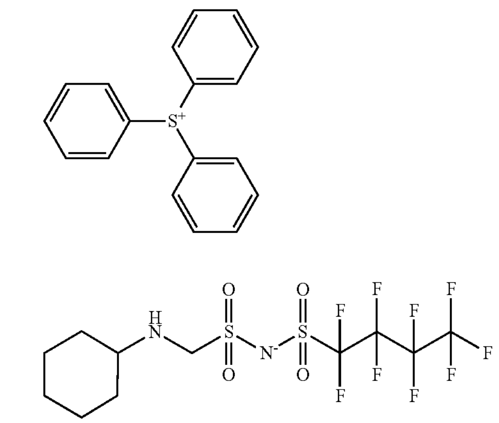
(PA-73)
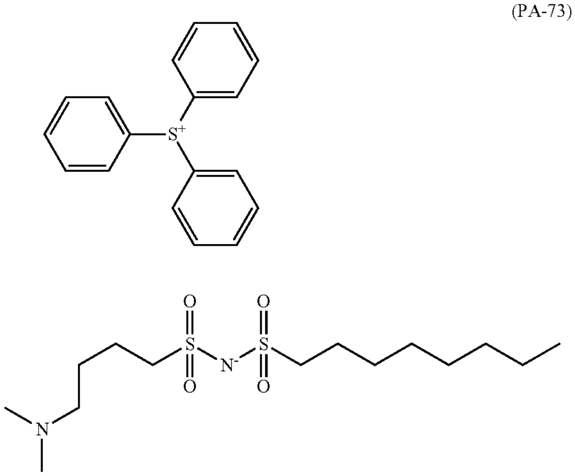
(PA-74)
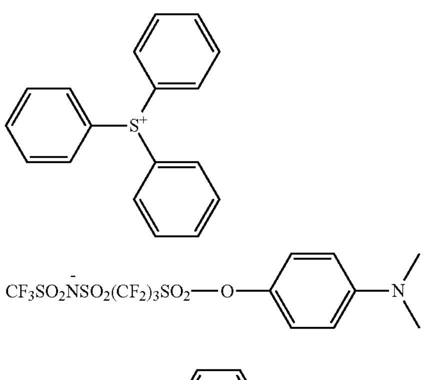
(PA-75)
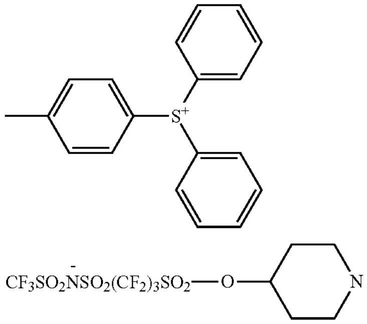
-continued
(PA-76)
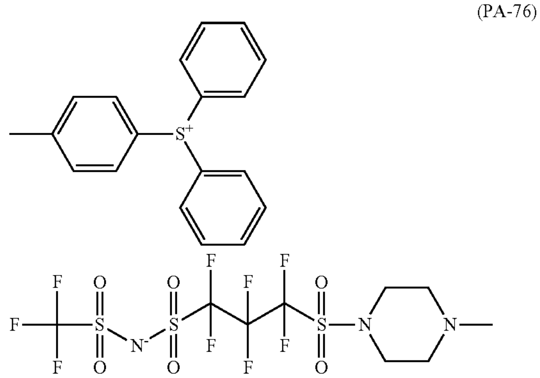
(PA-77)
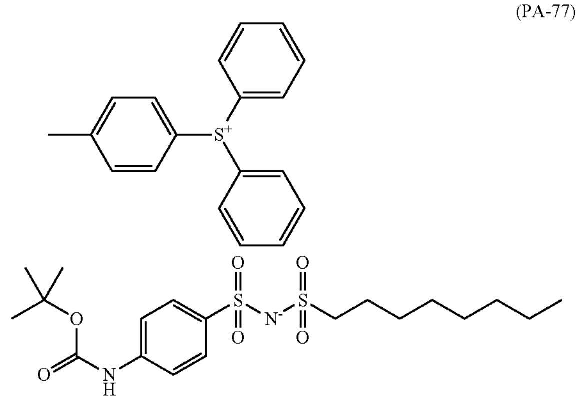
(PA-78)
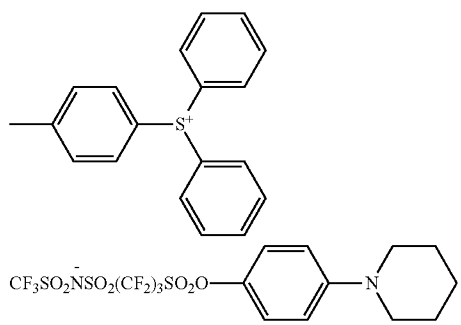
(PA-79)
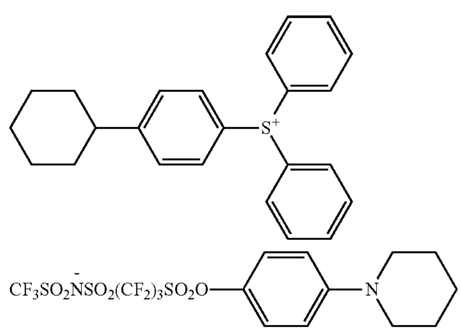
(PA-80)
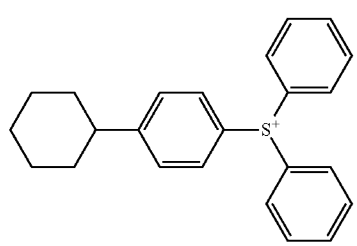

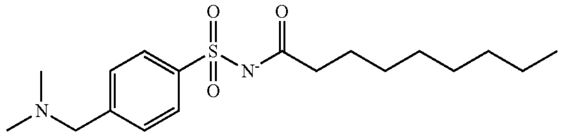
(PA-81)
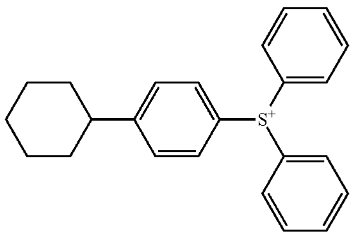
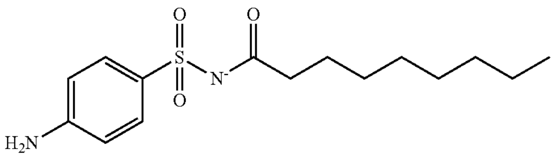
(PA-82)
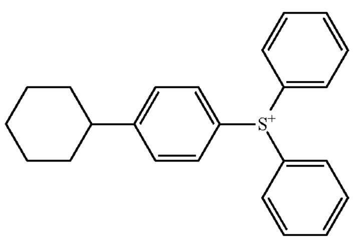
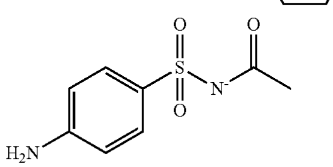
(PA-83)
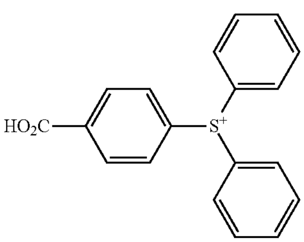
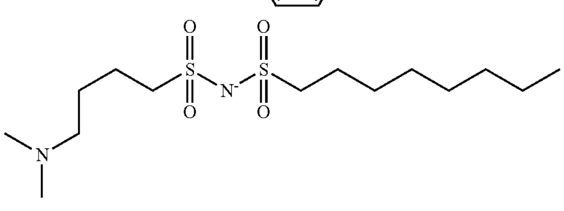
(PA-84)
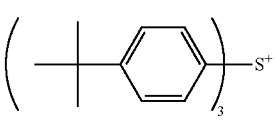
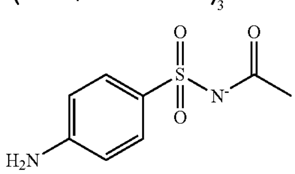
(PA-85)
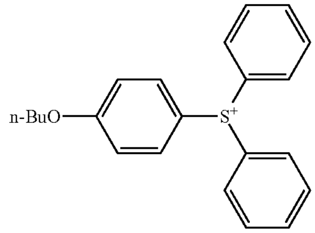
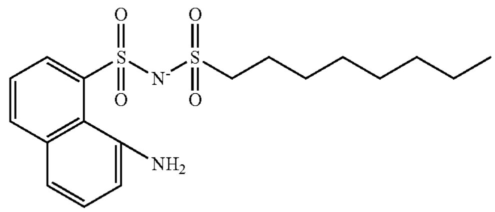
(PA-86)
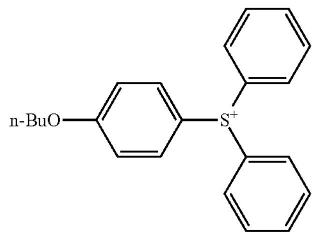
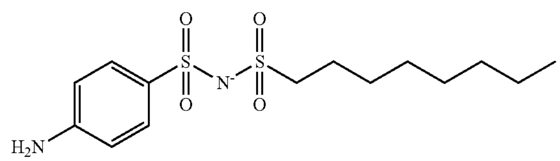
(PA-87)
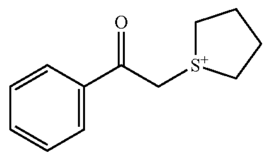
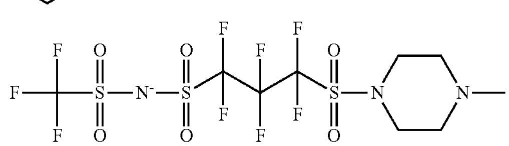
(PA-88)
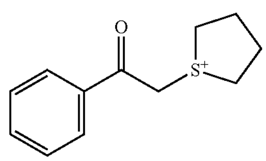
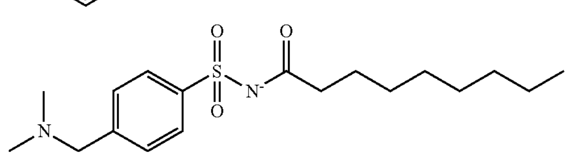
(PA-89)
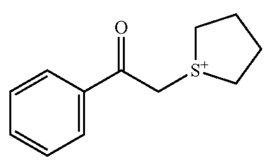

-continued
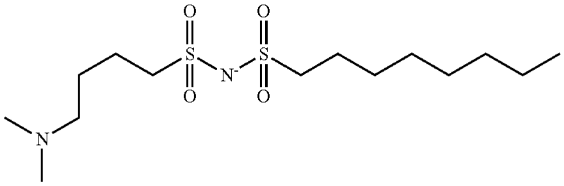
(PA-90)
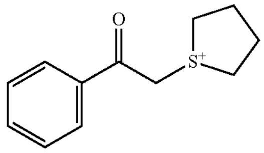
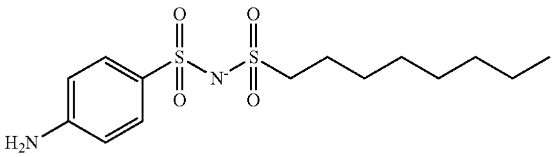
(PA-91)
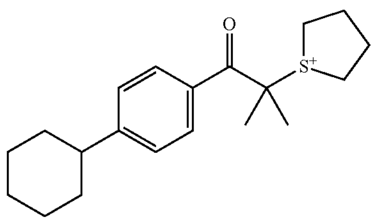
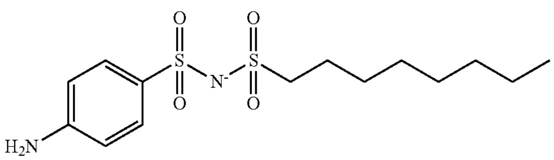
(PA-92)
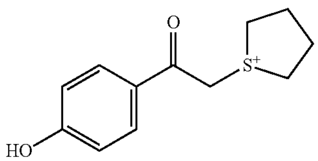
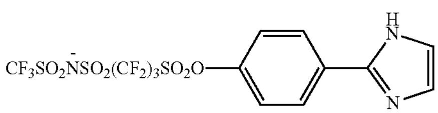
(PA-93)
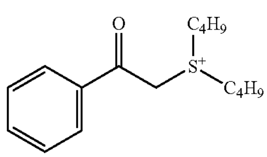
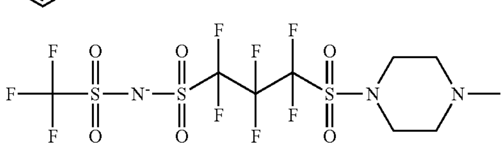
(PA-94)
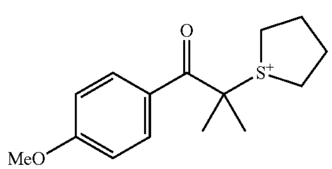
-continued
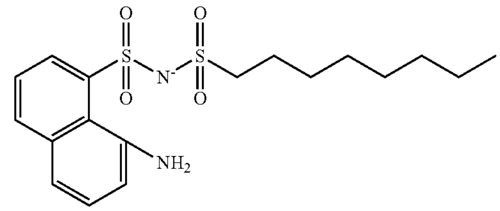
(PA-95)
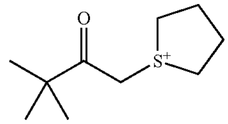
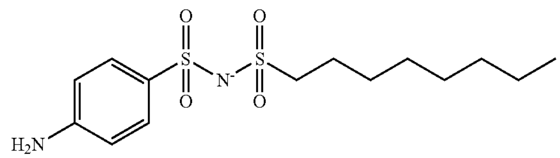
(PA-96)
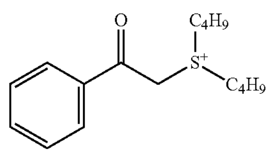
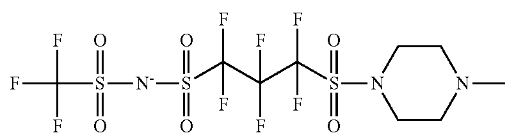
(PA-97)
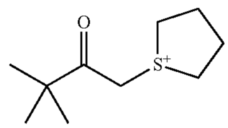
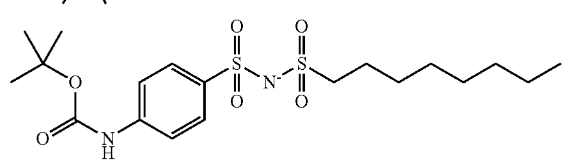
(PA-98)
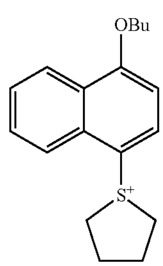
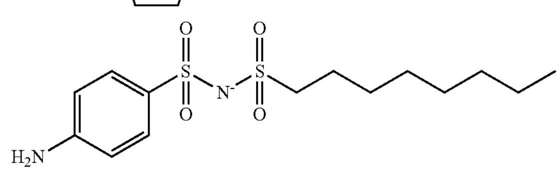

-continued
(PA-99)
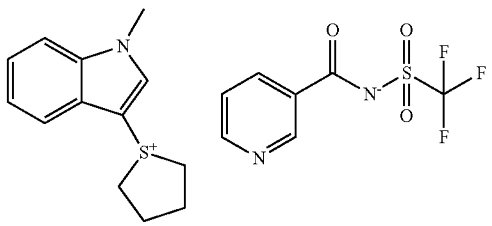
(PA-100)
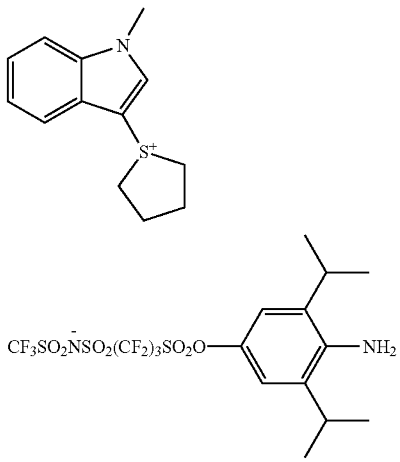
(PA-101)
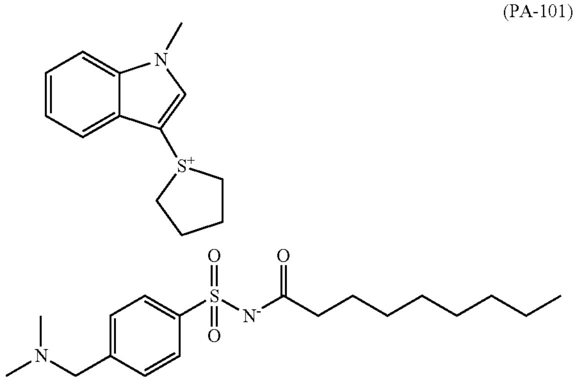
(PA-102)
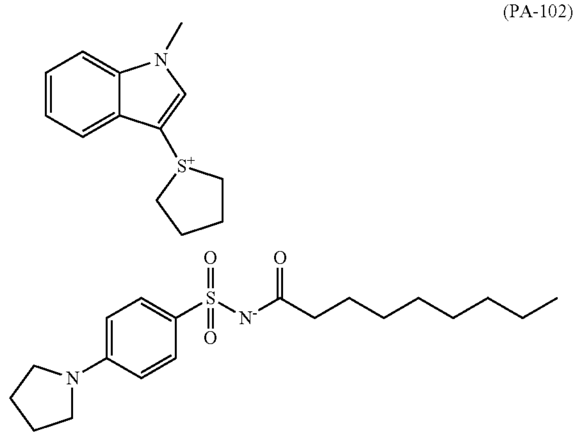
(PA-103)
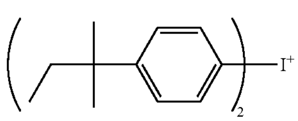
-continued
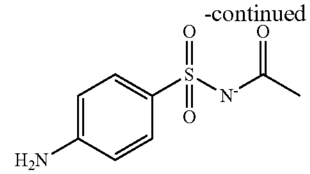
(PA-104)
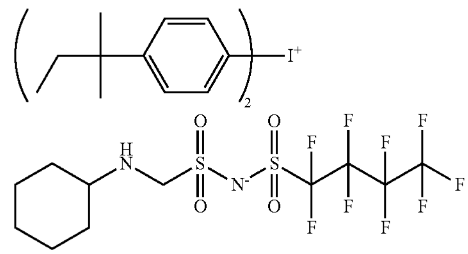
(PA-105)
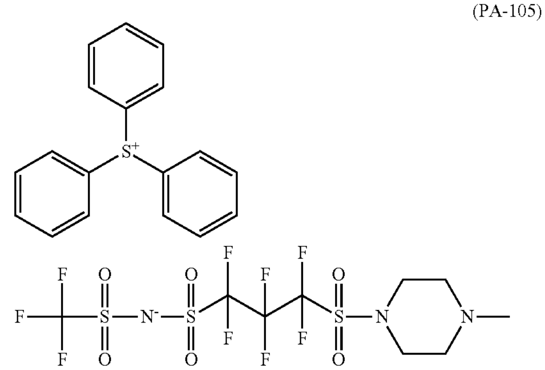
(PA-106)
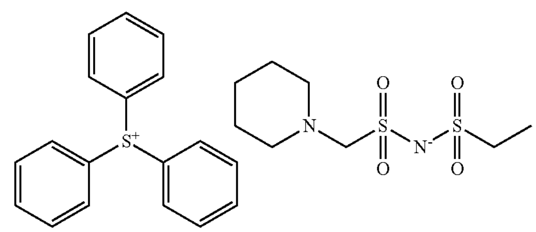
(PA-107)
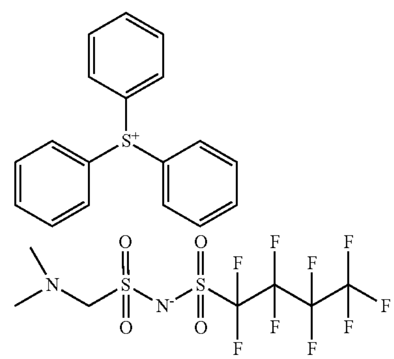
(PA-108)
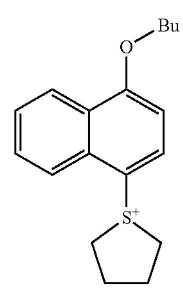

-continued
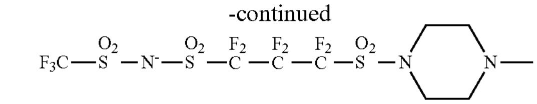
(PA-109)
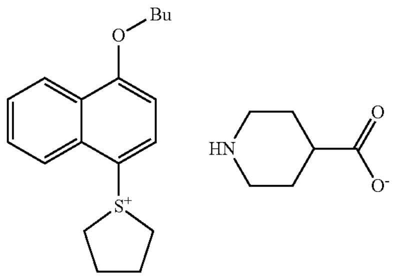
(PA-110)
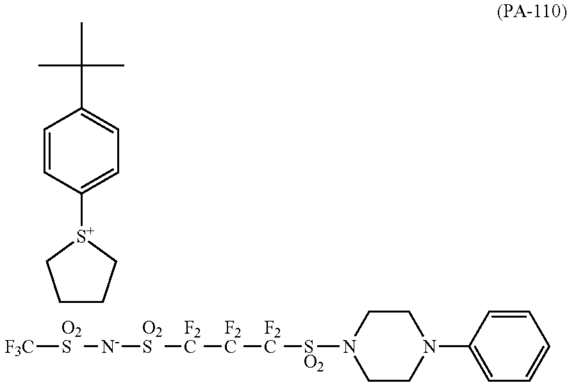
(PA-111)
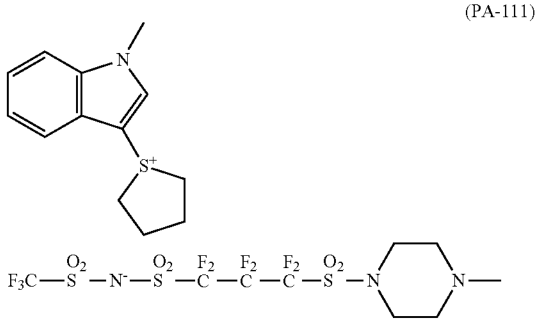
(PA-112)
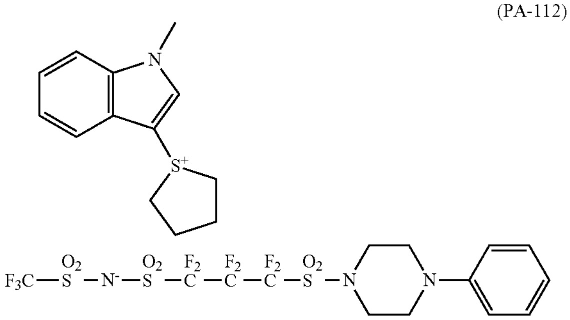
(PA-113)
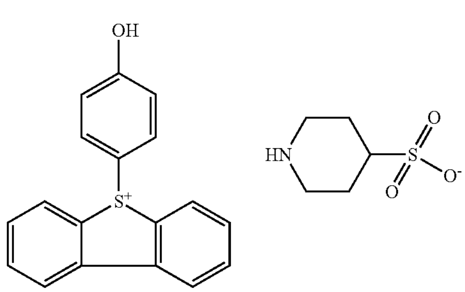
-continued
(PA-114)
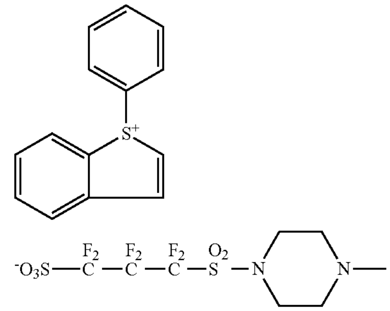
(PA-115)
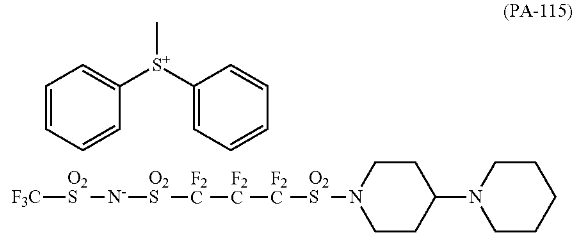
(PA-116)
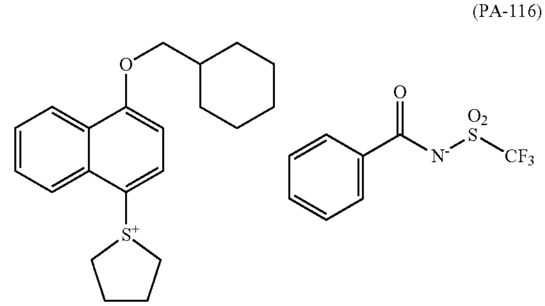
(PA-117)
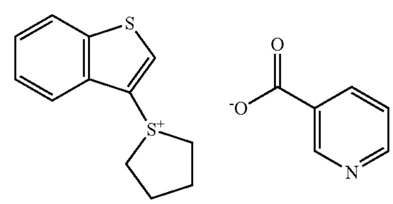
(PA-118)
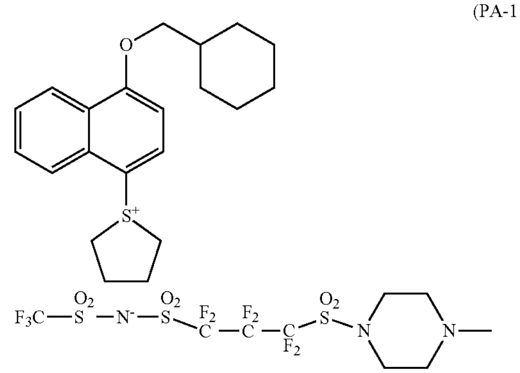
(PA-119)
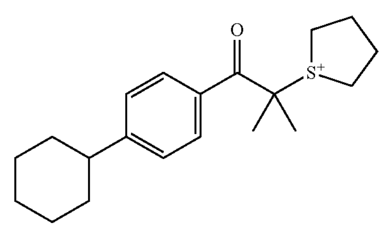

-continued
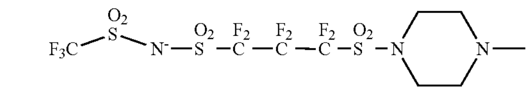
(PA-120)
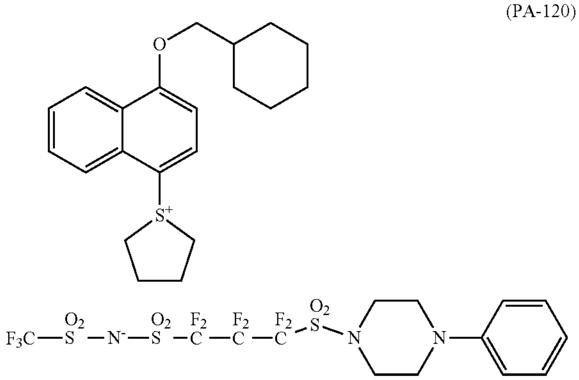
(PA-121)
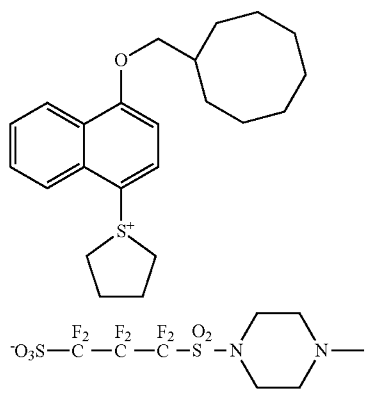
(PA-122)
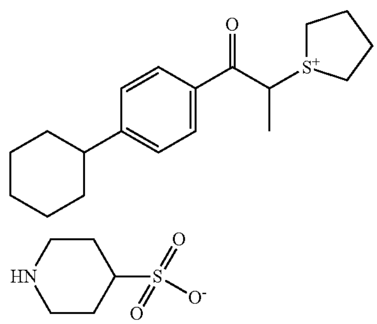
(PA-123)
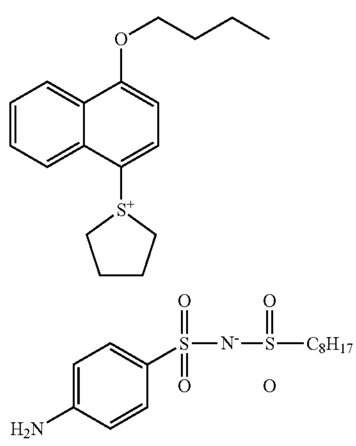
-continued
(PA-124)
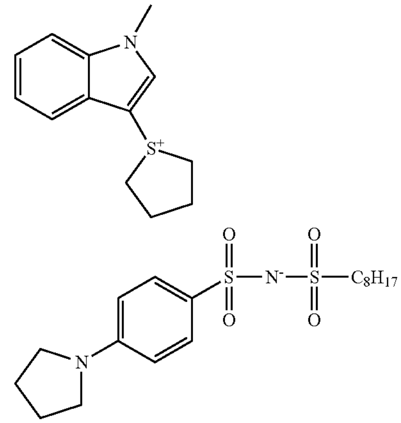
(PA-125)
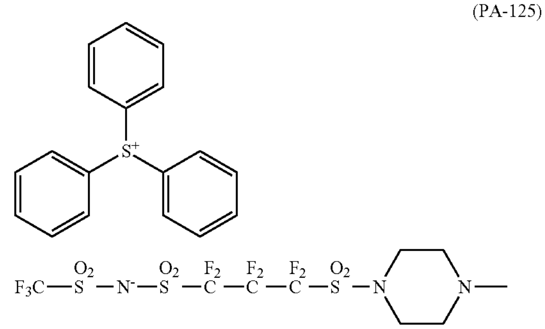
(PA-126)
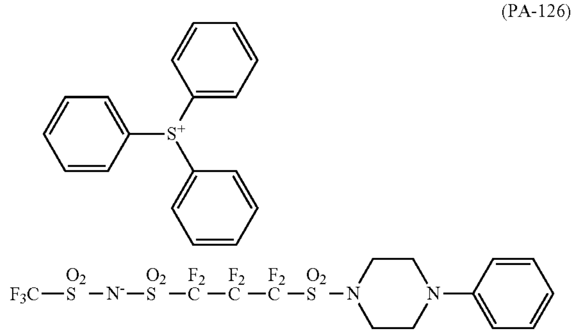
(PA-127)
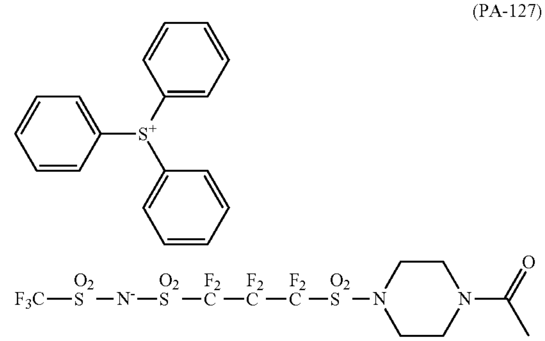
(PA-128)
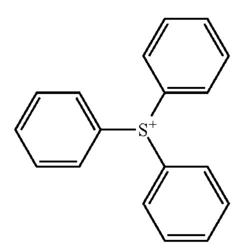

-continued
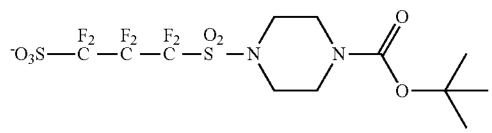
(PA-129)
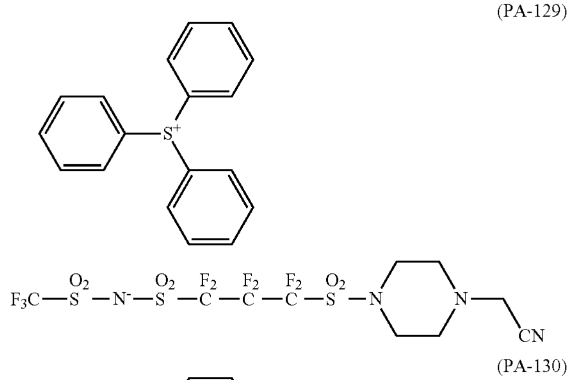
(PA-130)
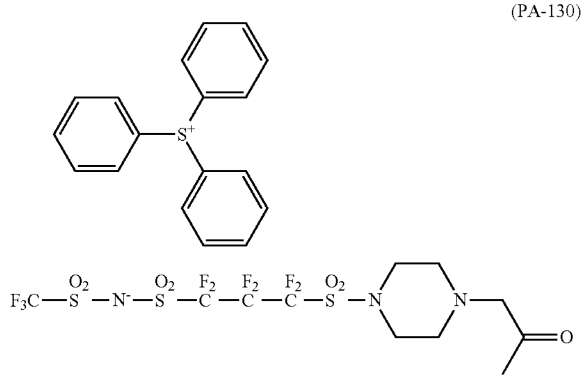
(PA-131)
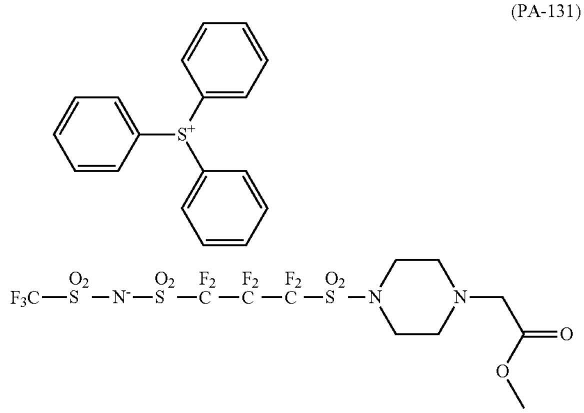
(PA-132)
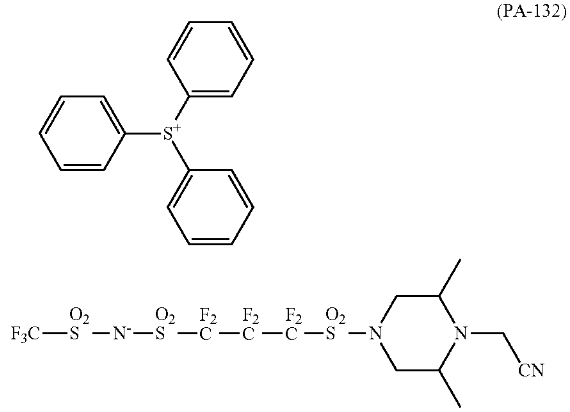
-continued
(PA-133)
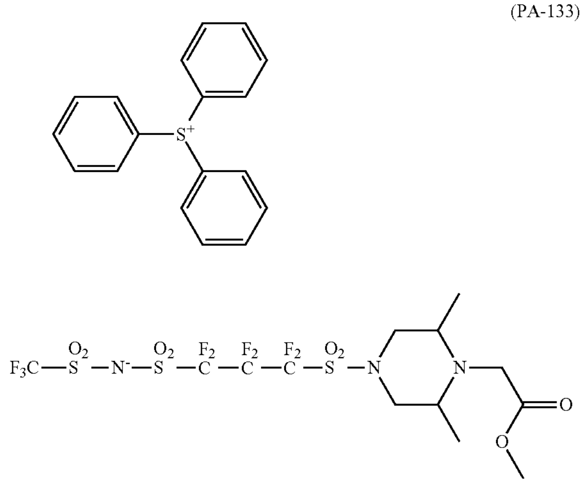
(PA-134)
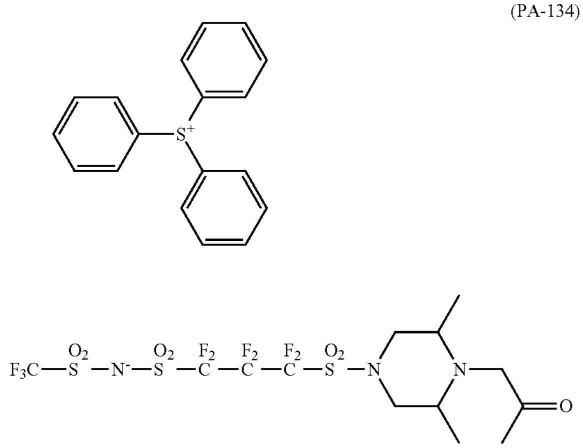
(PA-135)
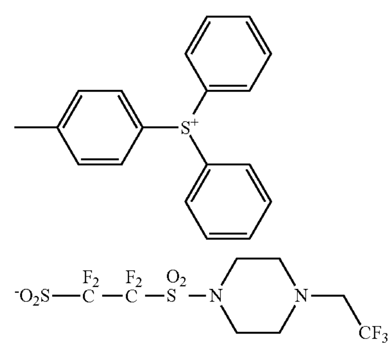
(PA-136)
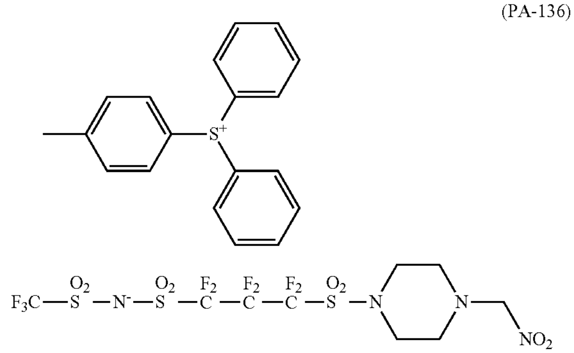

-continued
(PA-137)
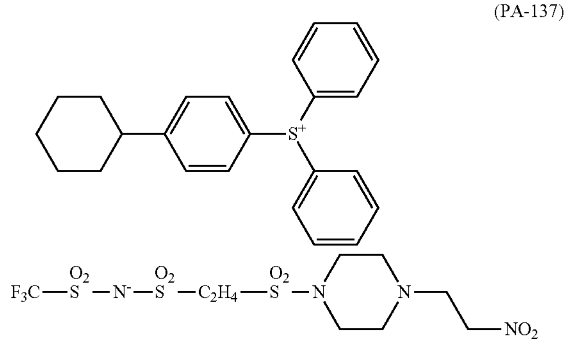
(PA-138)
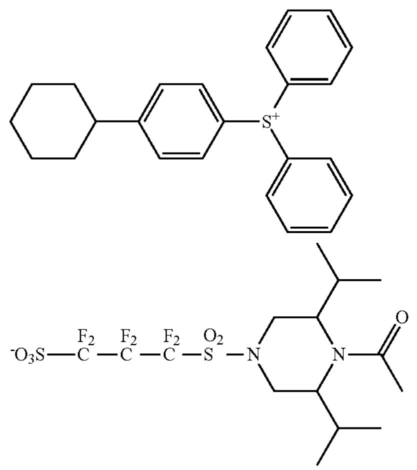
(PA-139)
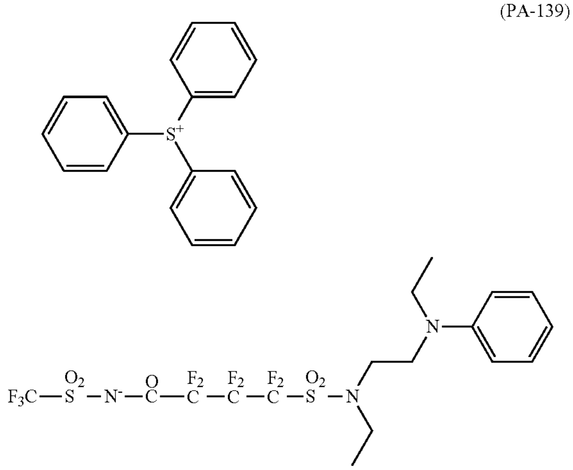
(PA-140)
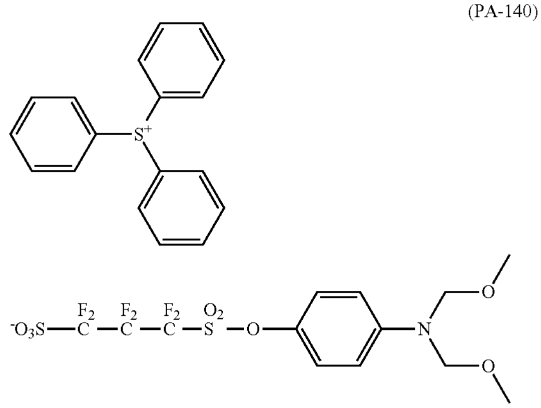
-continued
(PA-141)
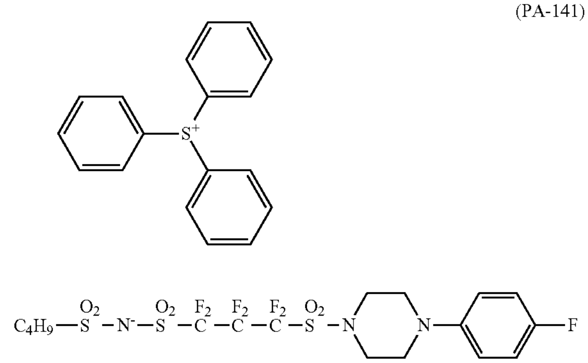
(PA-142)
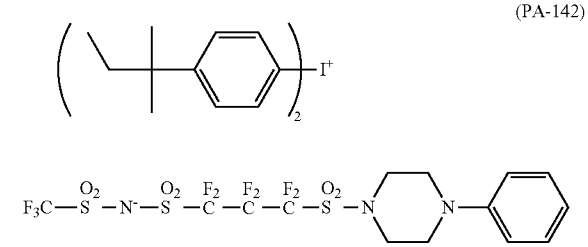
(PA-143)
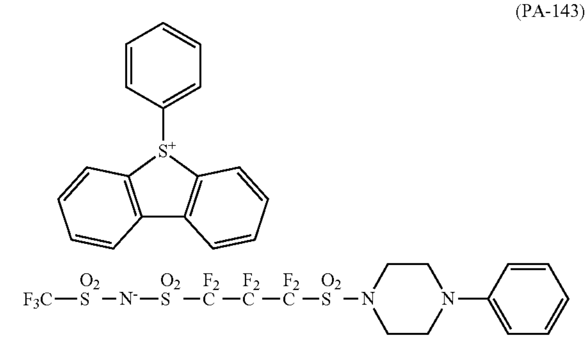
(PA-144)
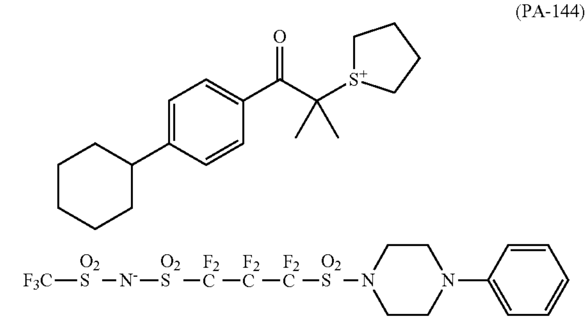
(PA-145)
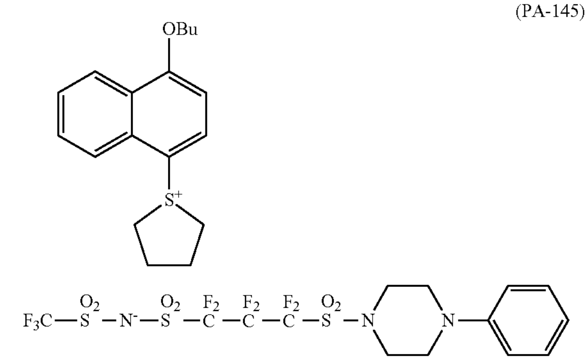

-continued (PA-146)

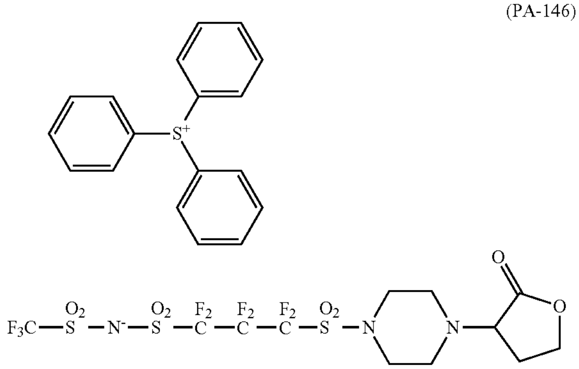

(PA-147)

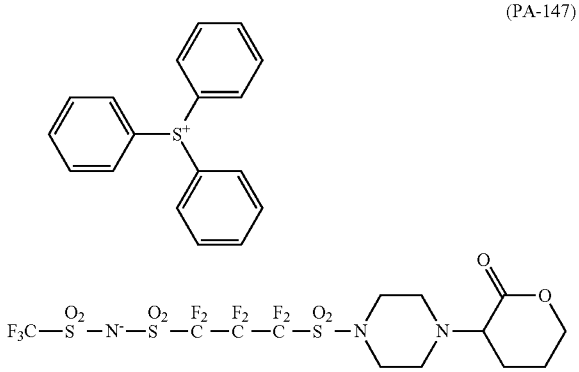

(PA-148)

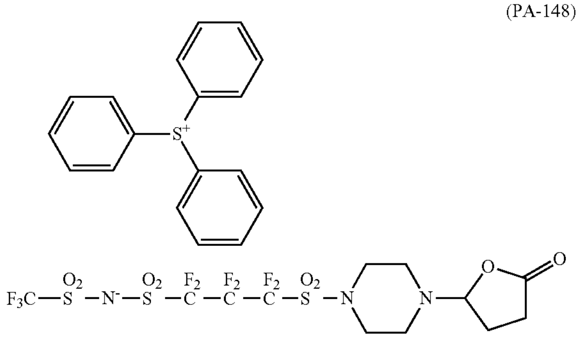

These compounds can be easily synthesized by using a general sulfonic acid esterification reaction or sulfonamidation reaction. For example, the compound may be obtained by a method of selectively reacting one sulfonyl halide moiety of a bis-sulfonyl halide compound with an amine, alcohol or the like containing a partial structure represented by formula (PA-II) or (PA-III) to form a sulfonamide bond or a sulfonic acid ester bond and then hydrolyzing the other sulfonyl halide moiety, or a method of ring-opening a cyclic sulfonic anhydride by an amine or alcohol containing a partial structure represented by formula (PA-II). The amine or alcohol containing a partial structure represented by formula (PA-II) or (PA-III) can be synthesized by reacting an amine or alcohol with an anhydride (e.g., $(R'O_2C)_2O$, $(R'SO_2)_2O$) or an acid chloride compound (e.g., $R'O_2CCl$, $R'SO_2Cl$) under basic conditions (R' is, for example, a methyl group, an n-octyl group or a trifluoromethyl group). In particular, the synthesis may be performed in accordance with synthesis examples and the like in JP-A-2006-330098.

The molecular weight of the compound (N) is preferably from 500 to 1,000.

The actinic ray-sensitive or radiation-sensitive resin composition of the present invention may or may not contain the compound (N), but in the case of containing the compound (N), the content thereof is preferably from 0.1 to 20 mass %, more preferably from 0.1 to 10 mass %, based on the solid content of the actinic ray-sensitive or radiation-sensitive resin composition.

[5-2] (N') Basic Compound

The actinic ray-sensitive or radiation-sensitive resin composition of the present invention may contain (N') a basic compound so as to reduce the change in performance with aging from exposure to heating.

Preferred basic compounds include a compound having a structure represented by the following formulae (A) to (E):

(A)

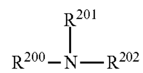

(B)

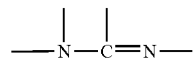

(C)

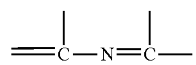

(D)

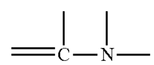

(E)

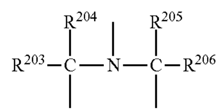

In formulae (A) and (E), each of $R^{200}$, $R^{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine with each other to form a ring. Each of $R^{203}$, $R^{204}$, $R^{205}$ and $R^{206}$, which may be the same or different, represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in formulae (A) and (E) is more preferably unsubstituted.

Preferred examples of the compound include guanidine, aminopyrrolidine, pyrazole, pyrazoline, piperazine, aminomorpholine, aminoalkylmorpholine, and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include a triarylsulfonium hydroxide, a phenacylsulfonium hydroxide, and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure becomes a carboxylate, and examples thereof include an acetate, an adamantane-1-carboxylate, and a perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound, and a sulfonic acid ester group-containing ammonium salt compound.

In the phenoxy group-containing amine compound, phenoxy group-containing ammonium salt compound, sulfonic acid ester group-containing amine compound and sulfonic acid ester group-containing ammonium salt compound, at least one alkyl group is preferably bonded to the nitrogen atom and also, the alkyl chain preferably contains an oxygen atom to form an oxyalkylene group. The number of oxyalkylene groups in the molecule is 1 or more, preferably from 3 to 9, more preferably from 4 to 6. Among oxyalkylene groups, those having a structure of —$CH_2CH_2O$—, —$CH(CH_3)CH_2O$— or —$CH_2CH_2CH_2O$— are preferred.

Specific examples of the phenoxy group-containing amine compound, phenoxy group-containing ammonium salt compound, sulfonic acid ester group-containing amine compound and sulfonic acid ester group-containing ammonium salt compound include, but are not limited to, Compounds (C1-1) to (C3-3) illustrated in paragraph [0066] of U.S. Patent Application Publication 2007/0224539.

The basic compound also includes an N-alkylcaprolactam. Suitable examples of the N-alkylcarpolactam include N-methylcaprolactam.

A nitrogen-containing organic compound having a group capable of leaving by the action of an acid may be also used as a kind of the basic compound. Examples of this compound include a compound represented by the following formula (F). Incidentally, the compound represented by the following formula (F) exhibits an effective basicity in the system as a result of elimination of the group capable of leaving by the action of an acid.

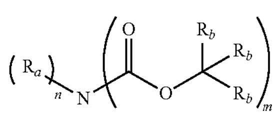

(F)

In formula (F), each Ra independently represents a hydrogen atom, an alkyl group, a cycloalkyl group, an aryl group, or an aralkyl group. Also, when n=2, two Ra's may be the same or different, and two Ra's may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group or an aralkyl group, provided that in —C(Rb)(Rb)(Rb), when one or more Rb's are a hydrogen atom, at least one of remaining Rb's is a cyclopropyl group or a 1-alkoxyalkyl group.

At least two Rb's may combine to form an alicyclic hydrocarbon group, an aromatic hydrocarbon group, a heterocyclic hydrocarbon group, or a derivative thereof n represents an integer of 0 to 2, m represents an integer of 1 to 3, and n+m=3.

In formula (F), each of the alkyl group, cycloalkyl group, aryl group and aralkyl group represented by Ra and Rb may be substituted with a functional group such as hydroxyl group, cyano group, amino group, pyrrolidino group, piperidino group, morpholino group and oxo group, an alkoxy group, or a halogen atom.

Examples of the alkyl group, cycloalkyl group, aryl group and aralkyl group (each of these alkyl group, cycloalkyl group, aryl group and aralkyl group may be substituted with the above-described functional group, an alkoxy group or a halogen atom) of R include:

a group derived from a linear or branched alkane such as methane, ethane, propane, butane, pentane, hexane, heptane, octane, nonane, decane, undecane and dodecane, or a group where the group derived from an alkane is substituted with one or more kinds of or one or more groups of cycloalkyl group such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, or a group where the group derived from a cycloalkane is substituted with one or more kinds of or one or more groups of linear or branched alkyl group such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, or a group where the group derived from an aromatic compound is substituted with one or more kinds of or one or more groups of linear or branched alkyl group such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from a heterocyclic compound is substituted with one or more kinds of or one or more groups of linear or branched alkyl group or aromatic compound-derived group; a group where the group derived from a linear or branched alkane or the group derived from a cycloalkane is substituted with one or more kinds of or one or more groups of aromatic compound-derived group such as phenyl group, naphthyl group and anthracenyl group; and a group where the substituent above is substituted with a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra's with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from a heterocyclic compound is substituted with one or more kinds of or one or more groups of linear or branched alkane-derived group, cycloalkane-derived group, aromatic compound-derived group, heterocyclic compound-derived group, and functional group such as hydroxyl group, cyano group, amino group, pyrrolidino group, piperidino group, morpholino group and oxo group.

Specific examples of the nitrogen-containing organic compound having a group capable of leaving by the action of an acid, which are particularly preferred in the present invention, are illustrated below, but the present invention is not limited thereto.

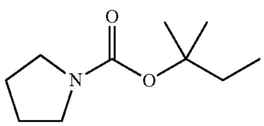
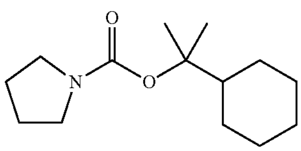
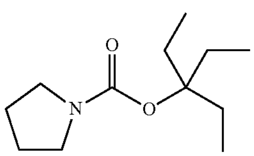
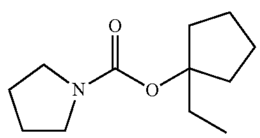
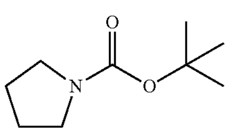
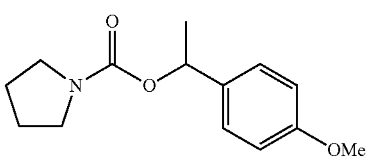
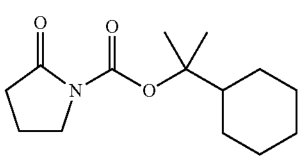
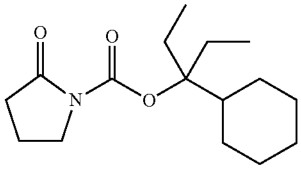
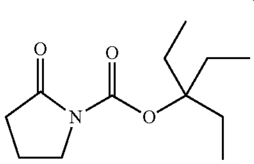

-continued

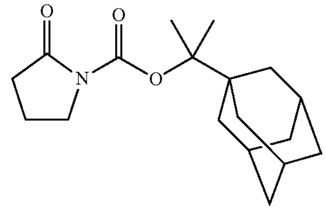
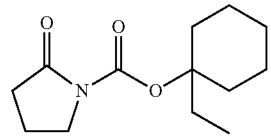
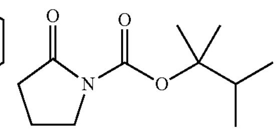
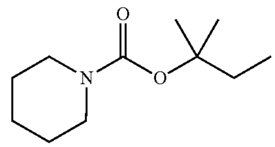
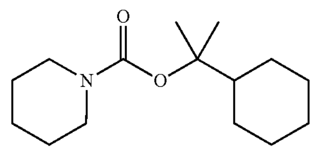
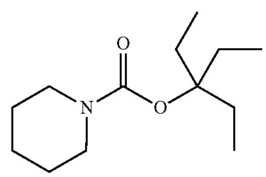
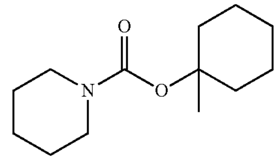
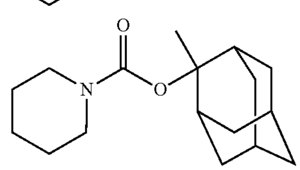
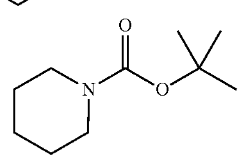
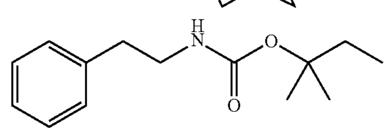
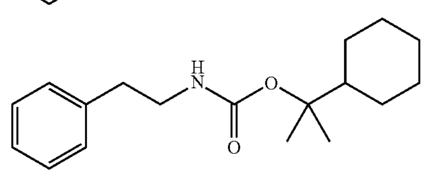
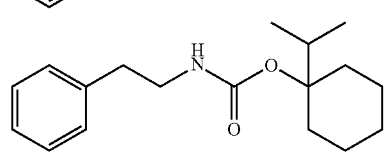
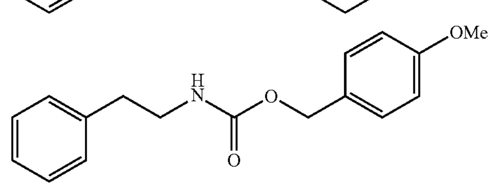
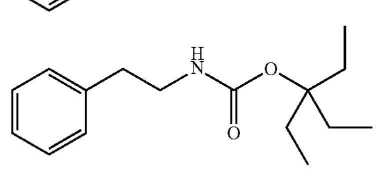

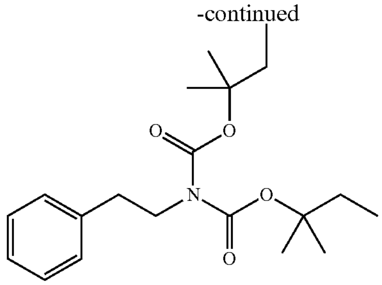
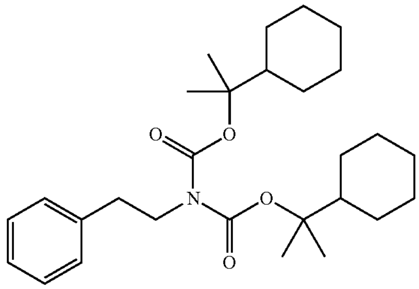
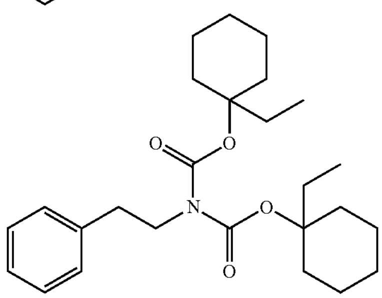
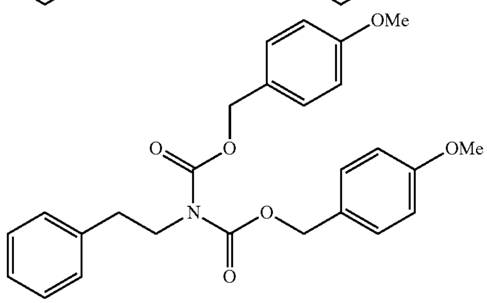
OMe
OMe
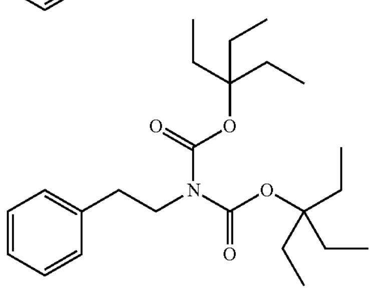
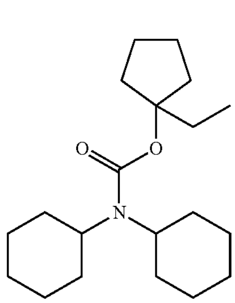
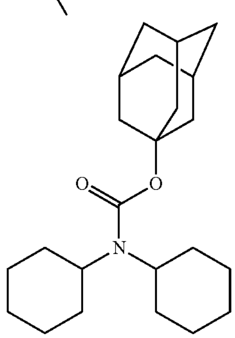
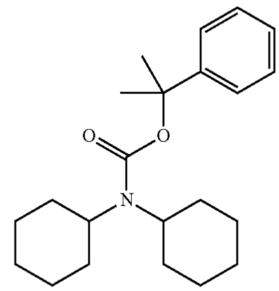
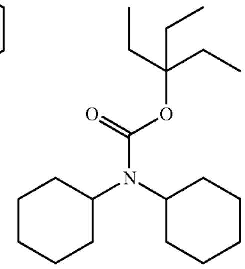
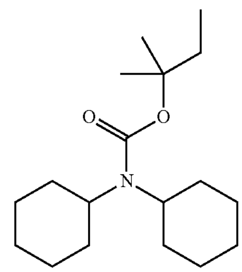
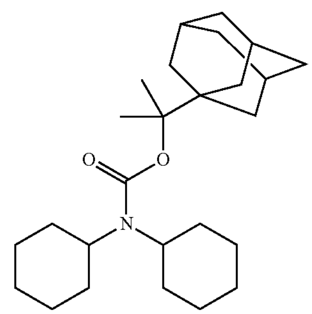
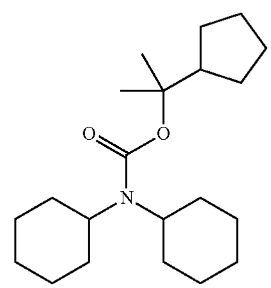
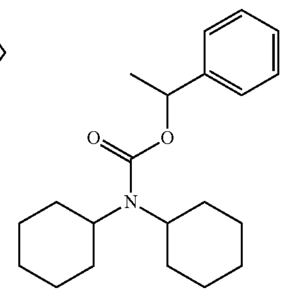
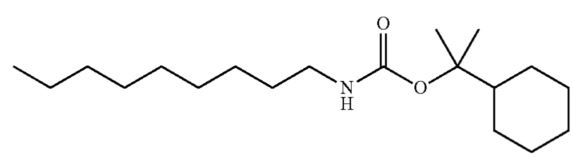
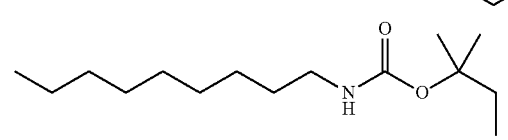
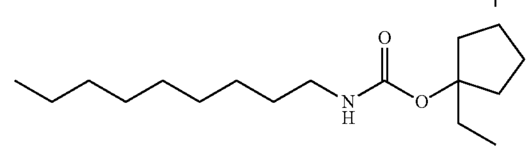
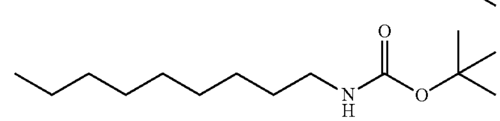

-continued

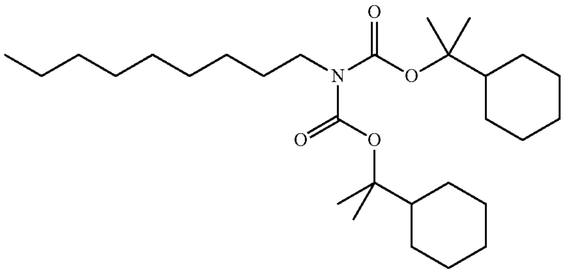

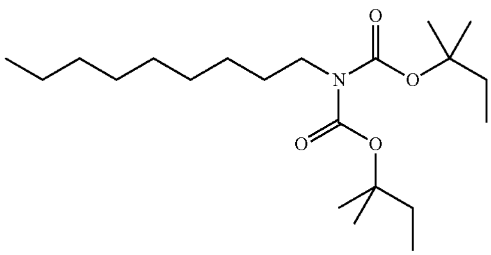

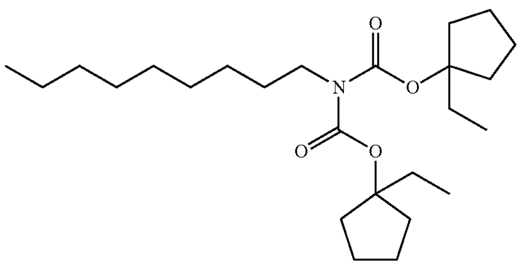

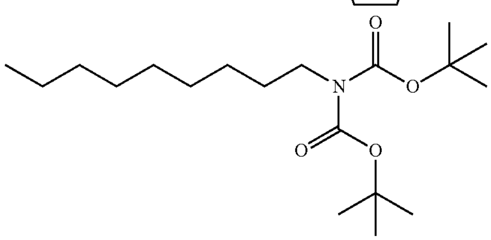

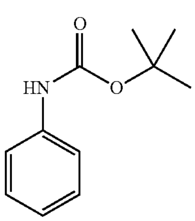

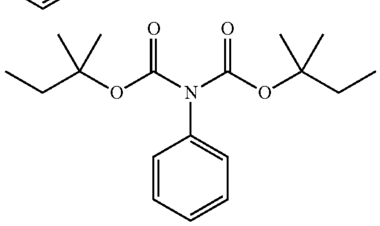

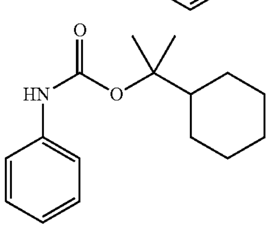

-continued

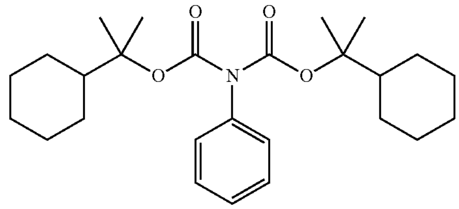

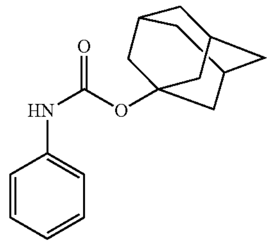

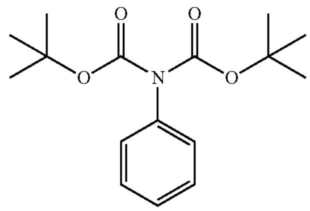

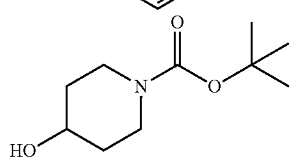

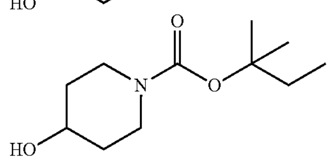

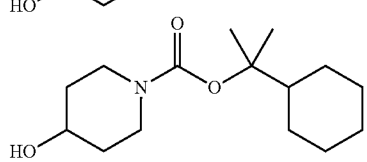

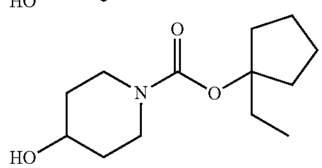

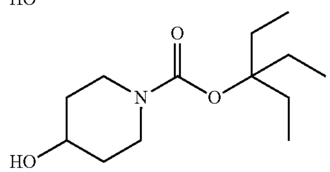

As for the compound represented by formula (F), a commercially available product may be used, or the compound may be synthesized from a commercially available amine by the method described, for example, in *Protective Groups in Organic Synthesis,* 4th edition. As a most general method, the compound can be synthesized in accordance with the method described, for example, in JP-A-2009-199021.

Also, as the basic compound, a compound containing a fluorine atom or a silicone atom and having basicity or being capable of increasing the basicity by the action of an acid, described in JP-A-2011-141494, may be used. Specific examples of the compound include Compounds (B-7) to (B-18) used in Examples of the same patent publication.

The molecular weight of the basic compound is preferably from 250 to 2,000, more preferably from 400 to 1,000. In view of more reduction of LWR and uniformity of local pattern dimension, the molecular weight of the basic compound is preferably 400 or more, more preferably 500 or more, still more preferably 600 or more.

Such a basic compound may be used in combination with the compound (N), and one basic compound may be used alone, or two or more basic compounds may be used in combination.

The actinic ray-sensitive or radiation-sensitive resin composition of the present invention may or may not contain the basic compound, but in the case of containing the basic compound, the amount used thereof is usually from 0.001 to 10 mass %, preferably from 0.01 to 5 mass %, based on the solid content of the actinic ray-sensitive or radiation-sensitive resin composition.

The ratio between the acid generator and the basic compound used in the composition is preferably acid generator/basic compound (molar ratio)=from 2.5 to 300. That is, the molar ratio is preferably 2.5 or more in view of sensitivity and resolution and is preferably 300 or less from the standpoint of preventing the resolution from reduction due to thickening of the resist pattern with aging after exposure until heat treatment. The acid generator/basic compound (molar ratio) is more preferably from 5.0 to 200, still more preferably from 7.0 to 150.

[6] (C) Solvent

Examples of the solvent which can be used at the preparation of the actinic ray-sensitive or radiation-sensitive resin composition of the present invention include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may have a ring, alkylene carbonate, alkyl alkoxyacetate and alkyl pyruvate.

Specific examples of these solvents include those described in paragraphs [0441] to [0455] of U.S. Patent Application Publication No. 2008/0187860.

In the present invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but preferred examples of the solvent containing a hydroxyl group include an alkylene glycol monoalkyl ether and an alkyl lactate, with propylene glycol monomethyl ether (PGME, another name: 1-methoxy-2-propanol) and ethyl lactate being more preferred. Preferred examples of the solvent not containing a hydroxyl group include an alkylene glycol monoalkyl ether acetate, an alkyl alkoxypropionate, a monoketone compound which may contain a ring, a cyclic lactone, and an alkyl acetate. Among these, propylene glycol monomethyl ether acetate (PGMEA, another name: 1-methoxy-2-acetoxypropane), ethyl ethoxypropionate, 2-heptanone, γ-butyrolactone, cyclohexanone and butyl acetate are more preferred, and propylene glycol monomethyl ether acetate, ethyl ethoxypropionate and 2-heptanone are most preferred.

The mixing ratio (by mass) of the solvent containing a hydroxyl group and the solvent not containing a hydroxyl group is from 1/99 to 99/1, preferably from 10/90 to 90/10, more preferably from 20/80 to 60/40. A mixed solvent in which the solvent not containing a hydroxyl group is contained in a ratio of 50 mass % or more is particularly preferred in view of coating uniformity.

The solvent preferably contains propylene glycol monomethyl ether acetate and is preferably a solvent composed of propylene glycol monomethyl ether acetate alone or a mixed solvent of two or more kinds of solvents containing propylene glycol monomethyl ether acetate.

[7] (F) Surfactant

The actinic ray-sensitive or radiation-sensitive resin composition of the present invention may or may not further contain a surfactant, but in the case of containing a surfactant, it is preferred to contain any one of fluorine-containing and/or silicon-containing surfactants (a fluorine-containing surfactant, a silicon-containing surfactant and a surfactant containing both a fluorine atom and a silicon atom), or two or more thereof.

By containing the surfactant, the actinic ray-sensitive or radiation-sensitive resin composition of the present invention can give a resist pattern improved in the sensitivity, resolution and adherence and reduced in the development defect when an exposure light source of 250 nm or less, particularly 220 nm or less, is used.

The fluorine-containing and/or silicon-containing surfactants include the surfactants described in paragraph [0276] of U.S. Patent Application Publication No. 2008/0248425, and examples thereof include EFtop EF301 and EF303 (produced by Shin-Akita Kasei K. K.); Florad FC430, 431 and 4430 (produced by Sumitomo 3M Inc.); Megaface F171, F173, F176, F189, F113, F110, F177, F120 and R08 (produced by DIC Corp.); Surflon S-382, SC101, 102, 103, 104, 105 and 106, and KH-20 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, Polysiloxane Polymer KP-341 (produced by Shin-Etsu Chemical Co., Ltd.) may be also used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

Examples of the surfactant coming under the surfactant above include Megaface F178, F-470, F-473, F-475, F-476 and F-472 (produced by DIC Corp.); a copolymer of a $C_6F_{13}$ group-containing acrylate (or methacrylate) with a (poly(oxyalkylene)) acrylate (or methacrylate); and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactants, described in paragraph [0280] of U.S. Patent Application Publication No. 2008/0248425 may be also used.

One of these surfactants may be used alone, or some of them may be used in combination.

In the case where the actinic ray-sensitive or radiation-sensitive resin composition contains a surfactant, the amount of the surfactant used is preferably from 0.0001 to 2 mass %, more preferably from 0.0005 to 1 mass %, based on the total amount of the actinic ray-sensitive or radiation-sensitive resin composition (excluding the solvent).

On the other hand, when the amount of the surfactant added is set to 10 ppm or less based on the total amount of the actinic ray-sensitive or radiation-sensitive resin composition (excluding the solvent), the resin (D) for use in the present invention is more unevenly distributed to the surface, so that the resist film surface can be made more hydrophobic and the followability of water at the immersion exposure can be more enhanced.

[8] (G) Other Additives

The actinic ray-sensitive or radiation-sensitive resin composition of the present invention may or may not contain an onium carboxylate. Examples of the onium carboxylate include those described in paragraphs [0605] to [0606] of U.S. Patent Application Publication No. 2008/0187860.

Such an onium carboxylate can be synthesized by reacting a sulfonium hydroxide, iodonium hydroxide or ammonium hydroxide and a carboxylic acid with silver oxide in an appropriate solvent.

In the case where the actinic ray-sensitive or radiation-sensitive resin composition contains an onium carboxylate, the content thereof is generally from 0.1 to 20 mass %, preferably from 0.5 to 10 mass %, more preferably from 1 to 7 mass %, based on the total solid content of the composition.

The actinic ray-sensitive or radiation-sensitive resin composition of the present invention may further contain, for example, a dye, a plasticizer, a photosensitizer, a light absorber, an alkali-soluble resin, a dissolution inhibitor, and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art by referring to the method described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid, and a cyclohexanedicarboxylic acid.

From the standpoint of enhancing the resolution, the actinic ray-sensitive or radiation-sensitive resin composition of the present invention is preferably used in a film thickness of 30 to 250 nm, more preferably from 30 to 200 nm. Such a film thickness can be achieved by setting the solid content concentration in the composition to an appropriate range, thereby imparting an appropriate viscosity and enhancing the coatability and film-forming property.

The solid content concentration of the actinic ray-sensitive or radiation-sensitive resin composition of the present invention is usually from 1.0 to 10 mass %, preferably from 2.0 to 5.7 mass %, more preferably from 2.0 to 5.3 mass %. By setting the solid content concentration to the range above, the resist solution can be uniformly coated on a substrate and furthermore, a resist pattern improved in the line width roughness can be formed. The reason therefor is not clearly known, but it is considered that thanks to a solid content concentration of 10 mass % or less, preferably 5.7 mass % or less, aggregation of materials, particularly, a photoacid generator, in the resist solution is suppressed, as a result, a uniform resist film can be formed.

The solid content concentration is a weight percentage of the weight of resist components excluding the solvent, based on the total weight of the actinic ray-sensitive or radiation-sensitive resin composition.

The actinic ray-sensitive or radiation-sensitive resin composition of the present invention is used by dissolving the components above in a predetermined organic solvent, preferably in the above-described mixed solvent, filtering the solution through a filter, and coating the filtrate on a predetermined support (substrate). The filter used for filtration is preferably a polytetrafluoroethylene-, polyethylene- or nylon-made filter having a pore size of 0.1 μm or less, more preferably 0.05 μm or less, still more preferably 0.03 μm or less. In the filtration through a filter, as described, for example, in JP-A-2002-62667, circulating filtration may be performed, or the filtration may be performed by connecting a plurality of kinds of filters in series or in parallel. Also, the composition may be filtered a plurality of times. Furthermore, a deaeration treatment or the like may be applied to the composition before and after filtration through a filter.

[9] Pattern Forming Method

The pattern forming method (negative pattern forming method) of the present invention includes at least:

(i) a step of forming a film (resist film) from the actinic ray-sensitive or radiation-sensitive resin composition of the present invention, (ii) a step of exposing the film, and (iii) a step of performing development by using a developer.

The exposure in the step (ii) may be immersion exposure.

The pattern forming method of the present invention preferably includes (iv) a heating step after the exposure step (ii).

The pattern forming method of the present invention may further include (v) a step of performing development by using an alkali developer.

In the pattern forming method of the present invention, the exposure step (ii) may be performed a plurality of times.

In the pattern forming method of the present invention, the heating step (v) may be performed a plurality of times.

The resist film of the present invention is formed of the above-described actinic ray-sensitive or radiation-sensitive resin composition of the present invention and, more specifically, is preferably a film formed by coating the actinic ray-sensitive or radiation-sensitive resin composition on a base material. In the pattern forming method of the present invention, the step of forming a film on a substrate by using the actinic ray-sensitive or radiation-sensitive resin composition, the step of exposing the film, and the development step can be performed by generally known methods.

It is also preferred to include, after film formation, a pre-baking step (PB) before entering the exposure step.

Furthermore, it is also preferred to include a post-exposure baking step (PEB) after the exposure step but before the development step.

As for the heating temperature, both PB and PEB are preferably performed at 70 to 130° C., more preferably at 80 to 120° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

Thanks to baking, the reaction in the exposed area is accelerated, and the sensitivity and pattern profile are improved.

The light source of the exposure apparatus for use in the present invention is not particularly limited in its wavelength but includes, for example, infrared light, visible light, ultraviolet light, far ultraviolet light, extreme-ultraviolet light, X-ray and electron beam and is preferably far ultraviolet light having a wavelength of 250 nm or less, more preferably 220 nm or less, still more preferably from 1 to 200 nm. Specific examples thereof include KrF excimer laser (248 nm), ArF excimer laser (193 nm), $F_2$ excimer laser (157 nm), X-ray, EUV (13 nm), and electron beam. Among these, KrF excimer laser, ArF excimer laser, EUV and electron beam are preferred, and ArF excimer laser is more preferred.

In the present invention, an immersion exposure method can be applied in the step of performing exposure.

The immersion exposure method is a technique to increase the resolution, and this is a technique of performing exposure by filling a space between the projection lens and the sample with a high refractive-index liquid (hereinafter, sometimes referred to as an "immersion liquid").

As for the "effect of immersion", assuming that $\lambda_0$ is the wavelength of exposure light in air, n is the refractive index of the immersion liquid for air, θ is the convergence half-angle of beam and $NA_0=\sin\theta$, the resolution and the depth of focus in immersion can be expressed by the following formulae. Here, $k_1$ and $k_2$ are coefficients related to the process.

$$(\text{Resolution})=k_1\cdot(\lambda_0/n)/NA_0$$

$$(\text{Depth of focus})=\pm k_2\cdot(\lambda_0/n)/NA_0^2$$

That is, the effect of immersion is equal to use of an exposure wavelength of 1/n. In other words, in the case of a projection optical system having the same NA, the depth of focus can be made n times larger by immersion. This is effective for all pattern profiles and furthermore, can be combined with the super-resolution technology under study at present, such as phase-shift method and modified illumination method.

In the case of performing immersion exposure, a step of washing the film surface with an aqueous chemical solution may be performed (1) before the exposure step after forming the film on a substrate and/or (2) after the step of exposing the film through an immersion liquid but before the step of baking the film.

The immersion liquid is preferably a liquid being transparent to light at the exposure wavelength and having as small a temperature coefficient of refractive index as possible in order to minimize the distortion of an optical image projected on the film. In particular, when the exposure light source is ArF excimer laser (wavelength: 193 nm), water is preferably used in view of easy availability and easy handleability in addition to the above-described aspects.

In the case of using water, an additive (liquid) capable of decreasing the surface tension of water and increasing the interface activity may be added in a small ratio. This additive is preferably an additive that does not dissolve the resist layer on the wafer and at the same time, gives only a negligible effect on the optical coat at the undersurface of the lens element.

Such an additive is preferably, for example, an aliphatic alcohol having a refractive index substantially equal to that of water, and specific examples thereof include methyl alcohol, ethyl alcohol and isopropyl alcohol. By virtue of adding an alcohol having a refractive index substantially equal to that of water, even when the alcohol component in water is evaporated and its content concentration is changed, the change in the refractive index of the liquid as a whole can be advantageously made very small.

On the other hand, if a substance opaque to light at 193 nm or an impurity greatly differing in the refractive index from water is mingled, this incurs distortion of the optical image projected on the resist. Therefore, the water used is preferably distilled water. Furthermore, pure water after filtration through an ion exchange filter or the like may be also used.

The electrical resistance of water used as the immersion liquid is preferably 18.3 MΩcm or more, and TOC (total organic carbon) is preferably 20 ppb or less. The water is preferably subjected to a deaeration treatment.

Also, the lithography performance can be enhanced by raising the refractive index of the immersion liquid. From such a standpoint, an additive for raising the refractive index may be added to water, or heavy water ($D_2O$) may be used in place of water.

In the case where the film formed using the composition of the present invention is exposed through an immersion medium, the receding contact angle on the surface is increased by the addition of the resin (D) for use in the present invention. The receding contact angle of the film is preferably from 60 to 90°, more preferably 70° or more.

In the immersion exposure step, the immersion liquid must move on a wafer following the movement of an exposure head that is scanning the wafer at a high speed and forming an exposure pattern. Therefore, the contact angle of the immersion liquid for the resist film in a dynamic state is important, and the resist is required to have a performance of allowing the immersion liquid to follow the high-speed scanning of an exposure head with no remaining of a liquid droplet.

In order to prevent the film from directly contacting with the immersion liquid, a film (hereinafter, sometimes referred to as a "topcoat") sparingly soluble in the immersion liquid may be provided between the film formed using the composition of the present invention and the immersion liquid. The functions required of the topcoat are suitability for coating as a resist overlayer, transparency to radiation, particularly, radiation having a wavelength of 193 nm, and sparing solubility in immersion liquid. The topcoat is preferably unmixable with the resist and capable of being uniformly coated as a resist overlayer.

In view of transparency to light at 193 nm, the topcoat is preferably an aromatic-free polymer.

Specific examples thereof include a hydrocarbon polymer, an acrylic acid ester polymer, a polymethacrylic acid, a polyacrylic acid, a polyvinyl ether, a silicon-containing polymer, and a fluorine-containing polymer. The resin (D) for use in the present invention is suitable also as the topcoat. If impurities are dissolved out into the immersion liquid from the topcoat, the optical lens is contaminated. For this reason, residual monomer components of the polymer are preferably little contained in the topcoat.

On removing the topcoat, a developer may be used, or a release agent may be separately used. The release agent is preferably a solvent less likely to permeate the film. From the standpoint that the removing step can be performed simultaneously with the development step of the film, the topcoat is preferably removable with an alkali developer and in view of removal with an alkali developer, the topcoat is preferably acidic, but considering non-intermixing with the film, the topcoat may be neutral or alkaline.

The difference in the refractive index between the topcoat and the immersion liquid is preferably null or small. In this case, the resolution can be enhanced. In the case where the exposure light source is ArF excimer laser (wavelength: 193 nm), water is preferably used as the immersion liquid and therefore, the topcoat for ArF immersion exposure preferably has a refractive index close to the refractive index (1.44) of water. Also, in view of transparency and refractive index, the topcoat is preferably a thin film.

The topcoat is preferably unmixable with the film and further unmixable also with the immersion liquid. From this standpoint, when the immersion liquid is water, the solvent used for the topcoat is preferably a medium that is sparingly soluble in the solvent used for the composition of the present invention and is water-insoluble. Furthermore, when the immersion liquid is an organic solvent, the topcoat may be either water-soluble or water-insoluble.

In the present invention, the substrate on which the film is formed is not particularly limited, and a substrate generally used in the process of producing a semiconductor such as IC or producing a liquid crystal device or a circuit board such as thermal head or in the lithography of other photo-fabrication processes, for example, an inorganic substrate such as silicon, SiN, $SiO_2$ and SiN, or a coating-type inorganic substrate such as SOG, can be used. If desired, an organic antireflection film may be formed between the film and the substrate.

In the case where the pattern forming method of the present invention further includes a step of performing development by using an alkali developer, the alkali developer which can be used includes, for example, an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

This alkaline aqueous solution may be also used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous solution of 2.38 mass % tetramethylammonium hydroxide is preferred.

As for the rinsing solution in the rinsing treatment performed after the alkali development, pure water is used, and the pure water may be used after adding thereto a surfactant in an appropriate amount.

After the development or rinsing, a treatment of removing the developer or rinsing solution adhering on the pattern by a supercritical fluid may be performed.

As for the developer which can be used in the step of performing development by using an organic solvent-containing developer (hereinafter, sometimes referred to as an "organic developer") in the pattern forming method of the present invention, a polar solvent such as ketone-based solvent, ester-based solvent, alcohol-based solvent, amide-based solvent and ether-based solvent, or a hydrocarbon-based solvent can be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent include, in addition to the glycol ether-based solvents above, dioxane and tetrahydrofuran.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or with water. However, in order to sufficiently bring out the effects of the present invention, the percentage water content in the entire developer is preferably less than 10 mass %, and it is more preferred to contain substantially no water.

That is, the amount of the organic solvent used in the organic developer is preferably from 90 to 100 mass %, more preferably from 95 to 100 mass %, based on the total amount of the developer.

In particular, the organic developer is preferably a developer containing at least one kind of an organic solvent selected from the group consisting of a ketone-based solvent, an ester-based solvent, an alcohol-based solvent, an amide-based solvent and an ether-based solvent.

The vapor pressure at 20° C. of the organic developer is preferably 5 kPa or less, more preferably 3 kPa or less, still more preferably 2 kPa or less. By setting the vapor pressure of the organic developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the solvent having a vapor pressure of 5 kPa or less include a ketone-based solvent such as 1-octanone, 2-octanone, 1-nonanone, 2-nonanone, 2-heptanone (methyl amyl ketone), 4-heptanone, 2-hexanone, diisobutyl ketone, cyclohexanone, methylcyclohexanone, phenylacetone and methyl isobutyl ketone; an ester-based solvent such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the solvent having a vapor pressure of 2 kPa or less that is a particularly preferred range include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

In the organic developer, a surfactant can be added in an appropriate amount, if desired.

The surfactant is not particularly limited but, for example, ionic or nonionic fluorine-containing and/or silicon-containing surfactants can be used. Examples of the fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the total amount of the developer.

As regards the developing method, for example, a method of dipping the substrate in a bath filled with the developer for a fixed time (dipping method), a method of raising the developer on the substrate surface by the effect of a surface tension and keeping it still for a fixed time, thereby performing the development (puddling method), a method of spraying the developer on the substrate surface (spraying method), and a method of continuously ejecting the developer on the substrate spinning at a constant speed while scanning with a developer ejecting nozzle at a constant rate (dynamic dispense method) may be applied.

In the case where the above-described various developing methods include a step of ejecting the developer toward the resist film from a development nozzle of a developing apparatus, the ejection pressure of the developer ejected (the flow velocity per unit area of the developer ejected) is preferably 2 $mL/sec/mm^2$ or less, more preferably 1.5 $mL/sec/mm^2$ or less, still more preferably 1 $mL/sec/mm^2$ or less. The flow velocity has no particular lower limit but in view of throughput, is preferably 0.2 $mL/sec/mm^2$ or more.

By setting the ejection pressure of the ejected developer to the range above, pattern defects attributable to the resist scum after development can be greatly reduced.

Details of this mechanism are not clearly known, but it is considered that thanks to the ejection pressure in the above-described range, the pressure imposed on the resist film by the developer becomes small and the resist film or resist pattern is kept from inadvertent chipping or collapse.

Here, the ejection pressure ($mL/sec/mm^2$) of the developer is a value at the outlet of a development nozzle in a developing apparatus.

Examples of the method for adjusting the ejection pressure of the developer include a method of adjusting the ejection pressure by a pump or the like, and a method of supplying the developer from a pressurized tank and adjusting the pressure to change the ejection pressure.

After the step of performing development by using an organic solvent-containing developer, a step of stopping the development by replacing the solvent with another solvent may be practiced.

The pattern forming method preferably includes a step of rinsing the film with a rinsing solution after the step of performing development by using an organic solvent-containing developer.

The rinsing solution used in the rinsing step after the step of performing development by using an organic solvent-containing developer is not particularly limited as long as it does not dissolve the resist pattern, and a solution containing a general organic solvent may be used. As the rinsing solution, a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent is preferably used.

Specific examples of the hydrocarbon-based solvent, ketone-based solvent, ester-based solvent, alcohol-based solvent, amide-based solvent and ether-based solvent are the same as those described above for the organic solvent-containing developer.

After the step of performing development by using an organic solvent-containing developer, more preferably, a step of rinsing the film by using a rinsing solution containing at least one kind of an organic solvent selected from the group consisting of a ketone-based solvent, an ester-based solvent, an alcohol-based solvent and an amide-based solvent is preformed; still more preferably, a step of rinsing the film by using a rinsing solution containing an alcohol-based solvent or an ester-based solvent is performed; yet still more preferably, a step of rinsing the film by using a rinsing solution containing a monohydric alcohol is performed; and most preferably, a step of rinsing the film by using a rinsing solution containing a monohydric alcohol having a carbon number of 5 or more is performed.

The monohydric alcohol used in the rinsing step includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. As for the particularly preferred monohydric alcohol having a carbon number of 5 or more, 1-hexanol, 2-hexanol, 4-methyl-2-pentanol, 1-pentanol, 3-methyl-1-butanol and the like can be used.

A plurality of these components may be mixed, or the solvent may be used by mixing it with an organic solvent other than those described above.

The percentage water content in the rinsing solution is preferably 10 mass % or less, more preferably 5 mass % or less, still more preferably 3 mass % or less. By setting the percentage water content to 10 mass % or less, good development characteristics can be obtained.

The vapor pressure at 20° C. of the rinsing solution used after the step of performing development by using an organic solvent-containing developer is preferably from 0.05 to 5 kPa, more preferably from 0.1 to 5 kPa, and most preferably from 0.12 to 3 kPa. By setting the vapor pressure of the rinsing solution to the range from 0.05 to 5 kPa, the temperature uniformity in the wafer plane is enhanced and moreover, swelling due to permeation of the rinsing solution is suppressed, as a result, the dimensional uniformity in the wafer plane is improved.

The rinsing solution may be also used after adding thereto a surfactant in an appropriate amount.

In the rinsing step, the wafer after development using an organic solvent-containing developer is rinsed using the above-described organic solvent-containing rinsing solution. The method for rinsing treatment is not particularly limited, but examples of the method which can be applied include a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method). Above all, it is preferred to perform the rinsing treatment by the spin coating method and after the rinsing, remove the rinsing solution from the substrate surface by spinning the substrate at a rotation speed of 2,000 to 4,000 rpm. It is also preferred to include a heating step (Post Bake) after the rinsing step. The developer and rinsing solution remaining between patterns and in the inside of the pattern are removed by the baking. The heating step after the rinsing step is performed at usually from 40 to 160° C., preferably from 70 to 95° C., for usually from 10 seconds to 3 minutes, preferably from 30 to 90 seconds.

The present invention also relates to a method for manufacturing an electronic device, comprising the pattern forming method of the present invention, and an electronic device manufactured by this manufacturing method.

The electronic device of the present invention is suitably mounted on electric electronic equipment (such as home electronic device, OA•media-related device, optical device and communication device).

EXAMPLES

The present invention is described in greater detail below by referring to Examples, but the present invention should not be construed as being limited thereto.

Synthesis Example(Synthesis of Resin A-1)

In a nitrogen stream, 102.3 parts by mass of cyclohexanone was heated at 80° C. While stirring this solution, a mixed solution containing 22.2 parts by mass of a monomer represented by the following structural formula M-1, 22.8 parts by mass of a monomer represented by the following structural formula M-2, 6.6 parts by mass of a monomer represented by the following structural formula M-3, 189.9 parts by mass of cyclohexanone and 2.40 parts by mass of dimethyl 2,2'-azobisisobutyrate [V-601, produced by Wako Pure Chemical Industries, Ltd.] was added dropwise over 5 hours. After the completion of dropwise addition, the solution was further stirred at 80° C. for 2 hours. The reaction solution was allowed to cool, then reprecipitated in a large amount of heptane/ethyl acetate (mass ratio: 9:1) and filtered, and the obtained solid was vacuum-dried to obtain 41.3 parts by mass of Resin (A-1) of the present invention.

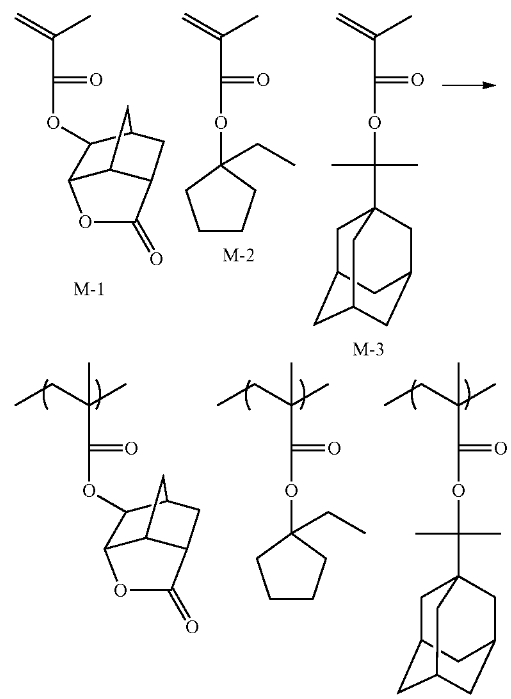

A-1

The weight average molecular weight (Mw, in terms of polystyrene) of the obtained resin as determined from GPC (carrier: tetrahydrofuran (THF)) was Mw=10,300, and the polydispersity was Mw/Mn=1.66. The compositional ratio as measured by $^{13}$C-NMR was 40/50/10.

<Acid-Decomposable Resin>

Resins A-2 to A-12 were synthesized in the same manner. Structures of the polymers synthesized are shown below.

A-1

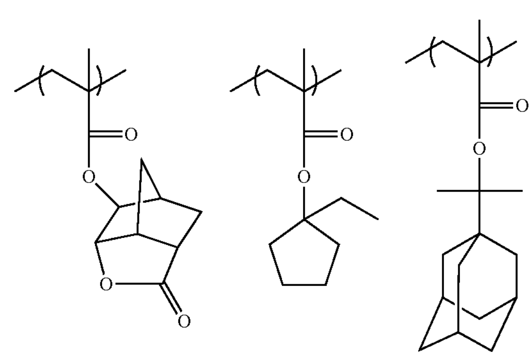

-continued
A-2
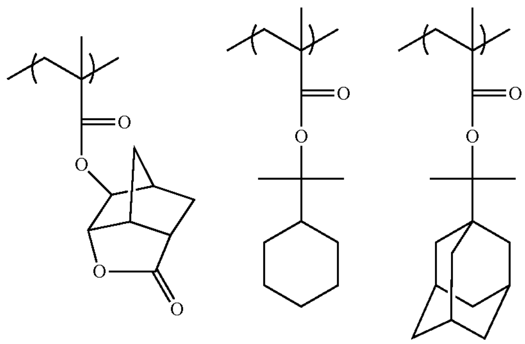
A-3
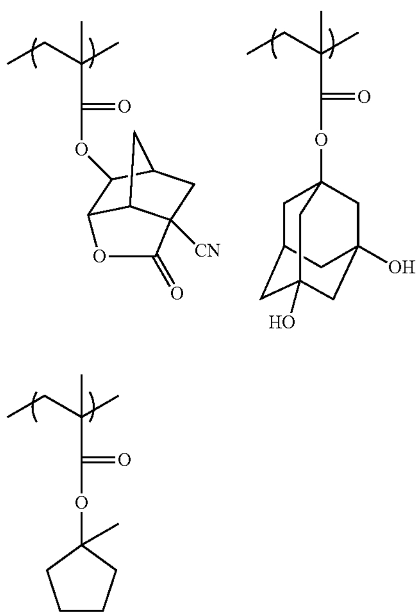
A-4
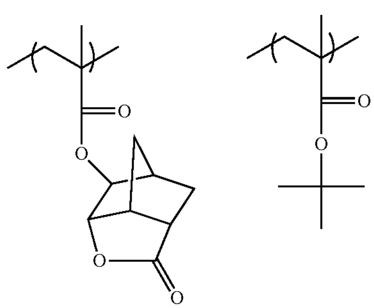
A-5
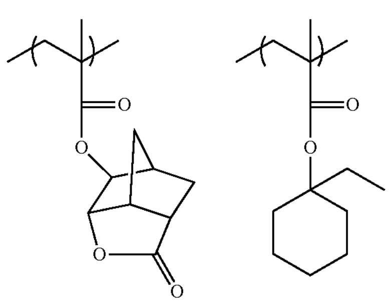
-continued
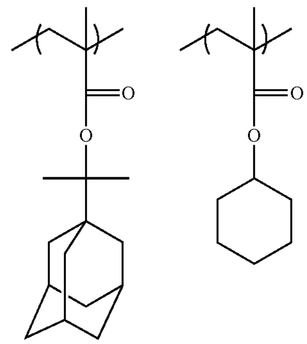
A-6
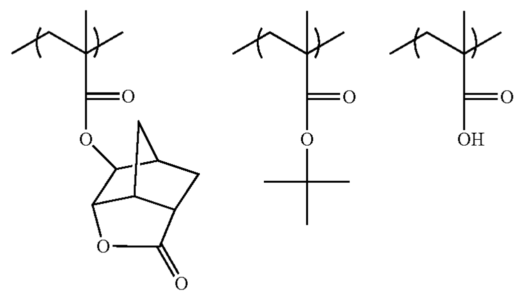
A-7
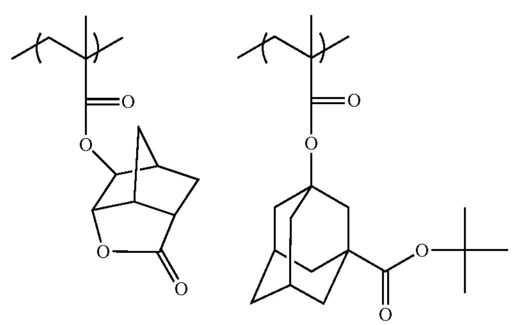
A-8
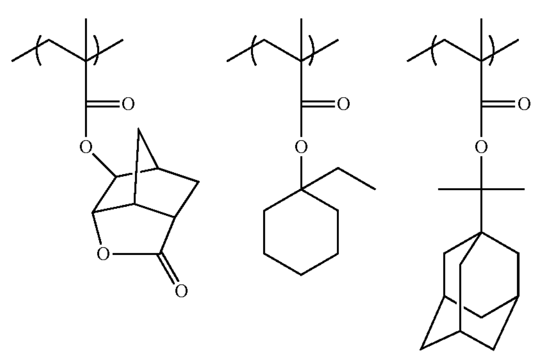

-continued

A-9

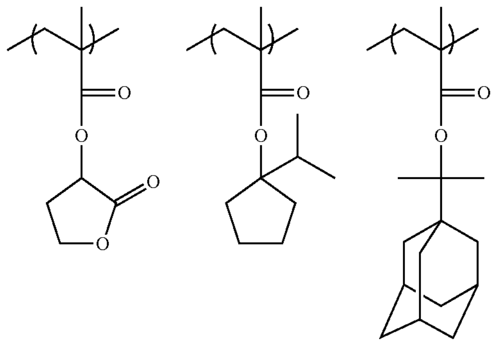

A-10

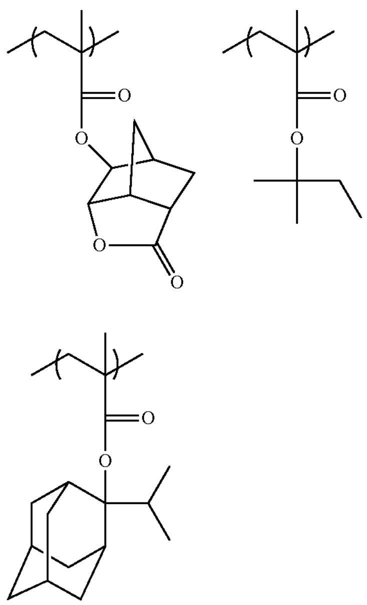

A-11

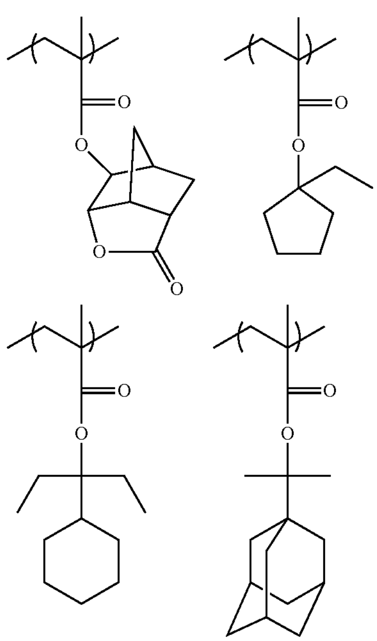

-continued

A-12

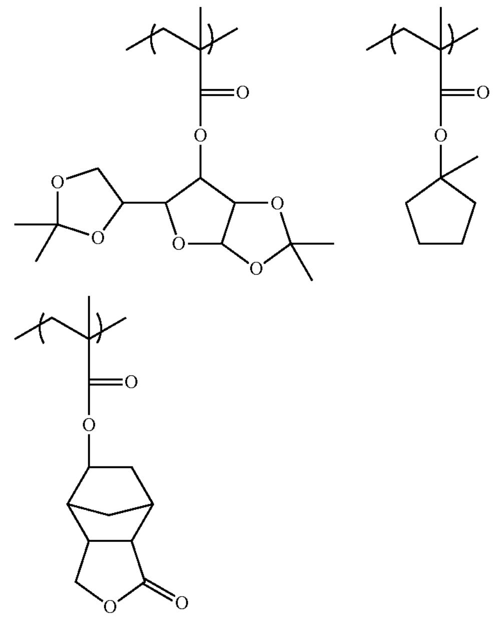

Also, the compositional ratio (molar ratio) of respective repeating units (corresponding to repeating units starting from the left), weight average molecular weight and polydispersity are shown in the Table below.

TABLE 3

| No. | Compositional Ratio (mol %) | | | | Mw | Mw/Mw |
|---|---|---|---|---|---|---|
| A-1 | 40 | 50 | 10 | — | 10300 | 1.66 |
| A-2 | 37 | 50 | 13 | — | 15700 | 1.71 |
| A-3 | 35 | 10 | 55 | — | 8900 | 1.59 |
| A-4 | 40 | 60 | — | — | 22000 | 1.78 |
| A-5 | 40 | 35 | 15 | 10 | 17500 | 1.84 |
| A-6 | 40 | 50 | 10 | — | 12600 | 1.67 |
| A-7 | 50 | 50 | — | — | 18100 | 1.80 |
| A-8 | 20 | 65 | 15 | — | 11200 | 1.62 |
| A-9 | 30 | 50 | 20 | — | 10800 | 1.71 |
| A-10 | 10 | 60 | 30 | — | 14700 | 1.76 |
| A-11 | 20 | 30 | 30 | 20 | 11500 | 1.67 |
| A-12 | 25 | 25 | 50 | — | 11000 | 1.68 |

Synthesis Example(Synthesis of Resin D-1)

In a nitrogen stream, 68.3 parts by mass of cyclohexanone was heated at 80° C. While stirring this solution, a mixed solution containing 12.0 parts by mass of a monomer represented by the following structural formula M-4, 22.4 parts by mass of a monomer represented by the following structural formula M-5, 126.9 parts by mass of cyclohexanone and 2.30 parts by mass of dimethyl 2,2'-azobisisobutyrate [V-601, produced by Wako Pure Chemical Industries, Ltd.] was added dropwise over 6 hours. After the completion of dropwise addition, the solution was further stirred at 80° C. for 2 hours. The reaction solution was allowed to cool, then reprecipitated in a large amount of heptane/ethyl acetate (mass ratio: 9:1) and filtered, and the obtained solid was vacuum-dried to obtain 15.9 parts by mass of Resin (D-1) of the present invention.

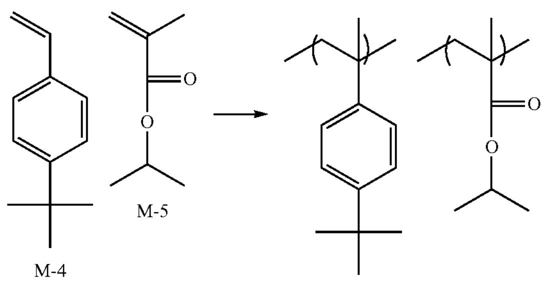

D-1

The weight average molecular weight (Mw, in terms of polystyrene) of the obtained resin as determined from GPC (carrier: tetrahydrofuran (THF)) was Mw=13,700, and the polydispersity was Mw/Mn=1.69. The compositional ratio as measured by $^{13}$C-NMR was 30/70. The mass percentage content of the $CH_3$ partial structure contained in the side chain moiety in Resin D-1 was computed and found to be 25.9%.

<Hydrophobic Resin>

Resins D-2 to D-17, RD-18 to RD-20, and D-21 to D-27 were synthesized in the same manner. Structures of the polymers synthesized are shown below.

D-1

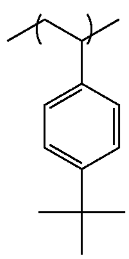

D-2

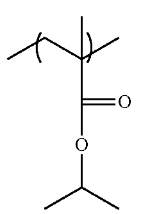

D-3

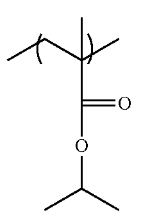

D-4

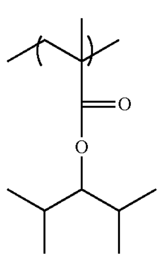

-continued

D-5

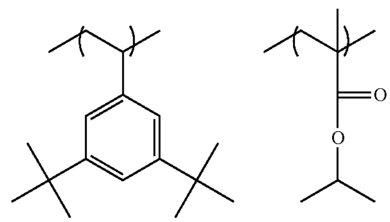

D-6

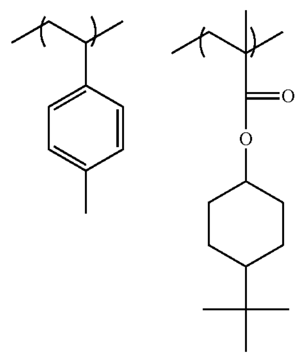

D-7

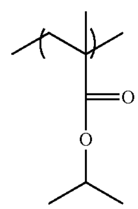

D-8

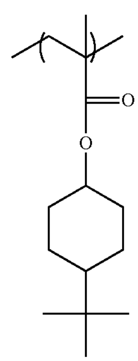

D-9

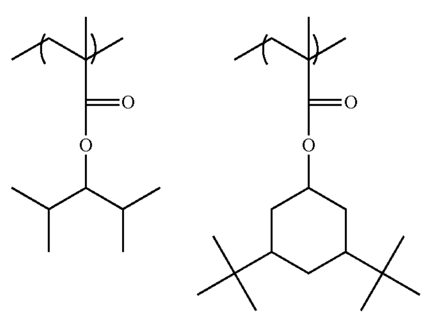

D-10
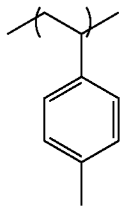
D-11
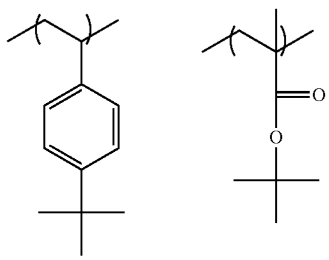
D-12
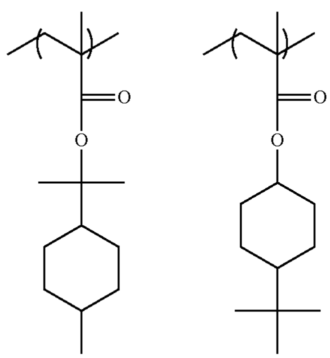
D-13
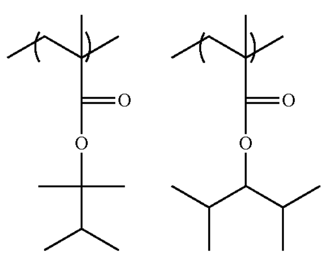
D-14
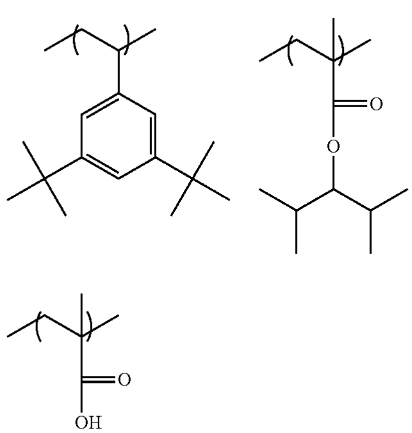
D-15
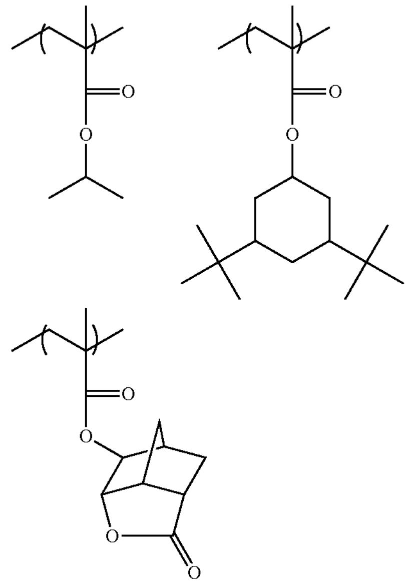
D-16
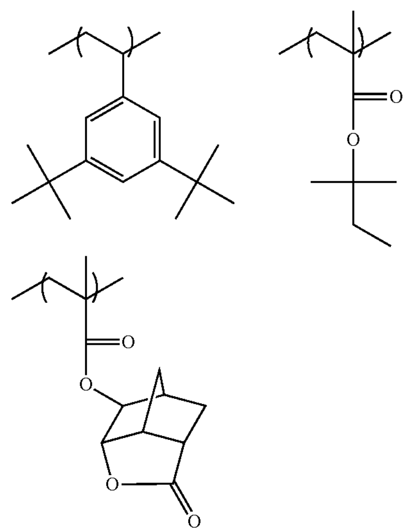
D-17
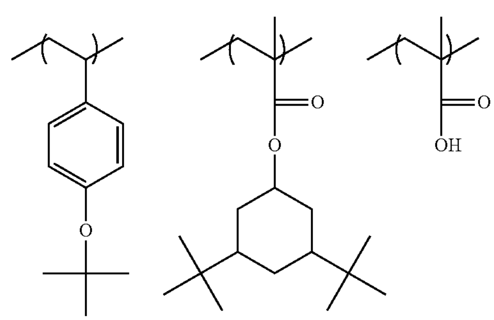
RD-18
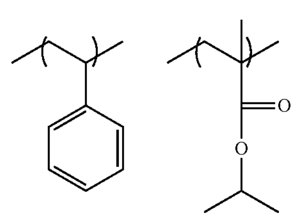

-continued
RD-19
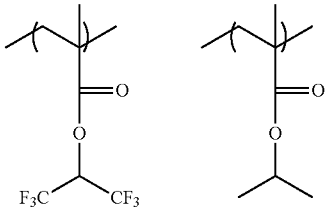
RD-20
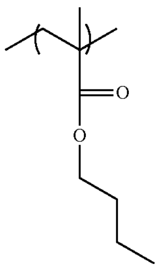
D-21
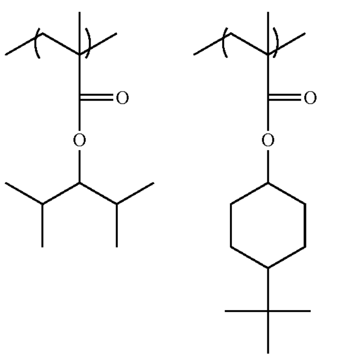
D-22
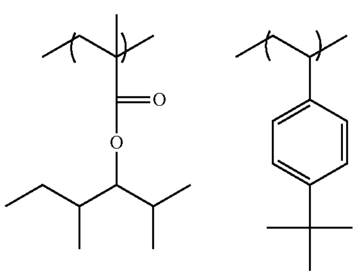
D-23
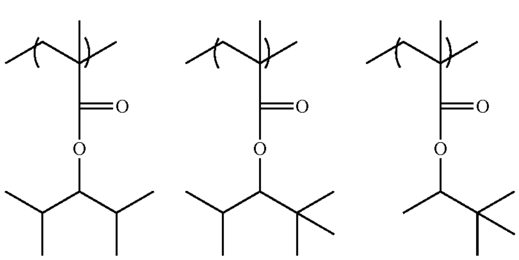
-continued
D-24
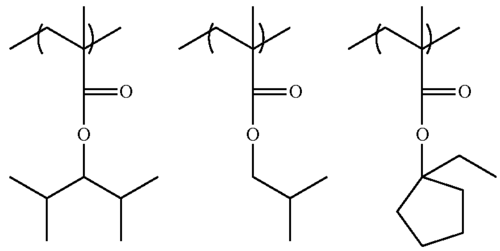
D-25
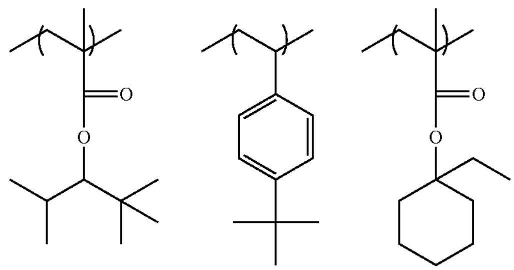
D-26
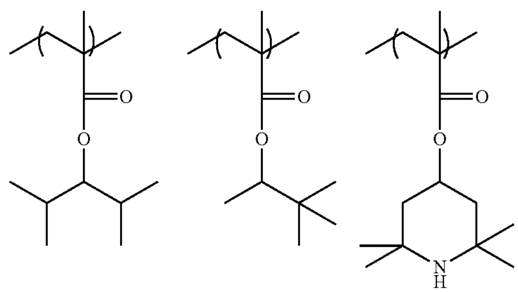
D-27
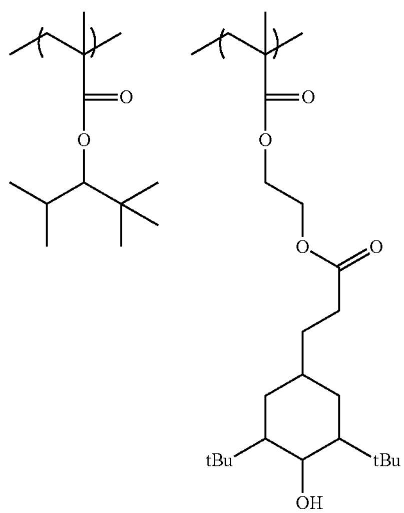
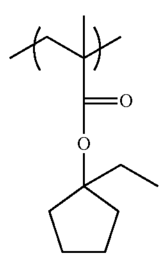

Also, the compositional ratio (molar ratio) of respective repeating units (corresponding to repeating units starting from the left), weight average molecular weight, polydispersity and the mass percentage content in each resin, which is accounted for by the $CH_3$ partial structure in the side chain moiety of each resin, are shown in the Table below.

TABLE 4

| No. | Compositional Ratio (mol %) | | | Mw | Mw/Mn | Mass Percentage Content of Side Chain $CH_3$ Partial Structure in Resin (%) |
|---|---|---|---|---|---|---|
| D-1 | 30 | 70 | — | 13700 | 1.69 | 25.9 |
| D-2 | 30 | 70 | — | 9200 | 1.61 | 25.9 |
| D-3 | 50 | 50 | — | 20100 | 1.75 | 28.0 |
| D-4 | 50 | 50 | — | 9700 | 1.62 | 28.0 |
| D-5 | 15 | 85 | — | 15500 | 1.70 | 26.2 |
| D-6 | 15 | 85 | — | 25000 | 1.76 | 19.0 |
| D-7 | 50 | 50 | — | 19800 | 1.73 | 21.8 |
| D-8 | 40 | 60 | — | 22400 | 1.74 | 21.4 |
| D-9 | 60 | 40 | — | 13200 | 1.68 | 32.4 |
| D-10 | 100 | — | — | 31100 | 1.77 | 12.7 |
| D-11 | 20 | 80 | — | 17300 | 1.70 | 28.1 |
| D-12 | 50 | 50 | — | 11600 | 1.65 | 20.1 |
| D-13 | 40 | 60 | — | 14900 | 1.69 | 33.7 |
| D-14 | 40 | 55 | 5 | 8900 | 1.54 | 38.8 |
| D-15 | 50 | 45 | 5 | 18300 | 1.76 | 26.2 |
| D-16 | 40 | 50 | 10 | 16700 | 1.73 | 31.1 |
| D-17 | 10 | 85 | 5 | 9400 | 1.59 | 29.9 |
| RD-18 | 50 | 50 | — | 10500 | 1.61 | 11.7 |
| RD-19 | 30 | 70 | — | 15000 | 1.68 | 16.4 |

TABLE 5

| No. | Compositional Ratio (mol %) | | | Mw | Mw/Mn | Mass Percentage Content of Side Chain $CH_3$ Partial Structure in Resin (%) |
|---|---|---|---|---|---|---|
| RD-20 | 100 | — | — | 25100 | 1.77 | 8.7 |
| D-21 | 80 | 20 | — | 30400 | 1.65 | 30.1 |
| D-22 | 70 | 30 | — | 28400 | 1.63 | 26.8 |
| D-23 | 30 | 40 | 30 | 16800 | 1.69 | 35.5 |
| D-24 | 70 | 10 | 20 | 12600 | 1.73 | 26.6 |
| D-25 | 40 | 30 | 30 | 9700 | 1.77 | 25.8 |
| D-26 | 45 | 45 | 10 | 18500 | 1.76 | 32.7 |
| D-27 | 30 | 40 | 30 | 29100 | 1.68 | 22.2 |

<Acid Generator>

The following compounds were used as the acid generator.

PAG-1

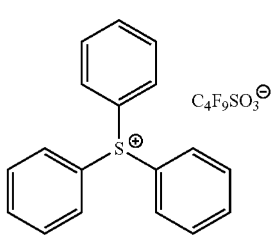

-continued

PAG-2

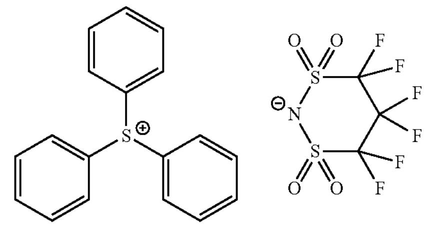

PAG-3

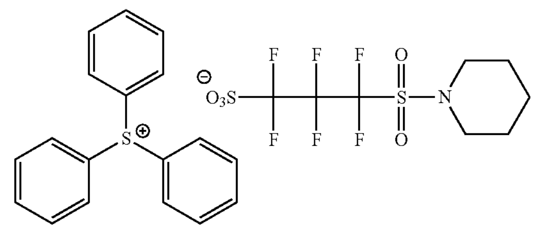

PAG-4

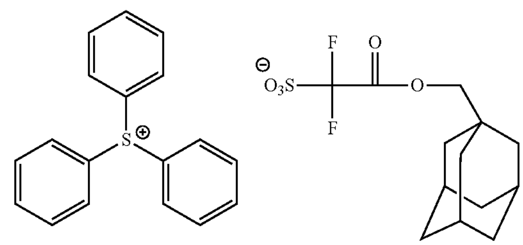

PAG-5

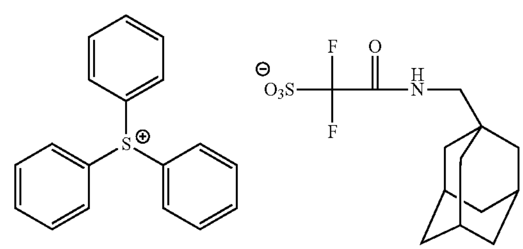

PAG-6

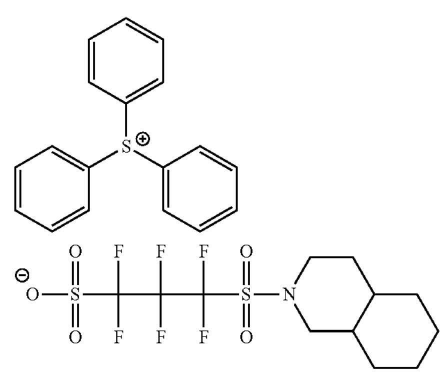

PAG-7

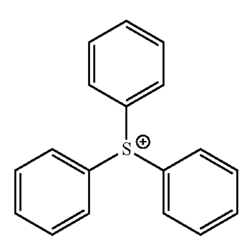

-continued
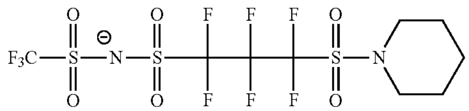
PAG-8
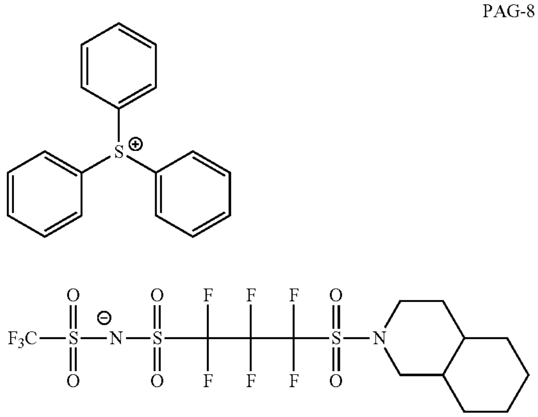
PAG-9
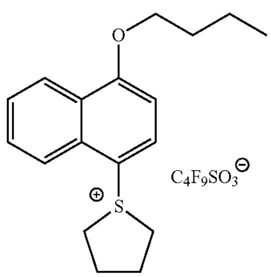
PAG-10
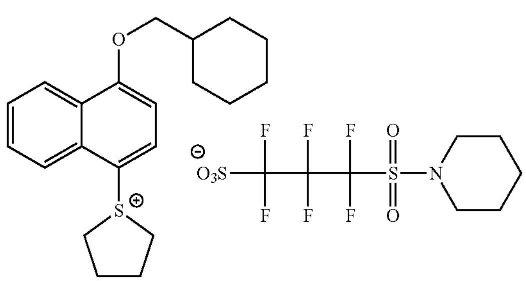
PAG-11
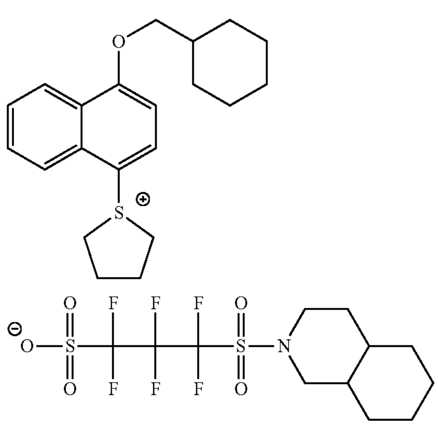
-continued
PAG-12
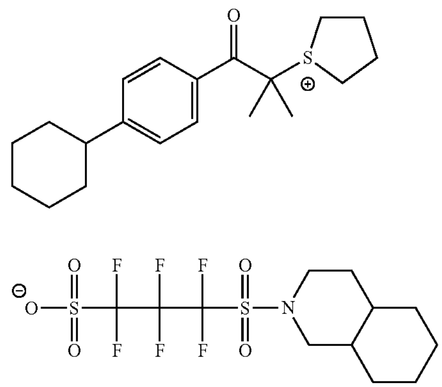
PAG-13
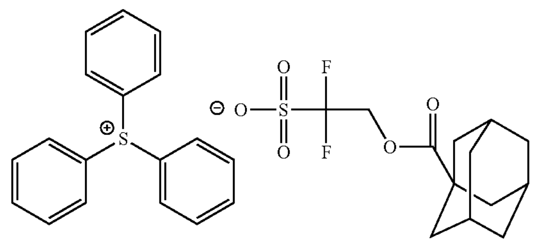
PAG-14
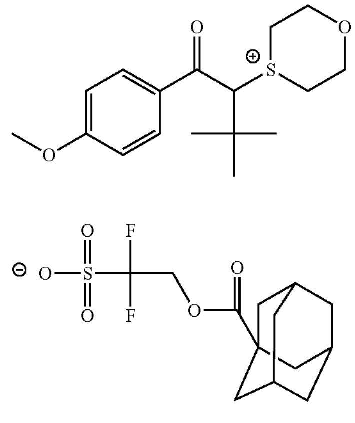
PAG-15
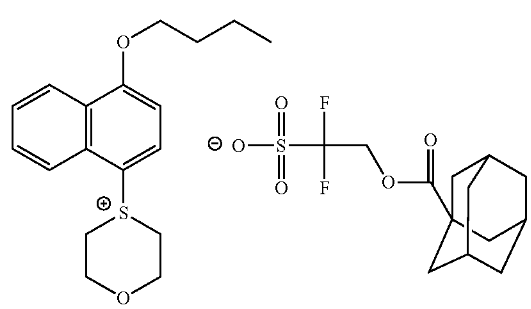
PAG-16
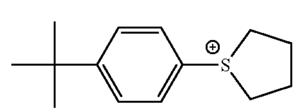

-continued

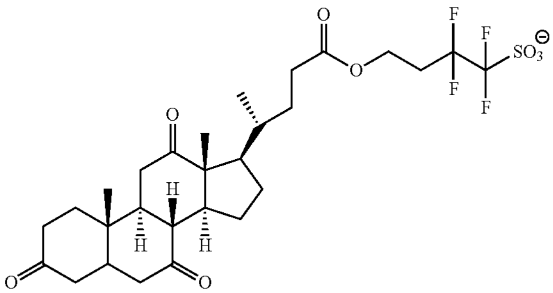

<Basic Compound (N) Whose Basicity Decreases Upon Irradiation with an Actinic Ray or Radiation, and Basic Compound (N')>

The following compounds were used as a basic compound whose basicity decreases upon irradiation with an actinic ray or radiation or as a basic compound.

N-1

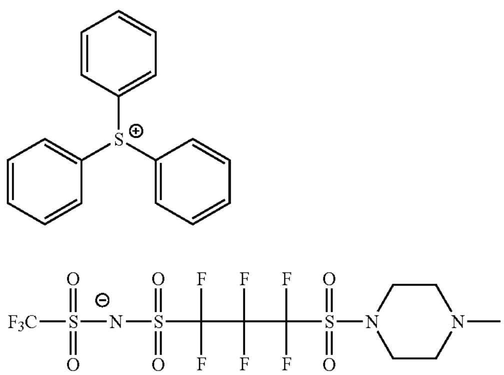

N-2

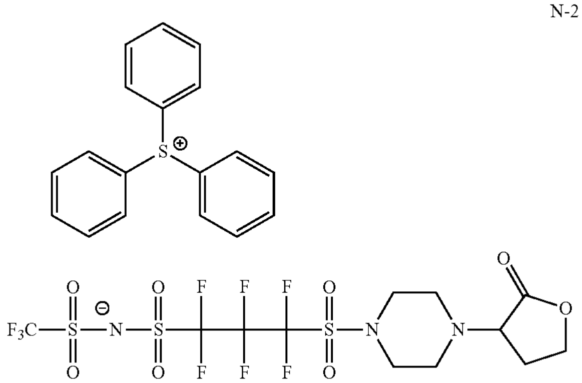

N-3

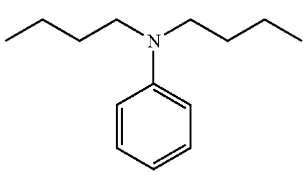

N-4

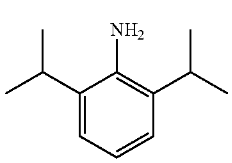

-continued

N-5

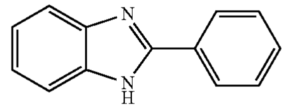

N-6

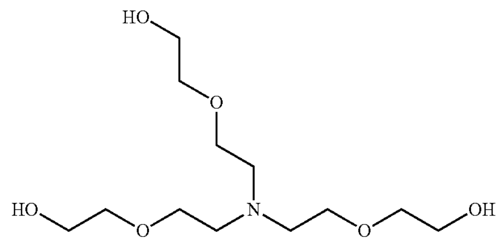

N-7

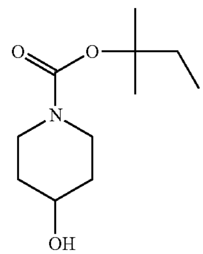

N-8

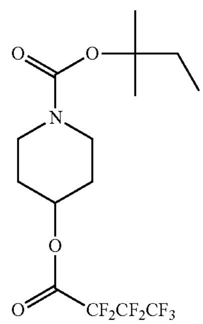

N-9

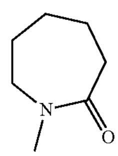

<Surfactant>

As the surfactant, the followings were prepared.

W-1: Megaface F176 (produced by DIC Corp.; fluorine-containing)

W-2: Megaface R08 (produced by DIC Corp.; fluorine- and silicon-containing)

W-3: Polysiloxane Polymer KP-341 (produced by Shin-Etsu Chemical Co., Ltd.; silicon-containing)

W-4: Troysol S-366 (produced by Troy Chemical)

W-5: KH-20 (produced by Asahi Glass Co., Ltd.)

W-6: PolyFox PF-6320 (produced by OMNOVA Solutions Inc., fluorine-containing)

<Solvent>

As the solvent, the followings were prepared.

(Group a)

SL-1: Propylene glycol monomethyl ether acetate (PGMEA)

SL-2: Propylene glycol monomethyl ether propionate

SL-3: 2-Heptanone (Group b)
SL-4: Ethyl lactate
SL-5: Propylene glycol monomethyl ether (PGME)
SL-6: Cyclohexanone
(Group c)
SL-7: γ-Butyrolactone
SL-8: Propylene carbonate
<Developer>

As the developer, the followings were prepared.
SG-1: Butyl acetate
SG-2: Methyl amyl ketone
SG-3: Ethyl-3-ethoxypropionate
SG-4: Pentyl acetate
SG-5: Isopentyl acetate
SG-6: Propylene glycol monomethyl ether acetate (PGMEA)
SG-7: Cyclohexanone
<Rinsing Solution>

As the rinsing solution, the followings were used.
SR-1: 4-Methyl-2-pentanol
SR-2: 1-Hexanol
SR-3: Butyl acetate
SR-4: Methyl amyl ketone
SR-5: Ethyl-3-ethoxypropionate Examples 1 to 35 and Comparative Examples 1 to 6

<ArF Immersion Exposure>
(Preparation of Resist)

The components shown in Table 5 below were dissolved in the solvent shown in the same Table to give a solid content of 3.8 mass %, and the obtained solution was filtered through a polyethylene filter having a pore size of 0.03 μm to prepare an actinic ray-sensitive or radiation-sensitive resin composition (resist composition). An organic antireflection film, ARC29SR (produced by Nissan Chemical Industries, Ltd.), was coated on a silicon wafer and baked at 205° C. for 60 seconds to form an antireflection film having a thickness of 95 nm, and the actinic ray-sensitive or radiation-sensitive resin composition was coated thereon and baked (PB: Prebake) at 100° C. over 60 seconds to form a resist film having a thickness of 100 nm.

The obtained wafer was patternwise exposed through a square-array halftone mask having a hole portion of 60 nm and a hole-to-hole pitch of 90 nm (here, because of negative image formation, the portions corresponding to holes were light-shielded) by using an ArF excimer laser immersion scanner (XT1700i, manufactured by ASML, NA: 1.20, C-Quad, outer sigma: 0.900, inner sigma: 0.812, XY deflection). As for the immersion liquid, ultrapure water was used. Thereafter, the resist film was heated at 105° C. for 60 seconds (PEB: Post Exposure Bake), developed by puddling the organic solvent-based developer shown in the Table below for 30 seconds, and then rinsed by puddling the rising solution shown in the Table below for 30 seconds while rotating the wafer at a rotation speed of 1,000 rpm. Subsequently, the wafer was rotated at a rotation speed of 4,000 rpm for 30 seconds, whereby a contact hole pattern having a hole diameter of 45 nm was obtained.

However, in Comparative Example 5, the wafer was patternwise exposed through a square-array halftone mask having a hole portion of 60 nm and a hole-to-hole pitch of 90 nm (here, because of positive image formation, the portions except for the portions corresponding to holes were light-shielded), subjected to development for 30 seconds using an aqueous 2.38 mass % tetramethylammonium hydroxide solution (so-called alkali development), then rinsed with pure water and spin-dried.

[Exposure Latitude (EL, %)]

The hole size was observed by a critical dimension scanning electron microscope (SEM, S-9380II, manufactured by Hitachi, Ltd.), and the optimum exposure dose when resolving a contact hole pattern with hole portions having an average size of 45 nm was taken as the sensitivity ($E_{opt}$) (mJ/cm$^2$). Based on the determined optimum exposure dose ($E_{opt}$), the exposure dose when giving a target hole size value of 45 nm±10% (that is, 40.5 nm and 49.5 nm) was determined. Thereafter, the exposure latitude (EL, %) defined by the following formula was calculated. As the value of EL is larger, the performance change due to change in the exposure dose is smaller and this is better.

$$[\text{EL }(\%)]=[(\text{exposure dose when the hole portion becomes 40.5 nm})-(\text{exposure dose when the hole portion becomes 49.5 nm})]/E_{opt}\times 100$$

[Local Pattern Dimension Uniformity (Local CDU, nm)]

Within one shot exposed at the optimum exposure dose determined in the evaluation of exposure latitude, arbitrary 25 holes in each of 20 regions spaced apart by a gap of 1 μm (that is, 500 holes in total) were measured for the hole size. The standard deviation thereof was determined, and 3σ was computed therefrom. A smaller value indicates less dimensional variation and higher performance.

[Residual Water (Watermark) Defect Performance]

In the observation of a contact hole pattern with a hole size of 45 nm resolved at the optimum exposure dose, random-mode measurement was performed using a defect inspection apparatus, 2360, manufactured by KLA-Tencor Corporation by setting the pixel size to 0.16 and the threshold value to 20, and after detecting development defects extracted from differences produced by superimposition of pixel units with a comparative image, the development defects were observed by SEM VISION G3 (manufactured by APPLIED MATERIALS, Inc.) to determine the number of watermark (WM) defects on the wafer.

The rating was A when the number of WM defects observed on the wafer was 0, B when from 1 to 4, C when from 5 to 9, and D when 10 or more. A smaller value indicates a higher WM defect performance.

[Pattern Profile]

The cross-sectional profile of the resist pattern having a hole diameter of 45 nm/film thickness of 100 nm was observed, and the hole diameter Lb at the bottom of the resist pattern and the hole diameter La at the top of the resist pattern were measured by using a critical dimension scanning electron microscope (SEM, S-9380II, manufactured by Hitachi, Ltd.) and rated "very good" when $0.95\leq(La/Lb)\leq 1.05$, rated "good" when $0.9\leq(La/Lb)<0.95$ or $1.05<(La/Lb)\leq 1.1$, or rated "bad" when outside the ranges in "very good" and "good".

These evaluation results are shown in the Table below.

TABLE 6

| Example | Resin (A) | (g) | Compound (B) | (g) | Compound (N) | (g) | Basic Compound (N') | (g) | Resin (D) | (g) | Resin (E) | (g) | Solvent | mass ratio |
|---|---|---|---|---|---|---|---|---|---|---|---|---|---|---|
| Example 1 | A-1 | 10 | PAG-3 | 1.24 | | | N-3 | 0.14 | D-1 | 0.50 | none | | SL-1/SL-5 | 60/40 |
| Example 2 | A-2 | 10 | PAG-3 | 1.24 | | | N-3 | 0.14 | D-2 | 0.50 | none | | SL-1 | 100 |
| Example 3 | A-3 | 10 | PAG-4 | 1.32 | N-1 | 0.86 | | | D-3 | 0.30 | none | | SL-1/SL-5 | 60/40 |
| Example 4 | A-1/A-2 | 7/3 | PAG-3 | 1.18 | | | N-6 | 0.15 | D-3 | 0.40 | none | | SL-1/SL-6 | 80/20 |
| Example 5 | A-7 | 10 | PAG-11 | 1.29 | | | N-4 | 0.08 | D-3 | 0.60 | none | | SL-1 | 100 |
| Example 6 | A-1 | 10 | PAG-5 | 0.98 | | | N-5 | 0.16 | D-4 | 0.65 | none | | SL-1/SL-5 | 60/40 |
| Example 7 | A-5 | 10 | PAG-6 | 1.06 | N-1 | 0.84 | | | D-5 | 0.15 | none | | SL-1/SL-2 | 90/10 |
| Example 8 | A-2 | 10 | PAG-11 | 2.40 | | | N-7 | 0.14 | D-6 | 0.05 | HR-47 | 0.06 | SL-1/SL-5 | 60/40 |
| Example 9 | A-1 | 10 | PAG-7 | 1.24 | N-2 | 0.54 | | | D-7 | 0.40 | none | | SL-5/SL-6 | 30/70 |
| Example 10 | A-1 | 10 | PAG-4 | 1.22 | N-1 | 0.31 | N-5 | 0.08 | D-7/D-2 | 0.4/0.1 | none | | SL-1/SL-6 | 90/10 |
| Example 11 | A-2 | 10 | PAG-3/ PAG-10 | 1.0/0.4 | | | N-5 | 0.08 | D-8 | 0.20 | none | | SL-1/SL-7 | 95/5 |
| Example 12 | A-3 | 10 | PAG-5 | 0.98 | N-1 | 0.86 | | | D-8 | 0.45 | none | | SL-1/SL-5 | 70/30 |
| Example 13 | A-6 | 10 | PAG-2 | 1.00 | | | N-6 | 0.14 | D-9 | 0.25 | none | | SL-1/SL-5 | 60/40 |
| Example 14 | A-5 | 10 | PAG-6/ PAG-12 | 0.4/0.44 | N-2 | 0.64 | | | D-10 | 0.53 | none | | SL-1/SL-3 | 80/20 |
| Example 15 | A-2 | 10 | PAG-4 | 1.32 | | | N-8 | 0.14 | D-11 | 0.38 | none | | SL-1/SL-5 | 60/40 |
| Example 16 | A-1 | 10 | PAG-8 | 1.46 | N-1 | 1.04 | | | D-12 | 1.10 | none | | SL-1/SL-5 | 70/30 |
| Example 17 | A-4 | 10 | PAG-1/ PAG-6 | 0.7/0.5 | | | N-4 | 0.16 | D-13 | 0.35 | HR-24 | 0.03 | SL-1/SL-8 | 95/5 |
| Example 18 | A-6 | 10 | PAG-4 | 1.04 | | | N-3 | 0.14 | D-14 | 1.03 | none | | SL-1 | 100 |
| Example 19 | A-3 | 10 | PAG-6 | 1.08 | | | N-4/N-8 | 0.04/0.04 | D-15 | 0.78 | none | | SL-1/SL-5 | 60/40 |
| Example 20 | A-4 | 10 | PAG-9/ PAG-6 | 1.0/1.0 | | | N-5 | 0.16 | D-16 | 0.69 | none | | SL-1/SL-4 | 80/20 |
| Example 21 | A-5 | 10 | PAG-2 | 1.00 | | | N-6 | 0.14 | D-17 | 0.87 | none | | SL-1/SL-5 | 60/40 |
| Example 22 | A-8 | 10 | PAG-14/ PAG-13 | 1.6/0.4 | | | N-3 | 0.14 | D-21 | 0.50 | none | | SL-1/SL-5 | 60/40 |
| Example 23 | A-9 | 10 | PAG-15/ PAG-13 | 0.8/0.2 | | | N-5 | 0.14 | D-22 | 0.37 | none | | SL-1 | 100 |
| Example 24 | A-10 | 10 | PAG-11 | 1.30 | N-1 | 0.40 | N-7 | 0.08 | D-23 | 0.45 | none | | SL-1/SL-5 | 70/30 |
| Example 25 | A-11 | 10 | PAG-3 | 1.24 | | | N-3 | 0.14 | D-24 | 0.50 | none | | SL-1/SL-7 | 95/5 |
| Example 26 | A-1 | 10 | PAG-14 | 1.64 | | | N-5 | 0.14 | D-25 | 0.40 | HR-24 | 0.03 | SL-1 | 100 |
| Example 27 | A-4 | 10 | PAG-7 | 1.32 | N-1 | 0.50 | | | D-26 | 0.37 | none | | SL-1/SL-5 | 60/40 |
| Example 28 | A-8 | 10 | PAG-15 | 2.15 | | | N-5 | 0.18 | D-27 | 0.40 | none | | SL-1/SL-4 | 80/20 |
| Example 29 | A-5 | 10 | PAG-3 | 1.24 | N-2 | 0.54 | | | D-21 | 0.45 | none | | SL-1/SL-5 | 60/40 |
| Example 30 | A-11 | 10 | PAG-15/ PAG-13 | 1.8/0.2 | | | N-5 | 0.08 | D-24 | 0.37 | none | | SL-1/SL-5 | 60/40 |
| Example 31 | A-12 | 10 | PAG-13 | 1.20 | | | N-5 | 0.08 | D-25 | 0.46 | none | | SL-1/SL-6 | 60/40 |
| Example 32 | A-10 | 10 | PAG-14 | 1.64 | N-1 | 0.75 | | | D-23 | 0.39 | none | | SL-1 | 100 |
| Example 33 | A-8 | 10 | PAG-15/ PAG-13 | 0.8/0.2 | N-2 | 0.65 | | | D-21 | 0.49 | HR-57 | 0.03 | SL-1/SL-8 | 95/5 |
| Example 34 | A-12 | 10 | PAG-16 | 1.36 | | | N-9 | 0.08 | D-21 | 0.40 | none | | SL-1/SL-4 | 90/10 |
| Example 35 | A-9 | 10 | PAG-15 | 1.64 | | | N-9 | 0.08 | D-26 | 0.42 | none | | SL-1/SL-5 | 60/40 |
| Comparative Example 1 | A-1 | 10 | PAG-3 | 1.24 | | | N-3 | 0.14 | None | | none | | SL-1/SL-5 | 60/40 |
| Comparative Example 2 | A-1 | 10 | PAG-3 | 1.24 | | | N-3 | 0.14 | D-1 | 1.80 | none | | SL-1/SL-5 | 60/40 |
| Comparative Example 3 | A-1 | 10 | PAG-3 | 1.24 | | | N-3 | 0.14 | RD-18 | 0.34 | none | | SL-1/SL-5 | 60/40 |
| Comparative Example 4 | A-1 | 10 | PAG-3 | 1.24 | | | N-3 | 0.14 | RD-19 | 0.75 | none | | SL-1/SL-5 | 60/40 |
| Comparative Example 5 | A-1 | 10 | PAG-3 | 1.24 | | | N-3 | 0.14 | D-1 | 0.50 | none | | SL-1/SL-5 | 60/40 |
| Comparative Example 6 | A-1 | 10 | PAG-3 | 1.24 | | | N-3 | 0.14 | RD-20 | 0.50 | none | | SL-1/SL-5 | 60/40 |

| Example | Surfactant | (g) | Developer | mass ratio | Rinsing Solution | Mass ratio | EL (%) | Local CDU (nm) | Defect Reduction Performance | Pattern Profile |
|---|---|---|---|---|---|---|---|---|---|---|
| Example 1 | W-1 | 0.003 | SG-1 | 100 | SR-1 | 100 | 19.5 | 4.4 | A | Good |
| Example 2 | W-3 | 0.003 | SG-1/SG-7 | 95/5 | SR-1 | 100 | 18.1 | 4.9 | A | Good |
| Example 3 | W-1 | 0.003 | SG-1 | 100 | SR-1 | 100 | 19.2 | 4.3 | A | Very Good |
| Example 4 | W-2 | 0.001 | SG-1 | 100 | SR-1 | 100 | 19.0 | 4.6 | A | Very Good |
| Example 5 | none | none | SG-1 | 100 | SR-1 | 100 | 17.9 | 4.7 | A | Very Good |
| Example 6 | W-1 | 0.003 | SG-1 | 100 | SR-1 | 100 | 18.3 | 4.8 | A | Very Good |
| Example 7 | W-2 | 0.003 | SG-1 | 100 | SR-1 | 100 | 19.3 | 4.4 | A | Good |
| Example 8 | W-1 | 0.003 | SG-1 | 100 | SR-1 | 100 | 19.4 | 4.5 | A | Good |
| Example 9 | none | none | SG-1/SG-4 | 50/50 | SR-1/SR-4 | 90/10 | 19.6 | 4.3 | A | Good |
| Example 10 | W-4 | 0.002 | SG-1 | 100 | SR-1 | 100 | 19.1 | 4.6 | A | Good |
| Example 11 | W-1 | 0.003 | SG-1 | 100 | SR-1 | 100 | 19.1 | 4.4 | A | Good |
| Example 12 | W-5 | 0.003 | SG-1 | 100 | SR-1 | 100 | 19.0 | 4.2 | A | Good |
| Example 13 | W-4 | 0.003 | SG-1 | 100 | SR-2 | 100 | 19.7 | 4.4 | A | Very Good |
| Example 14 | W-1 | 0.003 | SG-1 | 100 | SR-1 | 100 | 17.5 | 5.2 | A | Good |
| Example 15 | W-2 | 0.003 | SG-1/SG-3 | 90/10 | SR-1 | 100 | 16.1 | 5.5 | B | Good |

TABLE 6-continued

| | | | | | | | | | | |
|---|---|---|---|---|---|---|---|---|---|---|
| Example 16 | W-3 | 0.001 | SG-1 | 100 | SR-1/SR-5 | 90/10 | 16.3 | 5.4 | B | Good |
| Example 17 | none | none | SG-1 | 100 | SR-1 | 100 | 16.4 | 5.5 | B | Very Good |
| Example 18 | W-1 | 0.003 | SG-1 | 100 | SR-1 | 100 | 16.2 | 5.5 | B | Very Good |
| Example 19 | W-6 | 0.003 | SG-2 | 100 | SR-1/SR-3 | 90/10 | 16.7 | 5.6 | B | Good |
| Example 20 | W-1 | 0.003 | SG-1 | 100 | SR-1 | 100 | 15.3 | 6.1 | C | Good |
| Example 21 | none | none | SG-5/SG-6 | 95/5 | SR-1 | 100 | 15.4 | 5.9 | C | Good |
| Example 22 | W-1 | 0.003 | SG-1 | 100 | SR-1 | 100 | 19.0 | 4.5 | A | Very Good |
| Example 23 | W-6 | 0.003 | SG-1 | 100 | SR-1 | 100 | 18.9 | 4.6 | A | Very Good |
| Example 24 | W-1 | 0.003 | SG-1 | 100 | SR-1 | 100 | 19.3 | 4.5 | A | Very Good |
| Example 25 | W-3 | 0.003 | SG-1 | 100 | SR-1 | 100 | 17.2 | 5.3 | A | Very Good |
| Example 26 | W-1 | 0.003 | SG-1 | 100 | SR-1 | 100 | 17.0 | 5.4 | A | Very Good |
| Example 27 | W-5 | 0.003 | SG-1 | 100 | SR-1 | 100 | 19.3 | 4.9 | A | Very Good |
| Example 28 | W-4 | 0.003 | SG-1 | 100 | SR-1 | 100 | 16.7 | 5.5 | A | Very Good |
| Example 29 | none | none | SG-1 | 100 | SR-1 | 100 | 19.0 | 4.7 | A | Very Good |
| Example 30 | W-1 | 0.003 | SG-1 | 100 | SR-1 | 100 | 17.2 | 5.4 | A | Very Good |
| Example 31 | W-1 | 0.003 | SG-1/SG-4 | 40/60 | SR-1 | 100 | 17.0 | 5.5 | A | Very Good |
| Example 32 | W-3 | 0.003 | SG-1 | 100 | SR-1 | 100 | 18.6 | 4.5 | A | Very Good |
| Example 33 | W-2 | 0.003 | SG-1 | 100 | SR-1 | 100 | 18.7 | 4.8 | A | Very Good |
| Example 34 | W-5 | 0.003 | SG-1/SG-2 | 80/20 | SR-1 | 100 | 19.0 | 4.6 | A | Very Good |
| Example 35 | W-1 | 0.003 | SG-1 | 100 | SR-1 | 100 | 18.4 | 4.4 | A | Very Good |
| Comparative Example 1 | W-1 | 0.003 | SG-1 | 100 | SR-1 | 100 | 8.9 | 12.1 | D | Bad |
| Comparative Example 2 | W-1 | 0.003 | SG-1 | 100 | SR-1 | 100 | 9.2 | 10.8 | D | Bad |
| Comparative Example 3 | W-1 | 0.003 | SG-1 | 100 | SR-1 | 100 | 7.6 | 9.3 | D | Bad |
| Comparative Example 4 | W-1 | 0.003 | SG-1 | 100 | SR-1 | 100 | 8.1 | 8.9 | D | Bad |
| Comparative Example 5 | W-1 | 0.003 | Alkali development was performed. | | | | | Image formation failed and evaluation could not be performed. | | |
| Comparative Example 6 | W-1 | 0.003 | SG-1 | 100 | SR-1 | 100 | 9.9 | 10.1 | D | Bad |

As apparent from the results shown in Table 6, in both of Comparative Example 1 where the resin (D) is not incorporated and Comparative Example 2 where the content of the resin (D) exceeds 10 mass % based on the total solid content of the actinic ray-sensitive or radiation-sensitive resin composition, the exposure latitude (EL) is small, the local CDU is large, revealing that the pattern is poor in both EL and local CDU, and the number of residual water defects is large.

Also in Comparative Examples 3 and 6 where the mass percentage content in the resin (D), which is accounted for by the $CH_3$ partial structure contained in the side chain moiety of the resin (hereinafter, sometimes simply referred to as "addition resin") mixed with the resin (A), is less than 12.0%, EL is small, the local CDU is large, revealing that the pattern is poor in both EL and local CDU, and the number of residual water defects is large.

Also in Comparative Example 4 where the addition resin mixed with the resin (A) has a fluorine atom, EL is small, the local CDU is large, revealing that the pattern is poor in both EL and local CDU, and the number of residual water defects is large.

In Comparative Example 5 where the content of the resin (D) is from 0.1 mass % to less than 10 mass % based on the total solid content of the actinic ray-sensitive or radiation-sensitive resin composition and the mass percentage content in the resin (D), which is accounted for by the $CH_3$ partial structure contained in the side chain moiety of the resin (D), is 12.0% or more but positive development (alkali development) is performed, image formation failed and evaluation could not be performed.

On the other hand, in Examples 1 to 35 where the content of the resin (D) is from 0.1 mass % to less than 10 mass % based on the total solid content of the actinic ray-sensitive or radiation-sensitive resin composition and the mass percentage content in the resin (D), which is accounted for by the $CH_3$ partial structure contained in the side chain moiety of the resin (D), is 12.0% or more, in the immersion exposure, EL is large, the local CDU is small, revealing that the pattern is excellent in both EL and local CDU, and the number of residual water defects is small.

In Examples 1 to 14, 22-24, 27, 29, 32-35 where the resin (D) is composed only of at least either one repeating unit represented by formula (II) or (III) not having an acid-decomposable group, a lactone structure and an acid group (alkali-soluble group), EL is particularly large, the local CDU is particularly small, revealing that the pattern is particularly excellent in both EL and local CDU, and the number of residual water defects is particularly small.

Also, it is understood that in Examples 3 to 6, 13, 17, 18 and 22 to 35 where the mass percentage content in the resin (D), which is accounted for by the $C_{1-13}$ partial structure contained in the side chain moiety of the resin (D), is from 12.0 to 50.0% and the resin (D) is a resin having a repeating unit represented by formula (IV), the profile of the pattern cross-section of a hole pattern having a hole diameter of 45 nm is more excellent.

Also, with respect to the compositions of Examples 1 to 35 shown in the Table above, exposure evaluation was performed by exposure to electron beam irradiation or extreme-ultraviolet light (EUV light) in place of ArF immersion exposure.

Furthermore, exposure evaluation by exposure to EUV light was performed by using a resist composition having the same formulation except that in the composition of Example 1, Resin A-1 was changed to Resin AA-1 shown below, as a result, a pattern could be formed. The result was the same also in the composition where in Example 2, Resin A-2 was changed to Resin AA-2 shown below, the composition where in Example 3, Resin A-3 was changed to Resin AA-3 shown below, the composition where in Example 5, Resin A-7 was changed to Resin AA-4 shown below, and the composition where in Example 6, Resin A-1 was changed to Resin AA-5 shown below.

Incidentally, the compositional ratio of repeating units in each of Resins AA-1 to AA-5 shown below was in terms of the molar ratio.

AA-1
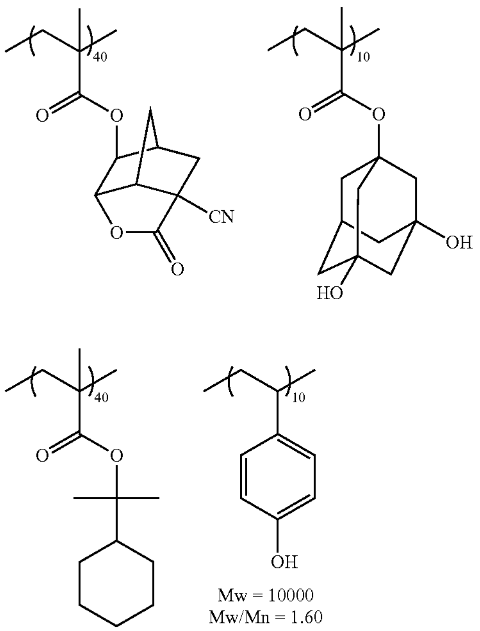
Mw = 10000
Mw/Mn = 1.60
AA-2
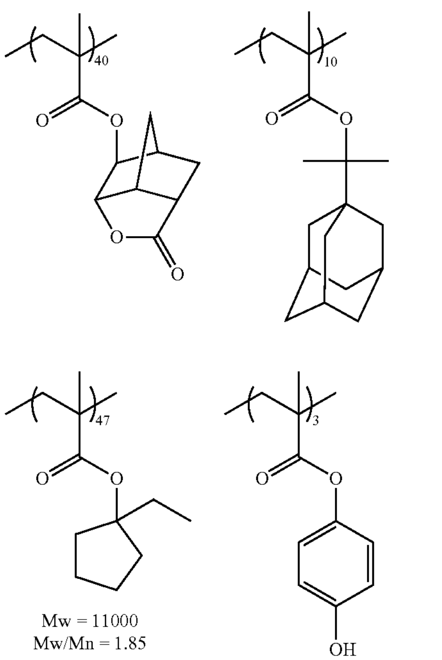
Mw = 11000
Mw/Mn = 1.85
AA-3
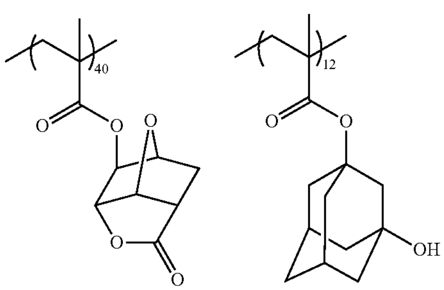
-continued
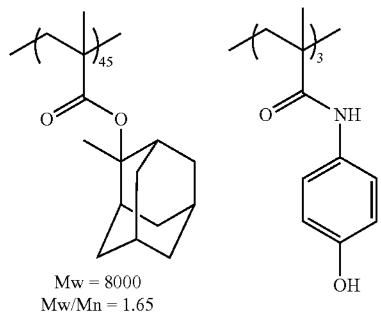
Mw = 8000
Mw/Mn = 1.65
AA-4
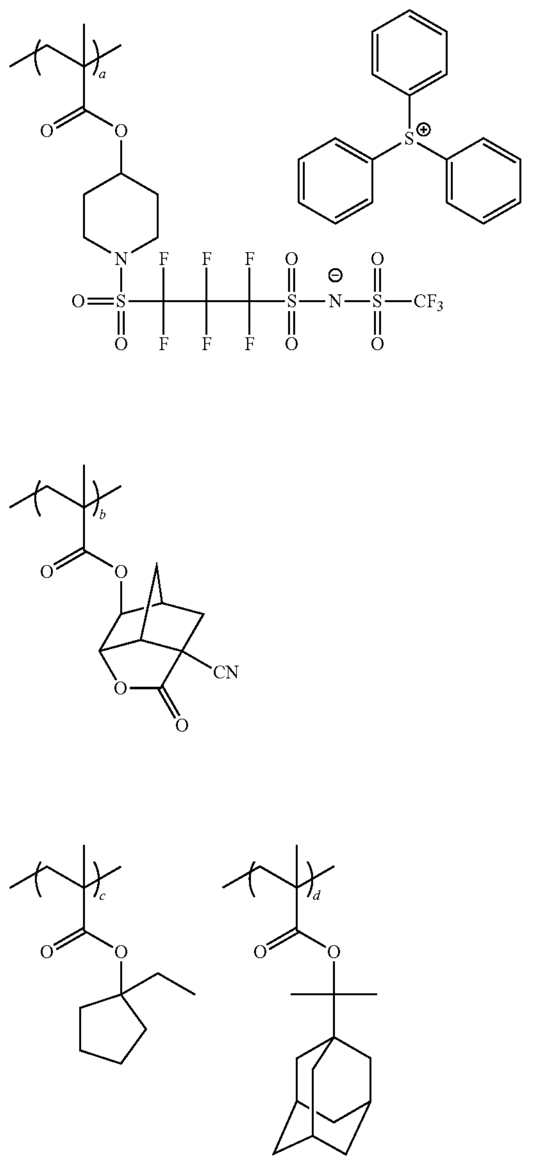
a/b/c/d = 5/43/37/15
Mw = 10500, Mw/Mn = 1.77

-continued

AA-5

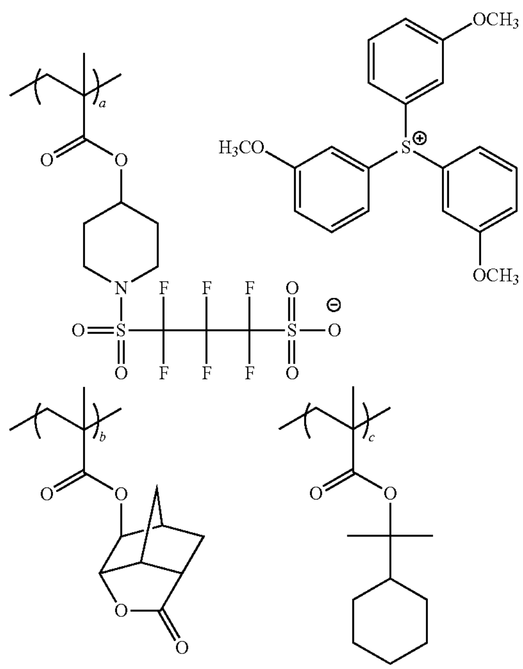

a/b/c = 10/30/60
Mw = 8500, Mw/Mn = 1.78

Industrial Applicability

According to the present invention, a pattern forming method ensuring that in forming a fine pattern such as hole pattern having a hole diameter of 45 nm or less, the local pattern dimension uniformity and exposure latitude are excellent and the generation of residual water defect is reduced, an actinic ray-sensitive or radiation-sensitive resin composition used therefor, a resist film, a manufacturing method of an electronic device, and an electronic device can be provided. Above all, a pattern forming method suitable for immersion exposure, an actinic ray-sensitive or radiation-sensitive resin composition used therefor, a resist film, a manufacturing method of an electronic device, and an electronic device can be provided.

This application is based on a Japanese patent application filed on Dec. 27, 2011 (Japanese Patent Application No. 2011-286985), US provisional application filed on Dec. 27, 2011 (U.S. Provisional Application No. 61/580,465), and Japanese patent application filed on Dec. 21, 2012 (Japanese Patent Application No. 2012-279835), and the contents thereof are incorporated herein by reference.

The invention claimed is:

1. A pattern forming method comprising:

(i) a step of forming a film by using an actinic ray-sensitive or radiation-sensitive resin composition containing (A) a resin capable of increasing its polarity by the action of an acid to decrease its solubility in an organic solvent-containing developer, (B) a compound capable of generating an acid upon irradiation with an actinic ray or radiation, (C) a solvent, and (D) a resin substantially free from a fluorine atom and a silicon atom and different from the resin (A), (ii) a step of exposing the film, and (iii) a step of performing development by using an organic solvent-containing developer to form a negative pattern, wherein the content of the resin (D) is from 0.1 mass % to less than 10 mass % based on the total solids content of the actinic ray-sensitive or radiation-sensitive resin composition and the mass percentage content in the resin (D), which is accounted for by the $CH_3$ partial structure contained in the side chain moiety of the resin (D), is from 12.0 to 50.0%, and the resin (D) is a resin containing a repeating unit represented by formula (IV):

(IV)

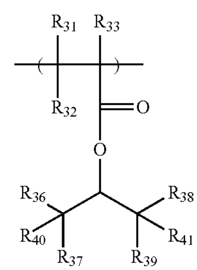

wherein:

each of $R_{31}$ to $R_{33}$ independently represents a hydrogen atom or an alkyl group, each of $R_{36}$ to $R_{39}$ independently represents an alkyl group or a cycloalkyl group, and each of $R_{40}$ and $R_{41}$ independently represents a hydrogen atom, an alkyl group or a cycloalkyl group.

2. The pattern forming method according to claim 1, wherein the resin (A) contains a repeating unit having a group capable of decomposing by the action of an acid to produce a polar group and the repeating unit is composed only of at least one repeating unit represented by the following formula (I):

(I)

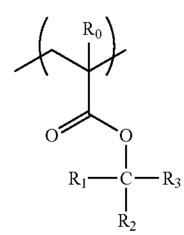

wherein $R_0$ represents a hydrogen atom or an alkyl group, each of $R_1$ to $R_3$ independently represents an alkyl group or a cycloalkyl group, and two members out of $R_1$ to $R_3$ may combine to form a monocyclic or polycyclic cycloalkyl group.

3. The pattern forming method according to claim 2, wherein the percentage content of the repeating unit represented by formula (I) is from 60 to 100 mol % based on all repeating units in the resin (A).

4. The pattern forming method according to claim 1, wherein the resin (D) contains at least either one repeating unit represented by the following formula (II) or (III):

(II)

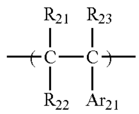

(III)

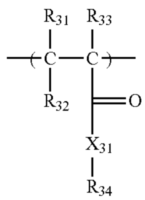

wherein in formula (II), each of $R_{21}$ to $R_{23}$ independently represents a hydrogen atom or an alkyl group, $Ar_{21}$ represents an aromatic group, $R_{22}$ and $Ar_{21}$ may form a ring, and in this case, $R_{22}$ represents an alkylene group; and in formula (III), each of $R_{31}$ to $R_{33}$ independently represents a hydrogen atom or an alkyl group, $X_{31}$ represents —O— or —$NR_{35}$—, $R_{35}$ represents a hydrogen atom or an alkyl group, and $R_{34}$ represents an alkyl group or a cycloalkyl group.

5. The pattern forming method according to claim 4, wherein the content of the repeating unit represented by formula (II) or (III) is from 50 to 100 mol % based on all repeating units in the resin (D).

6. The pattern forming method according to claim 1, wherein the developer is a developer containing at least one kind of an organic solvent selected from the group consisting of a ketone-based solvent, an ester-based solvent, an alcohol-based solvent, an amide-based solvent and an ether-based solvent.

7. The pattern forming method according to claim 1, further comprising:

(iv) a step of performing rinsing by using an organic solvent-containing rinsing solution.

8. The pattern forming method according to claim 1, wherein the exposure in the step (ii) is immersion exposure.

9. The pattern forming method according to claim 1, wherein the actinic ray-sensitive or radiation-sensitive resin composition further contains a compound represented by the following formula (F):

(F)

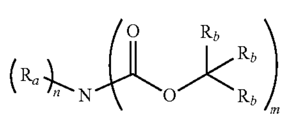

wherein in formula (F), each Ra independently represents a hydrogen atom, an alkyl group, a cycloalkyl group, an aryl group, or an aralkyl group, and, when n=2, two Ra's may be the same or different, and two Ra's may combine with each other to form a divalent heterocyclic hydrocarbon group or a derivative thereof;

each Rb independently represents a hydrogen atom, an alkyl group, a cycloalkyl group, an aryl group or an aralkyl group, provided that in —C(Rb)(Rb)(Rb), when one or more Rb's are a hydrogen atom, at least one of remaining Rb's is a cyclopropyl group or a 1-alkoxyalkyl group;

at least two Rb's may combine to form an alicyclic hydrocarbon group, an aromatic hydrocarbon group, a heterocyclic hydrocarbon group, or a derivative thereof;

n represents an integer of 0 to 2, m represents an integer of 1 to 3, and n+m=3.

10. The pattern forming method according to claim 1, wherein the amount of the organic solvent used in the organic solvent-containing developer is from 90 to 100 mass %, based on the total amount of the developer.

11. An actinic ray-sensitive or radiation-sensitive resin composition, used for the pattern forming method claimed in claim 1, containing:

(A) a resin capable of increasing its polarity by the action of an acid to decrease its solubility in an organic solvent-containing developer, (B) a compound capable of generating an acid upon irradiation with an actinic ray or radiation, (C) a solvent, and (D) a resin substantially free from a fluorine atom and a silicon atom and different from the resin (A), the content of the resin (D) is from 0.1 mass % to less than 10 mass % based on the total solids content of the actinic ray-sensitive or radiation-sensitive resin composition and the mass percentage content in the resin (D), which is accounted for by the $CH_3$ partial structure contained in the side chain moiety of the resin (D), is from 12.0 to 50.0%, and the resin (D) is a resin containing a repeating unit represented by formula (IV):

(IV)

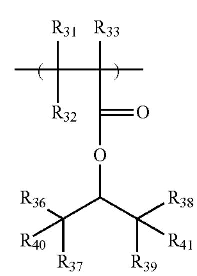

wherein:

each of $R_{31}$ to $R_{33}$ independently represents a hydrogen atom or an alkyl group, each of $R_{36}$ to $R_{39}$ independently represents an alkyl group or a cycloalkyl group, and each of $R_{40}$ and $R_{41}$ independently represents a hydrogen atom, an alkyl group or a cycloalkyl group.

12. The actinic ray-sensitive or radiation-sensitive resin composition according to claim 11, wherein the resin (A) contains a repeating unit having a group capable of decomposing by the action of an acid to produce a polar group and the repeating unit is composed only of at least one repeating unit represented by the following formula (I):

(I)

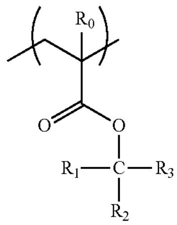

wherein $R_0$ represents a hydrogen atom or an alkyl group, each of $R_1$ to $R_3$ independently represents an alkyl group or a cycloalkyl group, and two members out of $R_1$ to $R_3$ may combine to form a monocyclic or polycyclic cycloalkyl group.

13. The actinic ray-sensitive or radiation-sensitive resin composition according to claim 12, wherein the percentage content of the repeating unit represented by formula (I) is from 60 to 100 mol % based on all repeating units in the resin (A).

14. The actinic ray-sensitive or radiation-sensitive resin composition according to claim 11, wherein the resin (D) contains at least either one repeating unit represented by the following formula (II) or (III):

(II)

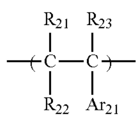

(III)

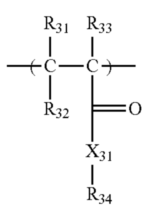

wherein in formula (II), each of $R_{21}$ to $R_{23}$ independently represents a hydrogen atom or an alkyl group, $Ar_{21}$ represents an aromatic group, $R_{22}$ and $Ar_{21}$ may form a ring, and in this case, $R_{22}$ represents an alkylene group; and in formula (III), each of $R_{31}$ to $R_{33}$ independently represents a hydrogen atom or an alkyl group, $X_{31}$ represents —O— or —$NR_{35}$—, $R_{35}$ represents a hydrogen atom or an alkyl group, and $R_{34}$ represents an alkyl group or a cycloalkyl group.

15. The actinic ray-sensitive or radiation-sensitive resin composition according to claim 14, wherein the content of the repeating unit represented by formula (II) or (III) is from 50 to 100 mol % based on all repeating units in the resin (D).

16. A resist film formed of the actinic ray-sensitive or radiation-sensitive resin composition claimed in claim 11.

17. The actinic ray-sensitive or radiation-sensitive resin composition according to claim 11, wherein the actinic ray-sensitive or radiation-sensitive resin composition further contains a compound represented by the following formula (F):

(F)

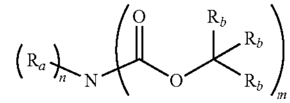

wherein in formula (F), each Ra independently represents a hydrogen atom, an alkyl group, a cycloalkyl group, an aryl group, or an aralkyl group, and, when n=2, two Ra's may be the same or different, and two Ra's may combine with each other to form a divalent heterocyclic hydrocarbon group or a derivative thereof;

each Rb independently represents a hydrogen atom, an alkyl group, a cycloalkyl group, an aryl group or an aralkyl group, provided that in —C(Rb)(Rb)(Rb), when one or more Rb's are a hydrogen atom, at least one of remaining Rb's is a cyclopropyl group or a 1-alkoxyalkyl group;

at least two Rb's may combine to form an alicyclic hydrocarbon group, an aromatic hydrocarbon group, a heterocyclic hydrocarbon group, or a derivative thereof;

n represents an integer of 0 to 2, m represents an integer of 1 to 3, and n+m=3.

18. A method for manufacturing an electronic device, comprising employing the pattern forming method according to claim 1 to form a negative pattern on an inorganic or coating-type inorganic substrate suitable for use in a process of producing a semiconductor, or a liquid crystal device or a circuit board.

19. An electronic device manufactured by the manufacturing method of an electronic device according to claim 18.

20. A pattern forming method comprising:

(i) a step of forming a film by using an actinic ray-sensitive or radiation-sensitive resin composition containing (A) a resin capable of increasing the polarity by the action of an acid to decrease the solubility for an organic solvent-containing developer, (B) a compound capable of generating an acid upon irradiation with an actinic ray or radiation, (C) a solvent, and (D) an acid decomposable resin substantially free from a fluorine atom and a silicon atom and different from the resin (A), (ii) a step of exposing the film, and (iii) a step of performing development by using an organic solvent-containing developer to form a negative pattern, wherein the content of the resin (D) is from 0.1 mass % to less than 10 mass % based on the total solids content of the actinic ray-sensitive or radiation-sensitive resin composition and the mass percentage content in the resin (D), which is accounted for by the $CH_3$ partial structure contained in the side chain moiety of the resin (D), is 12.0% or more.

21. The pattern forming method according to claim 20, wherein the weight average molecular weight of the resin (D) is from 10,000 to 40,000.

22. The pattern forming method according to claim 20, wherein the compound (B) is a compound represented by the following formula (ZI) or (ZII):

(ZI)

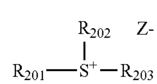

-continued (ZII)

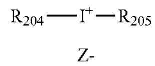

wherein in formulae (ZI) and (ZII), each of $R_{201}$, $R_{202}$ and $R_{203}$ independently represents an organic group, two members out of $R_{201}$ to $R_{203}$ may combine to form a ring structure, and the ring may contain an oxygen atom, a sulfur atom, an ester bond, an amide bond or a carbonyl group, each of $R_{204}$ and $R_{205}$ independently represents an aryl group, an alkyl group or a cycloalkyl group, and $Z^-$ represents a non-nucleophilic anion.

23. The pattern forming method according to claim 22, wherein $Z^-$ as the non-nucleophilic anion is an anion capable of producing an organic acid represented by the following formula (III) or (IV):

(III)

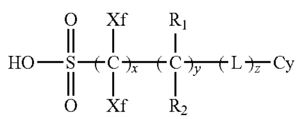

(IV)

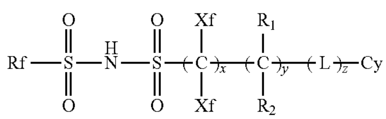

wherein each Xf independently represents a fluorine atom or an alkyl group substituted with at least one fluorine atom, each of $R_1$ and $R_2$ independently represents a hydrogen atom, a fluorine atom or an alkyl group, each L independently represents a divalent linking group, Cy represents a cyclic organic group, Rf represents a fluorine atom-containing group, x represents an integer of 1 to 20, y represents an integer of 0 to 10, and z represents an integer of 0 to 10.

24. The pattern forming method according to claim 23, wherein Cy as the cyclic organic group is a group having a steroid skeleton.

25. The pattern forming method according to claim 20, wherein the actinic ray-sensitive or radiation-sensitive resin composition further contains a compound represented by the following formula (F):

(F)

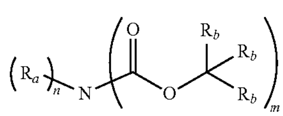

wherein in formula (F), each Ra independently represents a hydrogen atom, an alkyl group, a cycloalkyl group, an aryl group, or an aralkyl group, and, when n=2, two Ra's may be the same or different, and two Ra's may combine with each other to form a divalent heterocyclic hydrocarbon group or a derivative thereof;

each Rb independently represents a hydrogen atom, an alkyl group, a cycloalkyl group, an aryl group or an aralkyl group, provided that in —C(Rb)(Rb)(Rb), when one or more Rb's are a hydrogen atom, at least one of remaining Rb's is a cyclopropyl group or a 1-alkoxyalkyl group;

at least two Rb's may combine to form an alicyclic hydrocarbon group, an aromatic hydrocarbon group, a heterocyclic hydrocarbon group, or a derivative thereof;

n represents an integer of 0 to 2, m represents an integer of 1 to 3, and n+m=3.

26. A pattern forming method comprising:

(i) a step of forming a film by using an actinic ray-sensitive or radiation-sensitive resin composition containing (A) a resin capable of increasing its polarity by the action of an acid to decrease its solubility in an organic solvent-containing developer, (B) a compound capable of generating an acid upon irradiation with an actinic ray or radiation, (C) a solvent, and (D) a resin substantially free from a fluorine atom and a silicon atom and different from the resin (A), (ii) a step of exposing the film, and (iii) a step of performing development by using an organic solvent-containing developer to form a negative pattern, wherein the resin (A) contains, as a repeating unit having an acid-decomposable group, a repeating unit having in the side chain thereof a structure capable of decomposing by the action of an acid to produce an alcoholic hydroxy group, and the content of the resin (D) is from 0.1 mass % to less than 10 mass % based on the total solids content of the actinic ray-sensitive or radiation-sensitive resin composition and the mass percentage content in the resin (D), which is accounted for by the $CH_3$ partial structure contained in the side chain moiety of the resin (D), is 12.0% or more.

27. The pattern forming method according to claim 26, wherein the weight average molecular weight of the resin (D) is from 10,000 to 40,000.

28. The pattern forming method according to claim 26, wherein the compound (B) is a compound represented by the following formula (ZI) or (ZII):

(ZI)

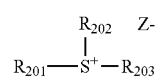

(ZII)

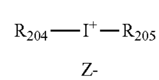

wherein in formulae (ZI) and (ZII), each of $R_{201}$, $R_{202}$ and $R_{203}$ independently represents an organic group, two members out of $R_{201}$ to $R_{203}$ may combine to form a ring structure, and the ring may contain an oxygen atom, a sulfur atom, an ester bond, an amide bond or a carbonyl group, each of $R_{204}$ and $R_{205}$ independently represents an aryl group, an alkyl group or a cycloalkyl group, and $Z^-$ represents a non-nucleophilic anion.

29. The pattern forming method according to claim 28, wherein $Z^-$ as the non-nucleophilic anion is an anion capable of producing an organic acid represented by the following formula (III) or (IV):

(III)

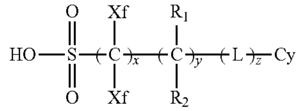

(IV)

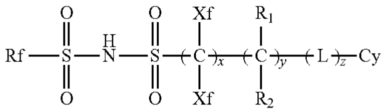

wherein each Xf independently represents a fluorine atom or an alkyl group substituted with at least one fluorine atom, each of $R_1$ and $R_2$ independently represents a hydrogen atom, a fluorine atom or an alkyl group, each L independently represents a divalent linking group, Cy represents a cyclic organic group, Rf represents a fluorine atom-containing group, x represents an integer of 1 to 20, y represents an integer of 0 to 10, and z represents an integer of 0 to 10.

30. The pattern forming method according to claim 29, wherein Cy as the cyclic organic group is a group having a steroid skeleton.

31. The pattern forming method according to claim 26, wherein the actinic ray-sensitive or radiation-sensitive resin composition further contains a compound represented by the following formula (F):

(F)

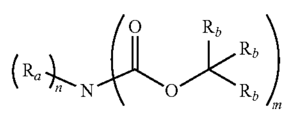

wherein in formula (F), each Ra independently represents a hydrogen atom, an alkyl group, a cycloalkyl group, an aryl group, or an aralkyl group, and, when n=2, two Ra's may be the same or different, and two Ra's may combine with each other to form a divalent heterocyclic hydrocarbon group or a derivative thereof;

each Rb independently represents a hydrogen atom, an alkyl group, a cycloalkyl group, an aryl group or an aralkyl group, provided that in –C(Rb)(Rb)(Rb), when one or more Rb's are a hydrogen atom, at least one of remaining Rb's is a cyclopropyl group or a 1-alkoxyalkyl group;

at least two Rb's may combine to form an alicyclic hydrocarbon group, an aromatic hydrocarbon group, a heterocyclic hydrocarbon group, or a derivative thereof;

n represents an integer of 0 to 2, m represents an integer of 1 to 3, and n+m=3.

32. A pattern forming method comprising:

(i) a step of forming a film by using an actinic ray-sensitive or radiation-sensitive resin composition containing (A) a resin capable of increasing its polarity by the action of an acid to decrease its solubility in an organic solvent-containing developer, (B) a compound capable of generating an acid upon irradiation with an actinic ray or radiation, (C) a solvent, and (D) a resin substantially free from a fluorine atom and a silicon atom and different from the resin (A), (ii) a step of exposing the film, and (iii) a step of performing development by using an organic solvent-containing developer to form a negative pattern, wherein the compound (B) is a compound represented by the following formula (ZI) or (ZII):

(ZI)

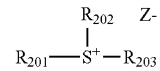

(ZII)

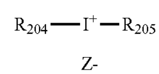

wherein each of $R_{201}$, $R_{202}$ and $R_{203}$ independently represents an organic group, two members out of $R_{201}$ to $R_{203}$ may combine to form a ring structure, and the ring may contain an oxygen atom, a sulfur atom, an ester bond, an amide bond or a carbonyl group, each of $R_{204}$ and $R_{205}$ independently represents an aryl group, an alkyl group or a cycloalkyl group, and $Z^-$ as the non-nucleophilic anion is an anion capable of producing an organic acid represented by the following formula (III) or (IV):

(III)

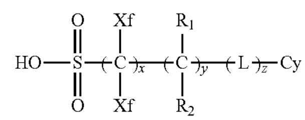

(IV)

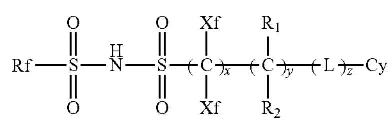

wherein each Xf independently represents a fluorine atom or an alkyl group substituted with at least one fluorine atom, each of $R_1$ and $R_2$ independently represents a hydrogen atom, a fluorine atom or an alkyl group, each L independently represents a divalent linking group, Cy represents a cyclopentyl group, a cylohexyl group, a cyclooctyl group, a norbornyl group, a tricyclodecanyl group, a tetracyclodecanyl group, a tetracyclododecanyl group or an adamantyl group, Rf represents a fluorine atom-containing group, x represents an integer of 1 to 20, y represents an integer of 0 to 10, and z represents an integer of 0 to 10, and the content of the resin (D) is from 0.1 mass % to less than 10 mass % based on the total solids content of the actinic ray-sensitive or radiation-sensitive resin composition and the mass percentage content in the resin (D), which is accounted for by the $CH_3$ partial structure contained in the side chain moiety of the resin (D), is 12.0% or more.

33. The pattern forming method according to claim 32, wherein the actinic ray-sensitive or radiation-sensitive resin composition further contains a compound represented by the following formula (F):

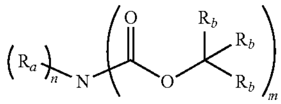

(F)

wherein in formula (F), each Ra independently represents a hydrogen atom, an alkyl group, a cycloalkyl group, an aryl group, or an aralkyl group, and, when n=2, two Ra's may be the same or different, and two Ra's may combine with each other to form a divalent heterocyclic hydrocarbon group or a derivative thereof;

each Rb independently represents a hydrogen atom, an alkyl group, a cycloalkyl group, an aryl group or an aralkyl group, provided that in —C(Rb)(Rb)(Rb), when one or more Rb's are a hydrogen atom, at least one of remaining Rb's is a cyclopropyl group or a 1-alkoxyalkyl group;

at least two Rb's may combine to form an alicyclic hydrocarbon group, an aromatic hydrocarbon group, a heterocyclic hydrocarbon group, or a derivative thereof;

n represents an integer of 0 to 2, m represents an integer of 1 to 3, and n+m=3.

34. The pattern forming method according to claim 32, wherein the weight average molecular weight of the resin (D) is from 10,000 to 40,000.

35. A pattern forming method comprising:

(i) a step of forming a film by using an actinic ray-sensitive or radiation-sensitive resin composition containing (A) a resin capable of increasing its polarity by the action of an acid to decrease its solubility in an organic solvent-containing developer, (B) a compound capable of generating an acid upon irradiation with an actinic ray or radiation, (C) a solvent, (D) a resin substantially free from a fluorine atom and a silicon atom and different from the resin (A), and (E) an N-alkylcaprolactam, (ii) a step of exposing the film, and (iii) a step of performing development by using an organic solvent-containing developer to form a negative pattern, wherein the content of the resin (D) is from 0.1 mass % to less than 10 mass % based on the total solids content of the actinic ray-sensitive or radiation-sensitive resin composition, and the mass percentage content in the resin (D), which is accounted for by the $CH_3$ partial structure contained in the side chain moiety of the resin (D), is 12.0% or more.

36. The pattern forming method according to claim 35, wherein the weight average molecular weight of the resin (D) is from 10,000 to 40,000.

37. The pattern forming method according to claim 35, wherein the compound (B) is a compound represented by the following formula (ZI) or (ZII):

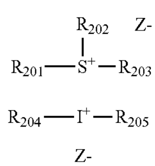

(ZI)

(ZII)

wherein in formulae (ZI) and (ZII), each of $R_{201}$, $R_{202}$ and $R_{203}$ independently represents an organic group, two members out of $R_{201}$ to $R_{203}$ may combine to form a ring structure, and the ring may contain an oxygen atom, a sulfur atom, an ester bond, an amide bond or a carbonyl group, each of $R_{204}$ and $R_{205}$ independently represents an aryl group, an alkyl group or a cycloalkyl group, and $Z^-$ represents a non-nucleophilic anion.

38. The pattern forming method according to claim 37, wherein $Z^-$ as the non-nucleophilic anion is an anion capable of producing an organic acid represented by the following formula (III) or (IV):

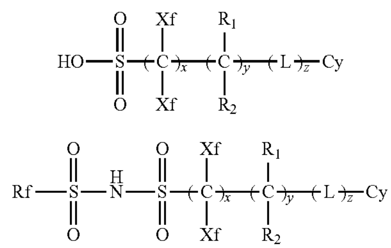

(III)

(IV)

wherein each Xf independently represents a fluorine atom or an alkyl group substituted with at least one fluorine atom, each of $R_1$ and $R_2$ independently represents a hydrogen atom, a fluorine atom or an alkyl group, each L independently represents a divalent linking group, Cy represents a cyclic organic group, Rf represents a fluorine atom-containing group, x represents an integer of 1 to 20, y represents an integer of 0 to 10, and z represents an integer of 0 to 10.

39. The pattern forming method according to claim 35, wherein Cy as the cyclic organic group is a group having a steroid skeleton.

40. The pattern forming method according to claim 35, wherein the actinic ray-sensitive or radiation-sensitive resin composition further contains a compound represented by the following formula (F):

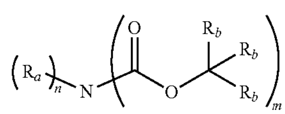

(F)

wherein in formula (F), each Ra independently represents a hydrogen atom, an alkyl group, a cycloalkyl group, an aryl group, or an aralkyl group, and, when n=2, two Ra's may be the same or different, and two Ra's may combine with each other to form a divalent heterocyclic hydrocarbon group or a derivative thereof;

each Rb independently represents a hydrogen atom, an alkyl group, a cycloalkyl group, an aryl group or an aralkyl group, provided that in –C(Rb)(Rb)(Rb), when one or more Rb's are a hydrogen atom, at least one of remaining Rb's is a cyclopropyl group or a 1-alkoxyalkyl group;

at least two Rb's may combine to form an alicyclic hydrocarbon group, an aromatic hydrocarbon group, a heterocyclic hydrocarbon group, or a derivative thereof;

n represents an integer of 0 to 2, m represents an integer of 1 to 3, and n+m=3.

* * * * *